US006858500B2

(12) United States Patent
Sugi et al.

(10) Patent No.: US 6,858,500 B2
(45) Date of Patent: Feb. 22, 2005

(54) SEMICONDUCTOR DEVICE AND ITS MANUFACTURING METHOD

(75) Inventors: Akio Sugi, Nagano (JP); Naoto Fujishima, Nagano (JP); Mutsumi Kitamura, Nagano (JP); Katsuya Tabuchi, Nagano (JP); Setsuko Wakimoto, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 95 days.

(21) Appl. No.: 10/334,127

(22) Filed: Dec. 31, 2002

(65) Prior Publication Data

US 2003/0164527 A1 Sep. 4, 2003

(30) Foreign Application Priority Data

Jan. 16, 2002 (JP) ....................................... 2002-008015
Oct. 16, 2002 (JP) ....................................... 2002-302136

(51) Int. Cl.[7] ............................................ H01L 21/336
(52) U.S. Cl. ........................ 438/270; 438/272; 438/589
(58) Field of Search ................................ 438/270, 272, 438/268, 212, 589

(56) References Cited

U.S. PATENT DOCUMENTS

| | | | | | |
|---|---|---|---|---|---|
| 5,250,450 | A | | 10/1993 | Lee et al. | |
| 5,701,026 | A | | 12/1997 | Fujishima et al. | |
| 5,828,100 | A | * | 10/1998 | Tamba et al. | 257/328 |
| 5,903,034 | A | | 5/1999 | Sakamoto et al. | |
| 6,316,807 | B1 | | 11/2001 | Fujishima et al. | |
| 6,359,318 | B1 | | 3/2002 | Yamamoto et al. | |
| 6,495,883 | B2 | * | 12/2002 | Shibata et al. | 438/720 |
| 6,545,316 | B1 | * | 4/2003 | Baliga | 257/329 |
| 6,624,470 | B2 | * | 9/2003 | Fujishima | 257/331 |
| 6,639,274 | B2 | * | 10/2003 | Fujishima | 257/330 |
| 6,664,163 | B2 | * | 12/2003 | Fujishima et al. | 438/270 |
| 6,781,197 | B2 | * | 8/2004 | Fujishima et al. | 257/329 |

FOREIGN PATENT DOCUMENTS

| | | |
|---|---|---|
| DE | 197 20 193 A1 | 11/1998 |
| DE | 102 11 690 A1 | 9/2002 |
| JP | 6-104446 | 4/1994 |
| JP | 8-088283 | 4/1996 |
| JP | 2000-77532 | 3/2000 |
| JP | 2002-184980 | 6/2002 |
| WO | WO 00/52760 | 9/2000 |
| WO | WO 01/41187 A2 | 6/2001 |

OTHER PUBLICATIONS

N. Fujishima, et al., A Low On–resistance Trench Lateral Power MOSFET in a 0.6 μm Smart Power Technology for 20–30 V Applications, Dec. 8, 2002, pp. 455–458.

M.S. Shekar, et al., Hot Electron Degradation and Unclamped Inductive Switching in Submicron 60–V Lateral DMOS, Mar. 31, 1998, pp. 383–390.

Naoto Fujishima et al., "A High Density, Low On–resistance, Trench Lateral Power MOSFTET with a Trench Bottom Source Contact", ISPSD Proceedings 2001, pp143–146.

U.S. Appl. No. 10/156,641, filed May 29, 2002, Naoto Fujishima, Fuji Electric Co., Ltd.

U.S. Appl. No. 10/156,757, filed May 29, 2002, Naoto Fujishima, Fuji Electric Co., Ltd.

U.S. Appl. No. 10/103,543, filed Mar. 21, 2002.

U.S. Appl. No. 10/272,304, filed Oct. 17, 2002, Naoto Fujishima et al., Fuji Electric Co., Ltd.

U.S. Appl. No. 10/322,367, filed Dec. 18, 2002, Tabuchi et al.

* cited by examiner

*Primary Examiner*—Kevin M. Picardat

(57) ABSTRACT

Gate electrodes of a TLPM and gate electrodes of planar devices are formed by patterning a same polysilicon layer. Drain electrode(s) and source electrode(s) of the TLPM and drain electrodes and source electrodes of the planar devices are formed by patterning a same metal layer. Therefore, the TLPM and the planar devices can be connected electrically to each other by resulting metal wiring layers and polysilicon layers without the need for performing wire bonding on a printed circuit board.

32 Claims, 275 Drawing Sheets

SEMICONDUCTOR DEVICE AND ITS MANUFACTURING METHOD

CROSS-REFERENCE TO RELATED APPLICATIONS

This application claims the benefit of Japanese Applications Nos. 2000-008015 and 2002-302136, filed Jan. 16, 2002 and Oct. 16, 2002, respectively, in the Japanese Patent Office, the disclosure of which is incorporated herein by reference.

BACKGROUND OF THE INVENTION

1. Field of the Invention

The present invention relates to a semiconductor device and its manufacturing method. In particular, the invention relates to a semiconductor device in which trench lateral power MOSFETs and planar devices such as planar MOSFETs are integrated on the same semiconductor substrate as well as its manufacturing method.

2. Description of the Related Art

In power MOSFETs, in general, an extended drain region is formed to increase the breakdown voltage. FIG. 265 is a vertical sectional view showing the configuration of a conventional n-channel planar power MOSFET. As shown in FIG. 265, an n-type extended drain region 12 is provided between gate electrodes 16 of adjoining devices that share an n-type drain region 13 and a drain electrode 17, to extend parallel with the surface of a p-type semiconductor substrate 11 and surround the drain region 13. P-type base regions 14, n-type source regions 15, and source electrodes 18 are separated by placement on both sides of the extended drain region 12.

The gate electrodes 16 extend to cover a thick field oxide film 10 that is continuous with a gate oxide film 19 and serve as field plates. It is noted that in this specification the term “planar device” does not include power devices such as the planar power MOSFET.

The planar power MOSFET is manufactured by approximately the same process as planar devices such as BiCMOS. Therefore, a one-chip power IC is readily obtained by forming planar power MOSFETs and planar devices on the same semiconductor substrate. However, such a one-chip power IC including planar power MOSFETs and planar devices has a disadvantage of a low integration density because, as described above, the extended drain region 12 extends parallel with the substrate surface in the planar power MOSFET In view of the above, a trench lateral power MOSFET (hereinafter abbreviated as “TLPM”) has been proposed which is advantageous since the on-resistance per unit area is lower than the planar power MOSFET. FIG. 266 is a vertical sectional view showing the configuration of a conventional n-channel TLPM. A trench 30 is formed in a p-type semiconductor substrate 21. An n-type extended drain region 22 is provided adjacent to the bottom surface and a bottom portion of the side surface of the trench 30.

A p-type body region 24 is provided outside the extended drain region 22, and an n-type drain region 23 is provided inside the extended drain region 22. Sequentially, a gate oxide film 29, gate electrodes 26, an interlayer insulating film 31, and a drain polysilicon layer 32 are provided inside the trench 30 from the outside. P-type channel regions 33 are provided on both sides of the trench 30, and n-type source regions 25 are provided on the respective p-type channel regions 33. P-type plug regions 34 are provided outside the respective source regions 25. Each source electrode 28 is in contact with both of the associated source region 25 and plug region 34. A drain electrode 27 is electrically connected to the drain region 23 via the drain polysilicon layer 32.

A description of a manufacturing process of the TLPM shown in FIG. 266 follows. FIGS. 267–274 are vertical sectional views showing intermediate states of manufacture of the TLPM of FIG. 266. First, a mask oxide film 41 is formed on the surface of a semiconductor substrate 21, and a trench 30 is formed through an opening of the mask oxide film 41 by RIE (reactive ion etching) (see FIG. 267). After a buffer oxide film 42 is formed on the surface of the trench 30, the semiconductor substrate 21 is doped with $B_{11}$ (see FIG. 268), whereby a body region 24 is formed. The semiconductor substrate 21 is then doped with $P_{31}$ (see FIG. 269) to form an extended drain region 22. After removing the buffer oxide film 42, a gate oxide film 29 is formed inside the trench 30 (see FIG. 270).

Subsequently, a polysilicon layer 43 is deposited inside the trench 30 and on the substrate surface (see FIG. 271) and then is etched back to leave only portions (as gate electrodes 26) on both side surfaces of the trench 30 (see FIG. 272). Then, an interlayer insulating film 31 is laid using a film forming method, for example, LPCVD or P-TEOS CVD. The interlayer insulating film 31 is thinner at the bottom of the trench 30 than on the substrate surface (see FIG. 273). The interlayer insulating film 31 is etched back to form a contact hole that penetrates through the interlayer insulating film 31 and the gate oxide film 29 at the bottom of the trench 30.

A drain region 23 is formed under the trench 30 through the contact hole that has been formed at the bottom of the trench 30. Then, the central portion of the trench 30 is filled with a drain polysilicon layer 32 (see FIG. 274). Then, contact holes are formed through portions of the interlayer insulating film 31 which cover the substrate surface, and channel regions 33, source regions 25, and plug regions 34 are formed. Finally, source electrodes 28 and a drain electrode 27 are formed by patterning a metal film. A TLPM having the configuration of FIG. 266 is thus completed.

In the above-type (called a “first type”) of TLPM, the drain region 23 is provided under the trench 30. Another type (called a “second type”) of TLPM is known in which a source region is provided under a trench 30. As shown in FIG. 275, in the second type of TLPM, an n-type source region 25 is provided under a trench 30 that is formed in a p-type semiconductor substrate 21. A p-type base region 45 is provided adjacent to the bottom surface and a bottom portion of the side surface of the trench 30 to surround the source region 25.

N-type extended drain regions 22 are provided on both sides of the trench 30. N-type drain regions 23 are positioned in surface layers of the extended drain regions 22, respectively. A gate oxide film 29, gate electrodes 26, an interlayer insulating film 31, and a source polysilicon layer 46 are positioned sequentially inside the trench 30 from the outside. The source electrode 28 is electrically connected with the source region 25 via the source polysilicon layer 46. Drain electrodes 27 are in contact with the respective drain regions 23.

As described above, in the first type of TLPM, the gate electrodes 26 are provided outside the drain polysilicon layer 32 with the interlayer insulating film 31 interposed between, and the extended drain region 22 is provided outside the gate electrodes 26 with the gate oxide film 29 interposed between. Therefore, in the first type of TLPM, gate-drain feedback capacitance, which is a factor of impairing the switching characteristic, exists not only between the extended drain region 22 and the gate electrodes 26, but also between the drain polysilicon layer 32 and the gate electrodes 26. On the other hand, in the second type of TLPM, gate-drain feedback capacitance exists only between the extended drain regions 22 and the gate electrodes 26. Therefore, the second type of TLPM is advantageous over the first type of TLPM since the switching characteristic is improved greatly.

However, the process that was described above for the first type of TLPM is a process for manufacturing a TLPM itself and is not compatible with manufacturing processes of planar devices such as the general CMOS and the BiCMOS. A manufacturing method of the second type TLPM, which was not described above, is approximately the same as the manufacturing method of the first type TLPM and is not compatible with manufacturing processes of planar devices, for example, the general CMOS and the BiCMOS. Therefore, conventionally, to construct a one-chip power IC using TLPMs and planar devices, TLPMs and planar devices are manufactured by separate processes and are connected to a common printed circuit board by wire bonding to attain electrical connections between the TLPMs and the planar devices.

This causes not only a cost increase, but also disadvantages such as reduction in integration density and an increase in on-resistance by the bonding wire, offsetting the advantages of the TLPM that enable a high integration density and a low on-resistance per unit area.

SUMMARY OF THE INVENTION

The present invention has been made in view of the above problems in the art, and an aspect of the invention is therefore to provide a semiconductor device capable of reducing the size, on-resistance, and cost of an IC chip having TLPMs and planar devices on a same semiconductor substrate.

Another aspect of the invention is to provide a manufacturing method of a semiconductor device capable of manufacturing, at a low cost, an IC chip that has TLPMs and planar devices on a same semiconductor substrate and is small in size and low in onresistance.

To attain various of the above aspects, according to the invention, the gate electrodes of a TLPM and the gate electrodes of planar devices are formed by patterning the same polysilicon layer, and the drain electrode(s) and the source electrode(s) of the TLPM and the drain electrodes and the source electrodes of the planar devices are formed by patterning the same metal layer. Therefore, the TLPM and the planar devices are connected electrically to each other by resulting metal wiring layers constituting the drain electrodes and by the source electrodes and resulting polysilicon layers constituting the gate electrodes.

BRIEF DESCRIPTION OF THE DRAWINGS

These and other aspects and advantages of the invention will become apparent and more readily appreciated from the following description of the embodiments, taken in conjunction with the accompanying drawings of which.

DETAILED DESCRIPTION OF THE EMBODIMENTS

Embodiments of the present invention will be hereinafter described in detail with reference to the accompanying drawings.

Figure 1:
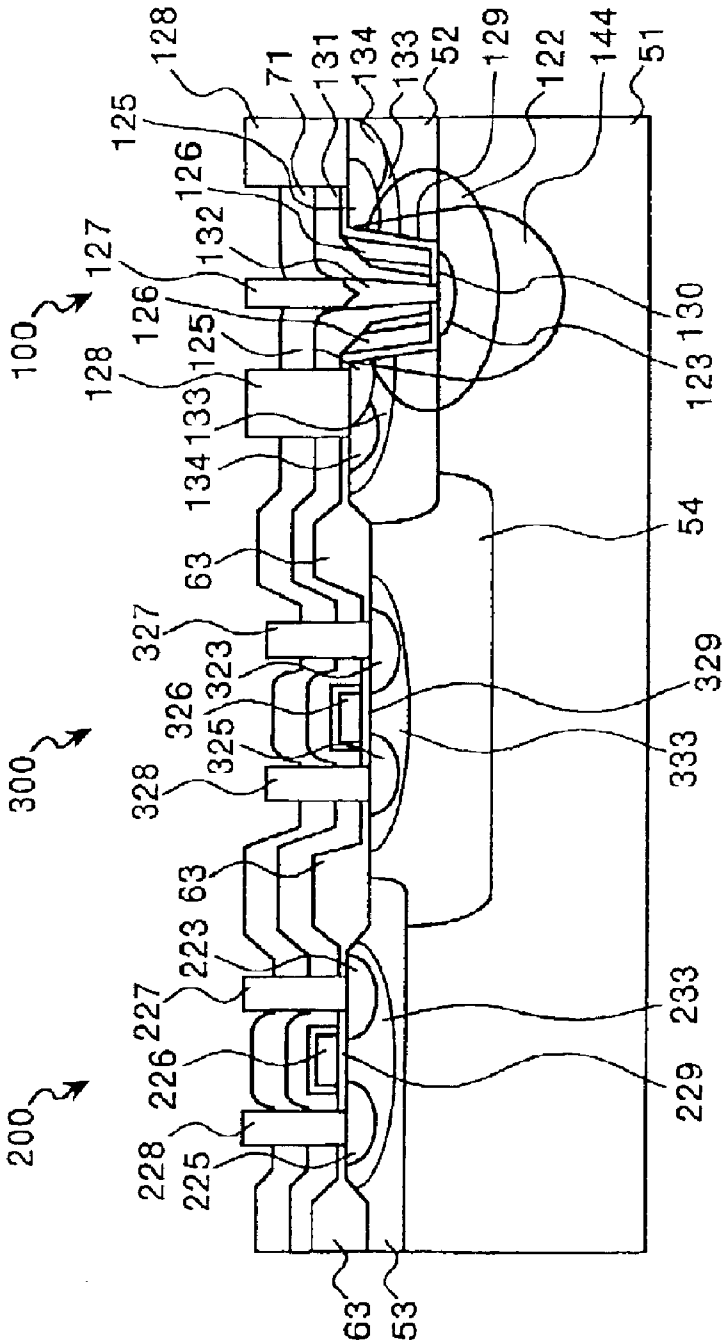
FIG. 1 is a vertical sectional view showing the configuration of a semiconductor device according to a first embodiment of the invention.

FIG. 1 is a vertical sectional view showing the configuration of a semiconductor device according to a first embodiment of the invention. As shown in FIG. 1, p-well regions 52 and 53 and an n-well region 54 are formed in a surface layer of a p-type semiconductor substrate 51. A TLPM 100 of such a type that drain contact is made at the bottom of a trench is formed in the one p-well region 52. An n-channel MOSFET (hereinafter abbreviated as "NMOS") 200 is formed in the other p-well region 53. A p-channel MOSFET (hereinafter abbreviated as "PMOS") 300 is formed in the n-well region 54.

In the following description, for the sake of convenience, the p-well regions 52 and 53 will be discriminated from each other by referring to the p-well region 52 where the TLPM 100 is formed as "first p-well region 52" and the p-well region 53 where the NMOS 200 is formed as "second p-well region 53." The TLPM 100, the NMOS 200, and the PMOS 300 are isolated from each other by selective oxidation (LOCOS) films 63. Also, for the sake of convenience, the terminology "on a semiconductor substrate" and "on the semiconductor substrate" are used throughout to describe the generally encountered state of "in/on a/the semiconductor substrate," that is, the terminology "on a semiconductor substrate" and "on the semiconductor substrate" are inclusive of being "in" and "on" the semiconductor substrate.

First, the TLPM 100 will be described. A trench 130 is formed in the first p-well region 52 approximately at the same depth as the depth of the first p-well region 52. The side surface and the bottom surface of the trench 130 are surrounded by a p-type field region 144. An n-type extended drain region 122 that is shallower than the field region 144 is provided adjacent to the side surface and the bottom surface of the trench 130. An n-type drain region 123 is provided inside the extended drain region 122. A gate oxide film 129, gate electrodes 126, an oxide film (part of shadow oxide films 68 (described later)), an interlayer insulating film 131, and a drain polysilicon layer 132 are formed inside the trench 130 sequentially from the outside.

P-type channel regions 133 are provided on both sides of the trench 130 in a substrate surface layer, and n-type source regions 125 are provided in surface layers of the p-type channel regions 133, respectively. P-type plug regions 134 are provided outside the respective source regions 125. Each source electrode 128 penetrates through the interlayer insulating film 131 and a passivation film 71 and is in contact with both of the associated source region 125 and plug region 134. The structure that the source region 125, the plug region 134, and the source electrode 128 are in electrical contact with each other provides good grounding of the substrate 51 and hence prevents reduction in breakdown voltage even at the occurrence of a large current. A drain electrode 127 penetrates through the passivation film 71 and is in electrical contact with the drain region 123 via the drain polysilicon layer 132.

Next, the NMOS 200 will be described. A p-type channel region 233 is formed in a surface layer of the second p-well region 53, and an n-type drain region 223 and an n-type source region 225 are formed in the p-type channel region 233. A gate oxide film 229 is formed on the substrate surface between the drain region 223 and the source region 225, and a gate electrode 226 is formed on the gate oxide film 229. A drain electrode 227 and a source electrode 228 penetrate through the interlayer insulating film 131 and the passivation film 71 and are in contact with the drain region 223 and the source region 225, respectively.

Next, the PMOS 300 will be described. An n-type channel region 333 is formed in a surface layer of the n-well region 54, and a p-type drain region 323 and a p-type source region 325 are formed in the p-type channel region 333. A gate oxide film 329 is formed on the substrate surface between the drain region 323 and the source region 325, and a gate electrode 326 is formed on the gate oxide film 329. A drain electrode 327 and a source electrode 328 penetrate through the interlayer insulating film 131 and the passivation film 71 and are in contact with the drain region 323 and the source region 325, respectively.

A manufacturing process of the semiconductor device shown in FIG. 1 is described below. FIGS. 2–27 are vertical sectional views showing intermediate states of manufacture of the embodiment of the semiconductor device shown in FIG. 1. First, an n-well region 54 is formed selectively in a surface layer of a semiconductor substrate 51, and a first p-well region 52 and a second p-well region 53 are formed by using, as a mask, a selective oxidation film 55 that is formed on the substrate surface (see FIG. 2). Then, the selective oxidation film 55 is removed completely (see FIG. 3).

Figure 5:
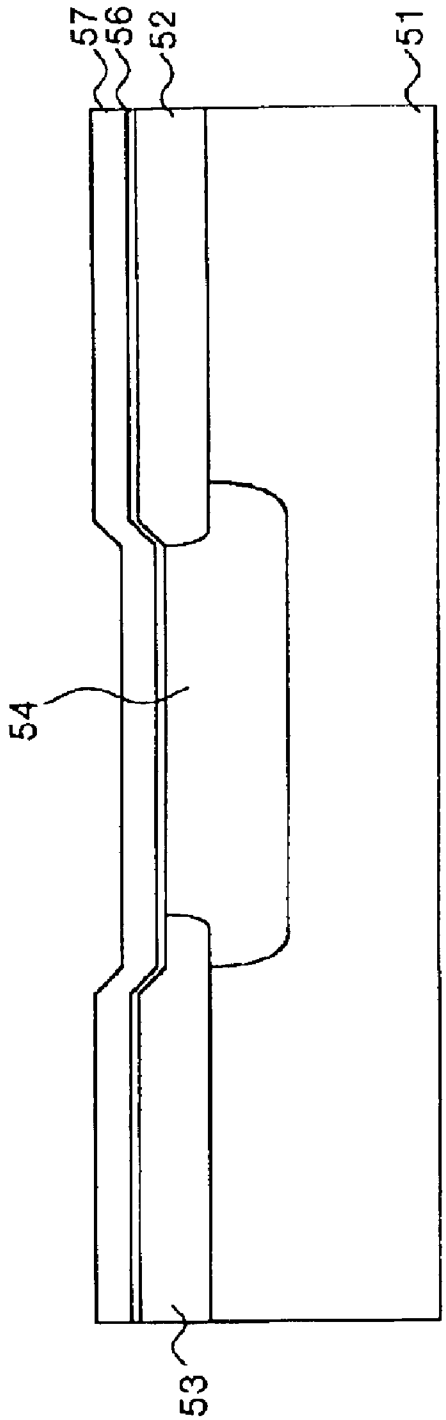
Figure 6:
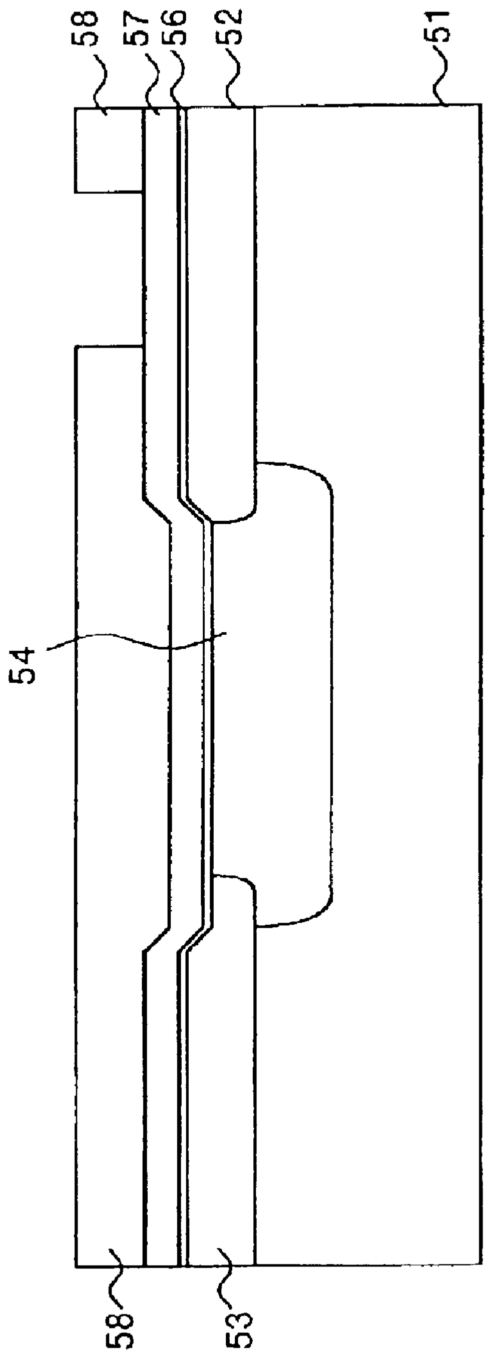
Figure 7:
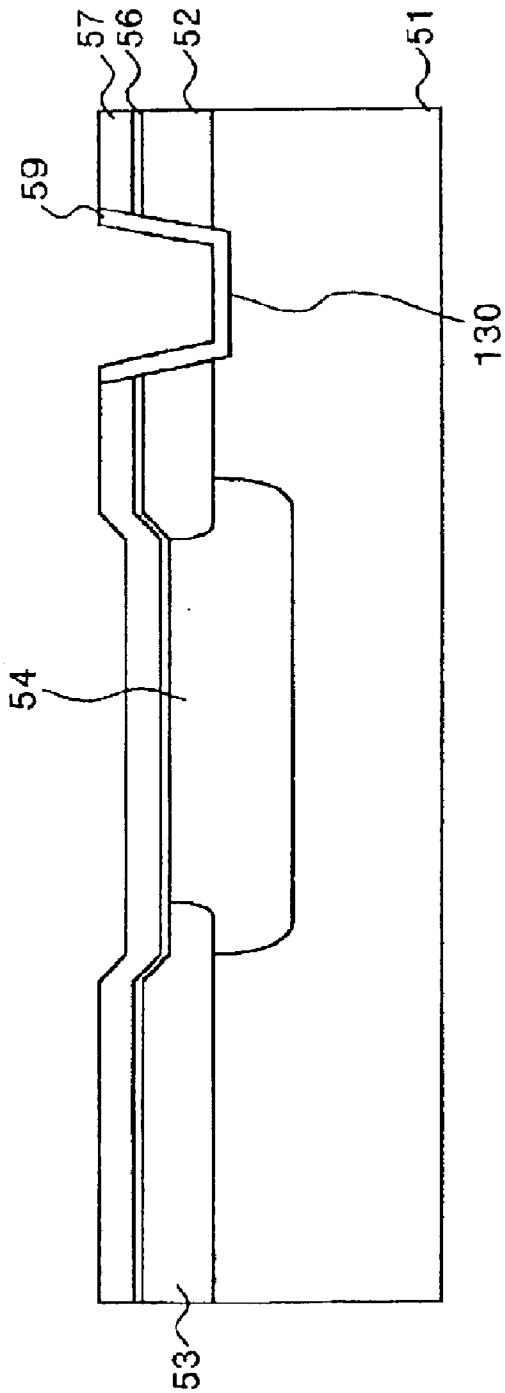
Figure 8:
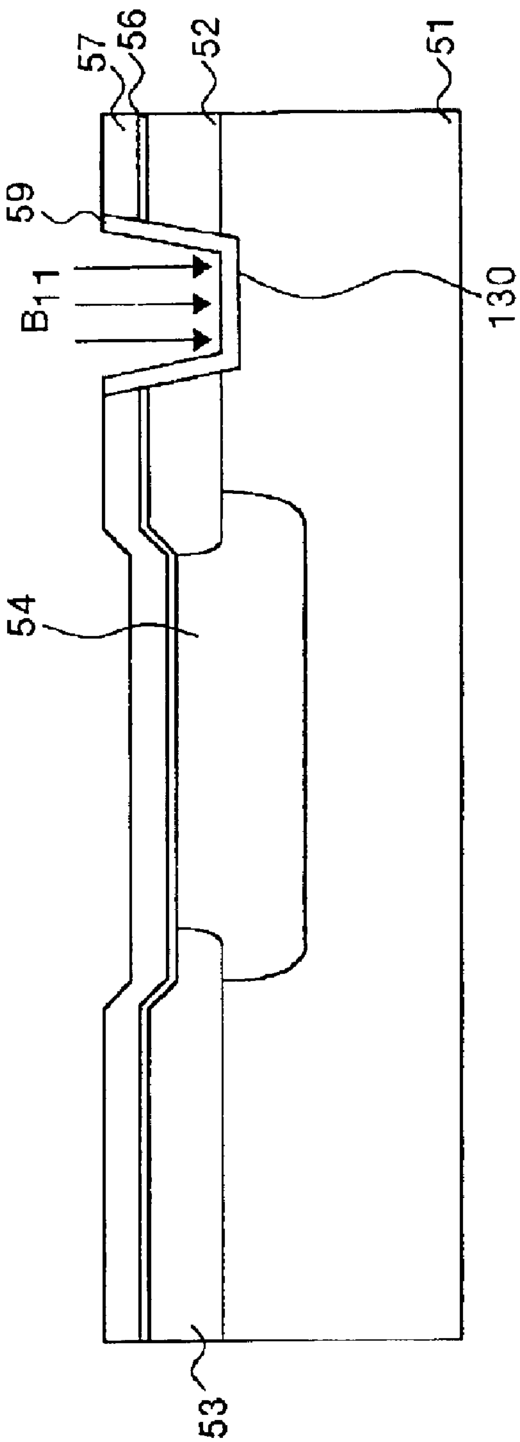
Figure 9:
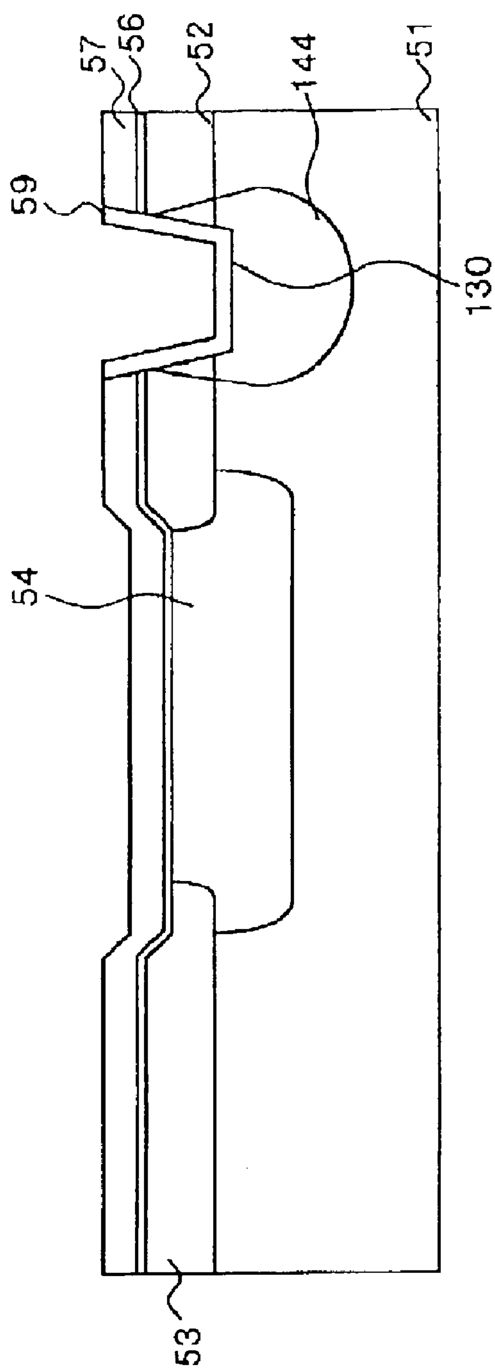
Figure 10:
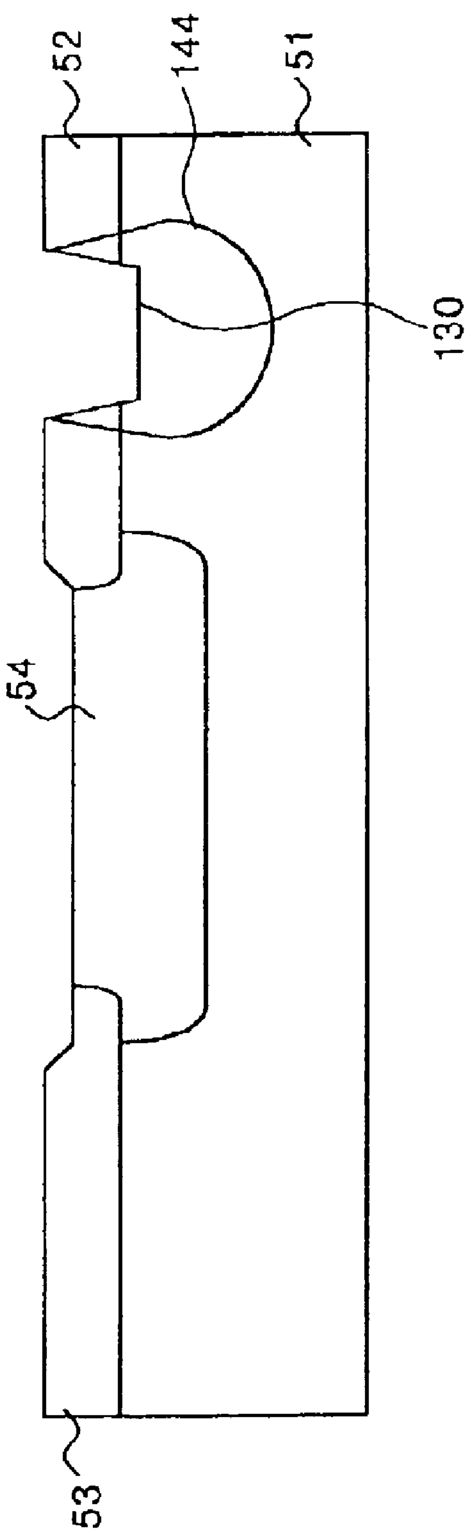
Figure 11:
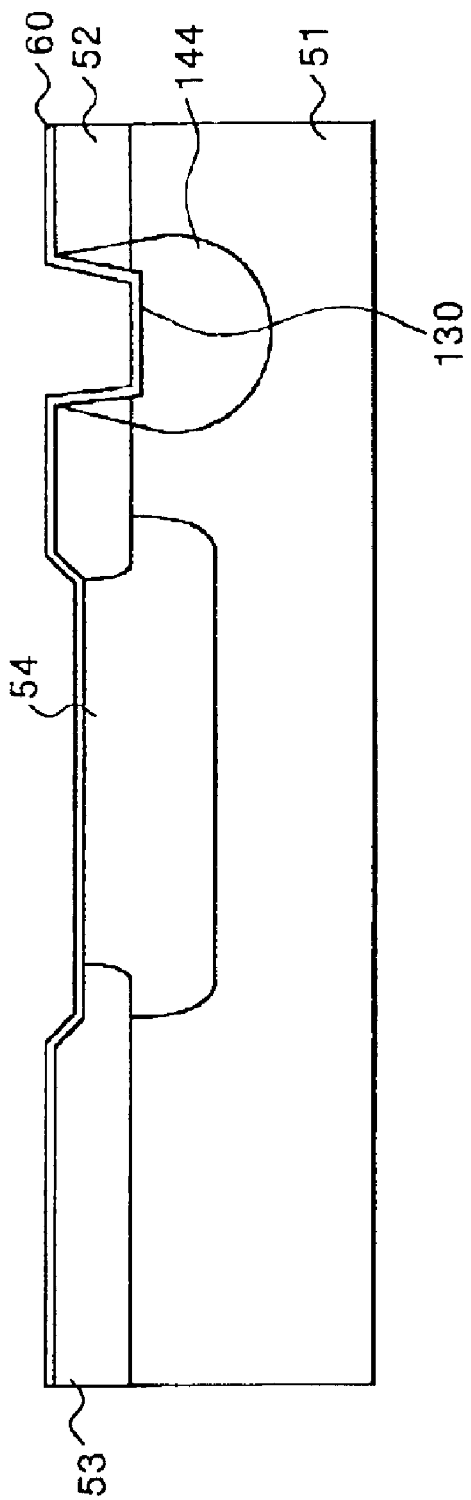
Figure 12:
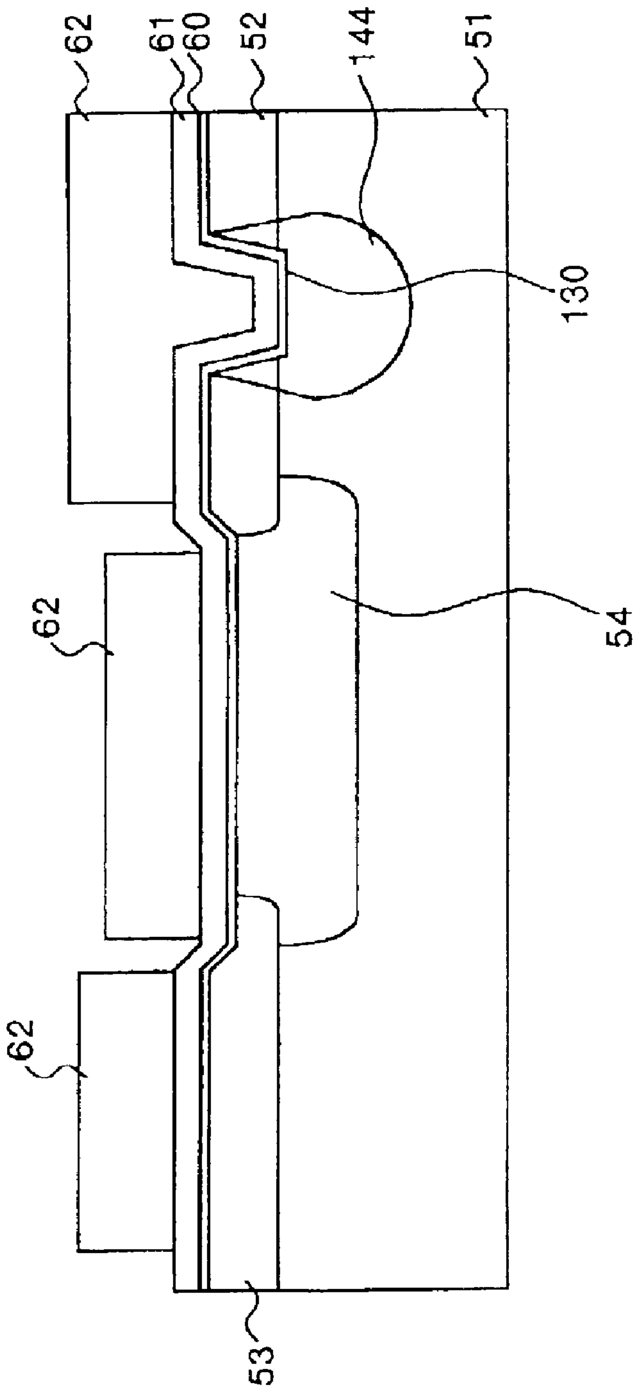
Figure 13:
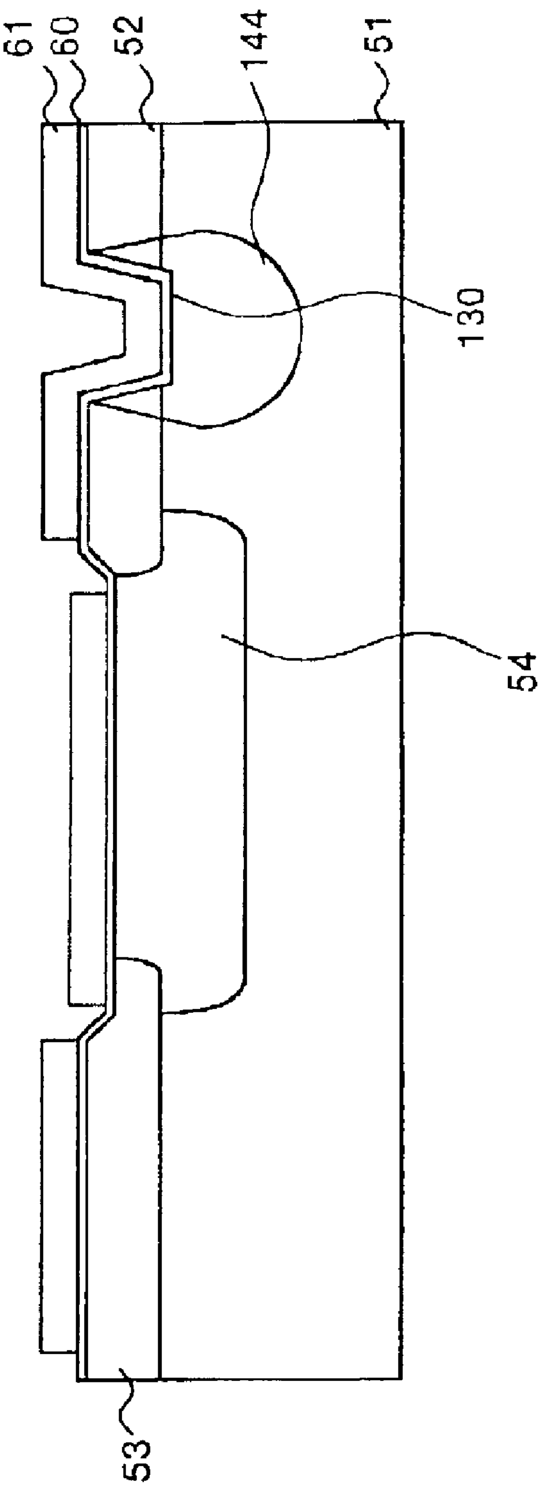
Figure 14:
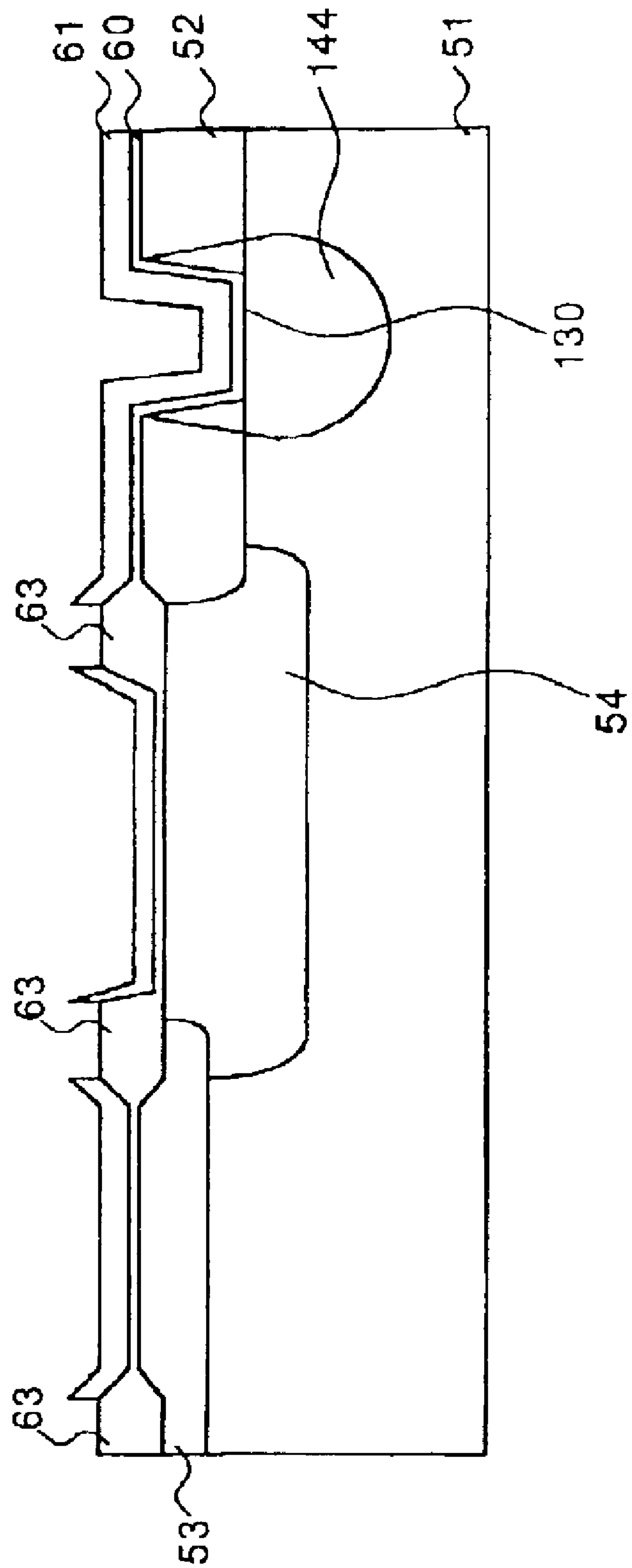
Figure 15:
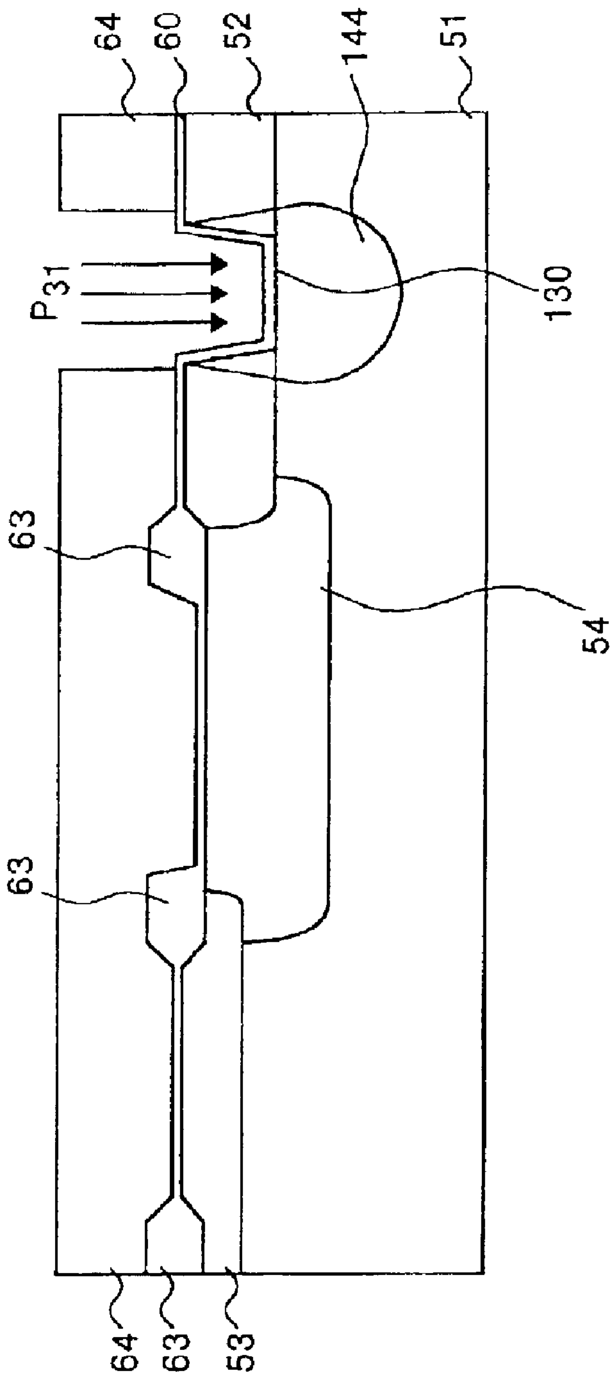

Subsequently, a buffer oxide film 56 is formed on the substrate surface (see FIG. 4), and a mask oxide film 57 is formed thereon (see FIG. 5). Then, a mask 58 having an opening in a trench forming area is formed on the mask oxide film 57 (see FIG. 6). The mask oxide film 57 is patterned by using the mask 58. After the mask 58 is removed, a trench 130 is formed in the first p-well region 52 by performing trench etching (RIE). A buffer oxide film 59 is formed on the surface of the trench 130 (see FIG. 7), and a field region 144 is formed (see FIG. 9) by doping the substrate 51 with $B_{11}$, under the bottom surface of the trench 130 (see FIG. 8). Then, the mask oxide film 57 and the buffer oxide films 56 and 59 are removed completely (see FIG. 10).

Subsequently, a buffer oxide film 60 is formed on the substrate surface and the surface of the trench 130 (see FIG. 11), and a silicon nitride film 61 is formed thereon. A mask 62 having openings in device isolation areas is formed on the silicon nitride film 61 (see FIG. 12). The silicon nitride film 61 is patterned by using the mask 62, and the mask 62 is removed thereafter (see FIG. 13). Thermal oxidation is performed by using, as a mask, the silicon nitride film 61 remaining on the substrate surface, whereby selective oxidation films 63 for device isolation are formed (see FIG. 14).

Subsequently, a mask 64 having an opening over the trench 130 is formed on the substrate surface and the substrate 51 is doped with $P_{31}$ (see FIG. 15), whereby an extended drain region 122 is formed (see FIG. 16). Then, a mask 65 having openings in areas corresponding to future channel regions of the intended TLPM and NMOS is formed on the substrate surface. The substrate 51 is doped with $B_{11}$ (FIG. 17), whereby channel regions 133 of the intended TLPM are formed in the first p-well region 52 and, simultaneously, a channel region 233 of the intended NMOS is formed in the second p-well region 53. The mask 65 is removed thereafter (see FIG. 18). The operations of FIGS. 15 and 16 and the operations of FIGS. 17 and 18 may be reversed.

Subsequently, after a mask 66 having an opening in an area corresponding to a future channel region of the intended PMOS is formed on the substrate surface, the substrate 51 is doped with $P_{31}$ (see FIG. 19), whereby a channel region 333 of the intended PMOS is formed in the n-well region 54. The buffer oxide film 60 is removed thereafter. A common thin oxide film to become gate oxide films 129, 229, and 329 of the intended TLPM, NMOS, and PMOS, respectively, is formed on the substrate surface and inside the trench 130, and a polysilicon layer 143 is laid thereon (see FIG. 20).

Figure 21:
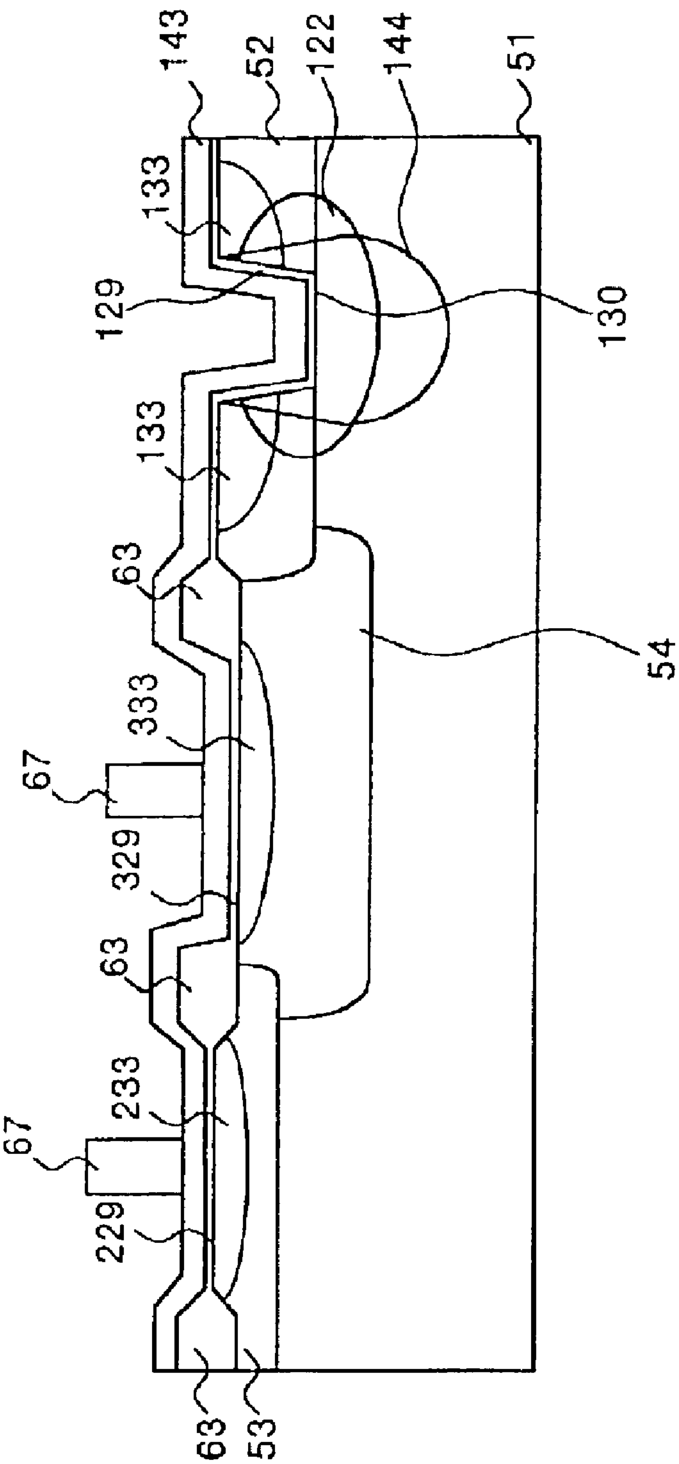
Figure 22:
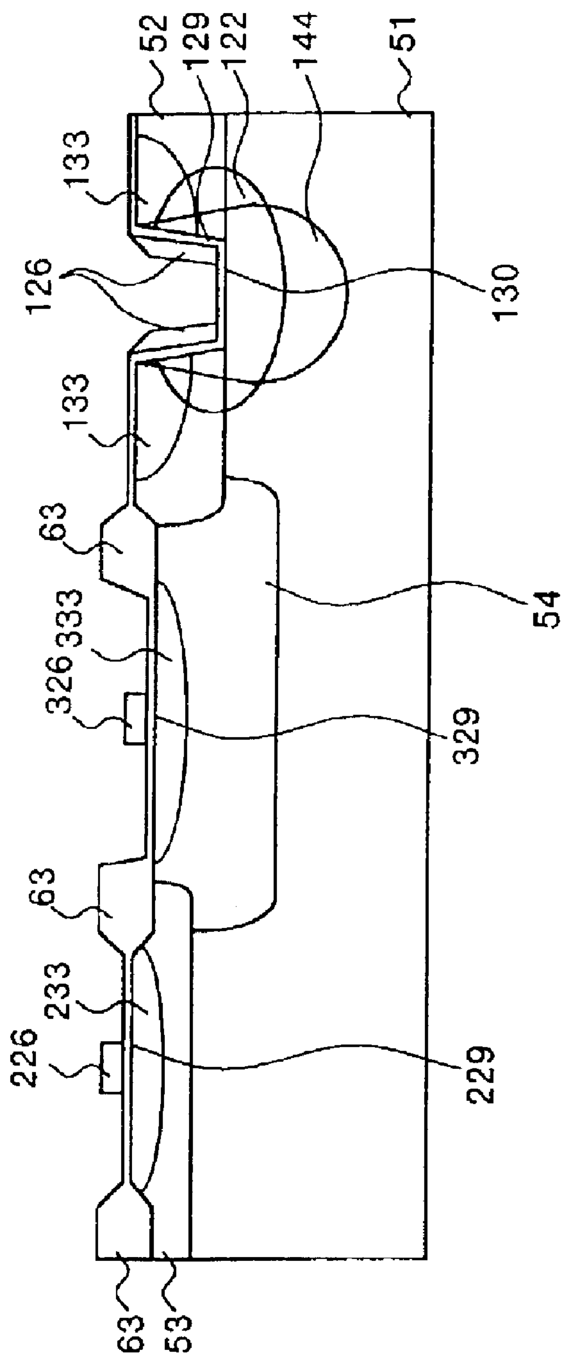
Figure 23:
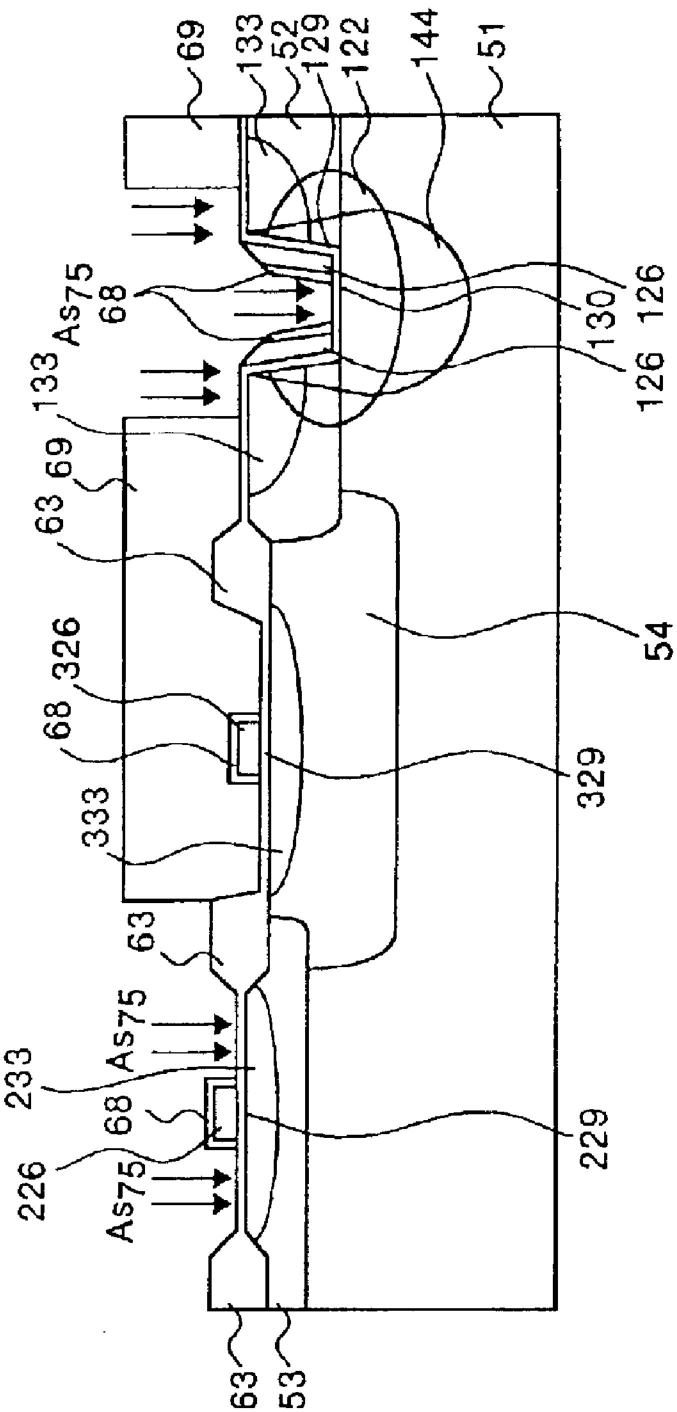
Figure 24:
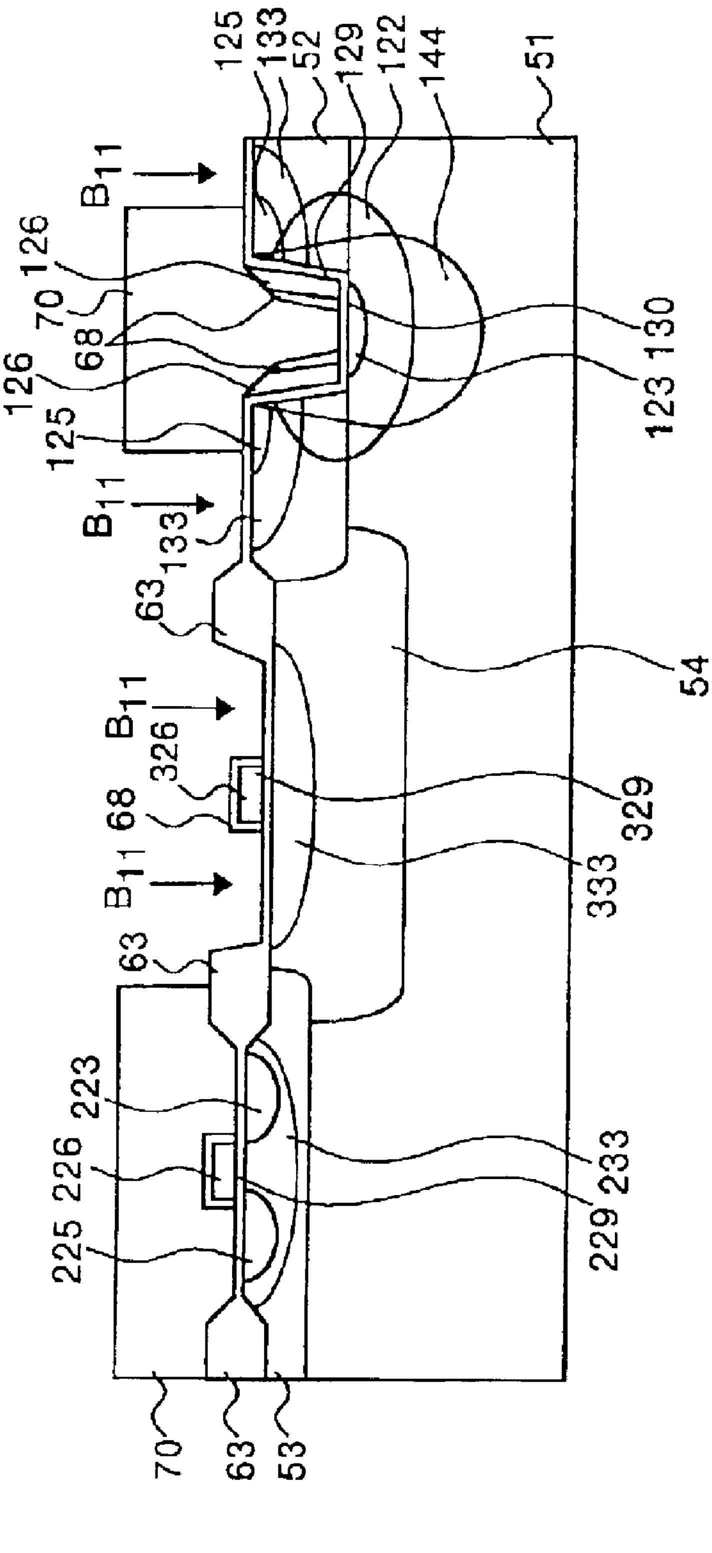
Figure 25:
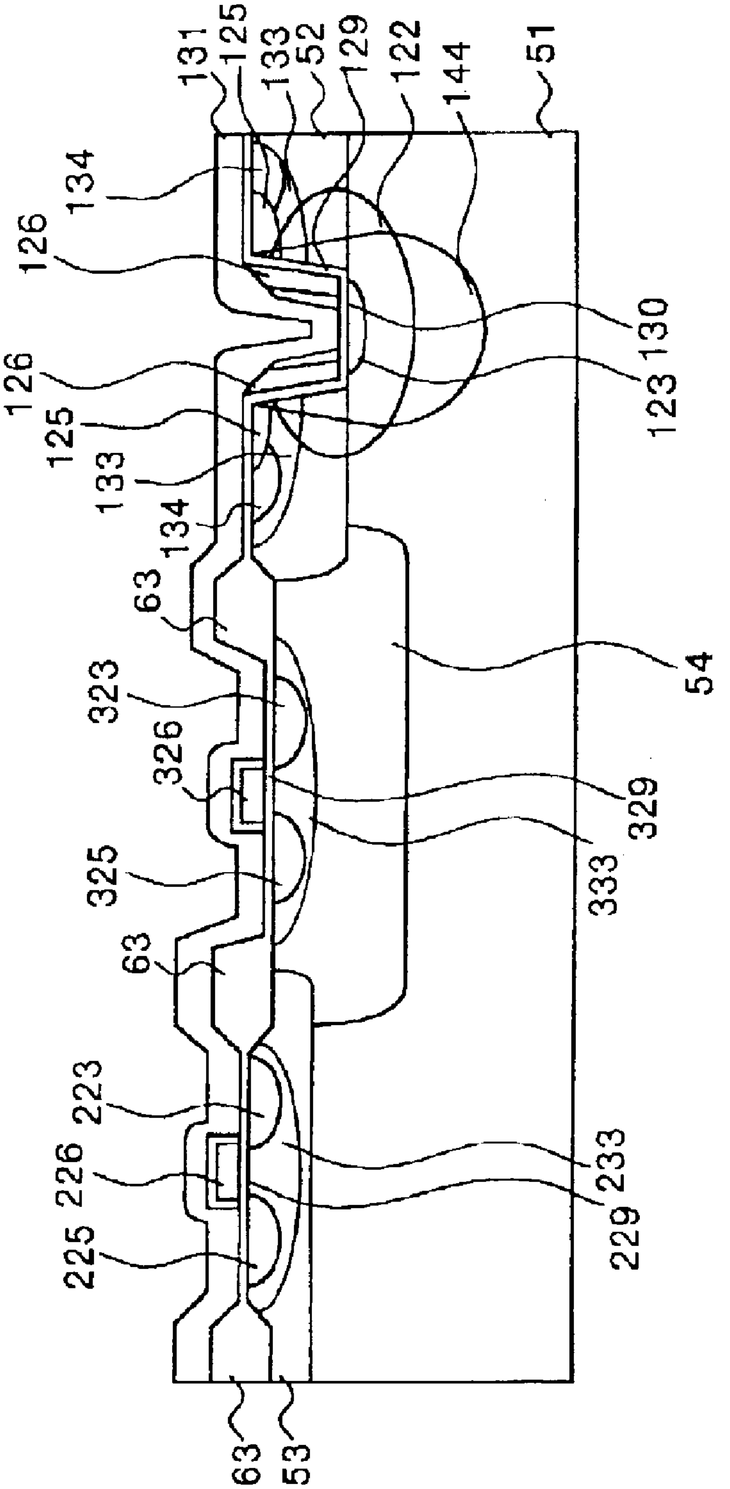
Figure 26:
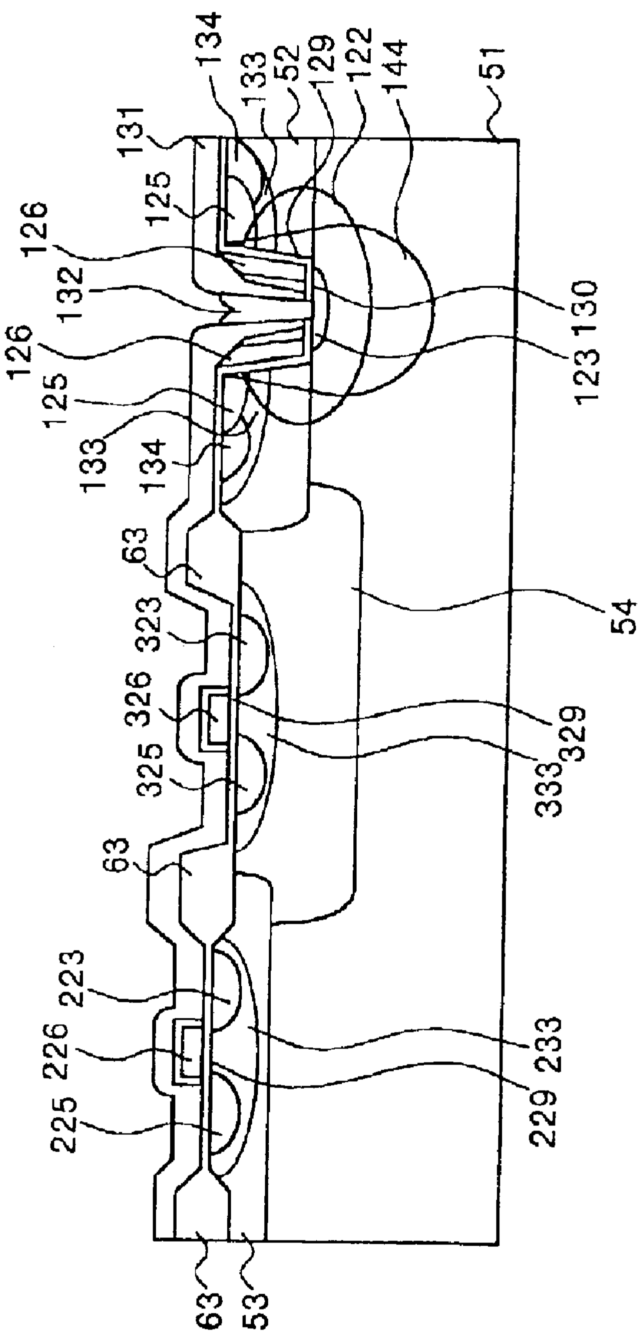
Figure 27:
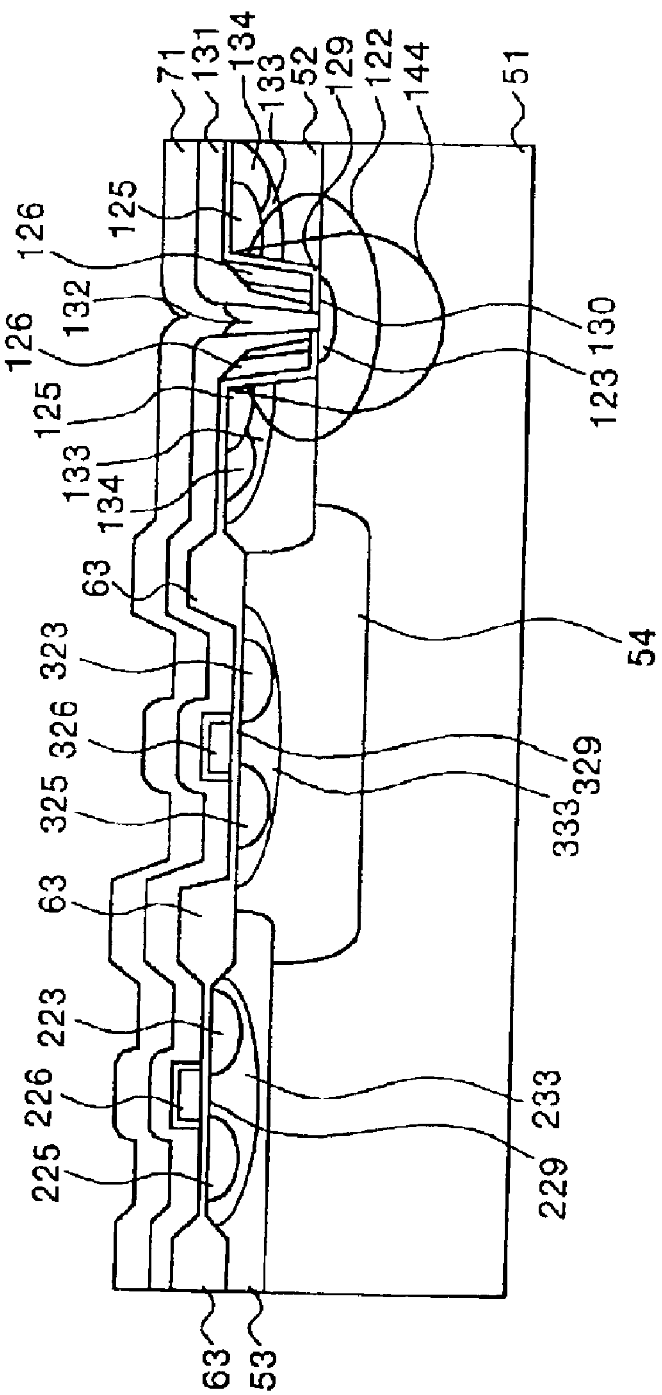

A mask 67 is formed on the polysilicon layer 143 only in areas corresponding to future gate electrodes of the intended NMOS and PMOS (see FIG. 21). The polysilicon layer 143 is etched by using the mask 67, whereby gate electrodes 126 of the intended TLPM are formed inside the trench 130 by self-alignment and, simultaneously, gate electrodes 226 and 326 of the intended NMOS and PMOS, respectively, are formed. The mask 67 is removed thereafter (see FIG. 22).

Then, shadow oxide films 68 are formed to cover the gate electrodes 126 of the intended TLPM and the gate electrodes 226 and 326 of the intended NMOS and PMOS. Then, a mask 69 having openings in areas corresponding to a future drain region and source regions of the intended TLPM and an area in which the intended NMOS is formed on the substrate surface. The substrate 51 is doped with $As_{75}$ (see FIG. 23), whereby a drain region 123 of the intended TLPM is formed under the bottom surface of the trench 130, source regions 125 of the intended TLPM are formed on both sides of the trench 130, and a source region 225 and a drain region 223 of the intended NMOS are formed in the channel region 233 simultaneously. The mask 69 is removed thereafter.

Subsequently, a mask 70 having openings in areas corresponding to future plug regions of the intended TLPM and an area in which the intended PMOS is formed on the substrate surface. The substrate 51 is doped with $B_{11}$ (see FIG. 24), whereby plug regions 134 are formed outside the respective source regions 125 of the intended TLPM and, simultaneously, a source region 325 and a drain region 323 of the intended PMOS are formed in the channel region 333. After the mask 70 is removed, an interlayer insulating film 131 is laid over the substrate surface (see FIG. 25). A portion of the interlayer insulating film 131 inside the trench 130 is etched away by self-alignment to form a contact hole, which is then filled with a drain polysilicon layer 132 (see FIG. 26). A passivation film 71 is formed over the substrate surface (see FIG. 27). The operations of FIG. 23 and FIG. 24 may be reversed.

Subsequently, the passivation film 71 is patterned to form contact holes. A metal film is formed on the passivation film 71 and then patterned, whereby a drain electrode 127 of the intended TLPM that is in contact with the drain polysilicon layer 132, source electrodes 128 of the intended TLPM each of which are in contact with both of the associated source region 125 and plug region 134, a drain electrode 227 and a source electrode 228 of the intended NMOS that are in contact with the drain region 223 and the source region 225, respectively, and a drain electrode 327 and a source electrode 328 of the intended PMOS that are in contact with the drain region 323 and the source region 325, respectively, are formed at the same time. In this manner, a semiconductor device is completed in which the TLPM 100, the NMOS 200, and the PMOS 300 are integrated on the same semiconductor substrate 51 as shown in FIG. 1.

Figure 28:
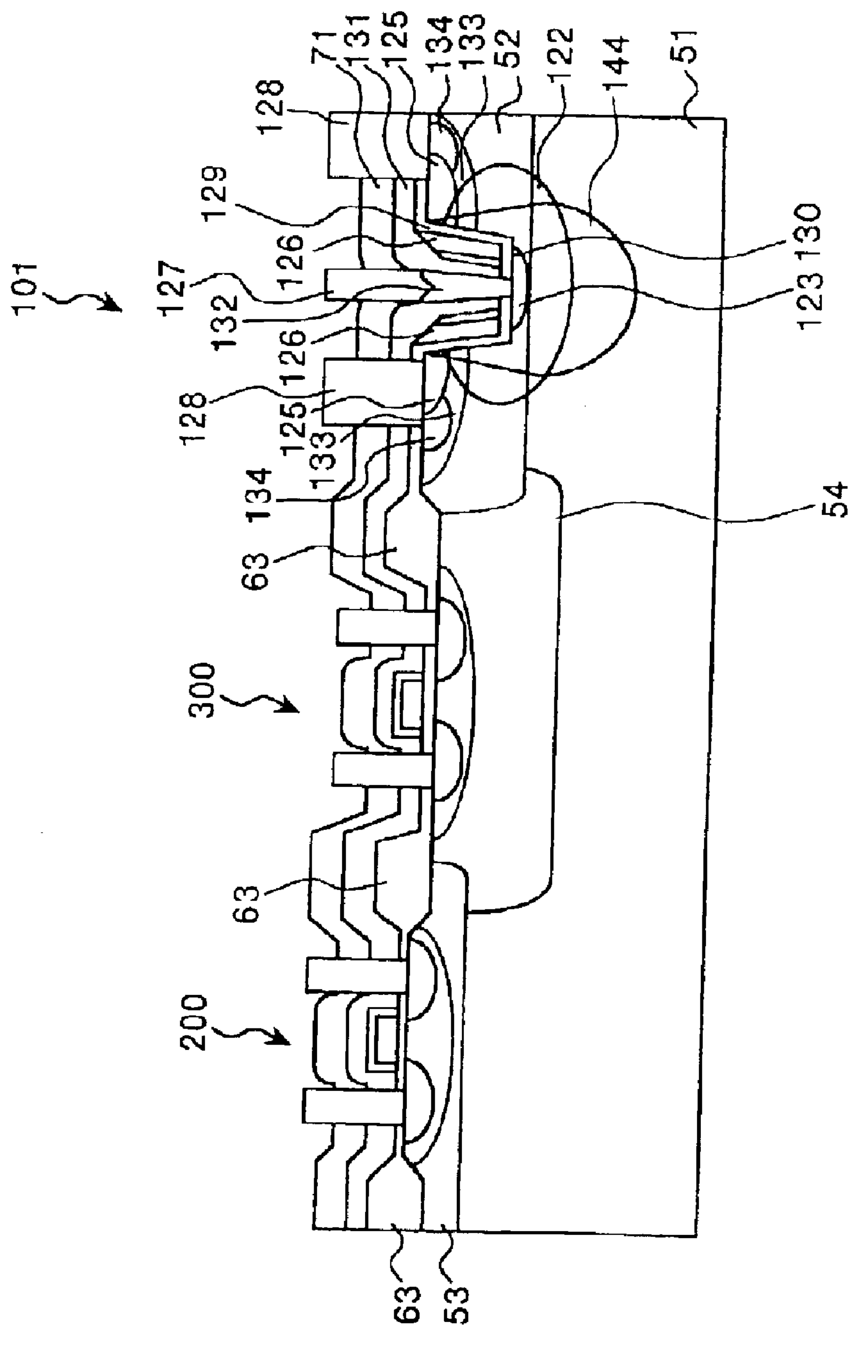
FIGS. 28–31 are vertical sectional views of respective modifications of the embodiment of the semiconductor device of FIG. 1.
Figure 29:
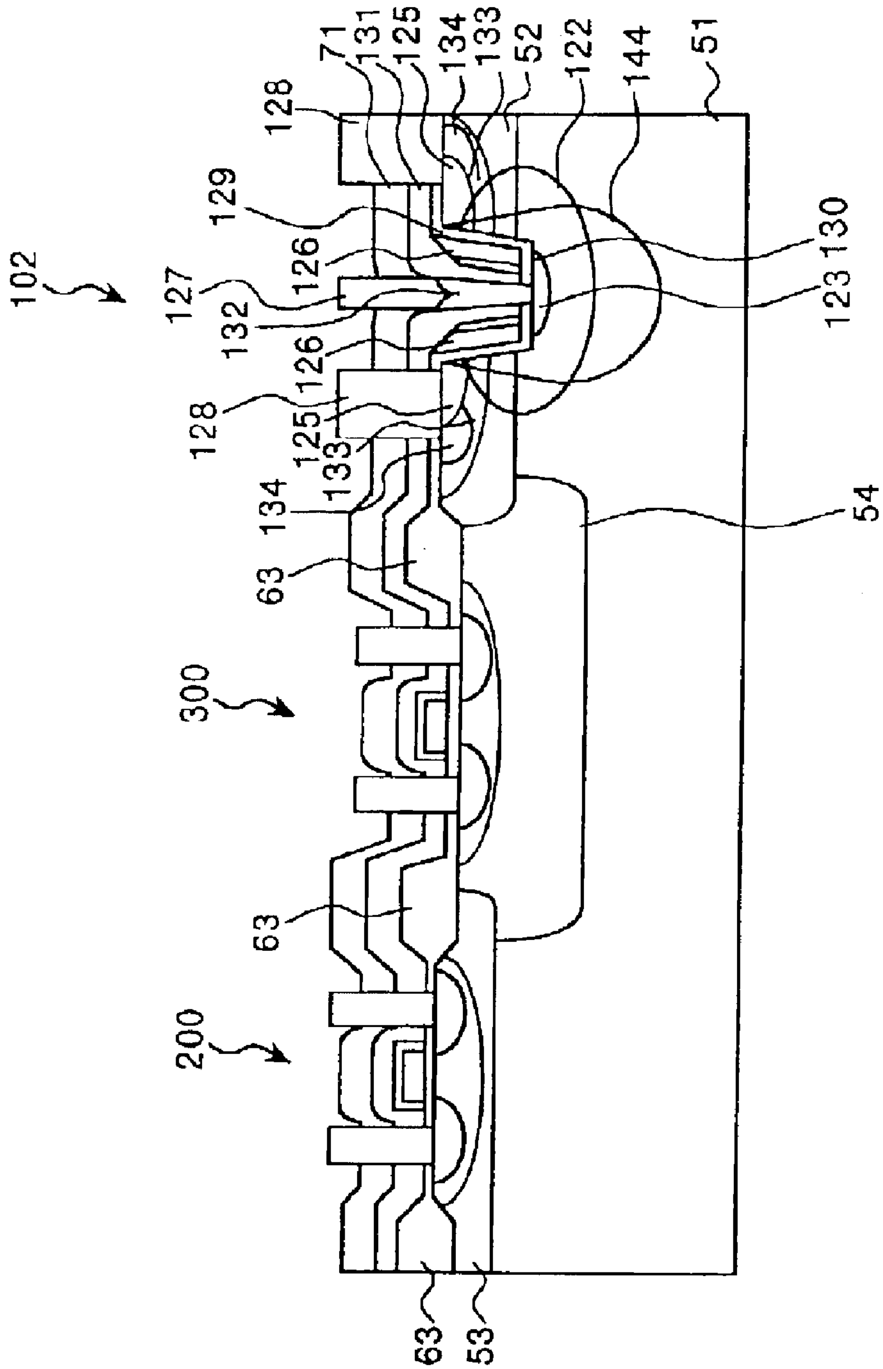

In the TLPM 100 shown in FIG. 1, the trench 130 has approximately the same depth as the first p-well region 52. FIG. 28 shows another TLPM 101 in which the first p-well region 52 is deeper than in the TLPM 100 of FIG. 1, and the drain region 123 is formed inside the first p-well region 52. Conversely, as shown in FIG. 29, another TLPM 102 may be constructed in which the first p-well region 52 is shallower than in the TLPM 100 of FIG. 1, and the trench 130 projects from the first p-well region 52.

Figure 30:
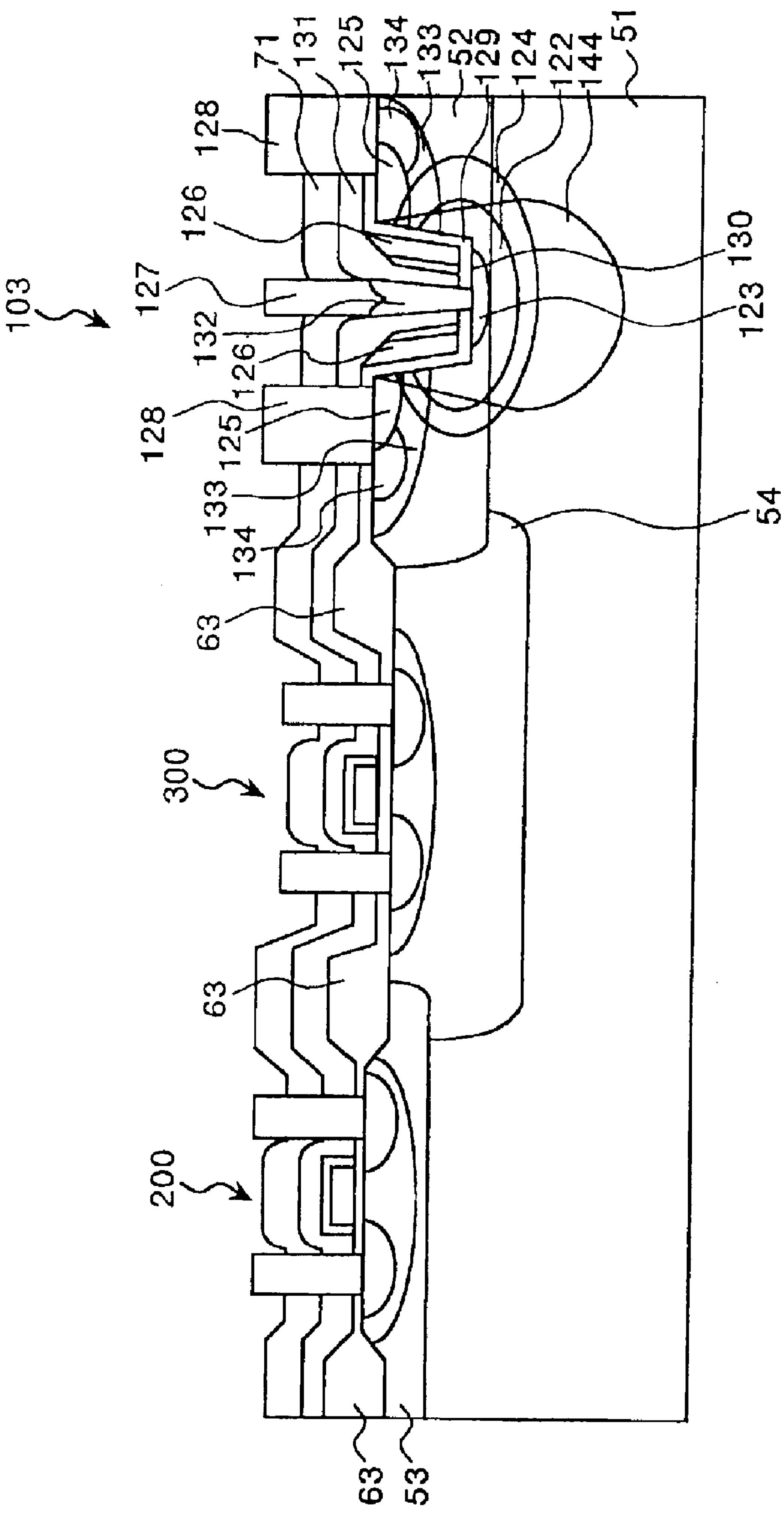

FIG. 30 shows another TLPM 103 in which a p-type body region 124 is formed to surround the extended drain region 122. This structure can be obtained by forming the extended drain region 122 after forming a body region 124, instead of forming the extended drain region 122 by doping the substrate 51 with $P_{31}$ under the bottom surface of the trench 130 in the operations of FIG. 15. The structure of FIG. 30 provides an advantage that the TLPM has a high breakdown voltage and a low on-resistance even if the dose of the n-type impurity is relatively high.

Similarly, in FIG. 28, even where the impurity concentration of the extended drain region 122 is increased to lower the on-resistance, the breakdown voltage can be kept high by making the first p-well region 52 deeper than the extended drain region 122.

Figure 31:
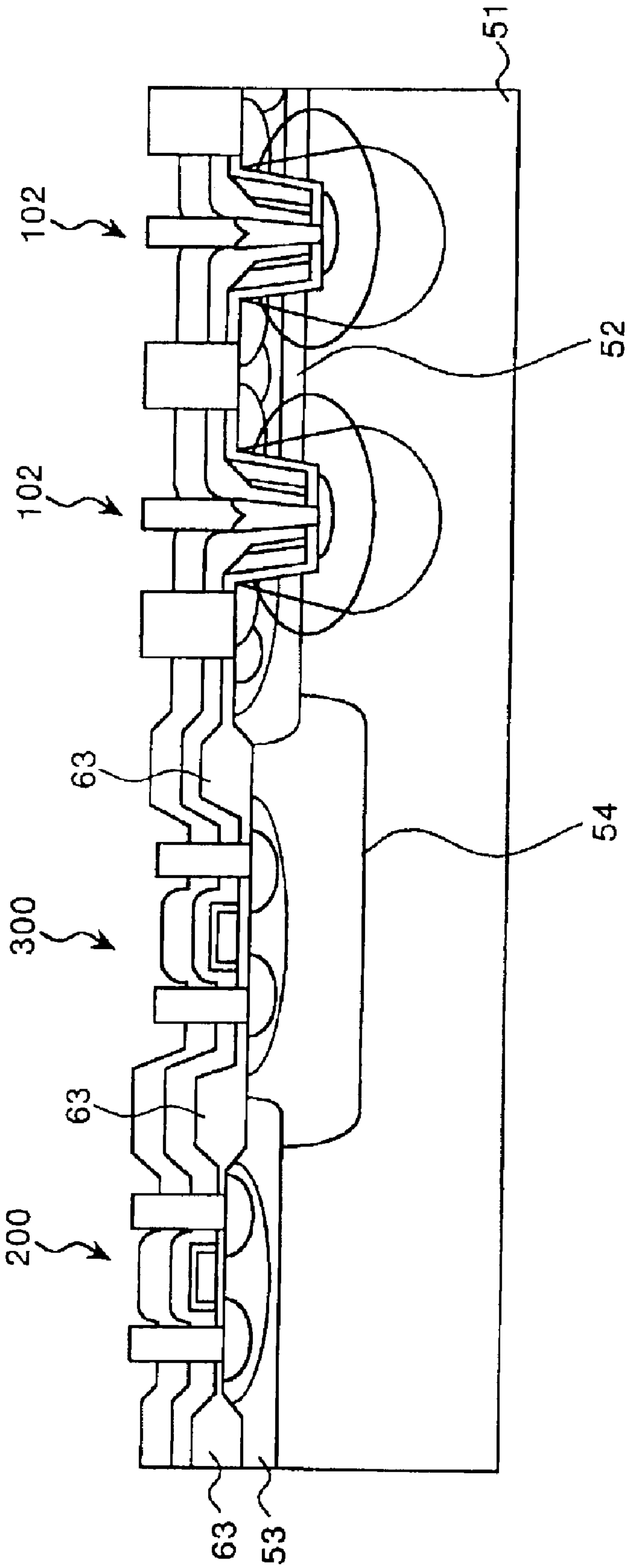

FIG. 31 shows still another configuration in which a plurality of (in FIG. 31, two) TLPMs 102 of the same conductivity type channel are provided in the same well region 52. This structure can be obtained by forming a plurality of trenches in the same well region 52 in the operations of FIGS. 6 and 7 and executing the processes that are executed on the trench 130 in the operations of FIG. 8 and the following operations on the plurality of trenches at the same time. This structure makes it possible to provide large-current devices in the TLPMs 102. TLPMs 100 or 101 may be provided instead of the TLPMs 102.

Figure 32:
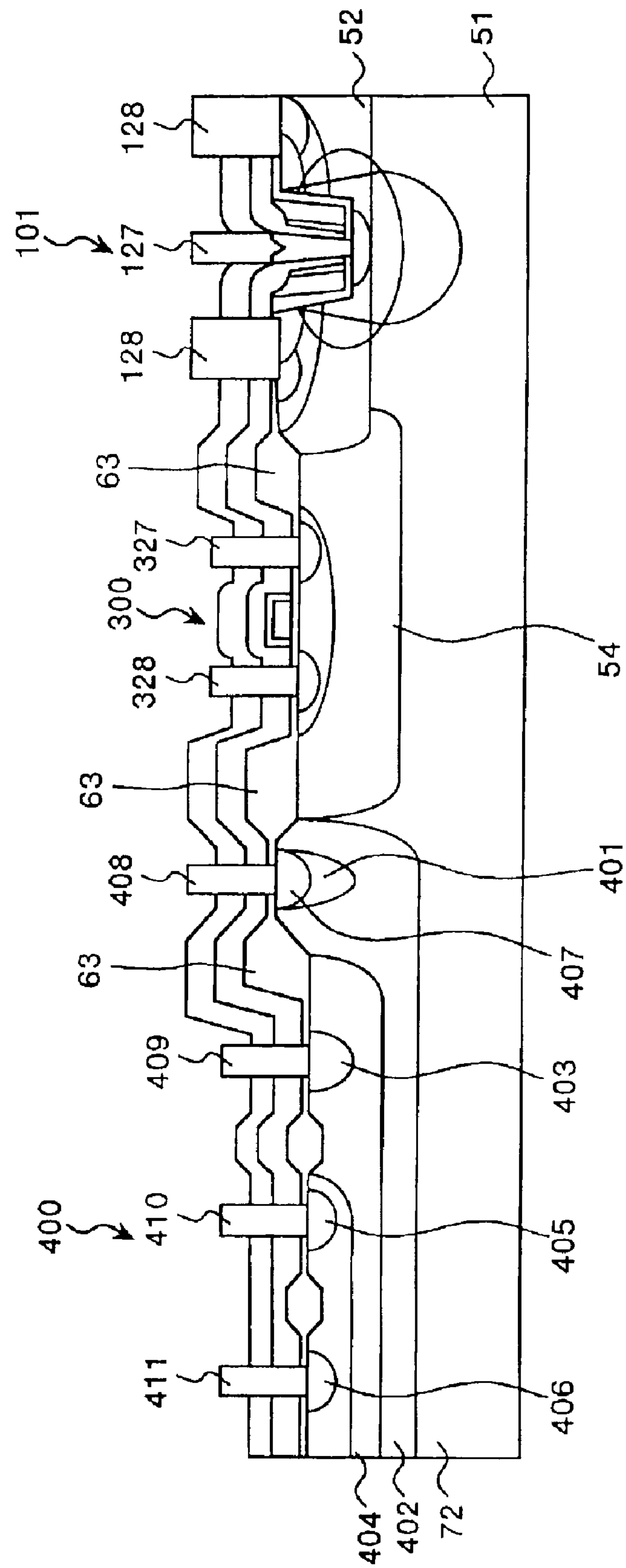
FIG. 32 is a vertical sectional view of an example in which a bipolar transistor and the semiconductor device according to the first embodiment are integrated.

FIG. 32 shows another configuration in which a bipolar transistors 400 and the TLPM 101 are integrated on the same semiconductor substrate 51. In the example of FIG. 32, the bipolar transistor 400 is formed in a third p-well region 72. A first p-type offset region 401 and an n-well region 402 are formed in the third p-well region 72. An n-type collector region 403 and a second p-type offset region 404 are formed in the n-type well region 402. A p-type base region 405 and an n-type emitter region 406 are formed in the second p-type offset region 404. A substrate pickup electrode 408 is electrically connected to the first p-type offset region 401 via a high-concentration p-type contact region 407.

A collector electrode 409, a base electrode 410, and an emitter electrode 411 are in contact with the collector region 403, the base region 405, and the emitter region 406, respectively. The substrate pickup electrode 408, the collector electrode 409, the base electrode 410, and the emitter electrode 411 are formed at the same time as the drain electrodes 127, 327, and 227 and the source electrodes 128, 328, and 228 of the TLPM 101, the PMOS 300, and the NMOS 200 (not shown in FIG. 32). The TLPM 100, 102, or 103 may be provided instead of the TLPM 101.

Figure 33:
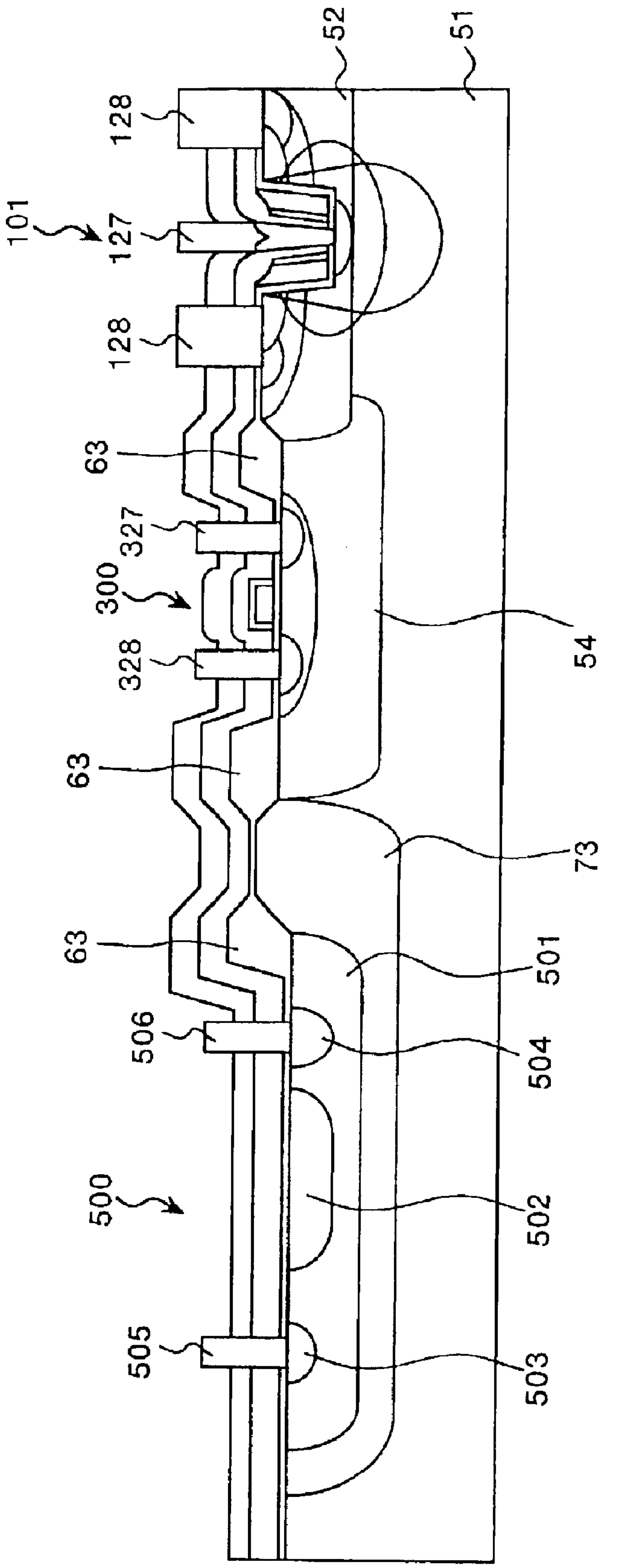
FIG. 33 is a vertical sectional view of an example in which a resistance element and the semiconductor device according to the first embodiment are integrated.

FIG. 33 shows yet another configuration in which a resistance element 500 and the TLPM 101 are integrated on the same semiconductor substrate 51. In the example of FIG. 33, a resistance element 500 is formed in a fourth p-well region 73. An n-well region 501 is formed in fourth p-well region 73. High-concentration n-type contact regions 503 and 504, which are separated from each other by a p-type offset region 502, are formed in the n-well region 501. Electrodes 505 and 506 are in contact with the respective n-type contact regions 503 and 504. The electrodes 505 and 506 are formed at the same time as the drain electrodes 127, 327, and 227 and the source electrodes 128, 328, and 228 of the TLPM 101, the PMOS 300, and the NMOS 200 (not shown in FIG. 33). The TLPM 100, 102, or 103 may be provided instead of the TLPM 101.

Figure 34:
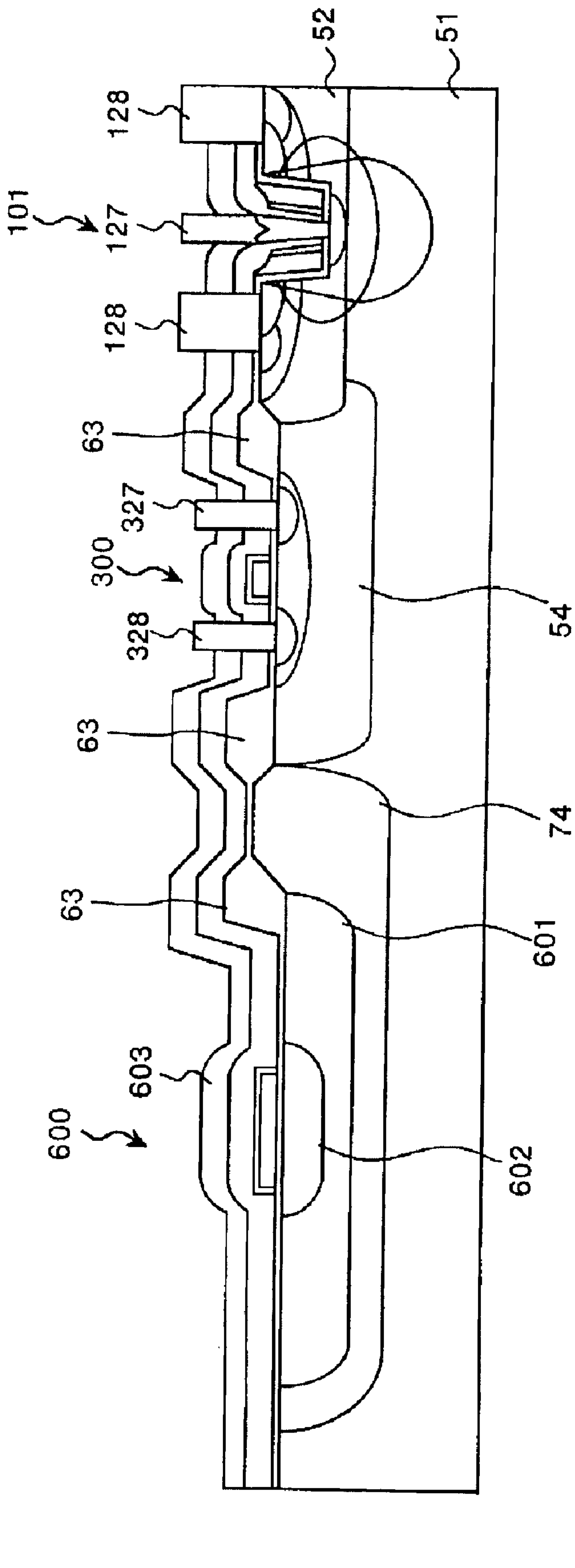
FIG. 34 is a vertical sectional view of an example in which a capacitance element and the semiconductor device according to the first embodiment are integrated.

FIG. 34 shows a further configuration in which a capacitance element 600 and the TLPM 101 are integrated on the same semiconductor substrate 51. In the example of FIG. 34, the capacitance element 600 is formed in a fifth p-well region 74. An n-well region 601 is formed in the fifth p-well region 74. A high-concentration n-type contact region 602 is formed in the n-well region 601. An electrode 603 is in contact with the n-type contact region 602. The electrode 603 is formed at the same time as the gate electrodes 126, 326, and 226 of the TLPM 101, the PMOS 300, and the NMOS 200 (not shown in FIG. 33). The TLPM 100, 102, or 103 may be provided instead of the TLPM 101.

Figure 35A:
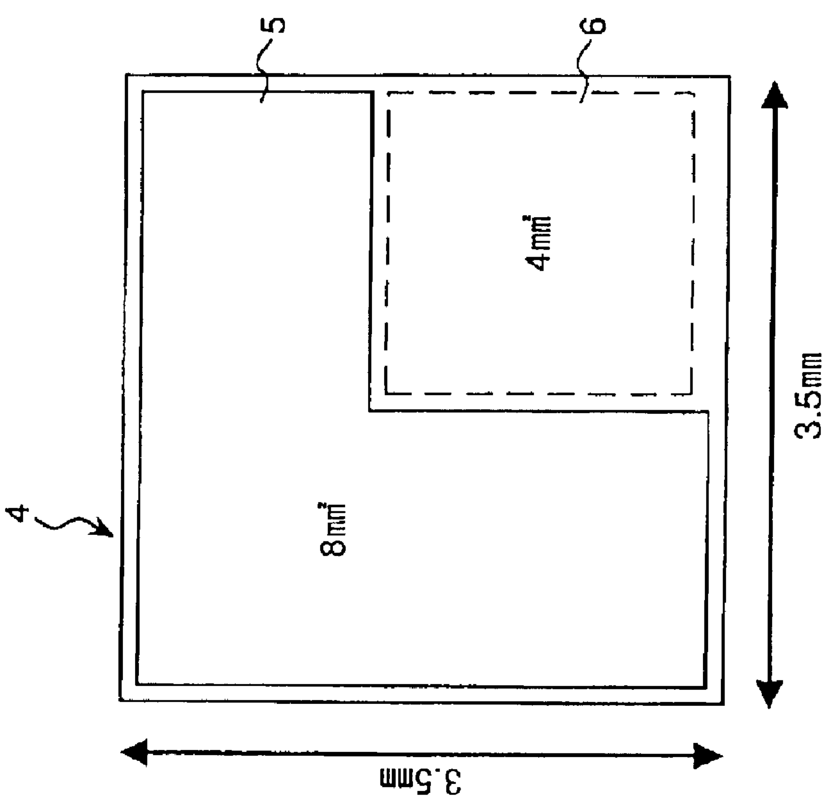
FIGS. 35A and 35B schematically compare the sizes of a power module using the semiconductor device according to the first embodiment with a power module using conventional planar power MOSFETs.
Figure 35B:
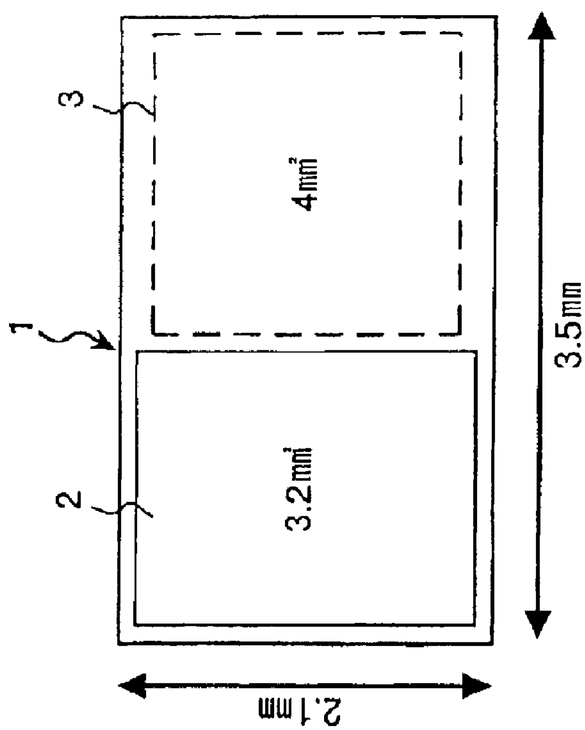

FIGS. 35A and 35B schematically compare the size of a power module using the semiconductor device according to the first embodiment with the size of a power module using conventional planar power MOSFETs. As shown in FIG. 35B, in the power module 1 using the semiconductor device according to the first embodiment, an IC chip measures 2.1 mm by 3.5 mm. A power section 2 that is composed of the above-described TLPMs 101, 102, or 103 etc. has an area of 3.2 $mm^2$. A control section 3 that is composed of the NMOSs 200, the PMOSs 300, the bipolar transistors 400, the resistance elements 500, the capacitance elements 600, etc. has an area of 4 $mm^2$.

In contrast, as shown in FIG. 35A, in the power module 4 using conventional planar power MOSFETs, an IC chip measures 3.5 mm by 3.5 mm. A power section 5 that is composed of the planar power MOSFETs etc. has an area of 8 $mm^2$, and a control section 6 has an area of 4 $mm^2$.

In the above-described first embodiment, the gate electrodes 126 of the TLPM 100, 101, 102, or 103, the gate electrode 226 of the NMOS 200, and the gate electrode 326 of the PMOS 300 are formed by patterning the same polysilicon layer 143. The drain electrode 127 and the source electrodes 128 of the TLPM 100, 101, 102, or 103, the drain electrode 227 and the source electrode 228 of the NMOS 200, and the drain electrode 327 and the source electrode 328 of the PMOS 300 are formed by patterning the same metal wiring layer. Therefore, the TLPM 100, the NMOS 200, and the PMOS 300 can be connected to each other electrically via the metal wiring layer and the polysilicon layer 143. Since, unlike conventional cases, it is not necessary to perform wire bonding on a printed circuit board, a one-chip power IC can be obtained that is small in size and low in on-resistance and cost.

In the first embodiment, the channel regions 133 of the TLPM 100 and the channel region 233 of the NMOS 200 are formed at the same time, the gate electrodes 126 of the TLPM 100, the gate electrode 226 of the NMOS 200, and the gate electrode 326 of the PMOS 300 are formed at the same time, the drain region 123 and the source regions 125 of the TLPM 100 and the drain region 223 and the source region 225 of the NMOS 200 are formed at the same time, the plug regions 134 of the TLPM 100 and the drain region 323 and the source region 325 of the PMOS 300 are formed at the same time, and the drain electrode 127 and the source electrodes 128 of the TLPM 100, the drain electrode 227 and the source electrode 228 of the NMOS 200, and the drain electrode 327 and the source electrode 328 of the PMOS 300 are formed at the same time. This can prevent cost increase due to an increase in the number of manufacturing operations.

Figure 36:
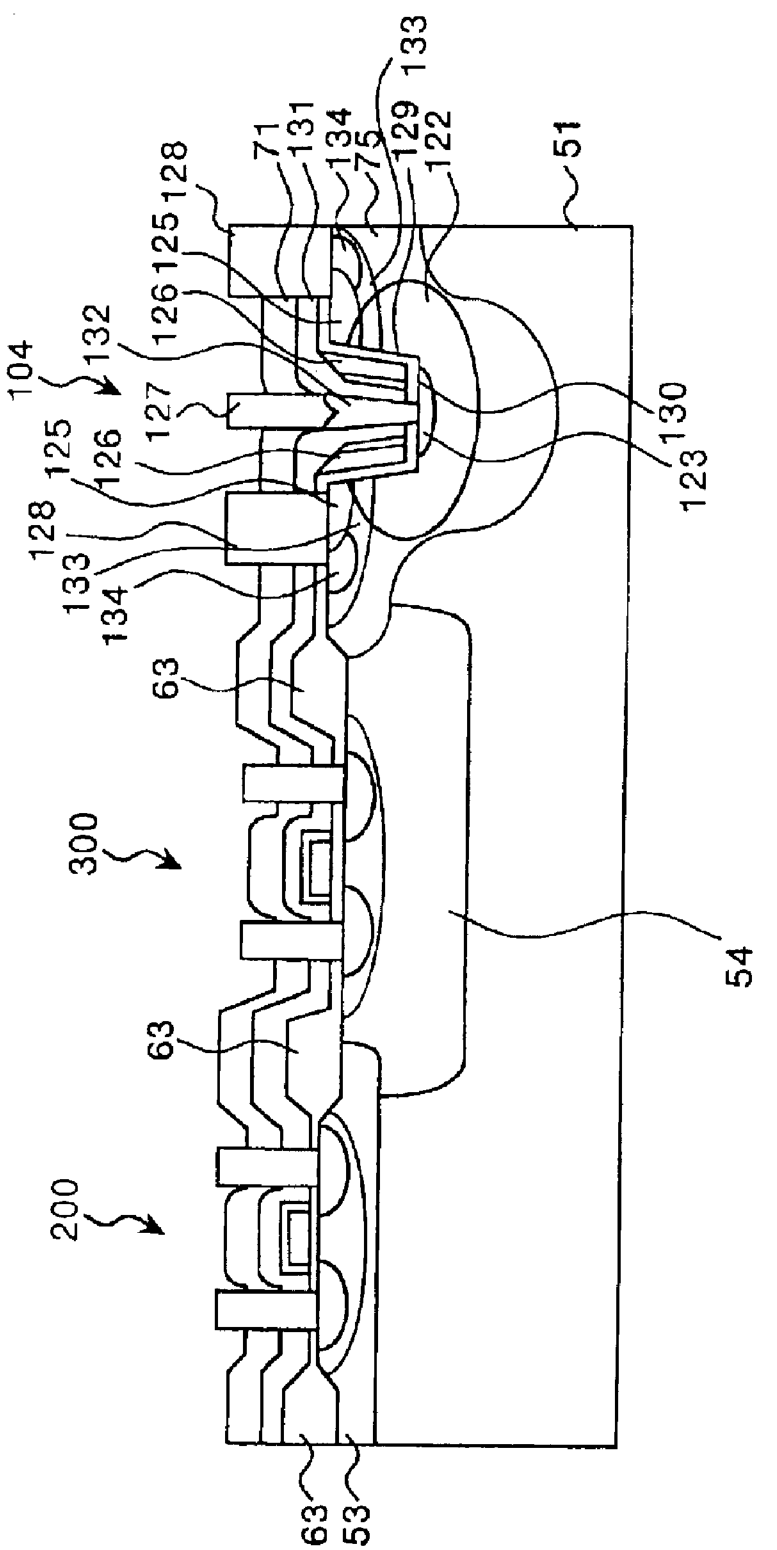
FIG. 36 is a vertical sectional view showing the configuration of a semiconductor device according to a second embodiment of the invention.
Figure 37:
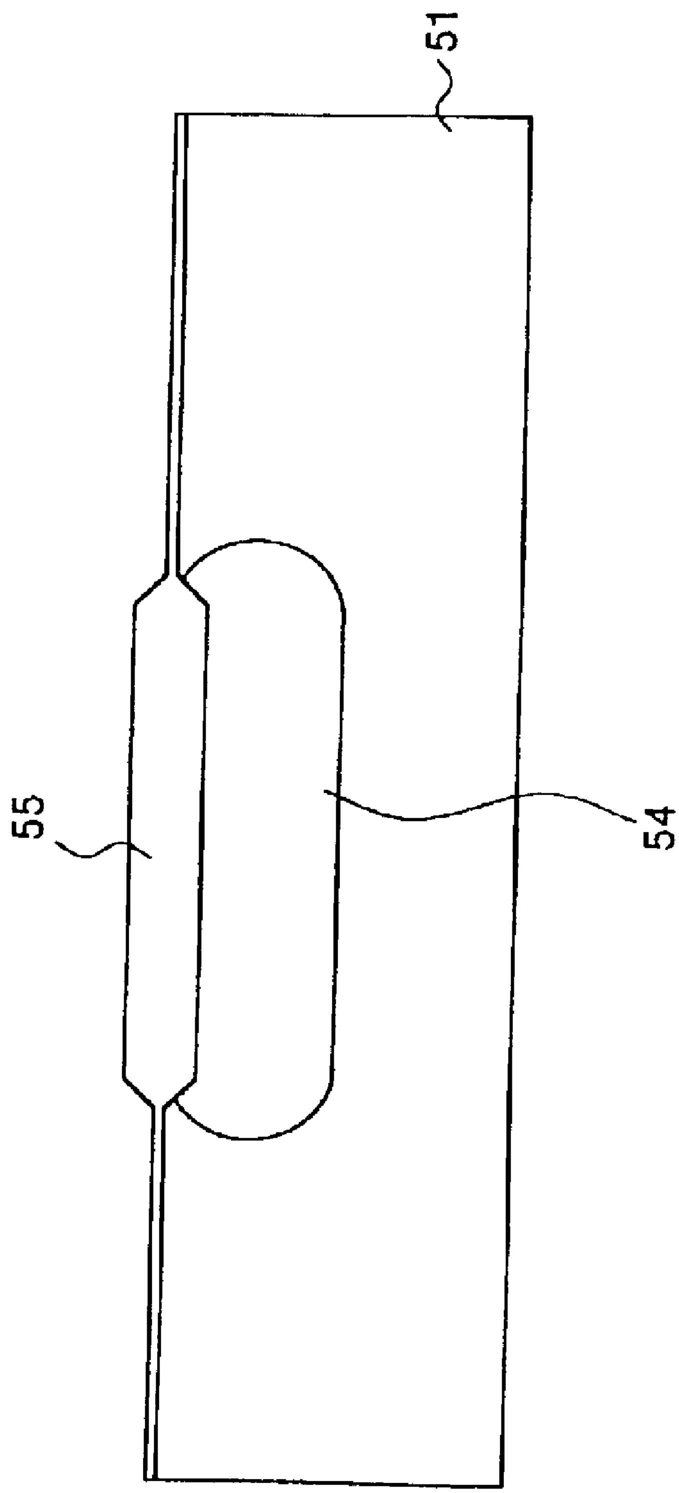
FIGS. 37–47 are vertical sectional views showing intermediate states of manufacture of the embodiment of the semiconductor device shown in FIG. 36.
Figure 38:
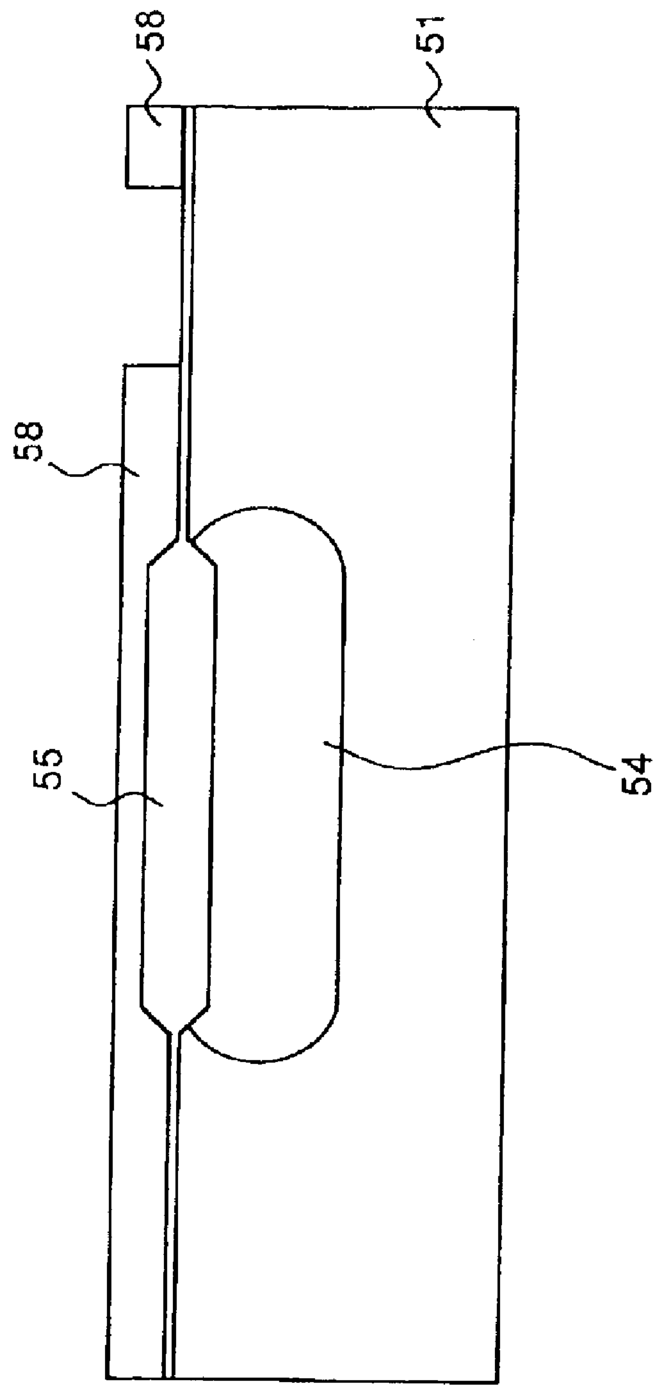
Figure 39:
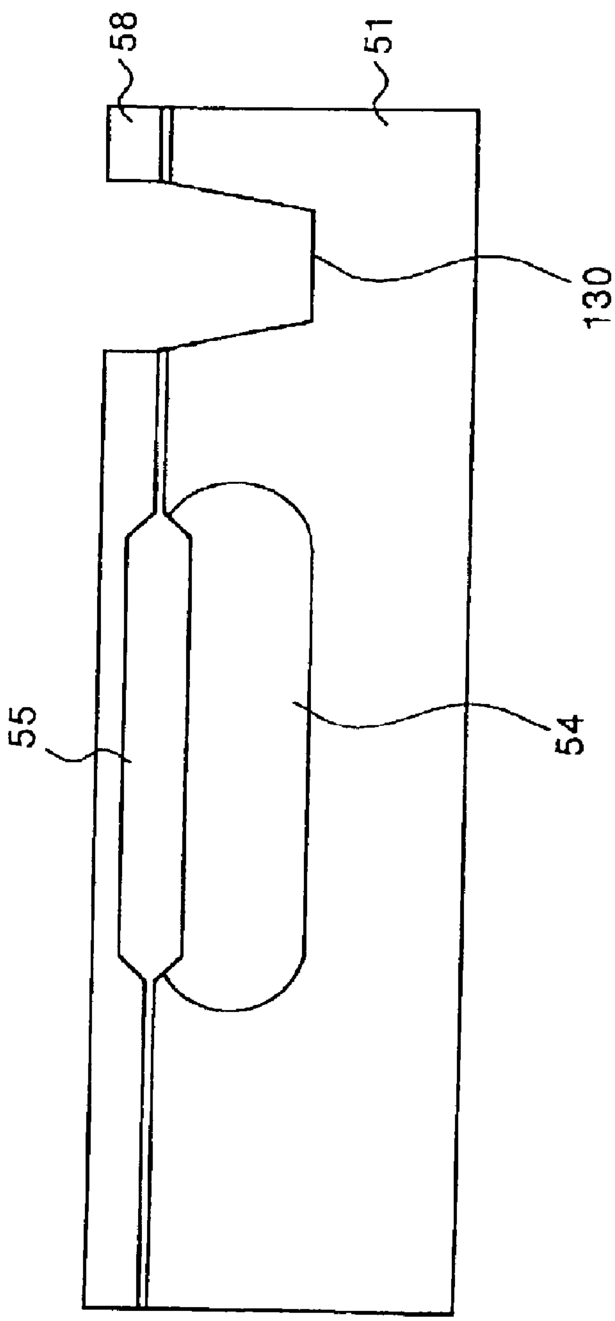
Figure 40:
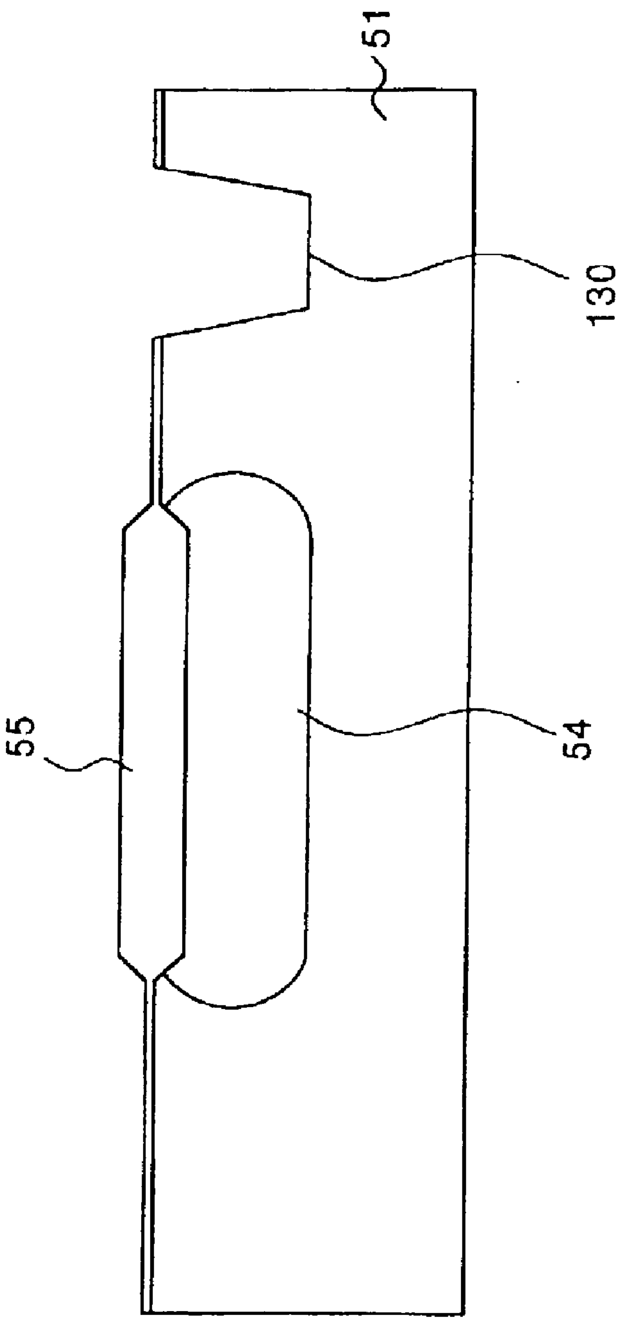
Figure 41:
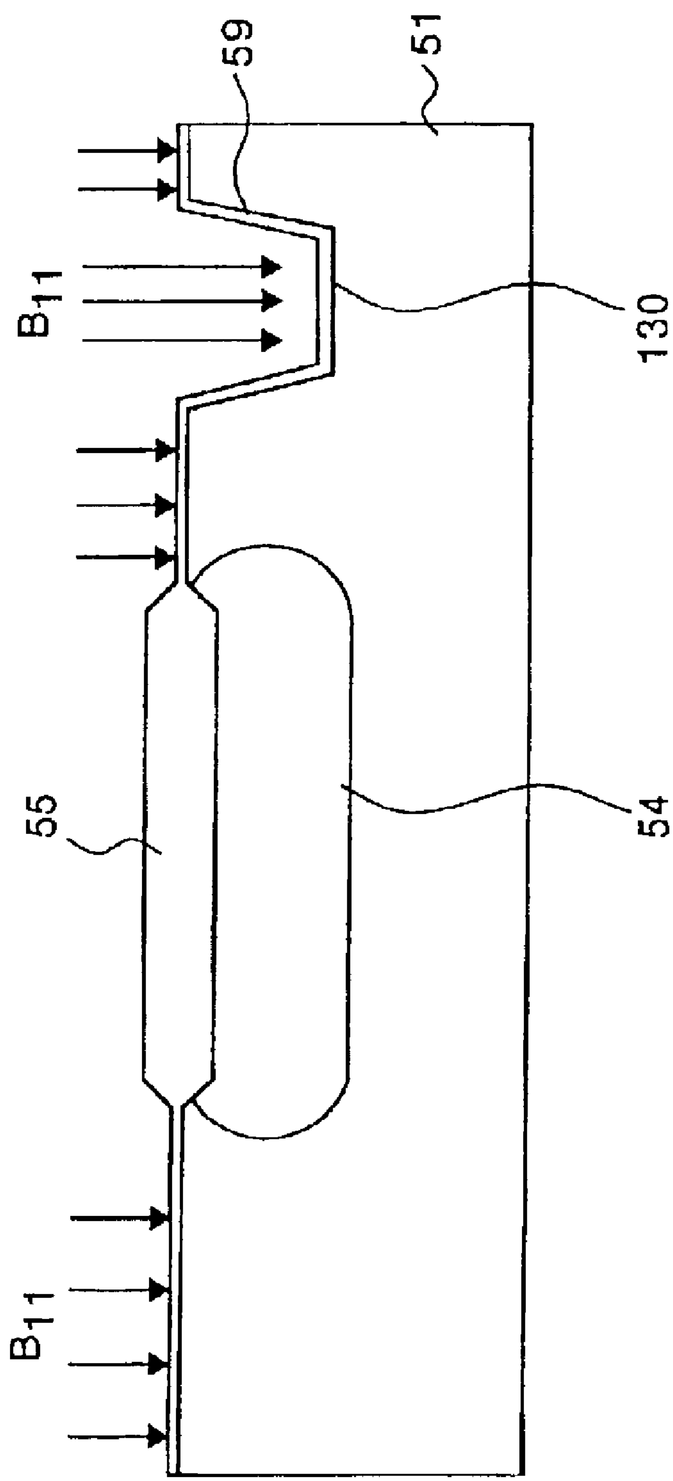

FIG. 36 is a vertical sectional view showing the configuration of a semiconductor device according to a second embodiment of the invention. The semiconductor device according to the second embodiment is different from the semiconductor device of FIG. 1 according to the first embodiment in that a TLPM 104 of the former does not have a field region and is formed in a p-well region 75 having a generally constant depth including under the trench 130. The other part of the configuration of the TLPM 104 is the same as of the TLPM 100 of the semiconductor device shown in FIG. 1 and hence will not be described. Regions, electrodes, etc. of the semiconductor device according to the second embodiment having the same names in the semiconductor device according to the first embodiment are given the same reference numerals as the latter and will not be described.

A manufacturing process of the semiconductor device shown in FIG. 36 is described below. FIGS. 37–47 are vertical sectional views showing intermediate states of manufacture of the semiconductor device shown in FIG. 36. First, an n-well region 54 is formed selectively in a surface layer of a semiconductor substrate 51, and a selective oxidation film 55 is formed on the surface of the n-well region 54 by diffusive oxidation (see FIG. 37). Then, a mask 58 having an opening in a trench forming area is formed on the substrate surface (see FIG. 38). A trench 130 is formed by trench etching using the mask 58 (see FIG. 39). The mask 58 is removed thereafter (see FIG. 40).

Figure 42:
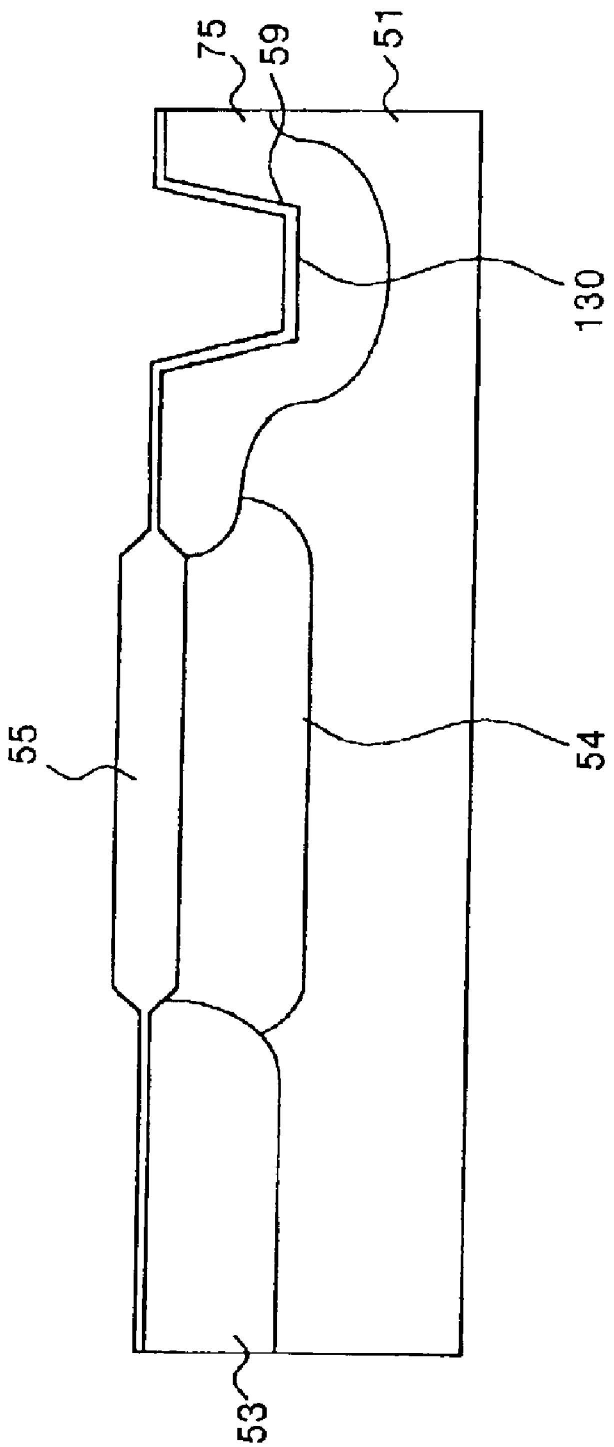
Figure 43:
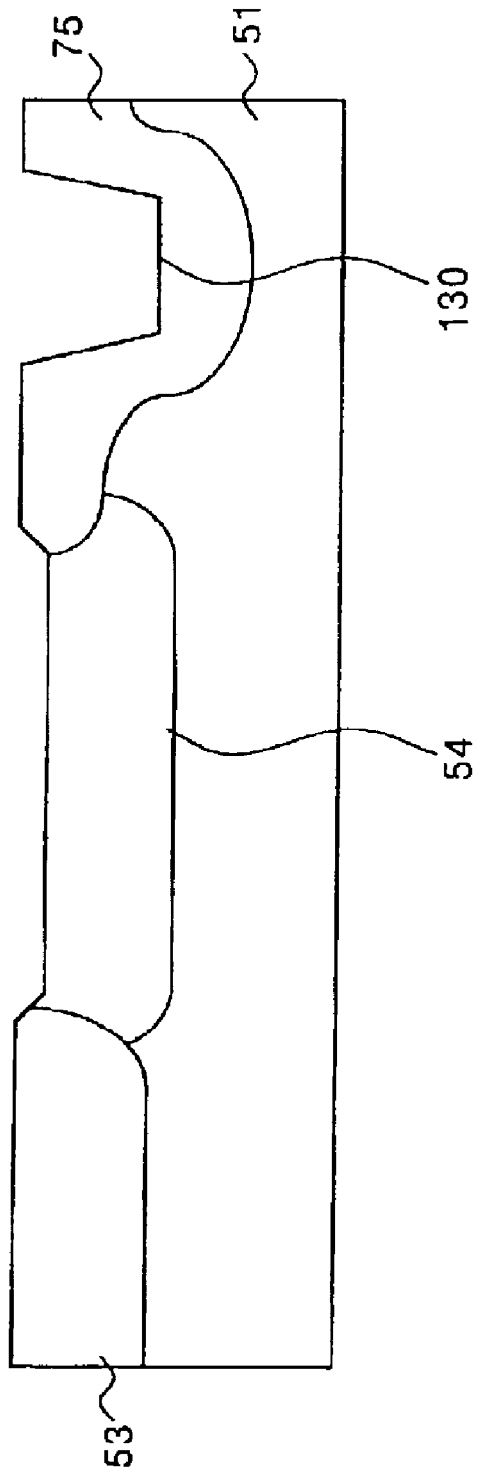
Figure 44:
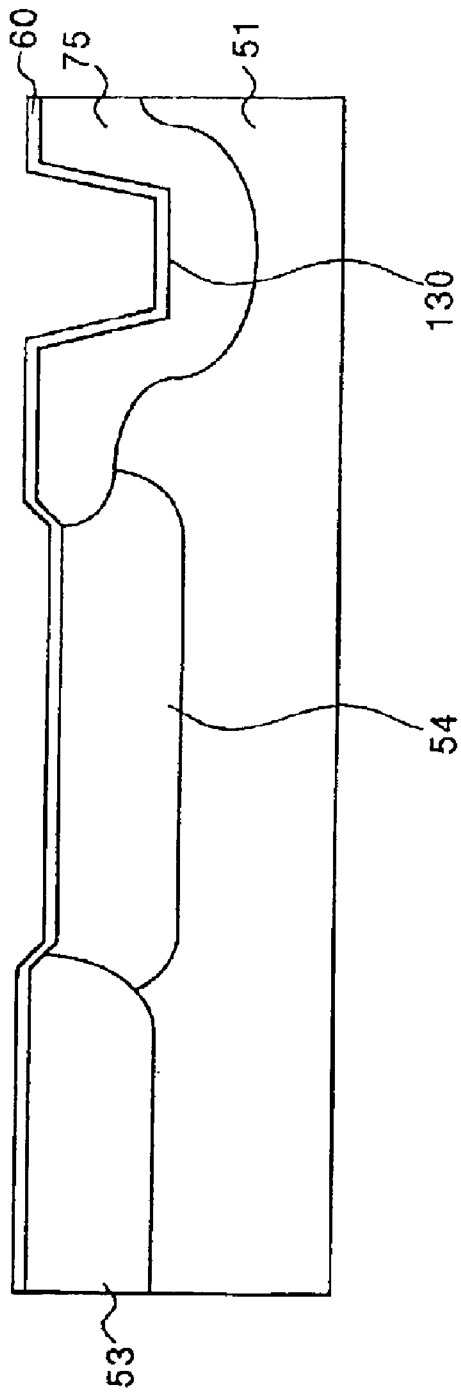
Figure 45:
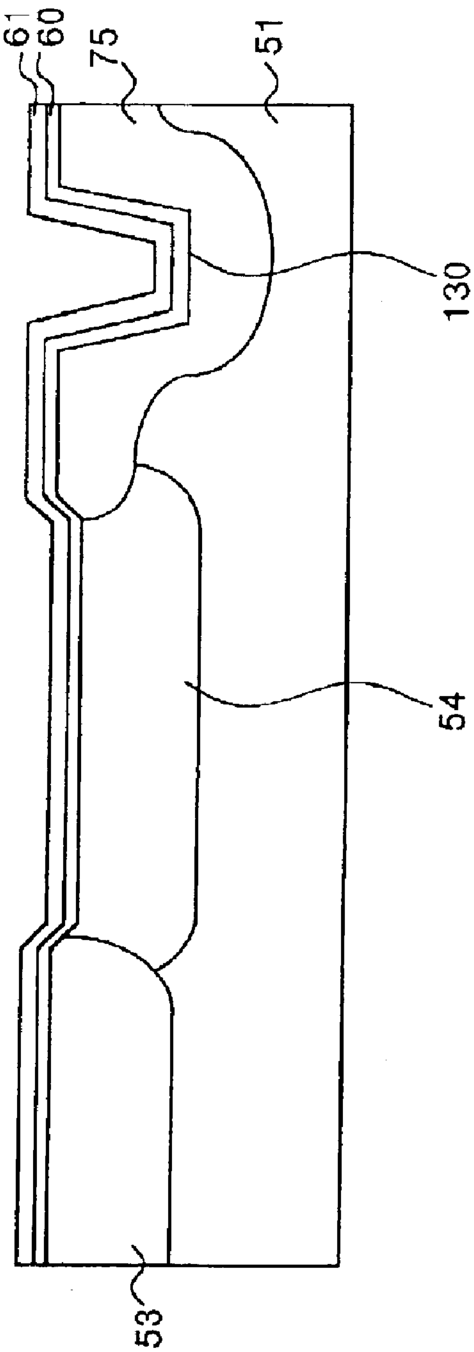
Figure 46:
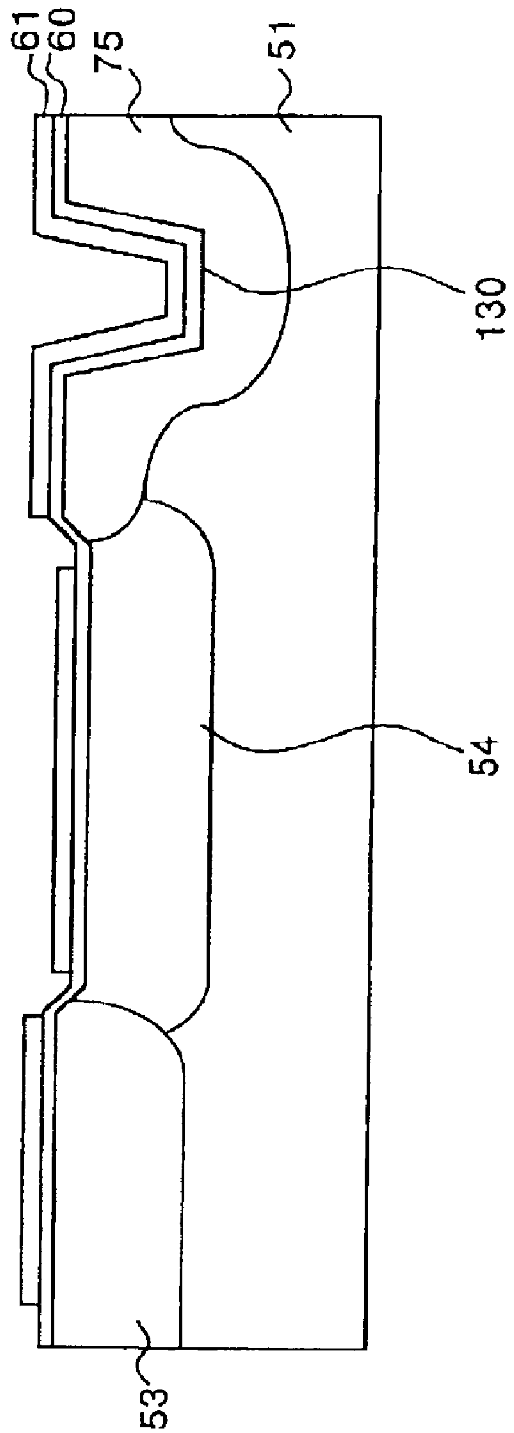
Figure 47:
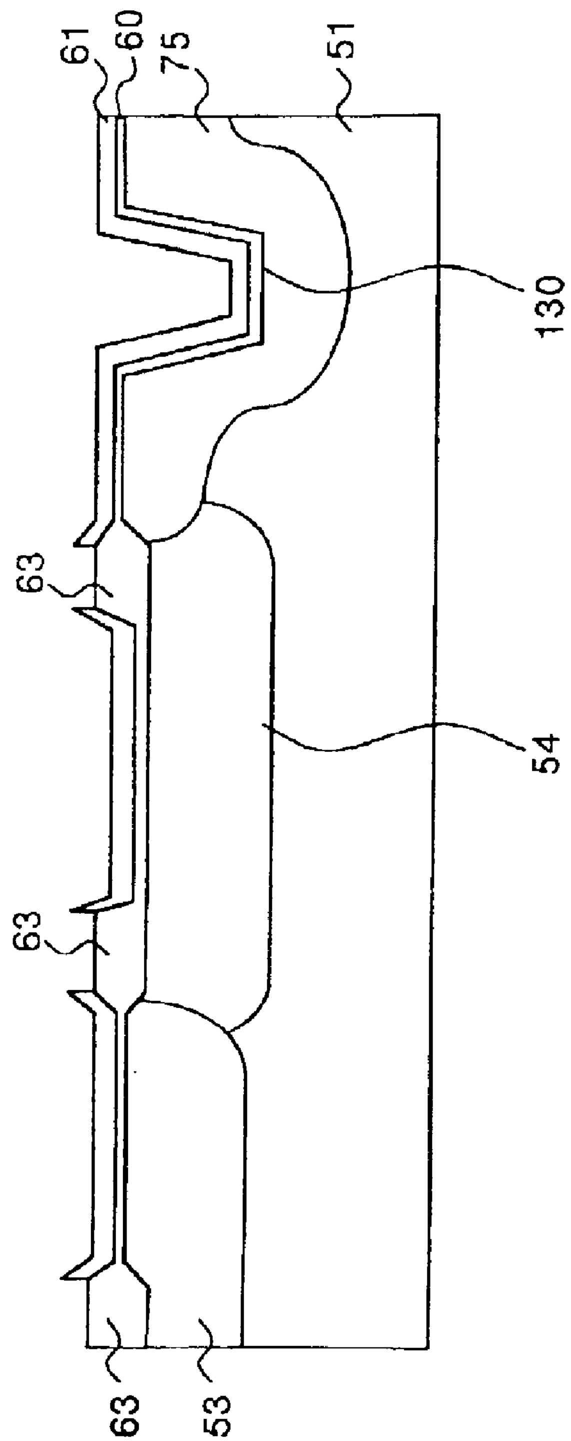

Subsequently, after a buffer oxide film 59 is formed on the side surfaces of the trench 130, the substrate 51 is doped with $B_{11}$ on both sides the trench 130, under the bottom surface of the trench 130, and in an NMOS forming region, by using the selective oxidation film 55 as a mask (see FIG. 41), whereby a first p-well region 75 and a second p-well region 53 is formed (see FIG. 42). After the selective oxidation film 55 and the buffer oxide film 59 are removed completely (see FIG. 43), a buffer oxide film 60 is formed on the substrate surface and the surface of the trench 130 (see FIG. 44). A silicon nitride film 61 is formed on the buffer oxide film 60 (see FIG. 45) and patterned, whereby a mask having openings in device isolation areas is formed (see FIG. 46). Selective oxidation films 63 for device isolation are formed by thermal oxidation (see FIG. 47).

The operations of the first embodiment shown in FIGS. 15–27 are thereafter executed in order and then a passivation film 71 is formed and drain electrodes and source electrodes are formed, wherein a semiconductor device having the configuration of FIG. 36 is completed.

In addition to the same advantage of the first embodiment that a one-chip power IC that is small in size and low in on-resistance and cost can be obtained, the second embodiment provides an advantage that a TLPM 104 of an arbitrary output stage that is free of the punch-through phenomenon even without a field region can be obtained because the p-well region 75 has a generally constant depth, including under the trench 130.

A semiconductor device according to a third embodiment of the invention is constructed by forming the trench 130 after the selective oxidation films 63 for device isolation are formed and after formation of the p-well region 52 and 53 and the n-well region 54. Therefore, a completed semiconductor device has the same configuration in a vertical cross-section as the semiconductor device of the first embodiment shown in FIG. 1, and hence will not be illustrated or described. Regions, electrodes, etc. of the semiconductor device according to the third embodiment having the same names in the semiconductor device according to the first embodiment are given the same reference numerals- as the latter.

Figure 48:
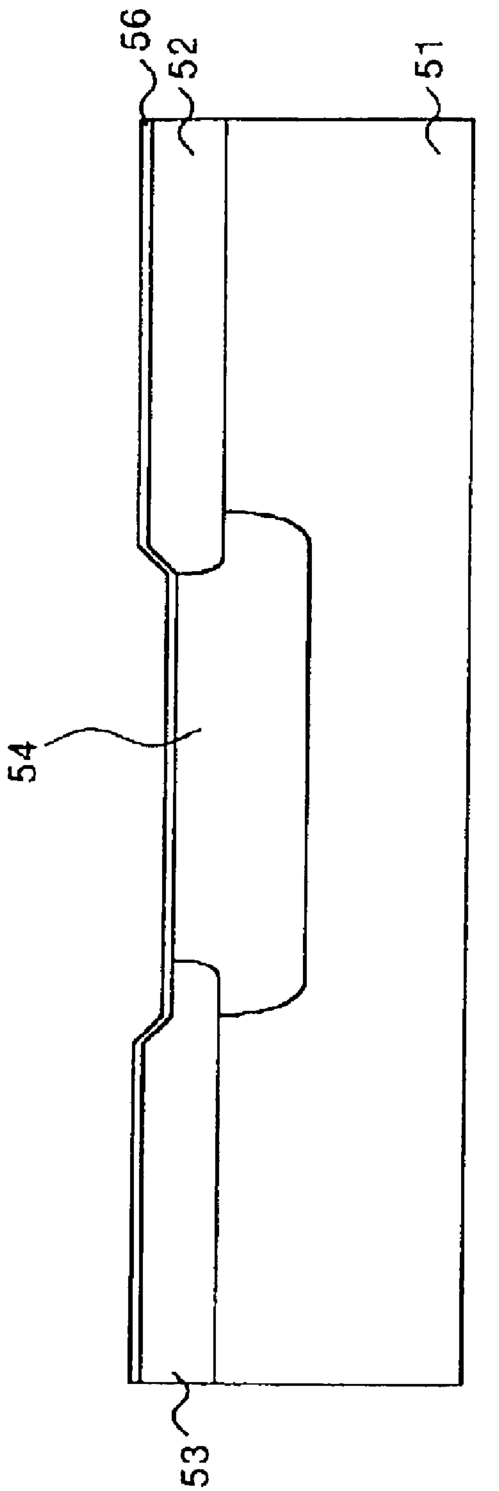
FIGS. 48–61 are vertical sectional views showing intermediate states of manufacture of a semiconductor device according to a third embodiment of the invention.
Figure 49:
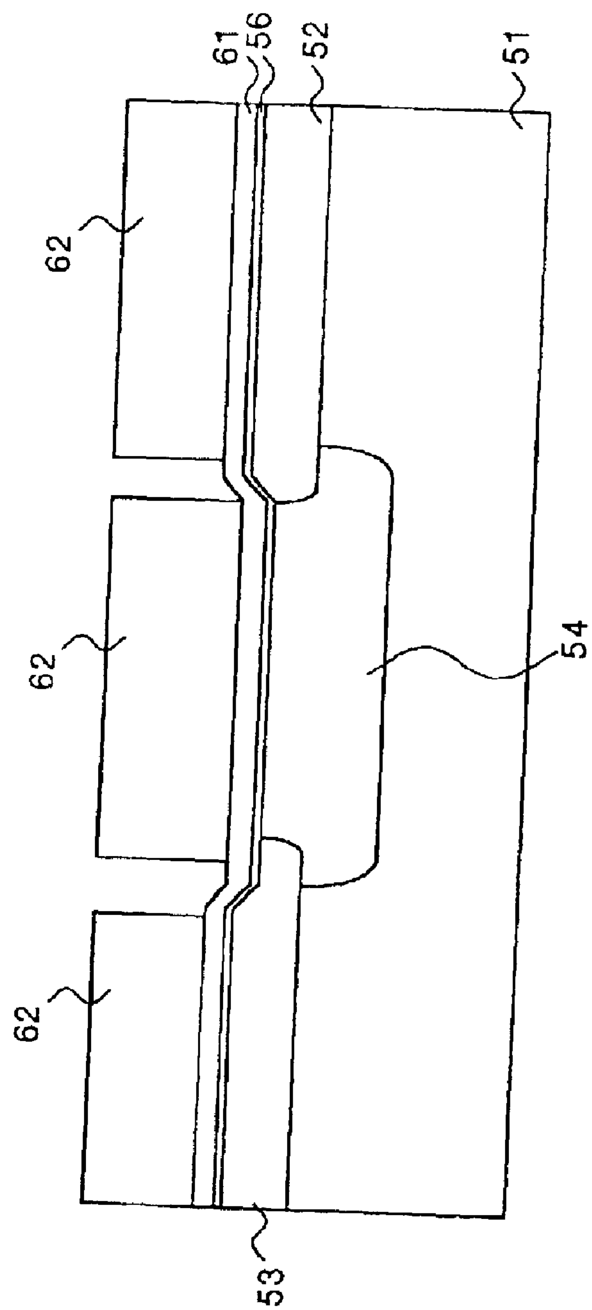
Figure 50:
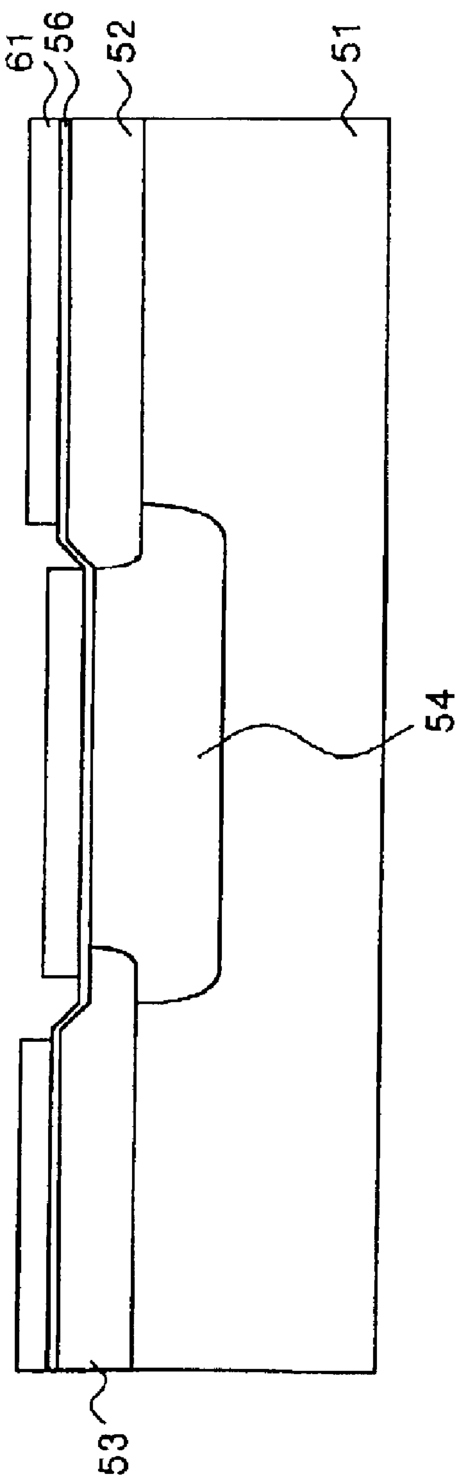
Figure 51:
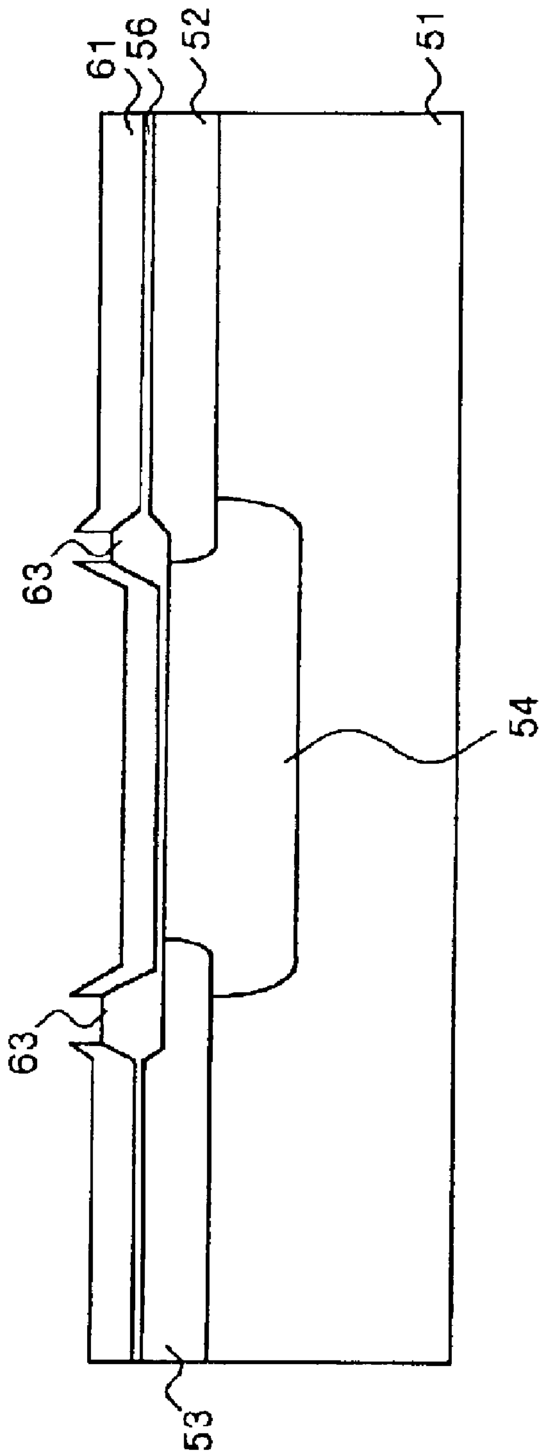
Figure 52:
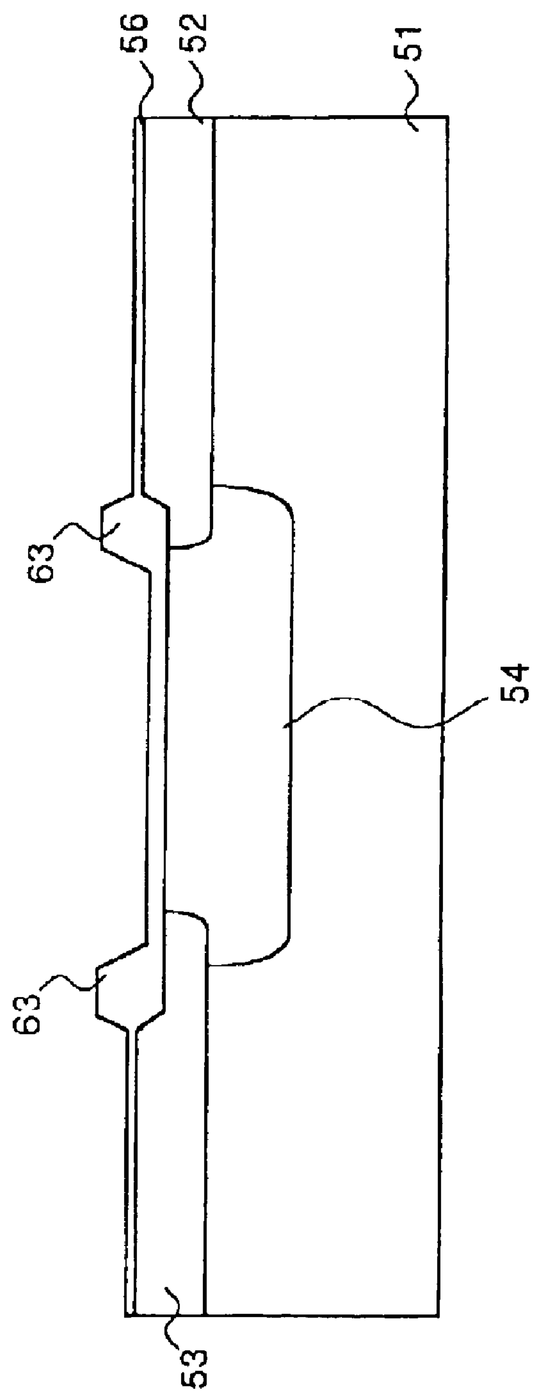

FIGS. 48–61 are vertical sectional views showing intermediate states of manufacture of the semiconductor device according to the third embodiment of the invention. First, after an n-well region 54 and p-well regions 52 and 53 are formed selectively in a surface layer of a semiconductor substrate 51 in the same manner as in the operations of FIGS. 2 and 3 of the first embodiment, a buffer oxide film 56 is formed on the substrate surface (see FIG. 48). A silicon nitride film 61 is formed on the buffer oxide film 56, and a mask 62 having openings in device isolation areas is formed thereon (see FIG. 49). The silicon nitride film 61 is patterned by using the mask 62 and the mask 62 is removed (see FIG. 50). Thermal oxidation is performed by using, as a mask, the silicon nitride film 61 remaining on the substrate surface, whereby selective oxidation films 63 for device isolation are formed (see FIG. 51). The silicon nitride film 61 is removed thereafter (see FIG. 52).

Figure 53:
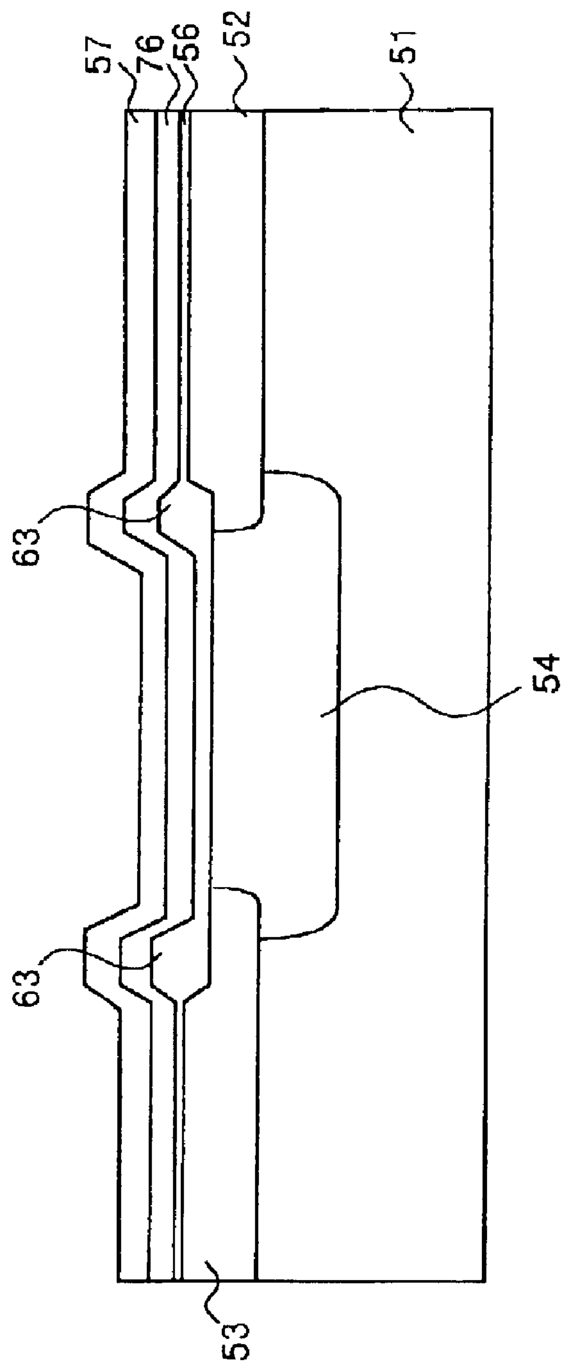
Figure 54:
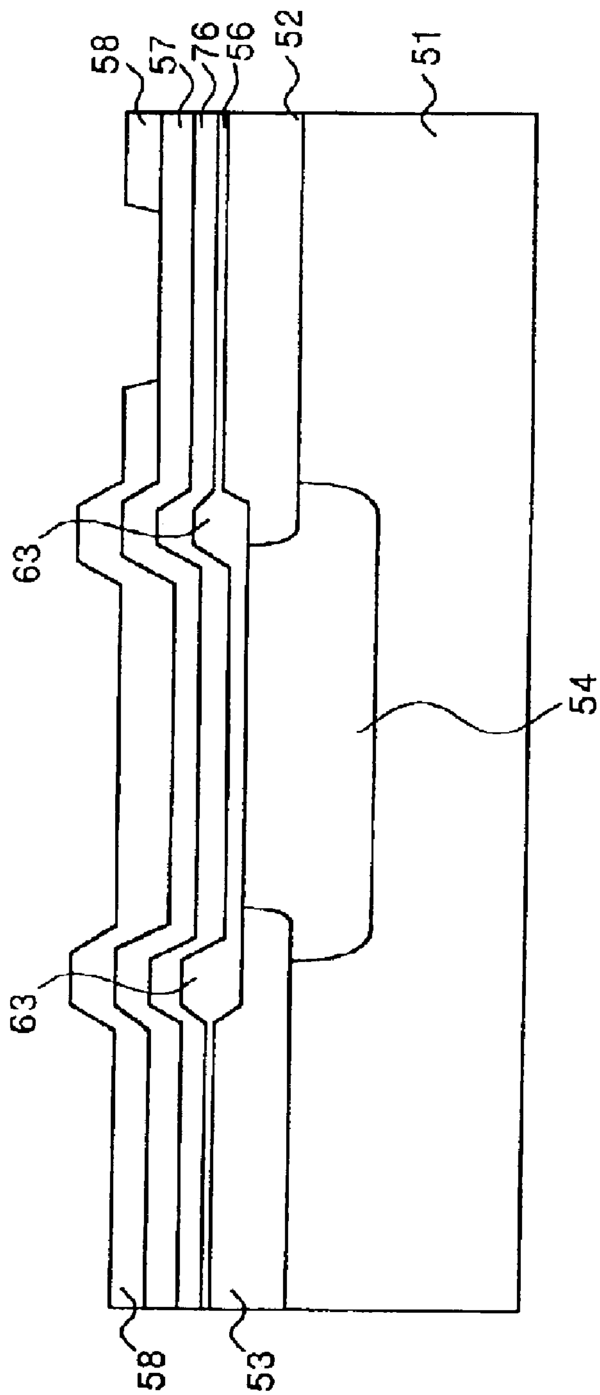
Figure 55:
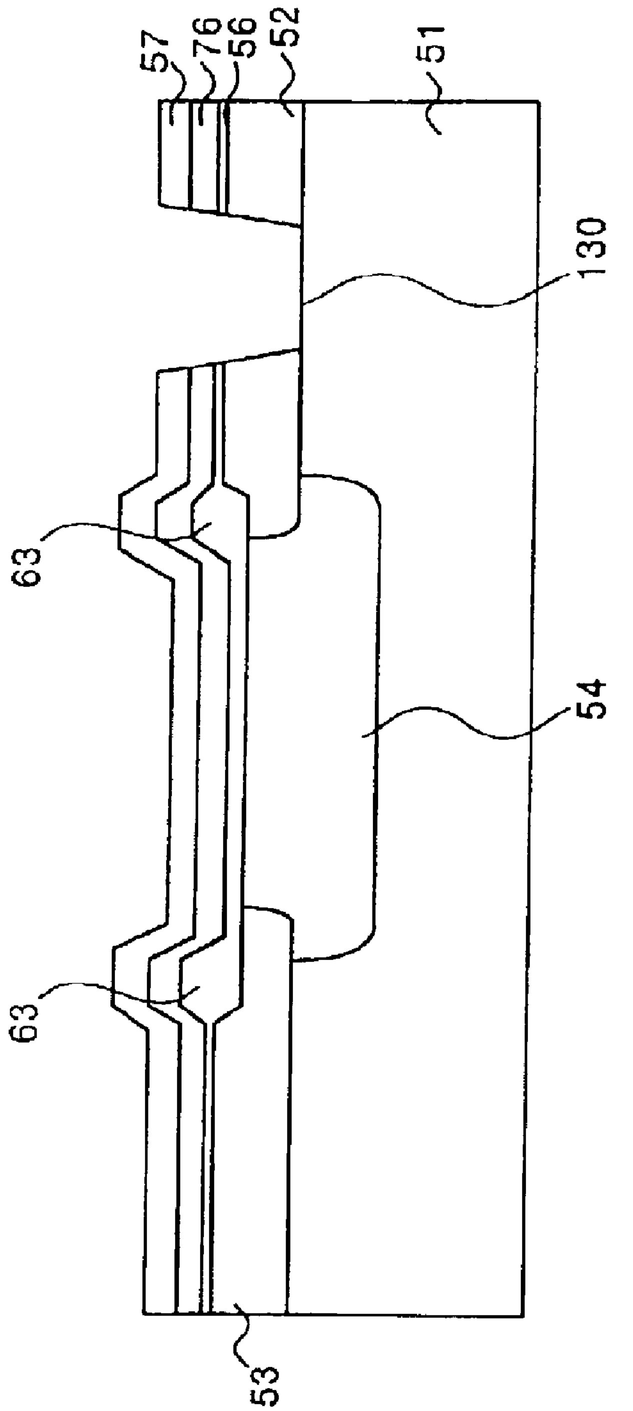
Figure 56:
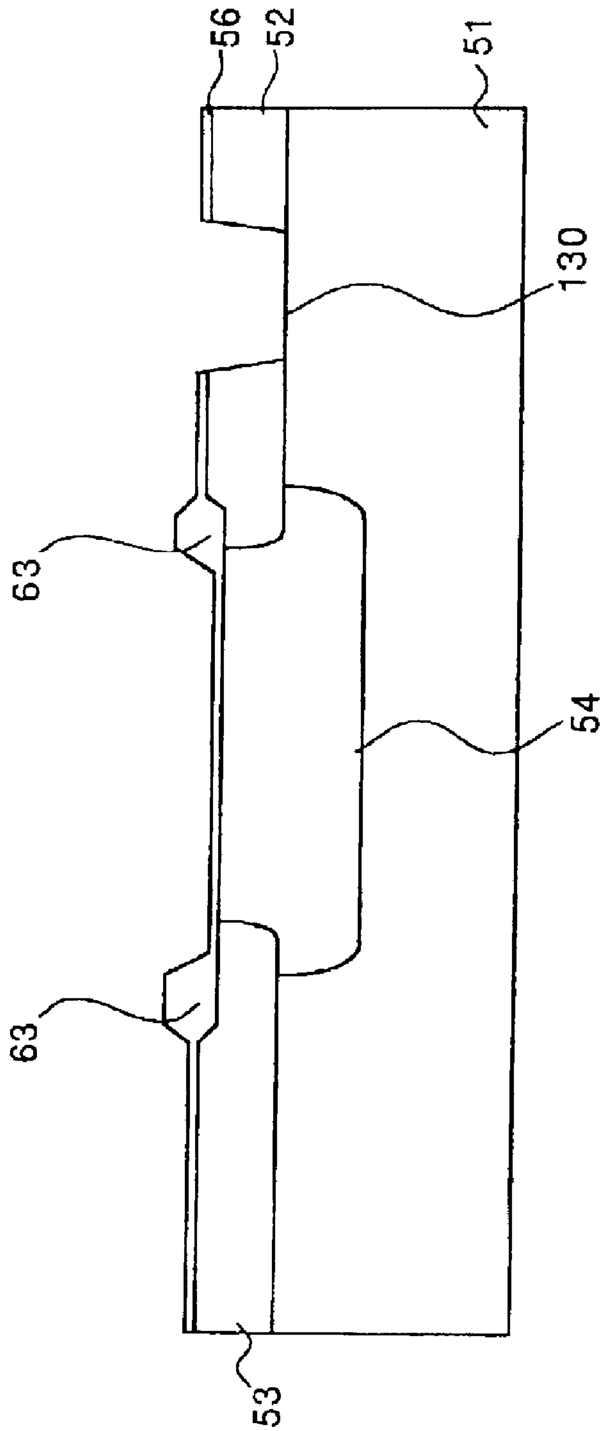
Figure 57:
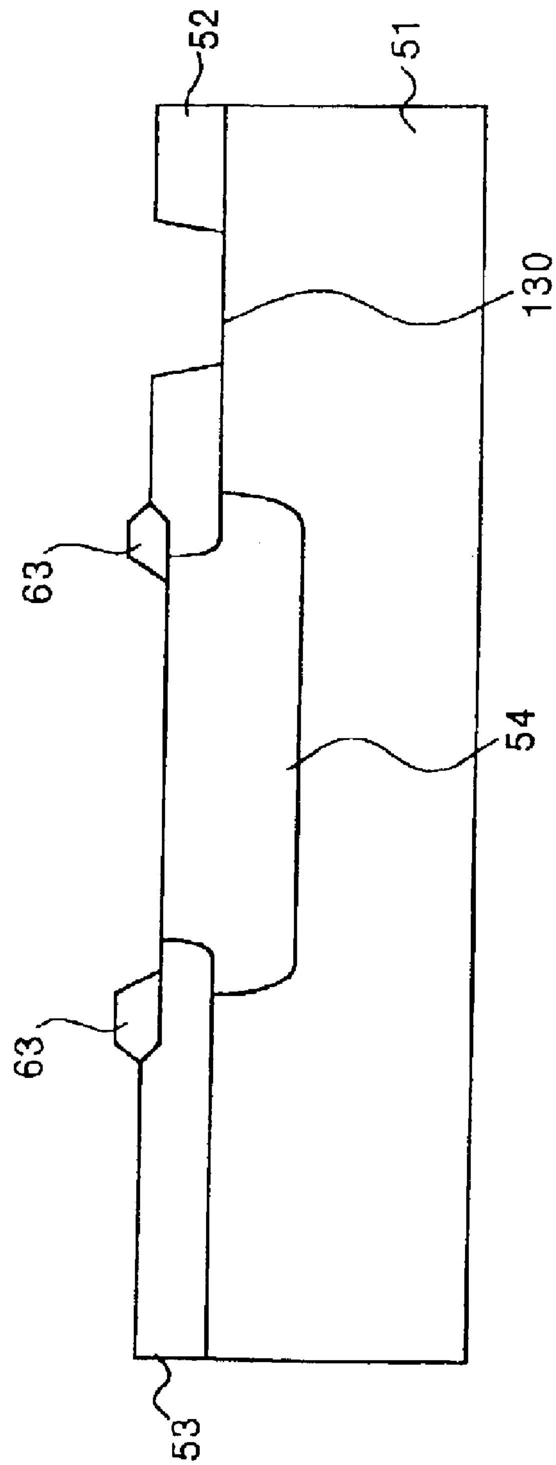

A silicon nitride film 76 is formed again on the substrate surface and a mask oxide film 57 is laid thereon (see FIG. 53). A mask 58 having an opening in a trench forming area is formed on the mask oxide film 57 (see FIG. 54). The mask oxide film 57 is patterned by using the mask 58. After the mask 58 is removed, a trench 130 is formed by trench etching (see FIG. 55). The mask oxide film 57 and the silicon nitride film 76 are removed (see FIG. 56), and the buffer oxide film 56 is removed while the selective oxidation films 63 are left (see FIG. 57).

Figure 58:
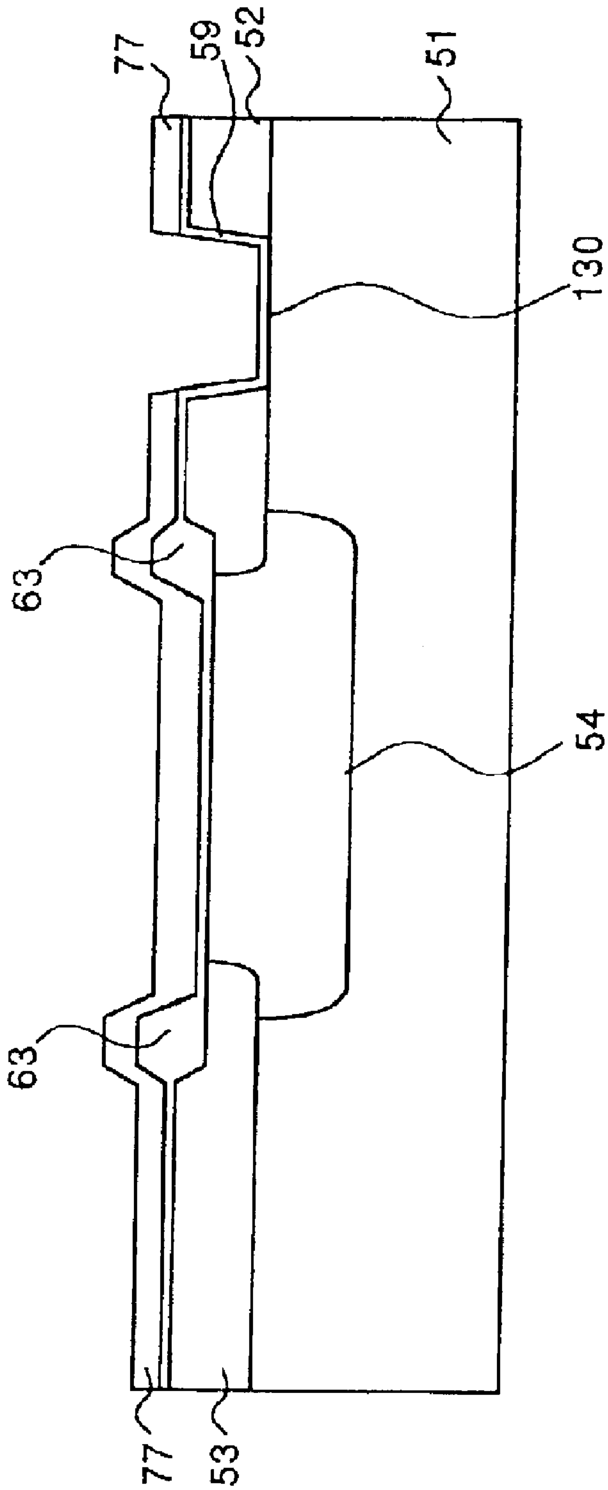
Figure 59:
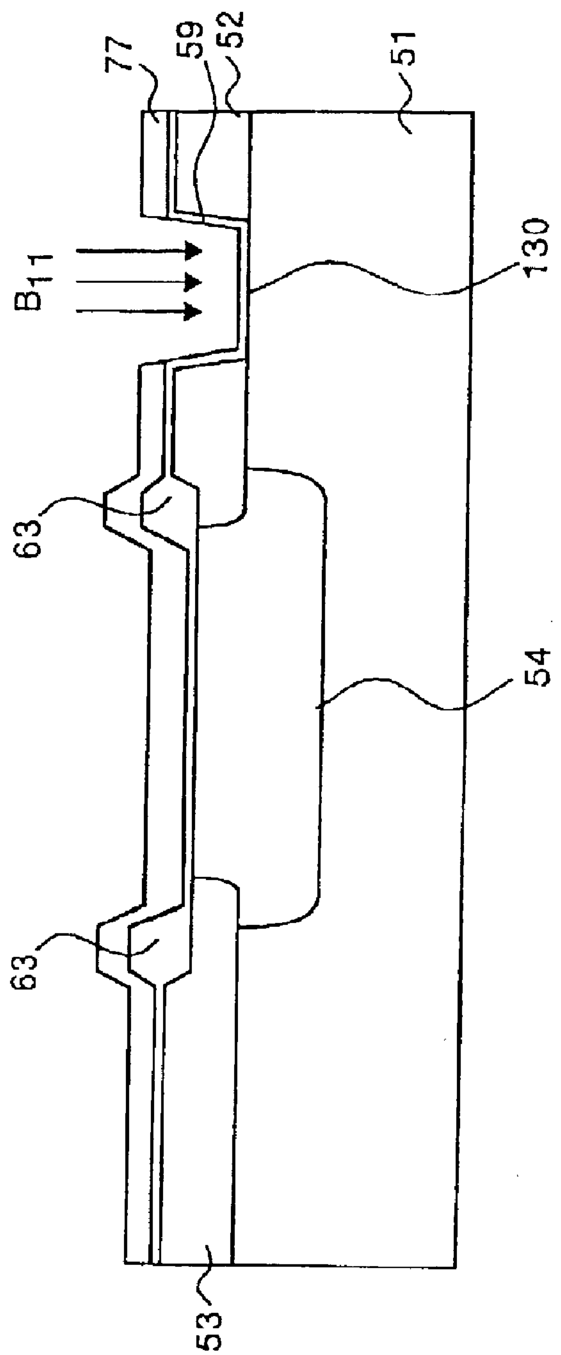
Figure 60:
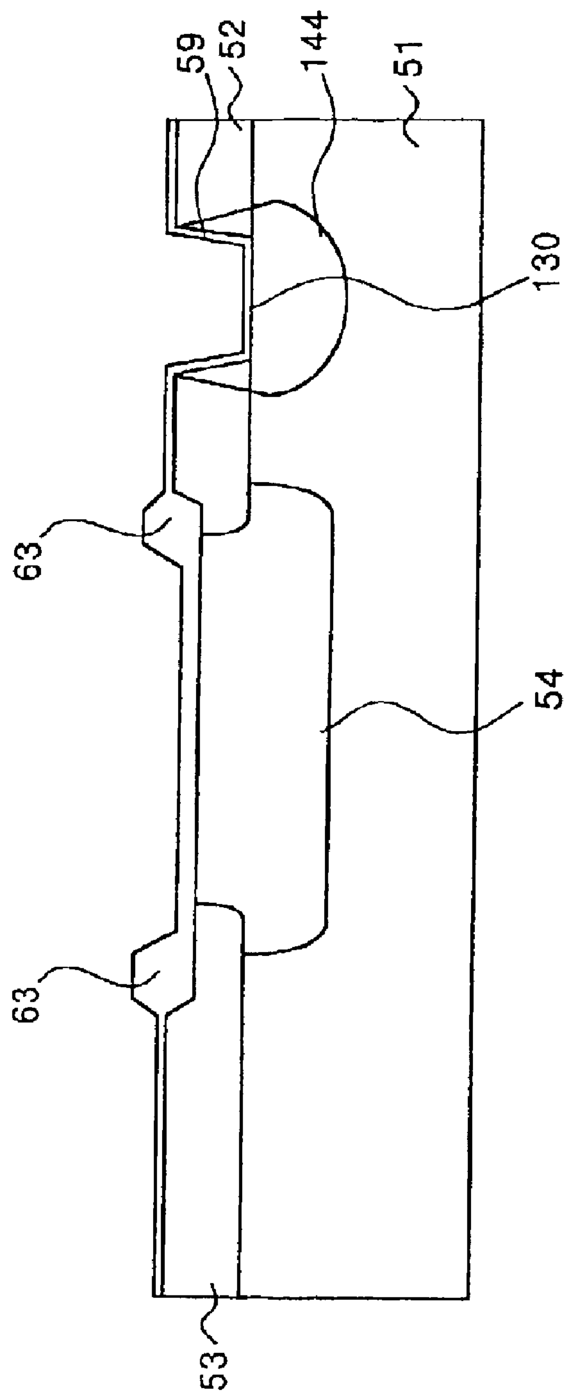
Figure 61:
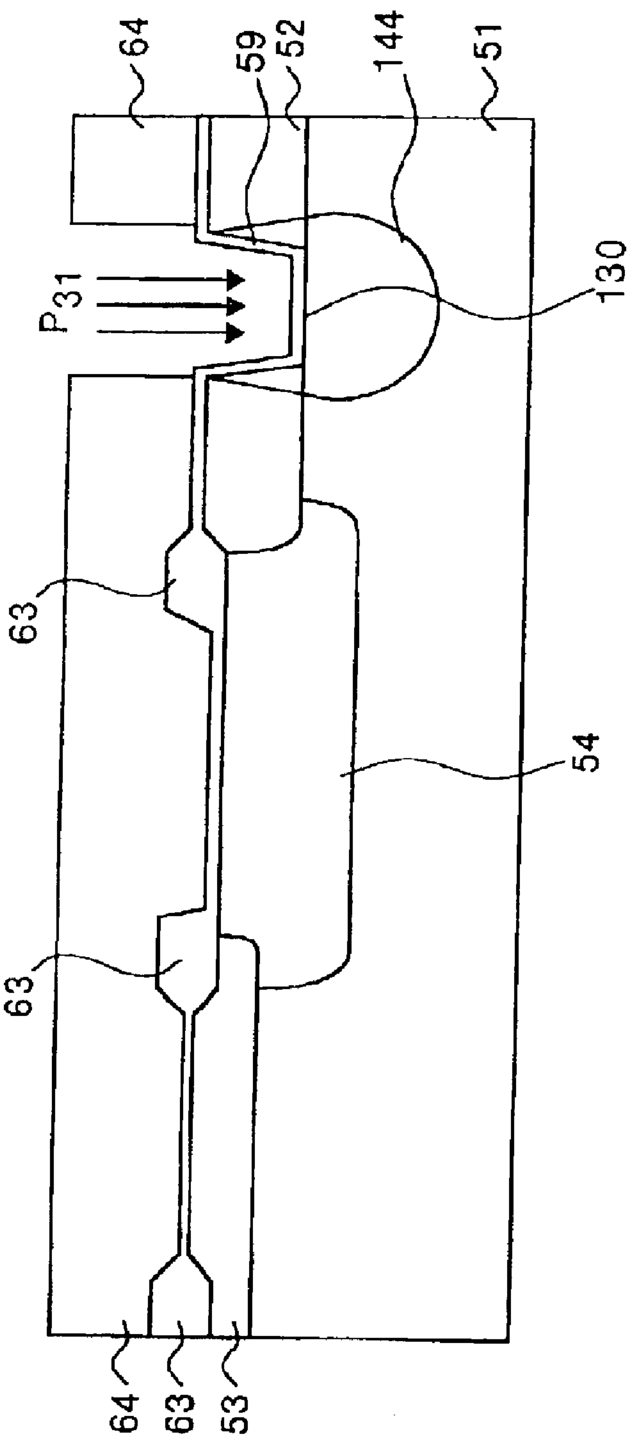

Subsequently, a buffer oxide film 59 is formed on the surface of the trench 130 and a mask 77 is formed so as to cover the substrate surface except the trench 130 (see FIG. 58). The substrate 51 is doped with $B_{11}$ under the bottom surface of the trench 130 by using the mask 77 (see FIG. 59), whereby a field region 144 is formed. The mask 77 is removed thereafter (see FIG. 60). Then, a mask 64 having an opening over the trench 130 is formed on the substrate surface and the substrate 51 is doped with $P_{31}$ (see FIG. 61).

Figure 16:
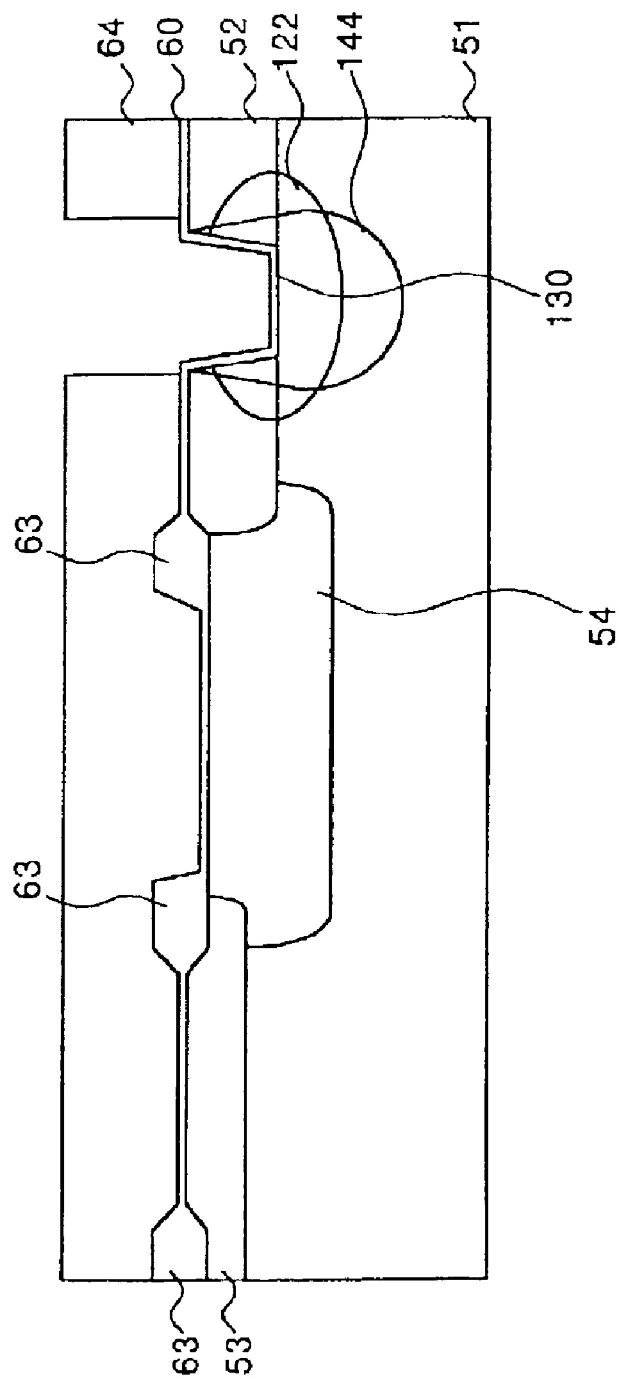
Figure 17:
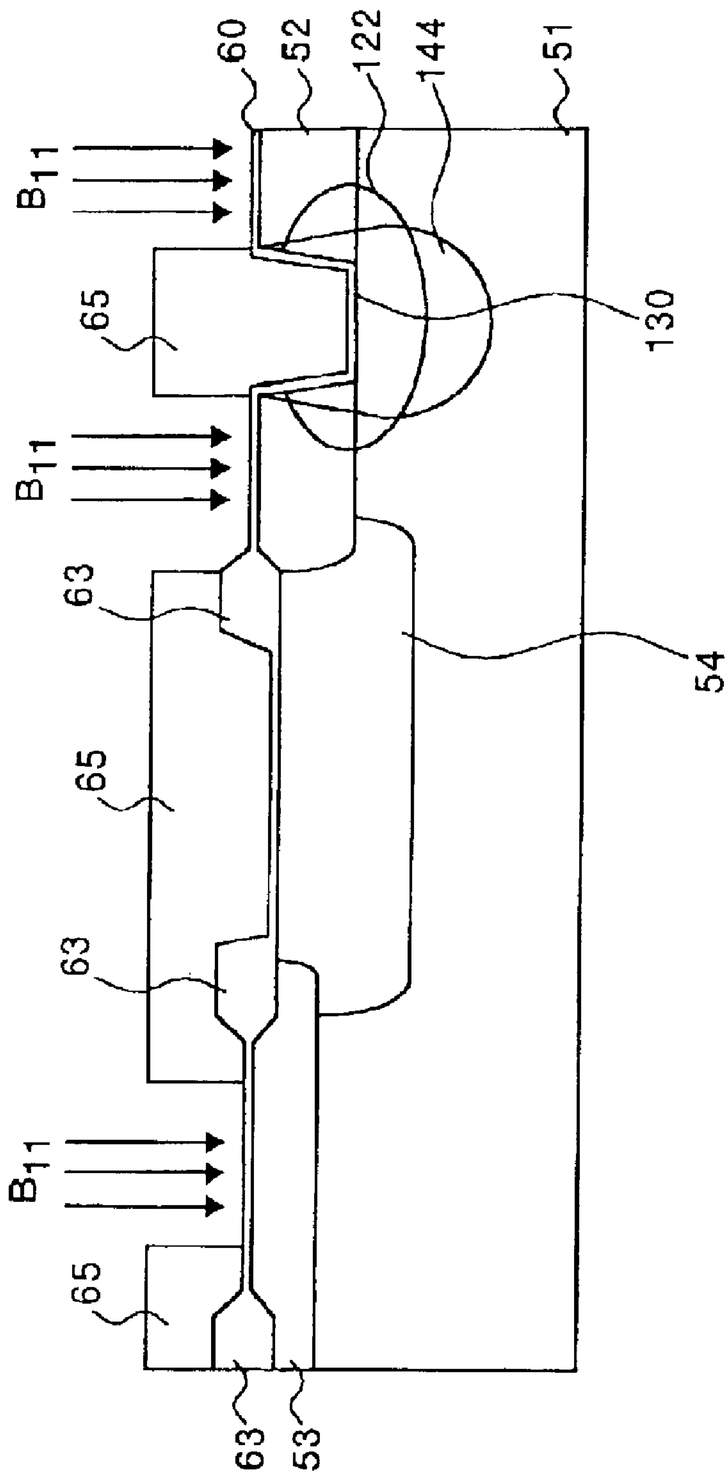
Figure 18:
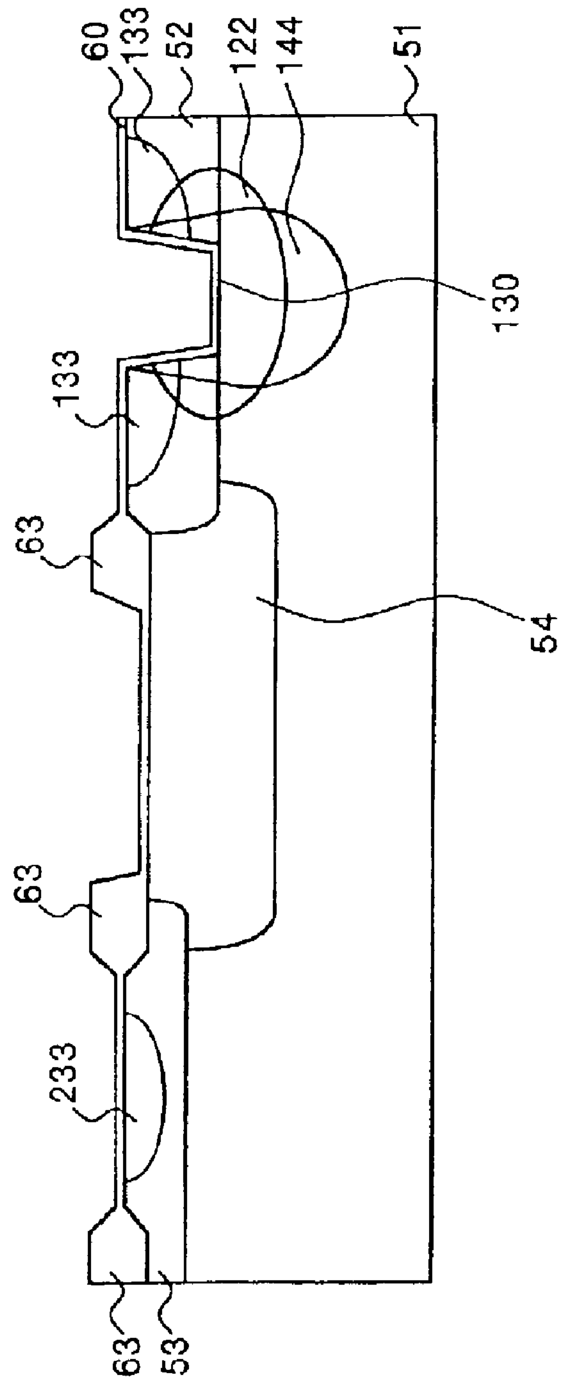
Figure 19:
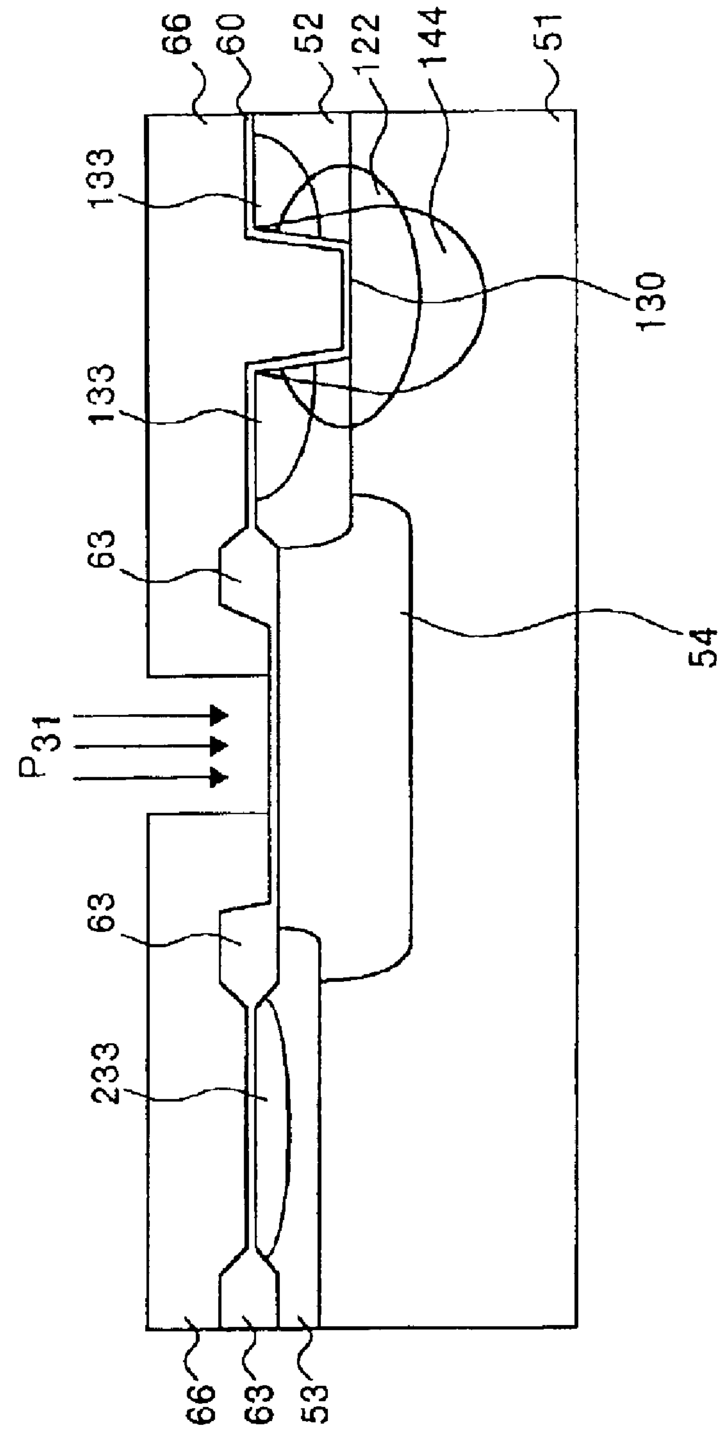
Figure 20:
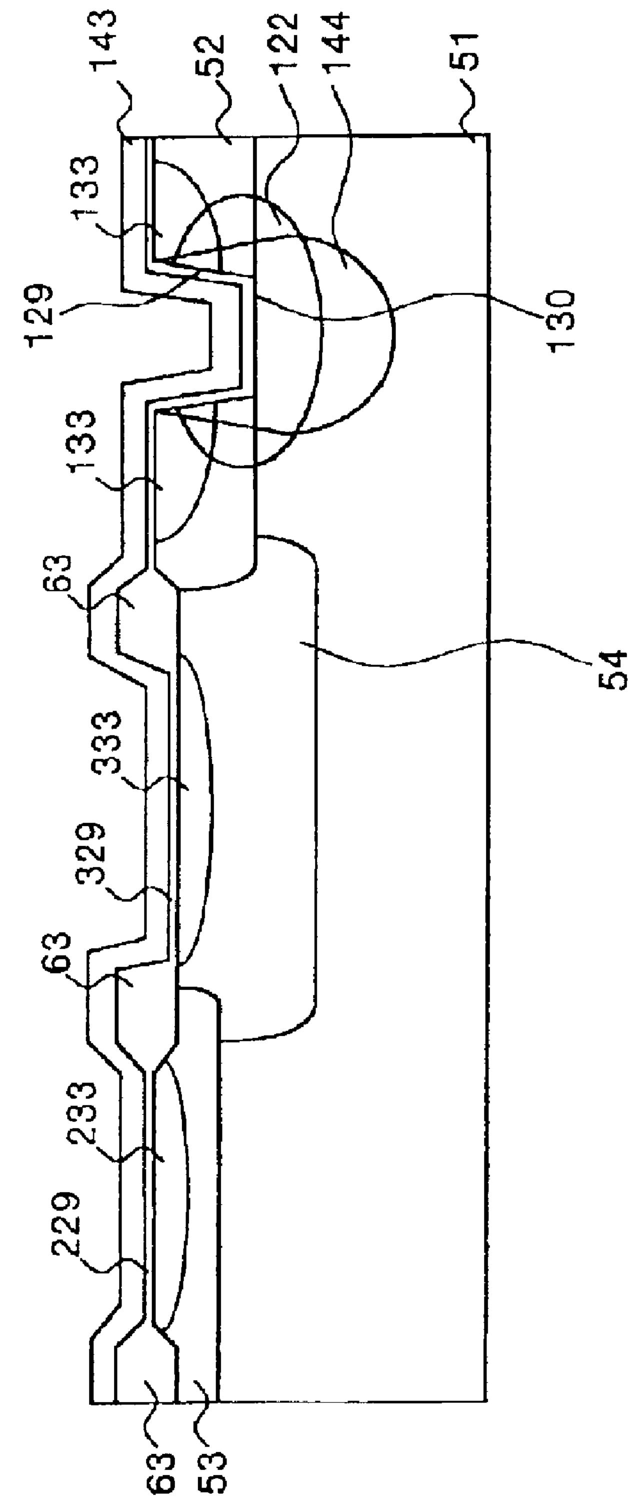

As a result, an extended drain region 122 is formed as shown in FIG. 16. The operations of the first embodiment shown in FIGS. 17–27 are thereafter executed in order and then a passivation film is formed and drain electrodes and source electrodes are formed, to complete a semiconductor device. Like the first embodiment, the third embodiment provides the advantage that a one-chip power IC that is small in size and low in on-resistance and cost can be obtained.

Figure 62:
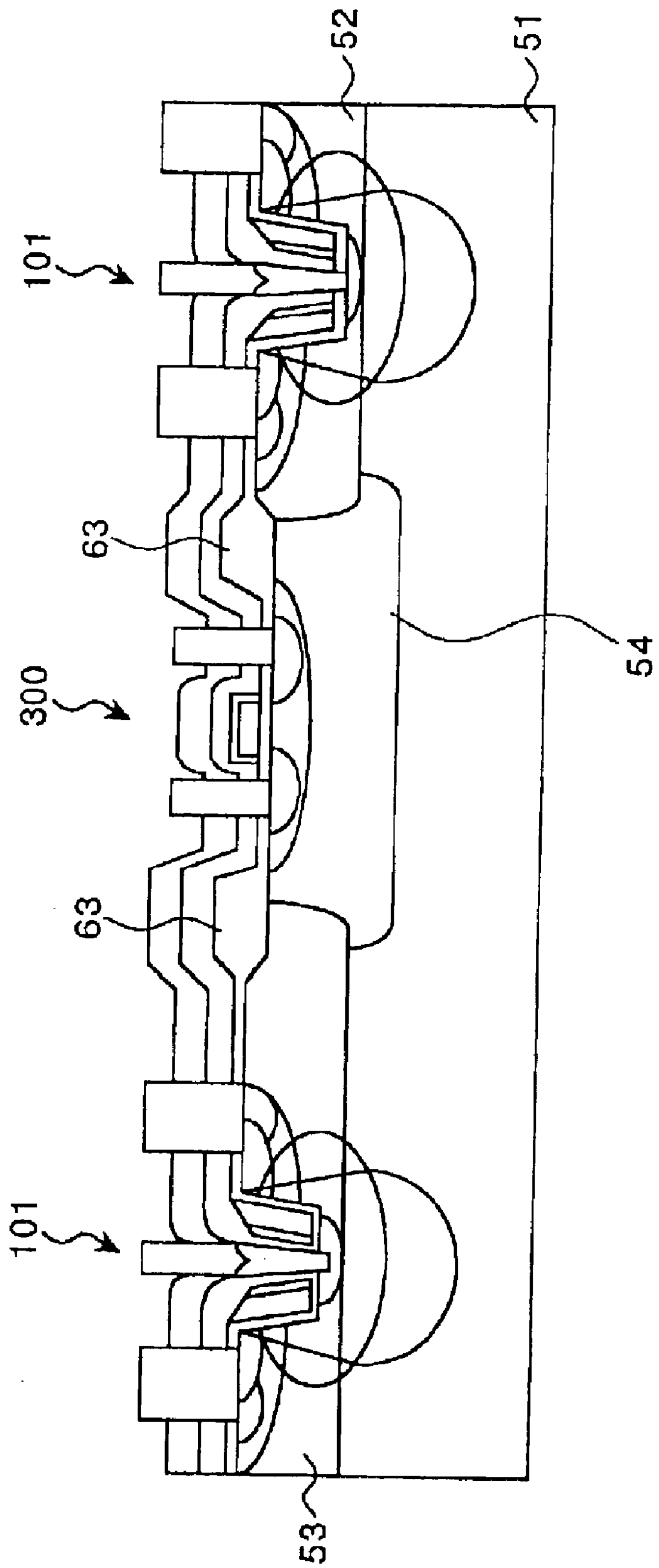
FIG. 62 is a vertical sectional view showing the configuration of a semiconductor device according to a fourth embodiment of the invention.
Figure 63:
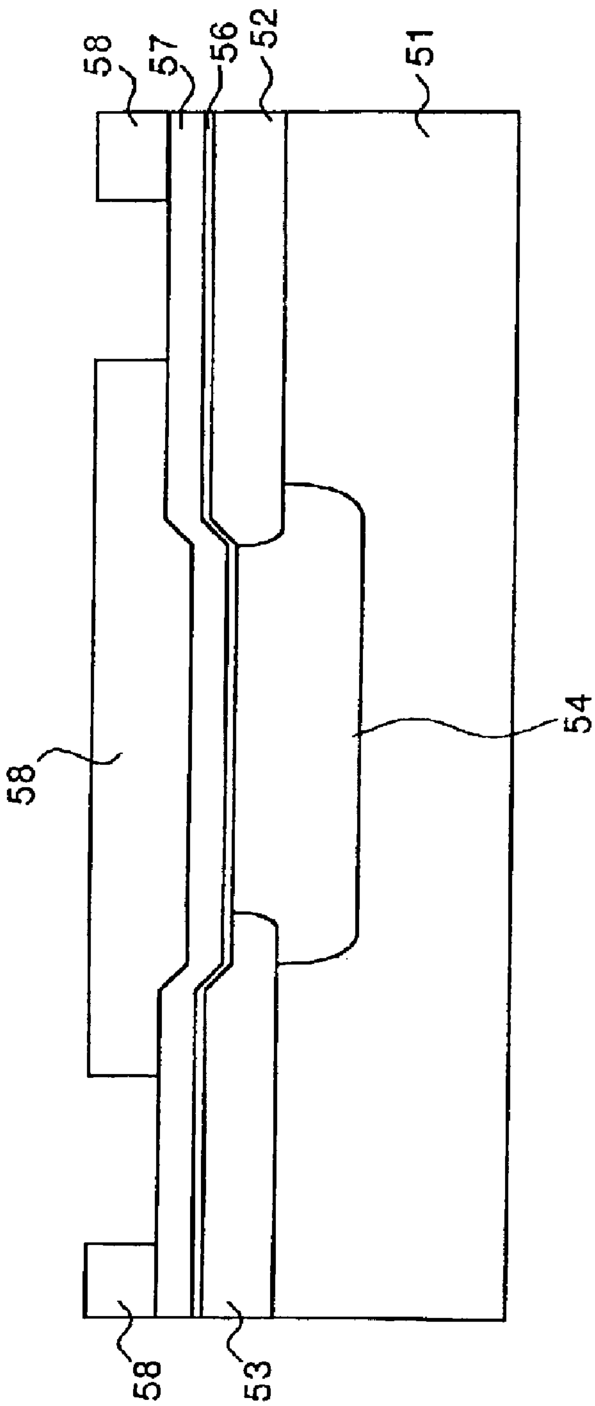
FIGS. 63–70 are vertical sectional views showing intermediate states of manufacture of the embodiment of the semiconductor device shown in FIG. 62.
Figure 64:
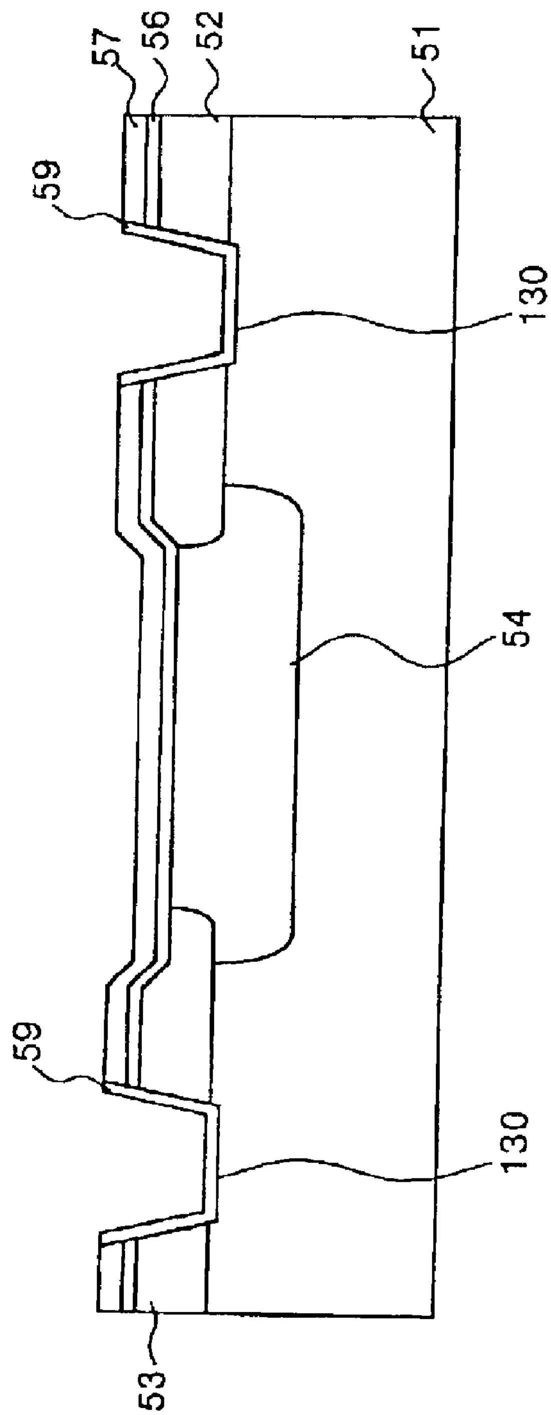
Figure 65:
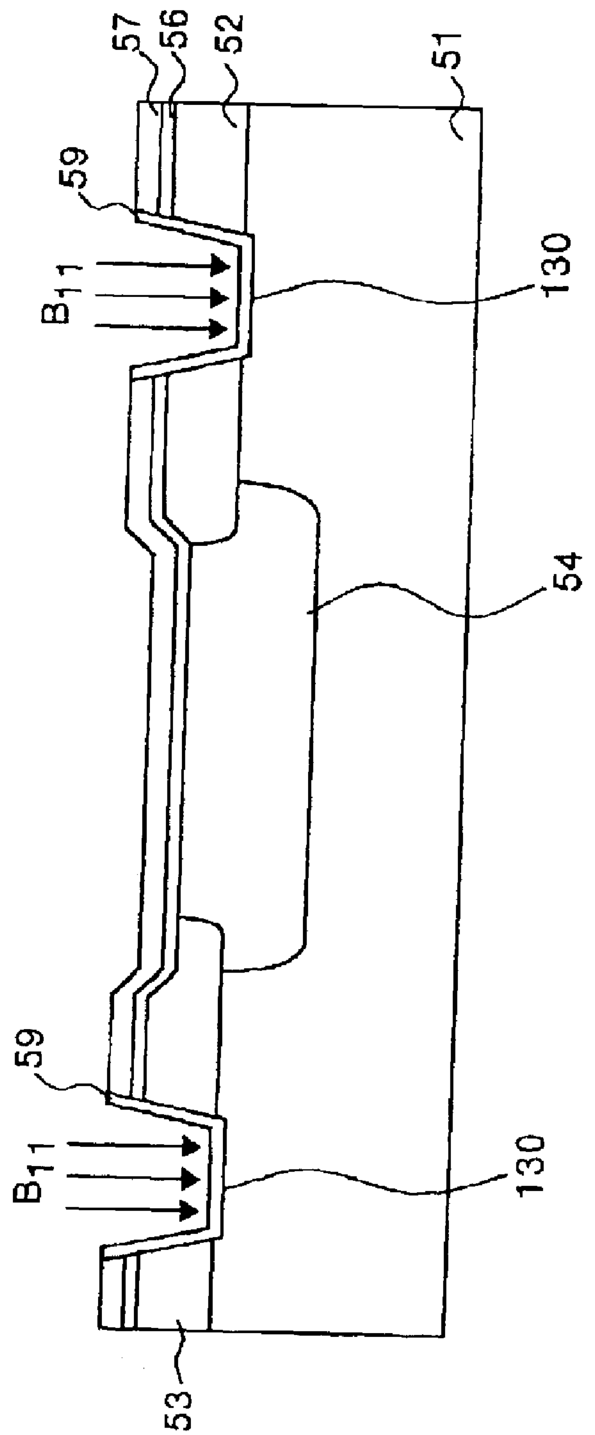
Figure 66:
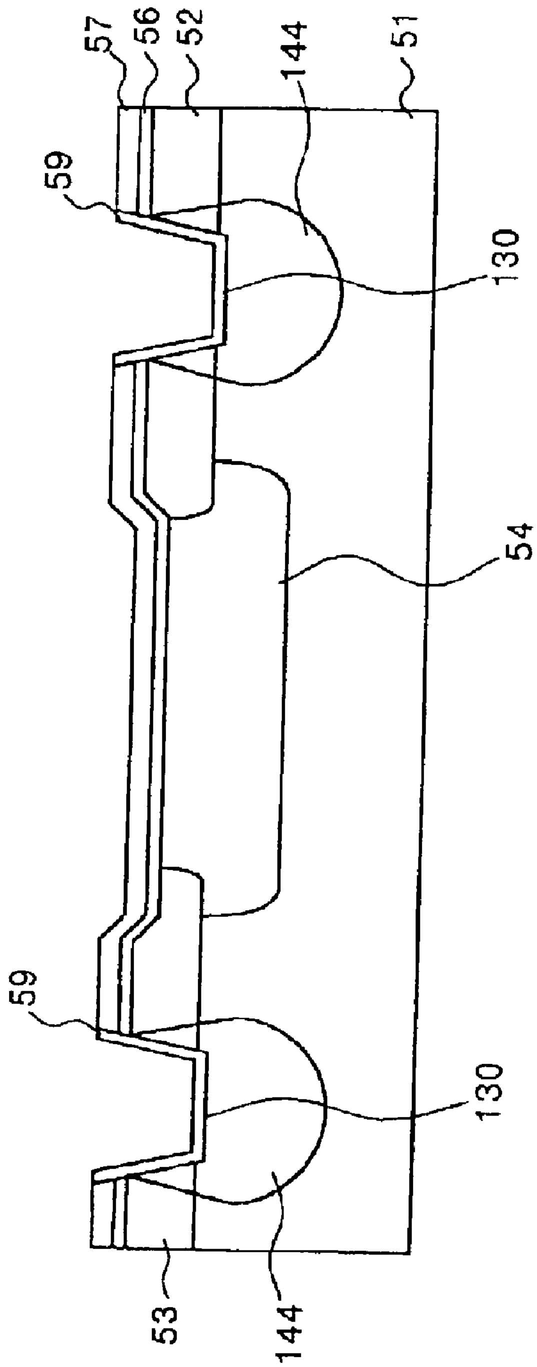
Figure 67:
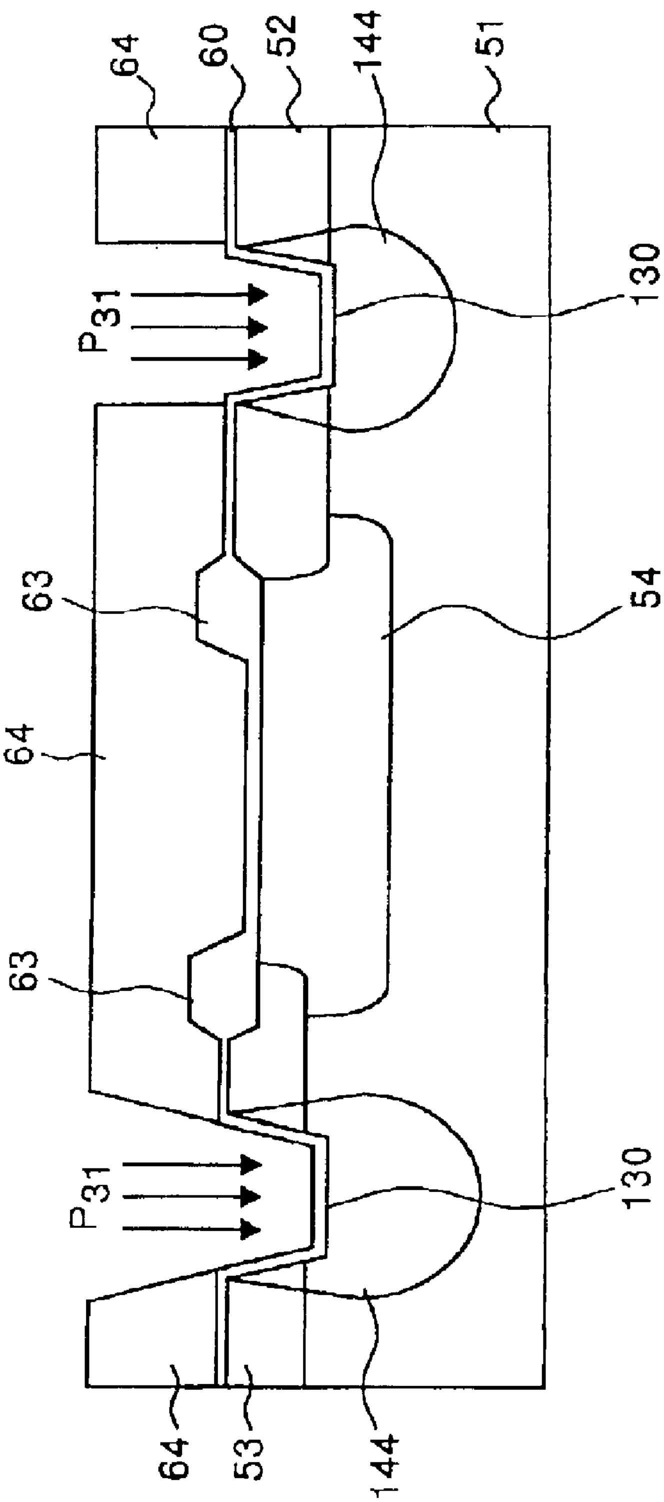
Figure 68:
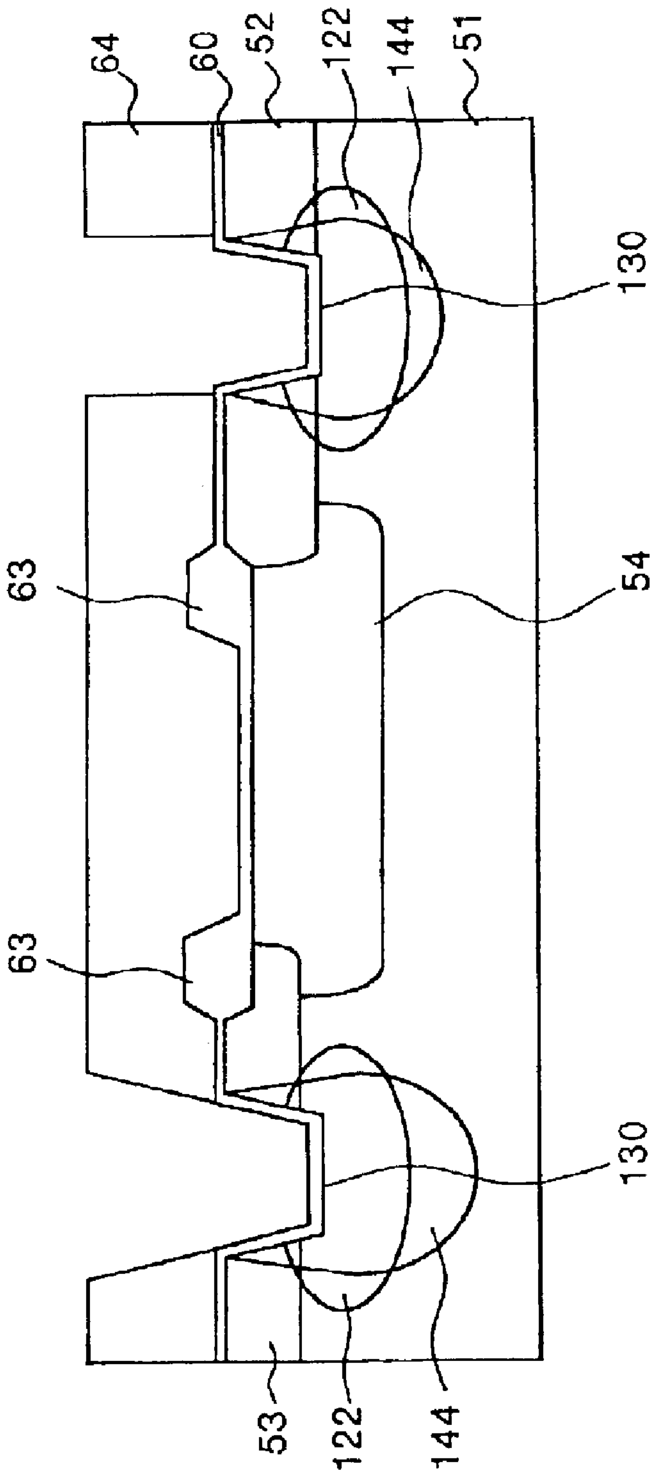
Figure 69:
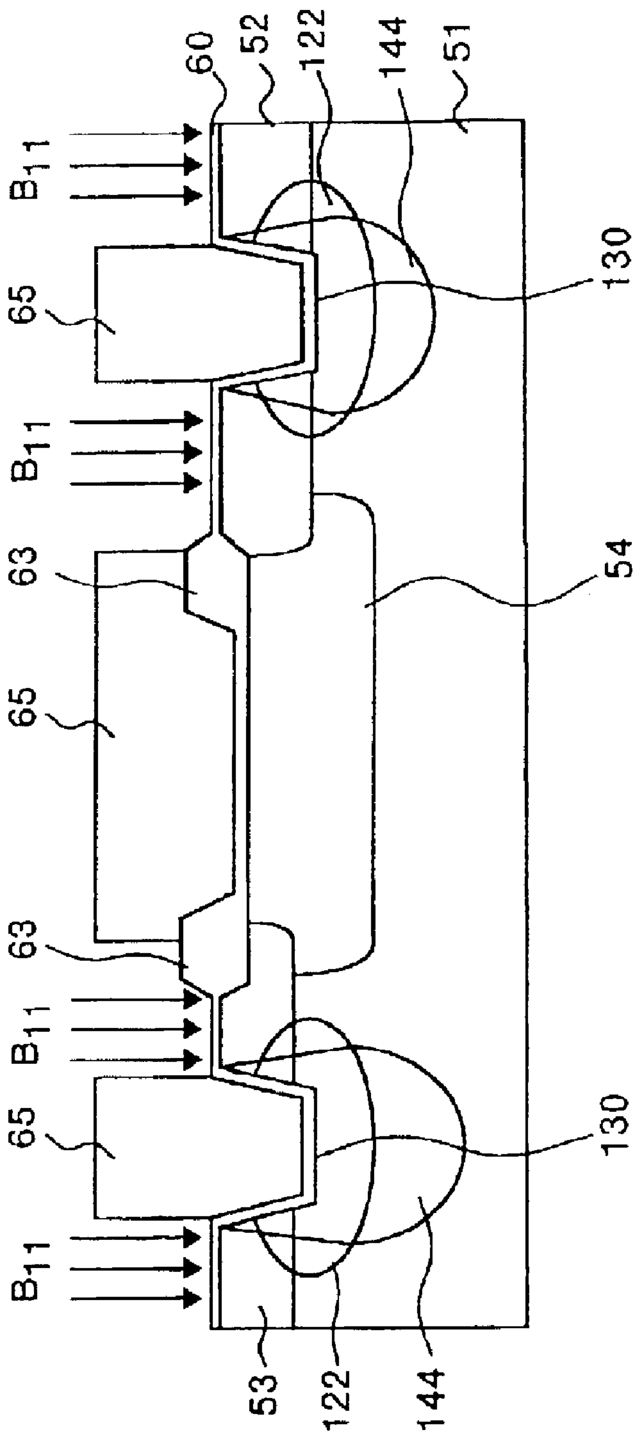
Figure 70:
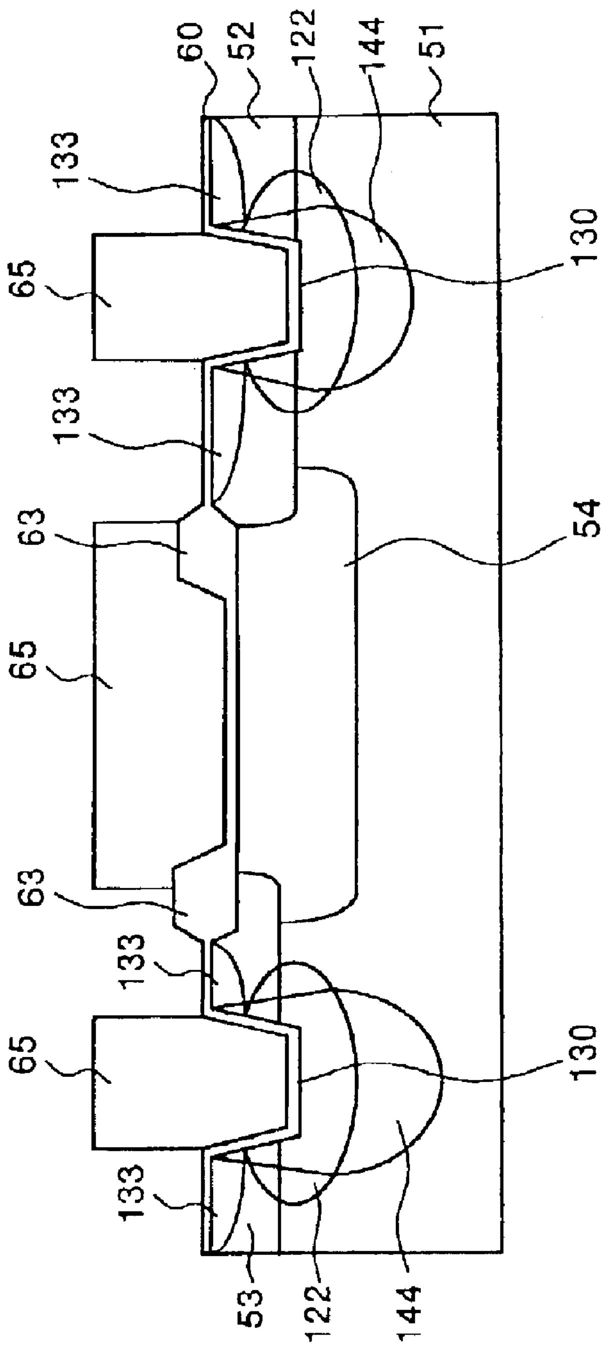

FIG. 62 is a vertical sectional view showing the configuration of a semiconductor device according to a fourth embodiment of the invention. The semiconductor device according to the fourth embodiment is different from the semiconductor device of FIG. 1 according to the first embodiment in that a TLPM 101 (see FIG. 28), rather than the NMOS 200, is formed in the second p-well region 53 and a TLPM 101, rather than the TLPM 100, is formed in the first p-well region 52. The configuration of the TLPM 101 will not be described to avoid redundancy. Regions, electrodes, etc. of the semiconductor device according to the fourth embodiment having the same names in the semiconductor device according to the first embodiment are given the same reference numerals as the latter and will not be described.

A manufacturing process of the semiconductor device shown in FIG. 62 will be described below. FIGS. 63–70 are vertical sectional views showing intermediate states of manufacture of the embodiment of the semiconductor device shown in FIG. 62. First, an n-well region 54 and p-well regions 52 and 53 are formed selectively in a surface layer of a semiconductor substrate 51 and a buffer oxide film 56 and a mask oxide film 57 are formed on the substrate surface in this order in the same manner as in the operations of FIGS. 2–5 of the first embodiment. A mask 58 having openings in trench forming areas is formed on the mask oxide film 57 (see FIG. 63).

The mask oxide film 57 is patterned, the mask 58 is removed, and trench etching is performed, whereby trenches 130 are formed in the first p-well region 52 and the second p-well region 53, respectively. Buffer oxide films 59 are formed on the surfaces of the trenches 130, respectively (see FIG. 64), and the substrate 51 is doped with $B_{11}$ under the bottom surfaces of the trenches 130 (see FIG. 65), whereby field regions 144 are formed for the respective trenches 130 (see FIG. 66).

After the mask oxide film 57 and the buffer oxide films 56 and 59 are removed, selective oxidation films 63 for device isolation are formed in the same manner as in the operations of FIGS. 10–14 of the first embodiment. Then, a mask 64 having openings over the respective trenches 130 is formed on the substrate surface and the substrate 51 is doped with $P_{31}$ (see FIG. 67), to form extended drain regions 122 for the respective trenches 130 (see FIG. 68). Then, a mask 65 having openings in future channel regions of the intended TLPMs is formed on the substrate surface, and the substrate 51 is doped with $B_{11}$ (see FIG. 69), to form channel regions 133 of the intended TLPMs in the first p-well region 52 and the second p-well region 53 (see FIG. 70).

After the mask 65 is removed, the operations of FIGS. 15–27 of the first embodiment are executed on the TLPMs in order and then a passivation film 71 is formed and drain electrodes and source electrodes are formed, to complete a semiconductor device having the configuration of FIG. 62. To lower the on-resistance by increasing the impurity concentration of the extended drain region 122, a TLPM in which the p-well regions 52 and 53 are deeper than the extended drain region 122 and the extended drain region 122 is formed in the p-well regions 52 and 53 may be employed instead of the TLPN 101 shown in FIG. 62. The TLPM 101 in FIG. 62 may be replaced by the TLPM 100 in FIG. 1, the TLPM 103 in FIG. 30, or the TLPM 102 in FIG. 29. Like the first embodiment, the fourth embodiment provides the advantage that a one-chip power IC that is small in size and low in on-resistance and cost can be obtained.

Figure 71:
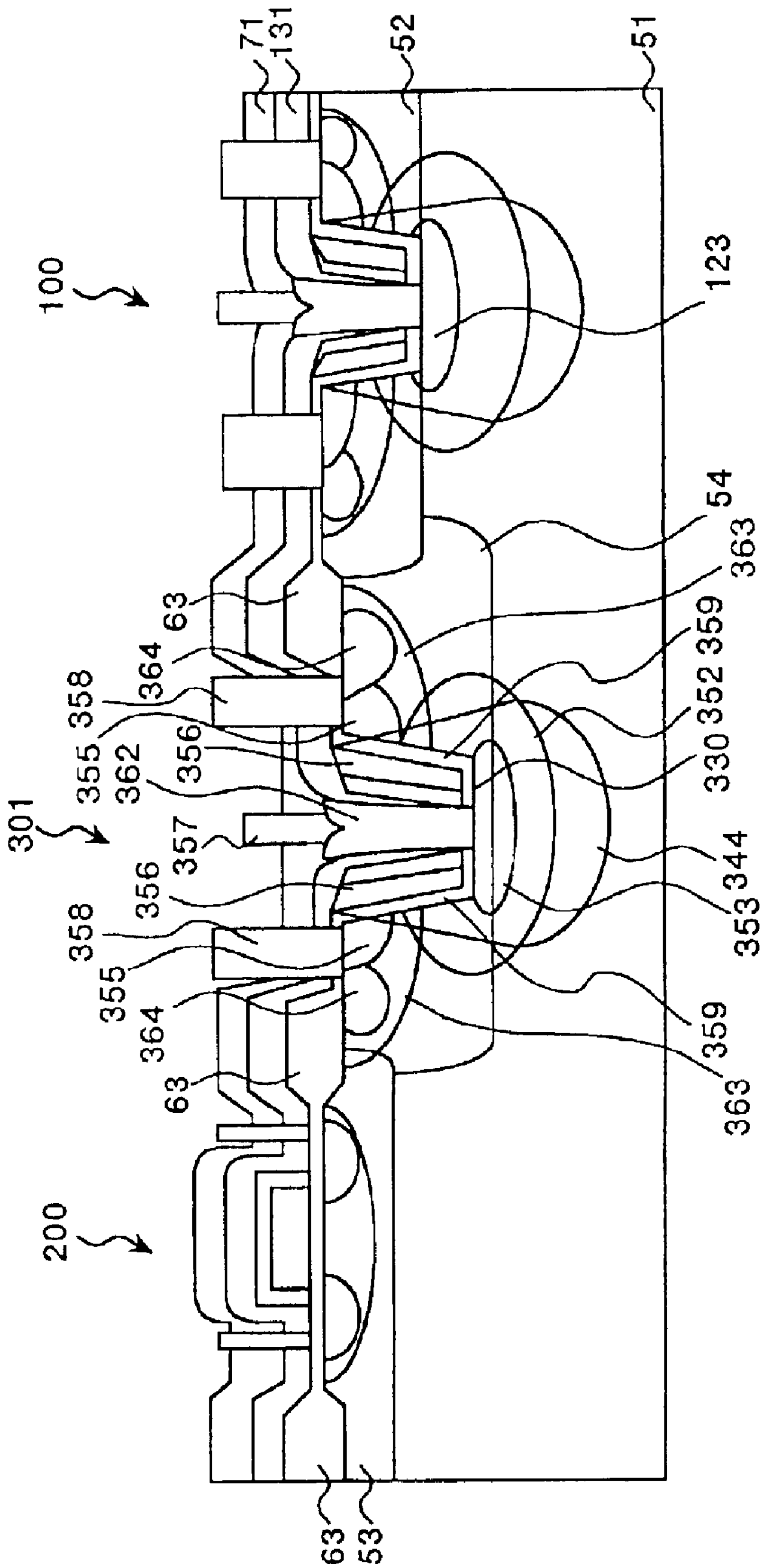
FIG. 71 is a vertical sectional view showing the configuration of a semiconductor device according to a fifth embodiment of the invention.

FIG. 71 is a vertical sectional view showing the configuration of a semiconductor device according to a fifth embodiment of the invention. The semiconductor device according to the fifth embodiment is different from the semiconductor device of FIG. 1 according to the first embodiment in that a TLPM 301, rather than the PMOS 300, is formed in the n-well region 54. The n-type drain region 123 of the TLPM 100 formed in the first p-well region 52 in FIG. 71 is the same as that of the TLPM 100 shown in FIG. 1 except that the shape is slightly different. Regions, electrodes, etc. of the semiconductor device according to the fifth embodiment having the same names in the semiconductor device according to the first embodiment are given the same reference numerals as the latter and will not be described.

The TLPM 301 will be described below. A trench 330 is formed in the n-well region 54. The side surface and the bottom surface of the trench 330 are surrounded by a field region 344, and a p-type extended drain region 352 that is shallower than the field region 344 is provided adjacent to the side surface and the bottom surface of the trench 330. A p-type drain region 353 is provided inside the extended drain region 352. A gate oxide film 359, gate electrodes 356, an oxide film (part of shadow oxide films 68 (described later)), an interlayer insulating film 131, and a drain polysilicon layer 362 are formed inside the trench 330 in this order from the outside.

N-type channel regions 363 are provided on both sides of the trench 330 in a substrate surface layer and p-type source regions 355 are provided in surface layers of the n-type channel regions 363, respectively. N-type plug regions 364 are provided outside the respective source regions 355. Each source electrode 358 penetrates through the interlayer insulating film 131 and a passivation film 71 and is in contact with both of the associated source region 355 and plug region 364 to improve grounding of the substrate 51 and prevent reduction in breakdown voltage even when a large current occurs. A drain electrode 357 penetrates through the passivation film 71 and is in electrical contact with the drain region 353 via the drain polysilicon layer 362.

Figure 72:
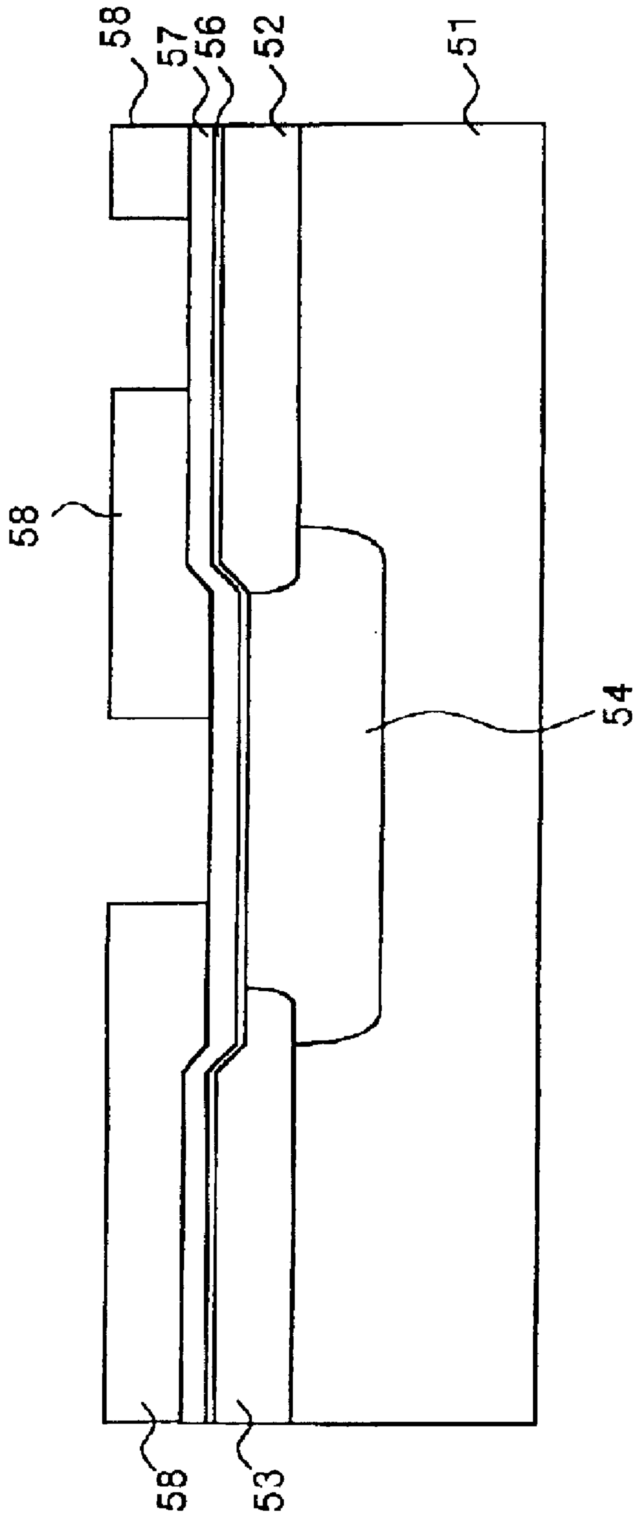
FIGS. 72–90 are vertical sectional views showing intermediate states of manufacture of the embodiment of the semiconductor device shown in FIG. 71.
Figure 73:
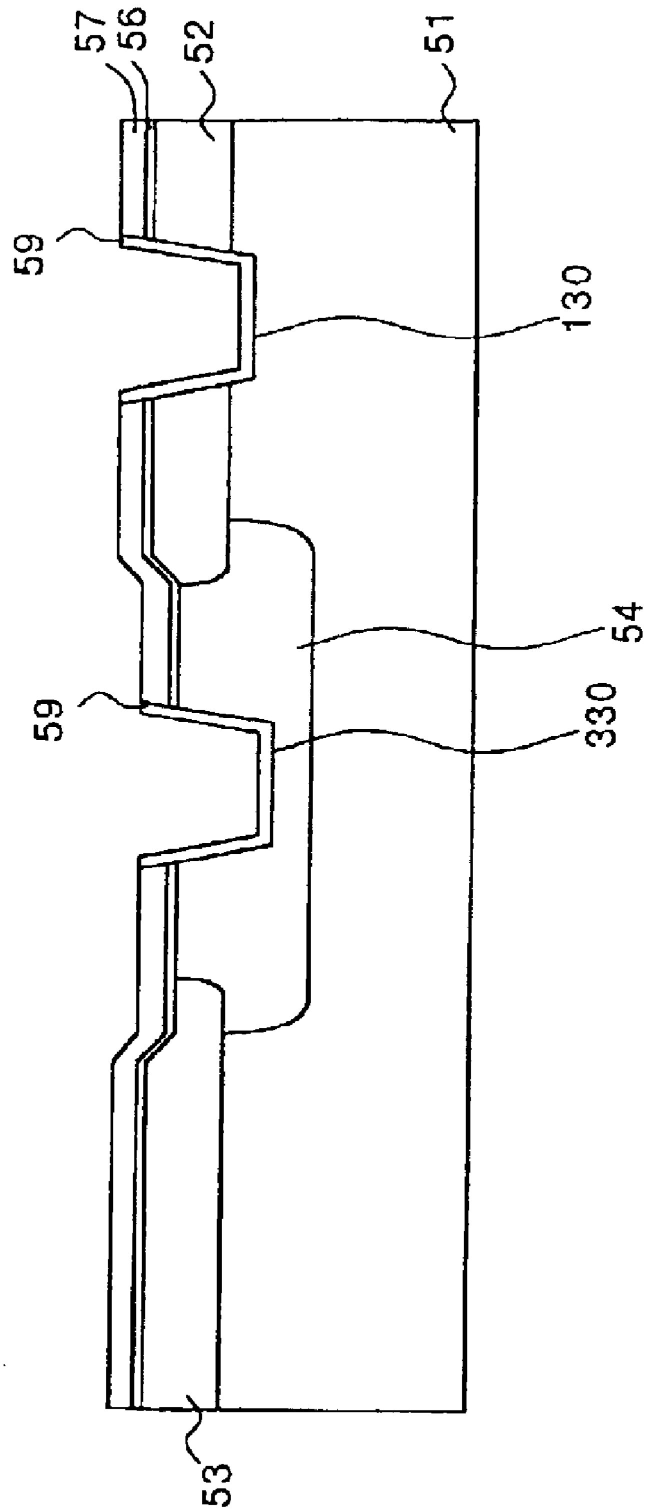

A manufacturing process of the semiconductor device shown in FIG. 71 is described below. FIGS. 72–90 are vertical sectional views showing intermediate states of manufacture of the embodiment of the semiconductor device of FIG. 71. First, an n-well region 54 and p-well regions 52 and 53 are formed selectively in a surface layer of a semiconductor substrate 51 and a buffer oxide film 56 and a mask oxide film 57 are formed on the substrate surface in this order in the same manner as in the operations of FIGS. 2–5 of the first embodiment. Then, a mask 58 having openings in trench forming areas is formed on the mask oxide film 57 (see FIG. 72). The mask oxide film 57 is patterned, the mask 58 is removed, and trench etching is performed, whereby a trench 130 is formed in the first p-well region 52 and a trench 330 is formed in the n-well region 54. Buffer oxide films 59 are formed on the surfaces of the trenches 130 and 330, respectively (see FIG. 73).

Figure 74:
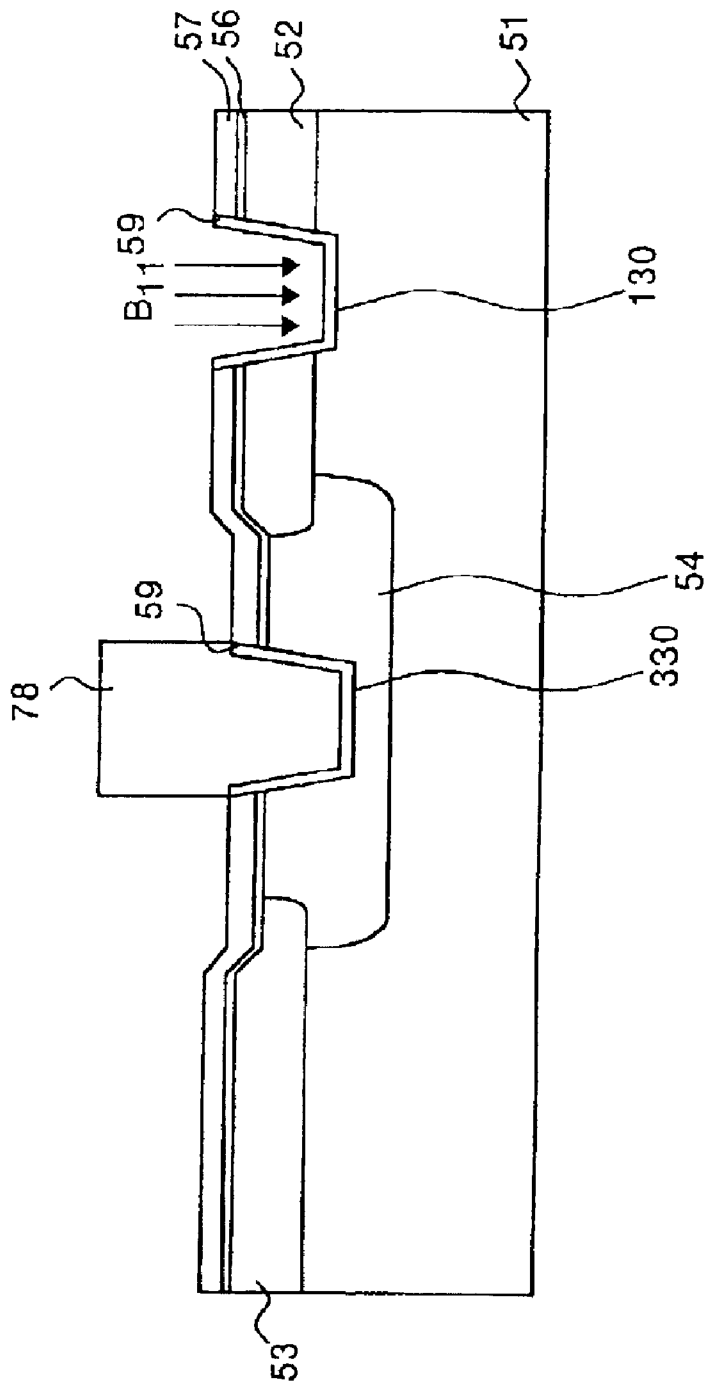
Figure 75:
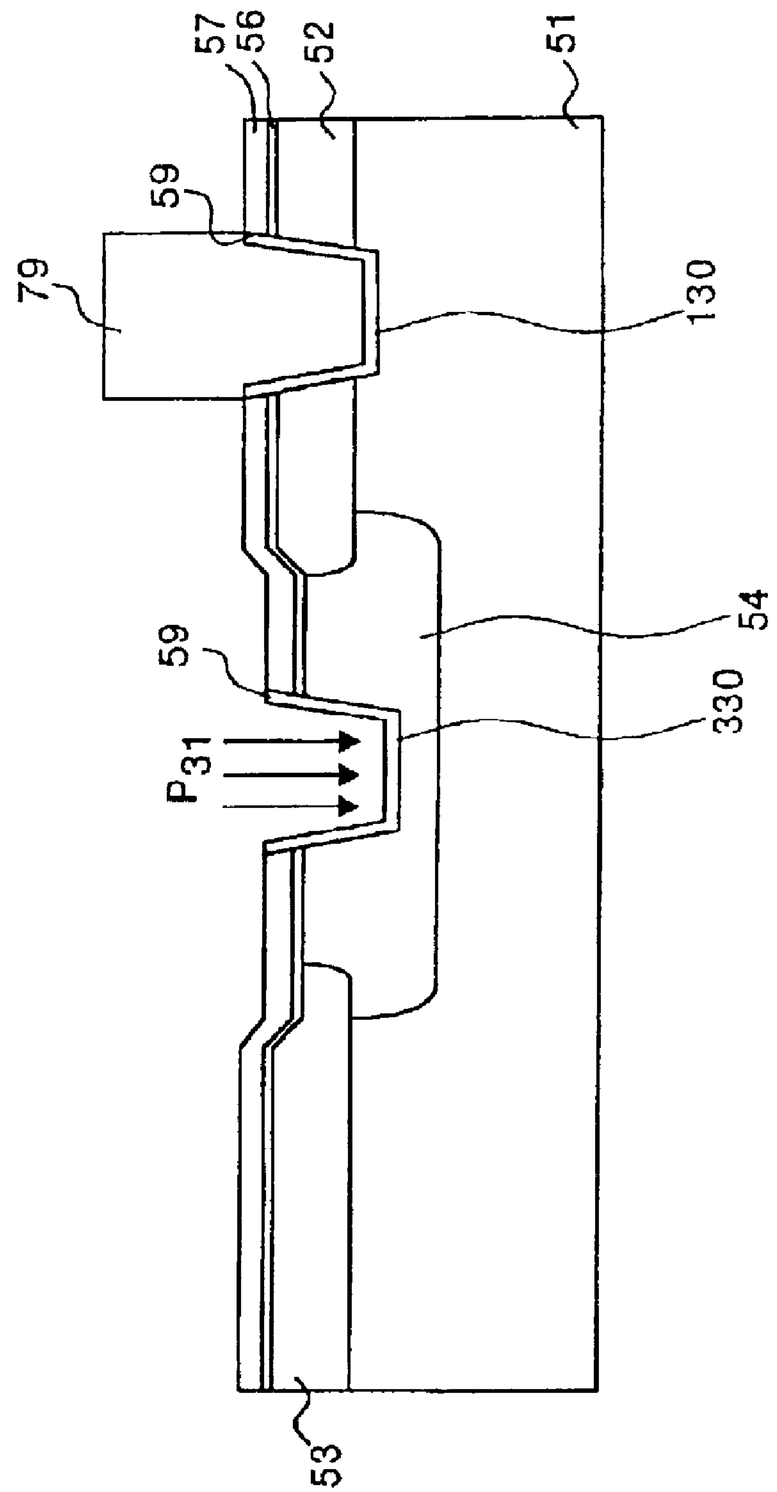
Figure 76:
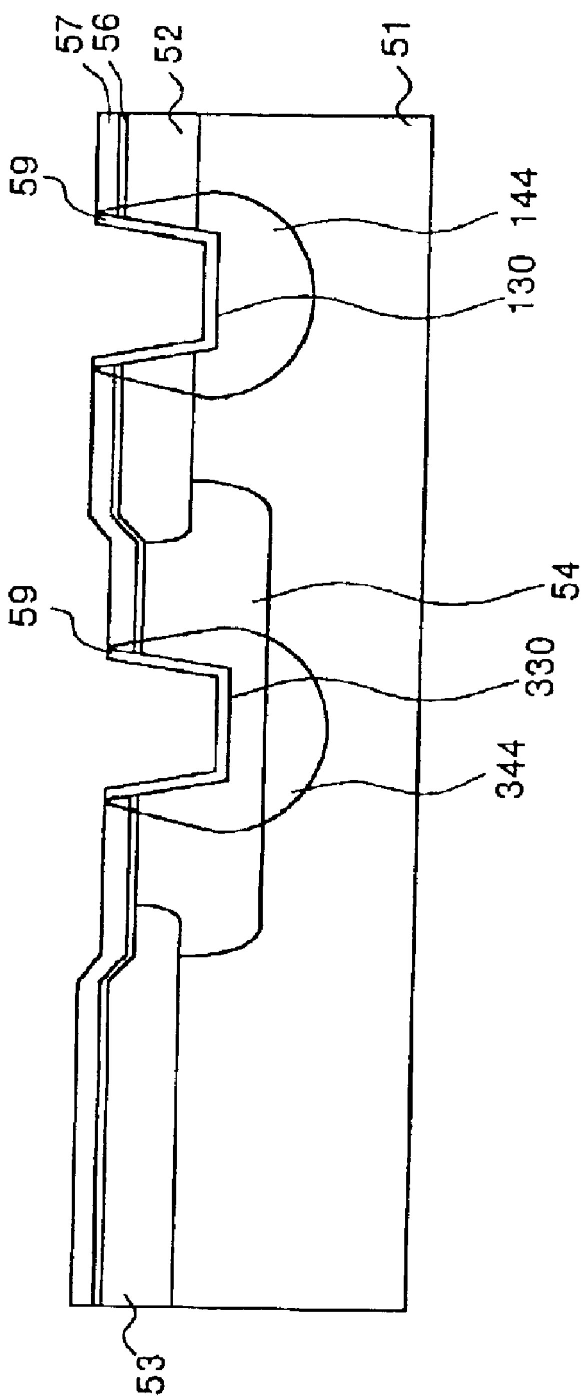
Figure 77:
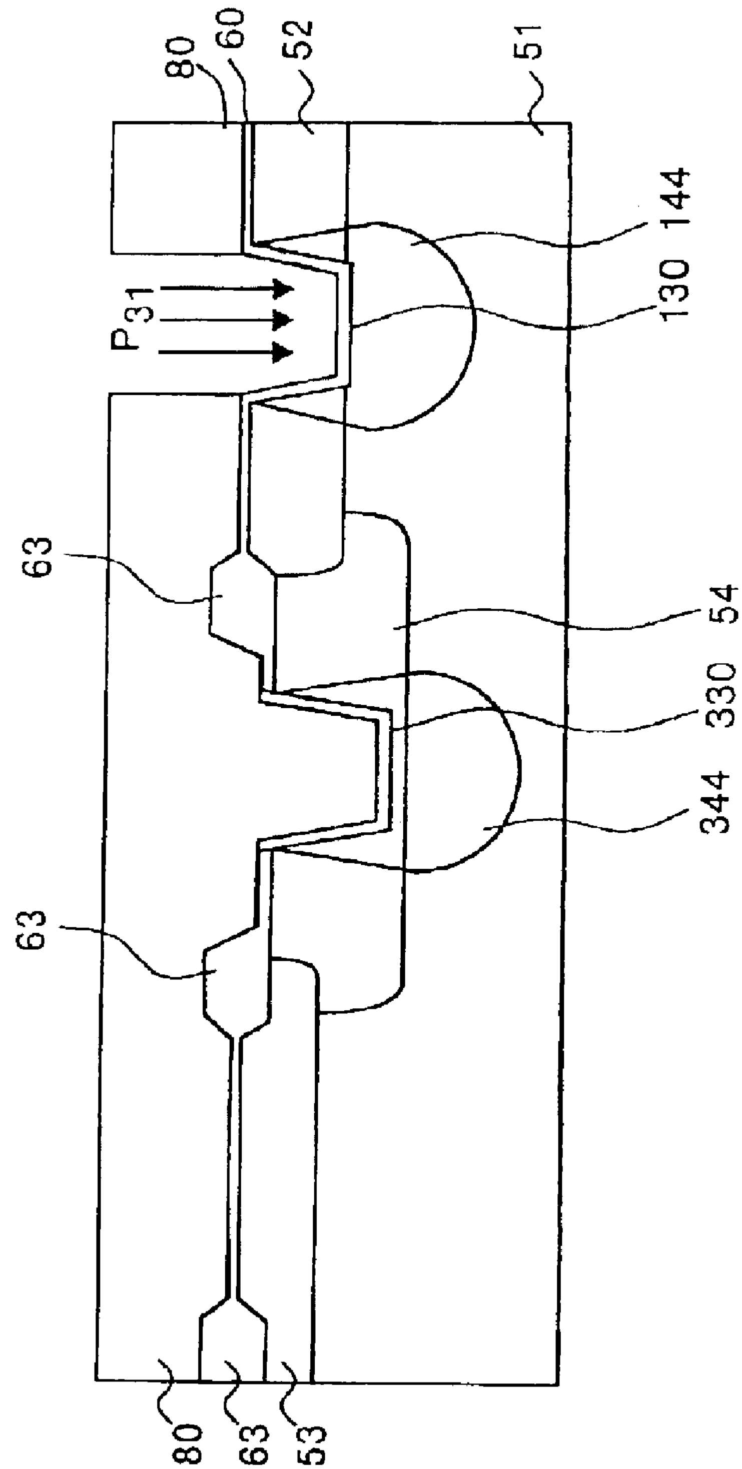
Figure 78:
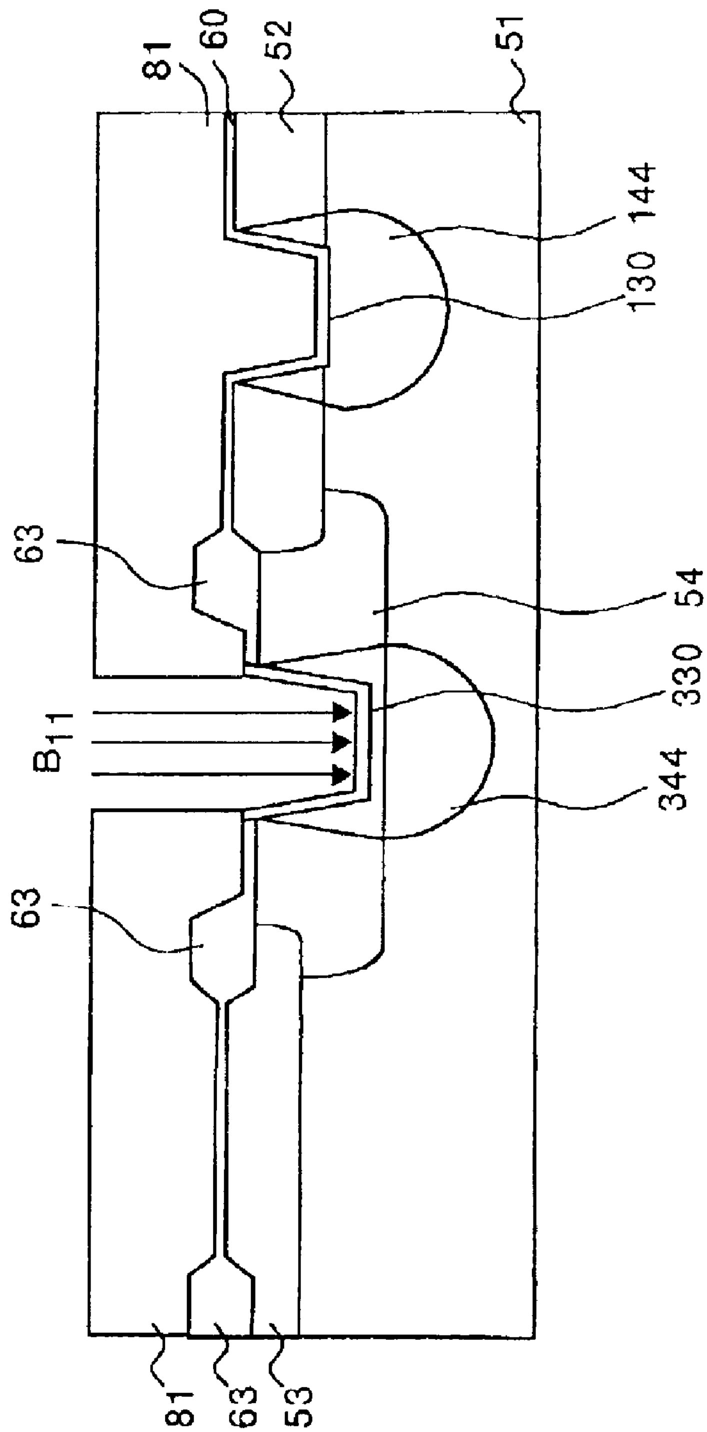

Subsequently, the trench 330 in the n-well region 54 is covered with a mask 78 and the substrate 51 is doped with $B_{11}$ under the bottom surface of the trench 130 in the first p-well region 52 (see FIG. 74). After the mask 78 is removed, the trench 130 in the first p-well region 52 is covered with a mask 79 and the substrate 51 is doped with $P_{31}$ under the bottom surface of the trench 330 in the n-well region 54 (see FIG. 75). The mask 79 is removed and thermal diffusion is performed, to form field regions 144 and 344 for the respective trenches 130 and 330 (see FIG. 76). The operations of FIG. 74 and the operations of FIG. 75 may be reversed.

After the mask oxide film 57 and the buffer oxide films 56 and 59 are removed, selective oxidation films 63 for device isolation are formed in the same manner as in the operations of FIGS. 10–14 of the first embodiment. Then, a mask 80 having an opening over the trench 130 in the first p-well region 52 is formed on the substrate surface and the substrate 51 is doped with $P_{31}$ (see FIG. 77). After the mask 80 is removed, a mask 81 having an opening over the trench 330 in the n-well region 54 is formed on the substrate surface and the substrate 51 is doped with $B_{11}$ (see FIG. 78). The mask 81 is removed and thermal diffusion is performed, to form extended drain regions 122 and 352 for the respective trenches 130 and 330

Figure 79:
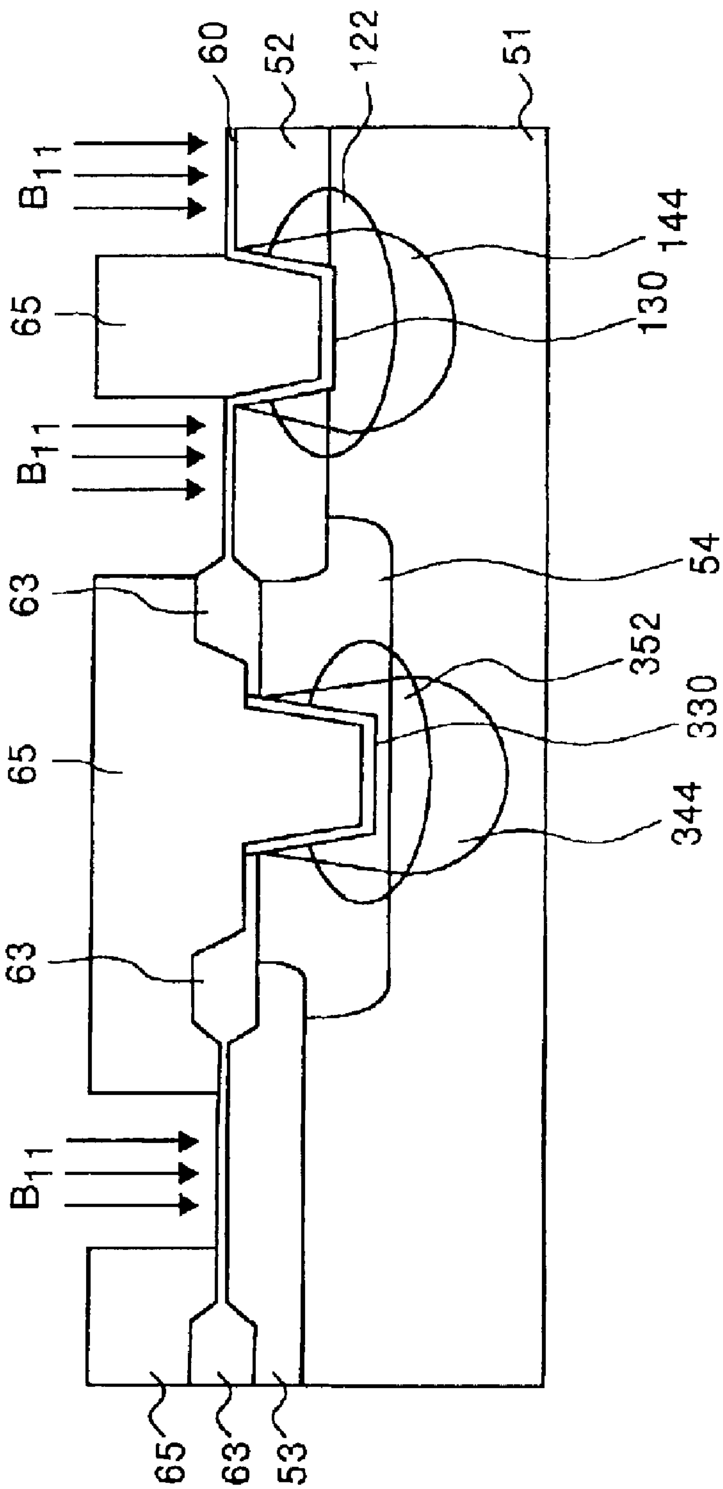
Figure 80:
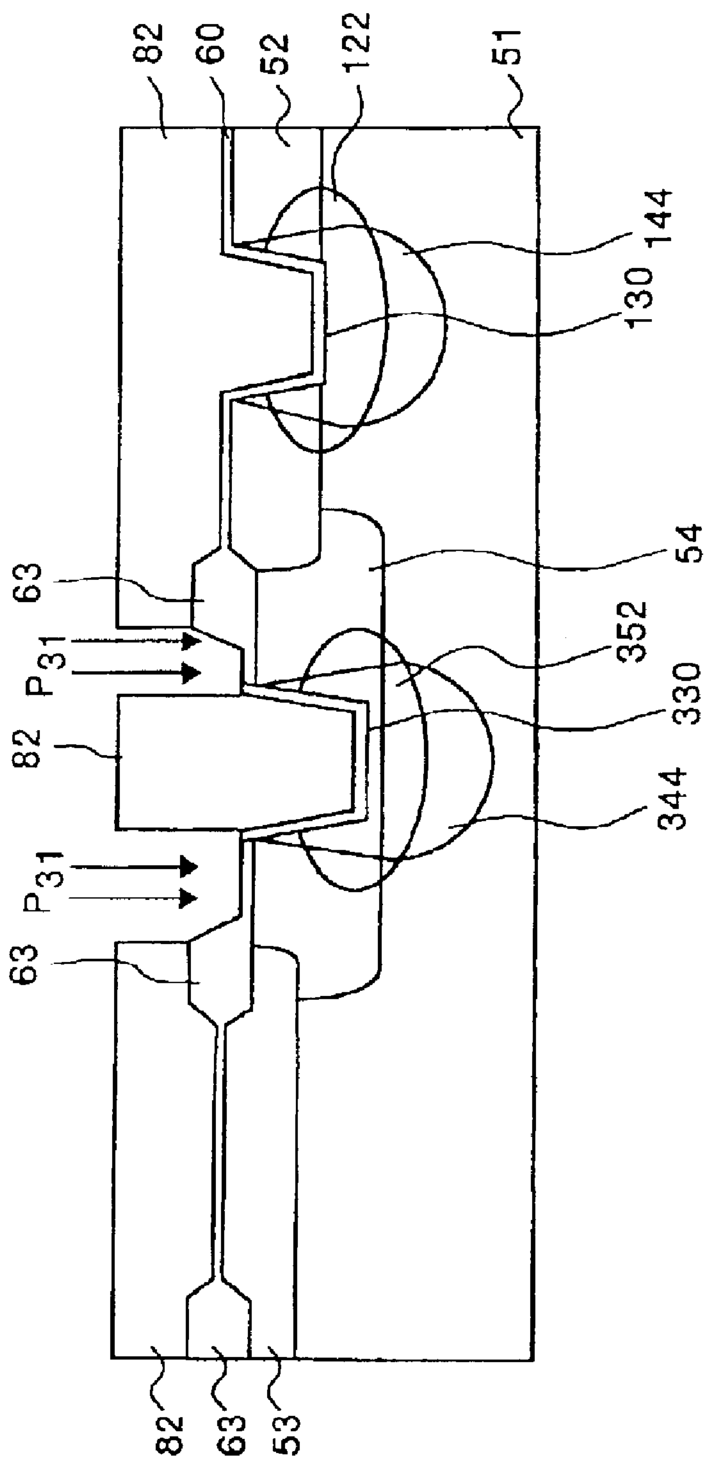
Figure 81:
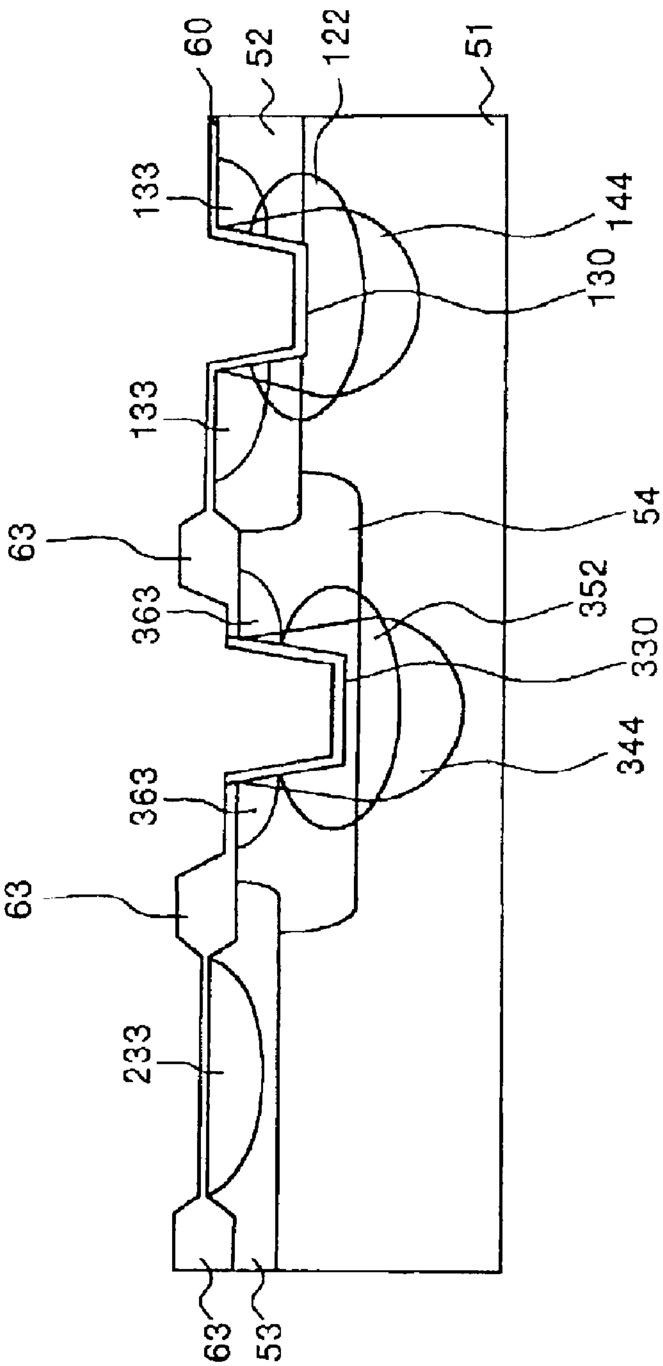

Then, a mask 65 having openings in areas corresponding to future channel regions of the TLPM to be formed in the first p-well region 52 and an area corresponding to the NMOS to be formed in the second p-well region 53 is formed on the substrate surface, and the substrate 51 is doped with $B_{11}$ (FIG. 79). After the mask 65 is removed, a mask 82 having openings in areas corresponding to future channel regions of the TLPM to be formed in the n-well region 54 is formed on the substrate surface and the substrate 51 is doped with $P_{31}$ (see +80). The mask 82 is removed and thermal diffusion is performed, whereby channel regions 133 of the intended TLPM are formed in the first p-well region 52, a channel region 233 of the intended NMOS is formed in the second p-well region 53, and channel regions 363 of the intended TLPM are formed in the n-well region 54 (see FIG. 81). The operations of FIG. 79 and FIG. 80 may be revered.

Figure 82:
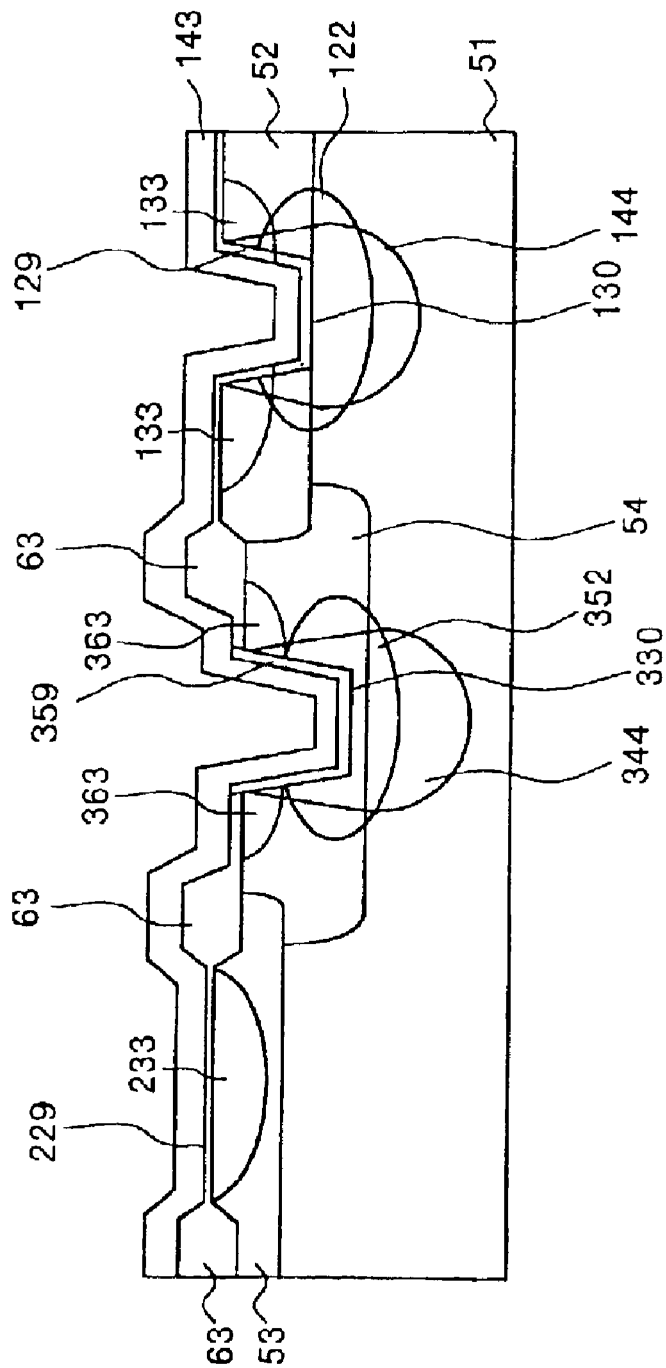
Figure 83:
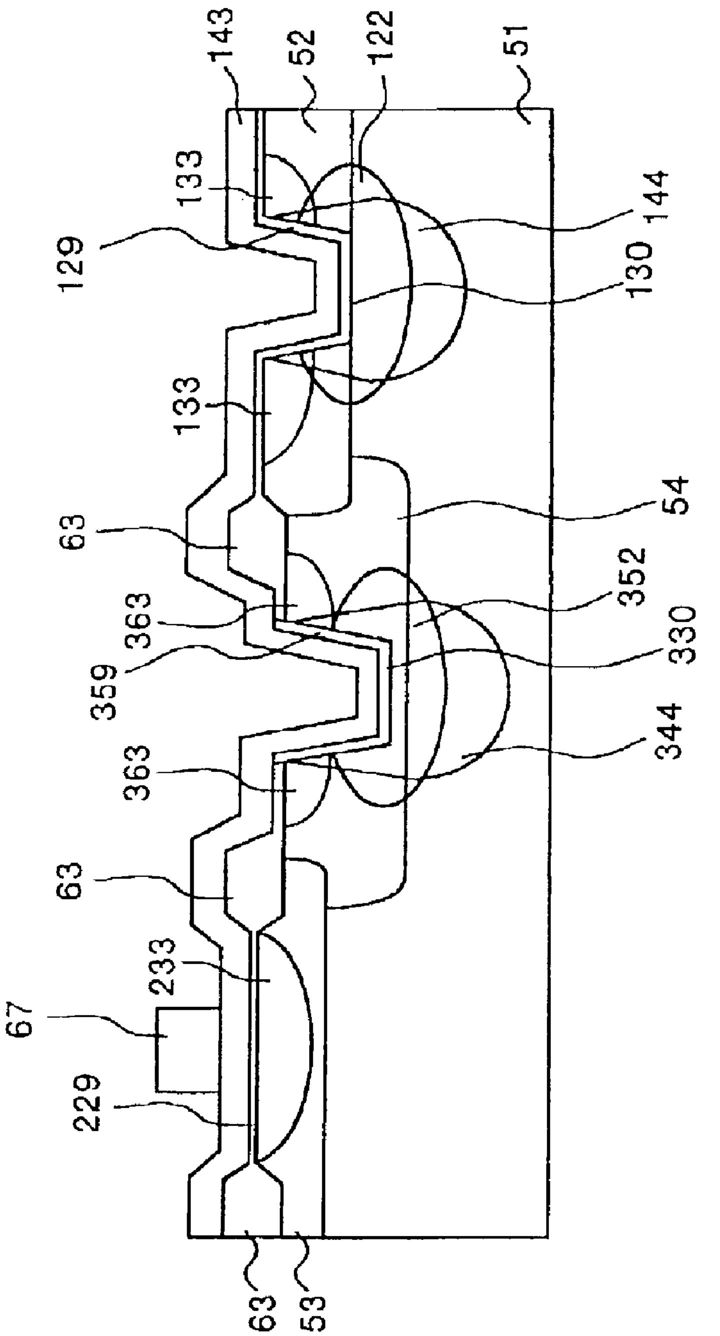
Figure 84:
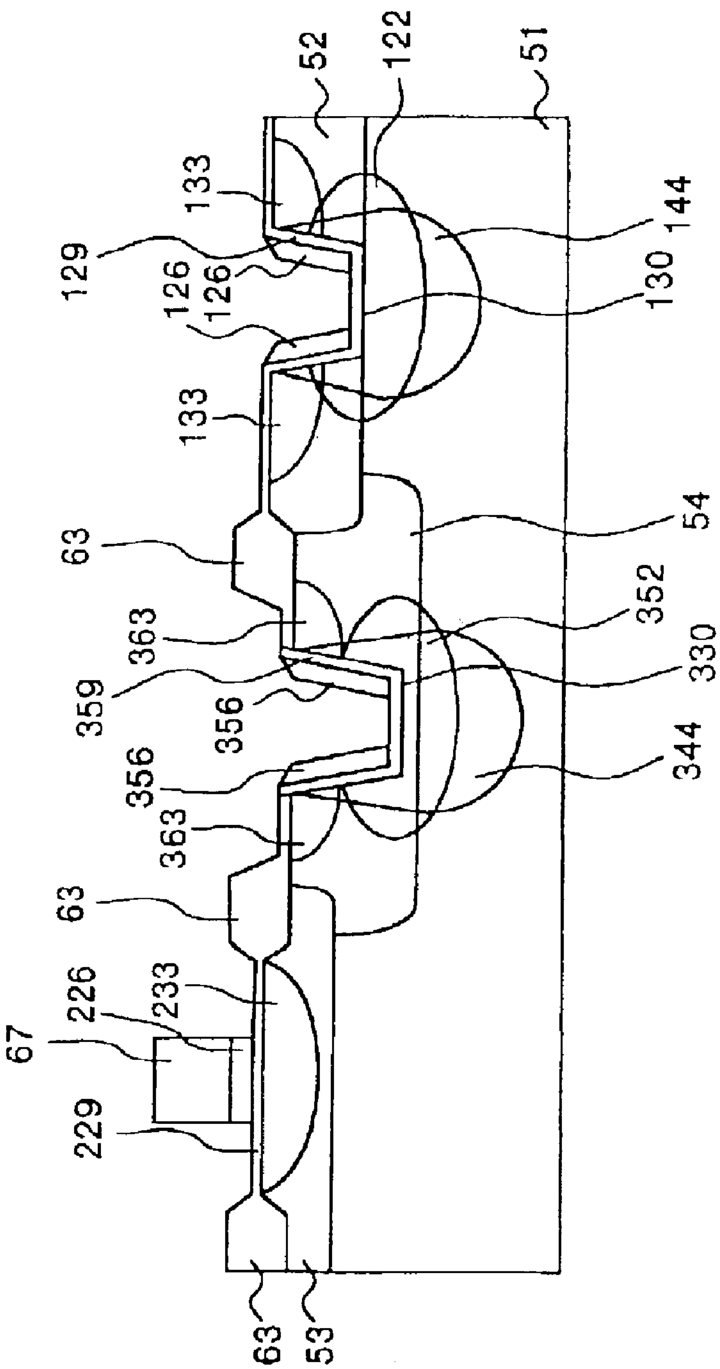

After the buffer oxide film 60 is removed, a common thin oxide film to become gate oxide films 129, 359, and 229 of the intended TLPMs and NMOS, respectively, is formed on the substrate surface and a polysilicon layer 143 is laid thereon (see FIG. 82). A mask 67 is formed on the polysilicon layer 143 only in an area corresponding to a future gate electrode of the intended NMOS (see FIG. 83). The polysilicon layer 143 is etched by using the mask 67, whereby gate electrodes 126 and 356 of the intended TLPMs are formed inside the trenches 130 and 330 by self-alignment and, at the same time, a gate electrode 226 of the intended NMOS is formed (see FIG. 84).

Figure 85:
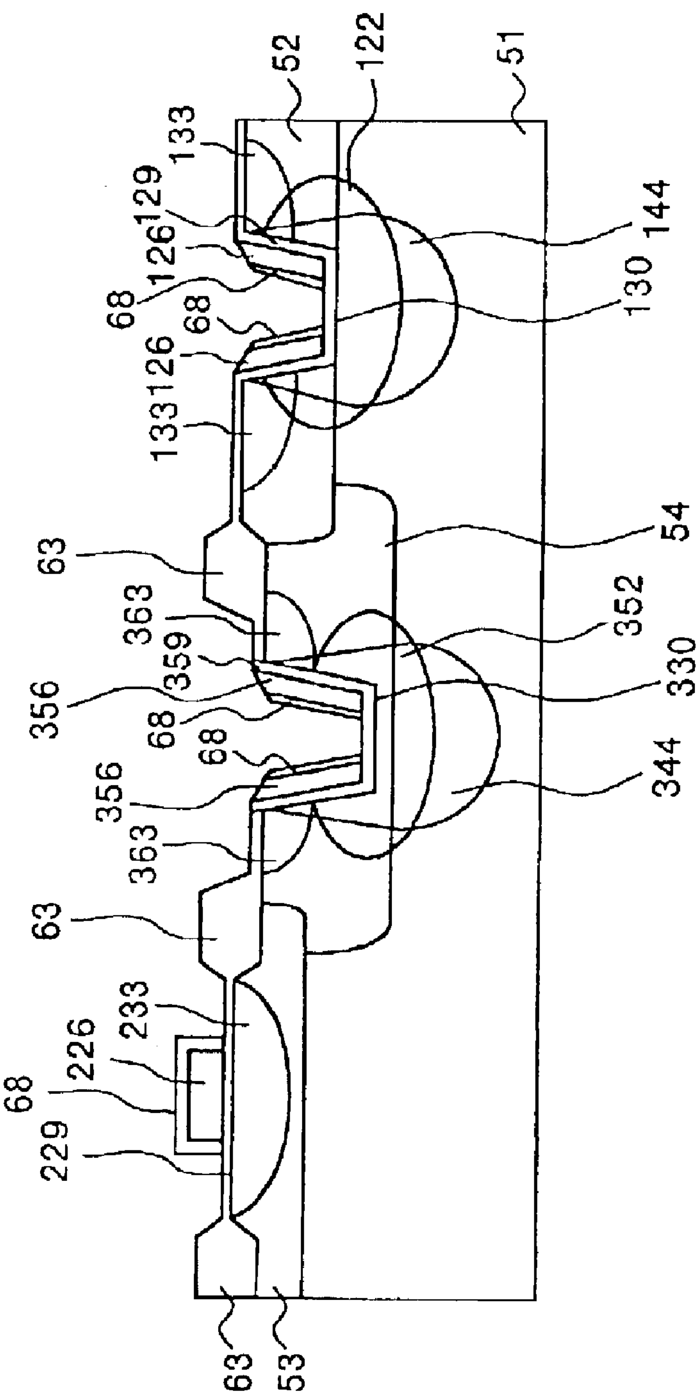
Figure 86:
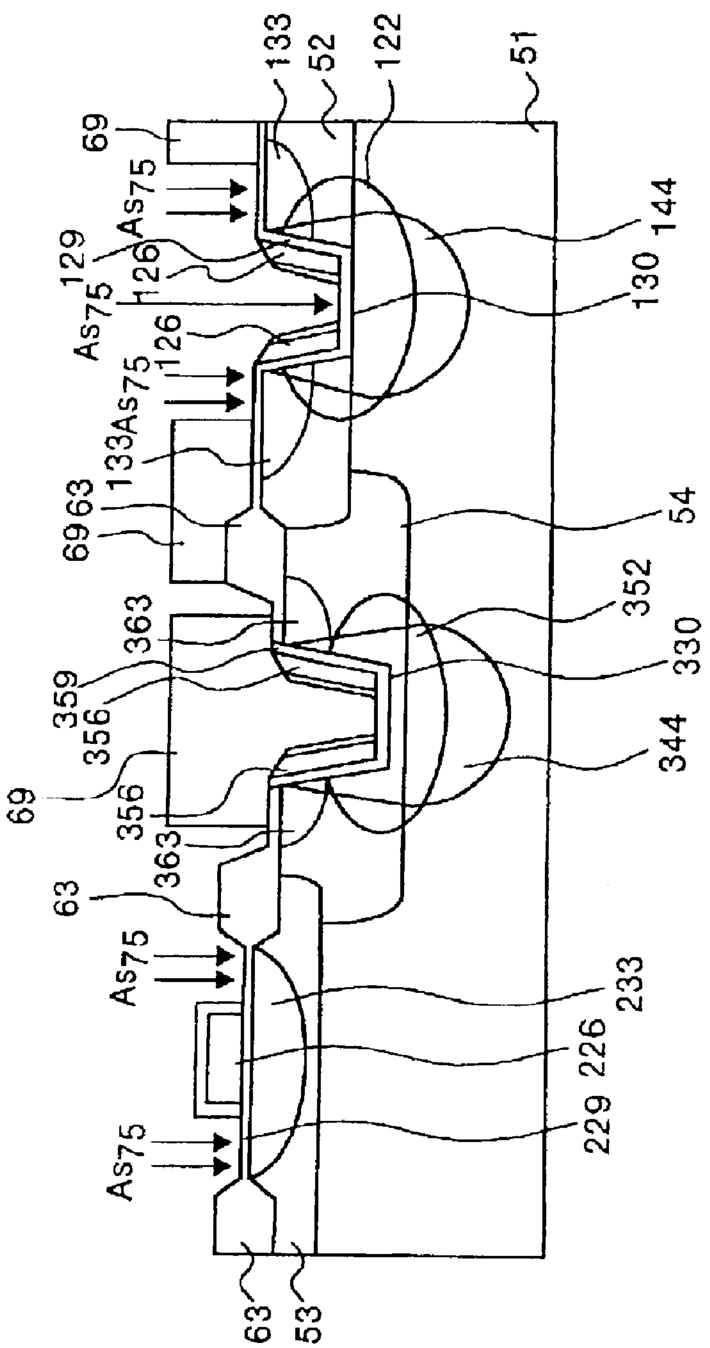
Figure 87:
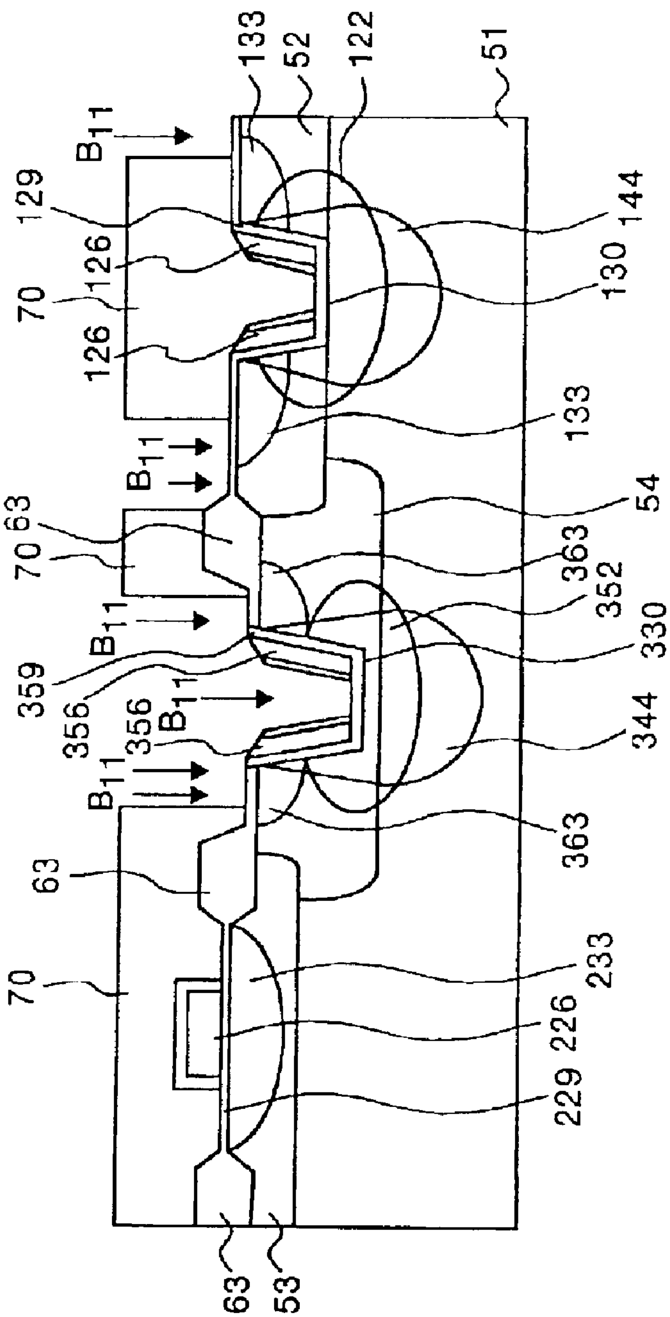
Figure 88:
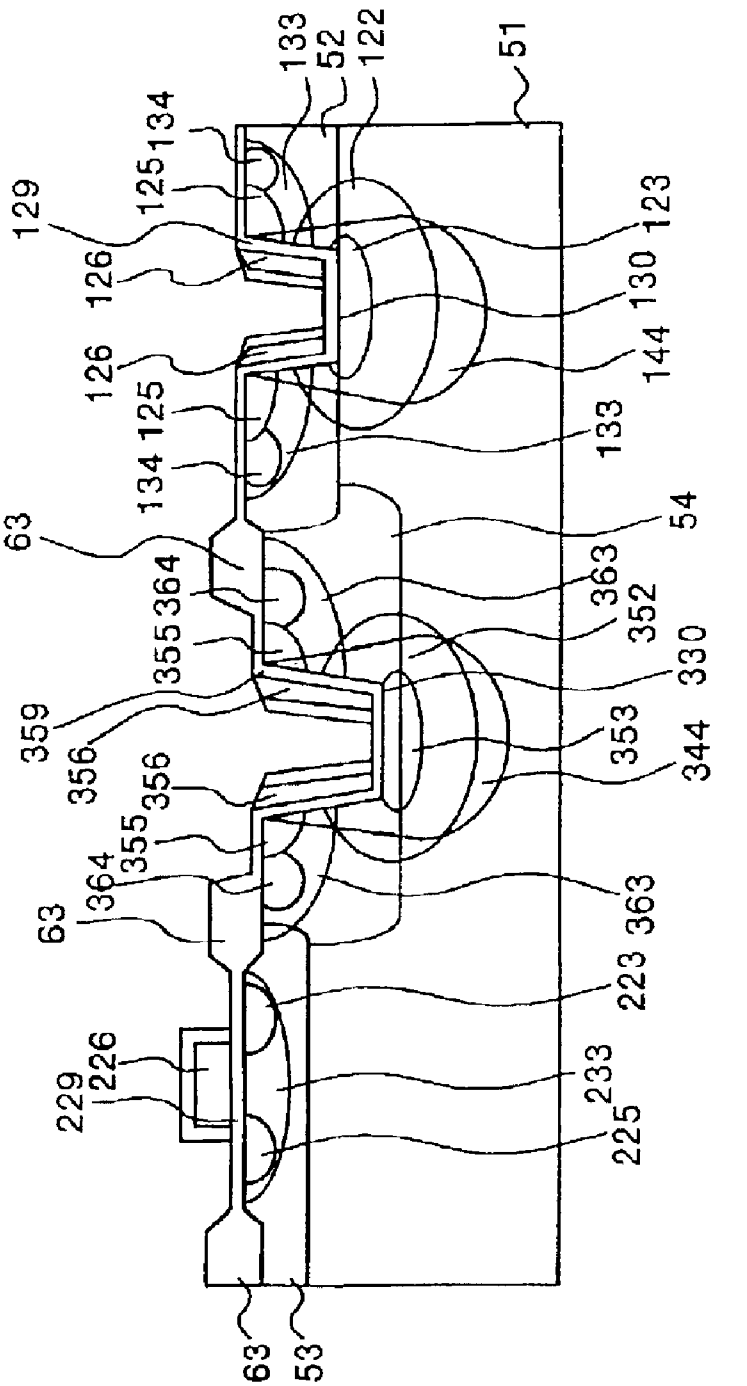

The mask 67 is removed and shadow oxide films 68 are formed to cover the gate electrodes 126 and 356 of the intended TLPMs and the gate electrode 226 of the intended NMOS (see FIG. 85). Then, a mask 69 having openings in areas corresponding to a future drain region and source regions of the TLPM to be formed in the first p-well region 52 and an area in which the intended NMOS is formed on the substrate surface, and the substrate 51 is doped with $As_{75}$ (see FIG. 86). After the mask 69 is removed, a mask 70 having openings in areas corresponding to future plug regions of the TLPM to be formed in the first p-well region 52 and a future drain region and source regions of the TLPM to be formed in the n-well region 54 is formed on the substrate surface and the substrate 51 is doped with $B_{11}$ (see FIG. 87).

The mask 70 is removed and thermal diffusion is performed. Thus, a drain region 123, source regions 125, and plug regions 134 of the TLPM to be formed in the first p-well region 52, a source region 225 and a drain region 223 of the intended NMOS, and a drain region 353, source regions 355, and plug regions 364 of the TLPM to be formed in the n-well region 54 are formed at the same time. (see FIG. 88). The operations of FIG. 86 and FIG. 87 may be reversed.

Figure 89:
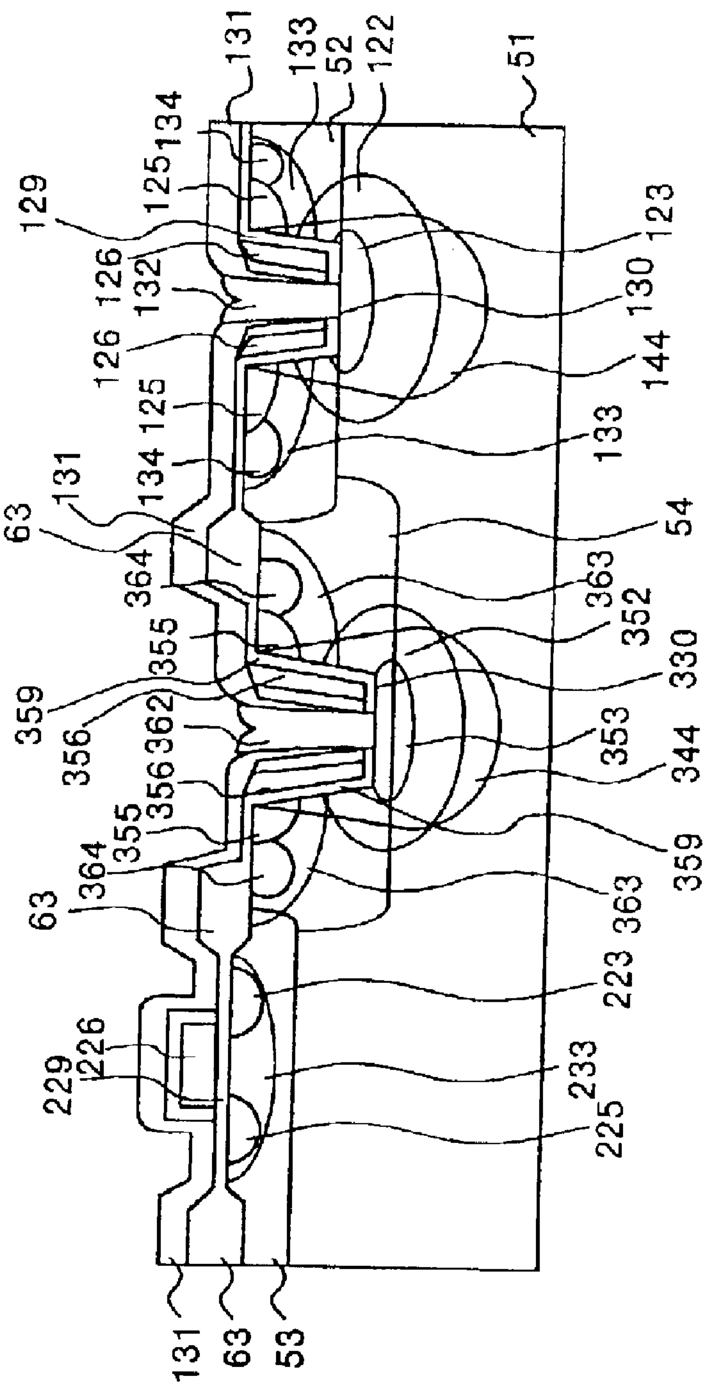
Figure 90:
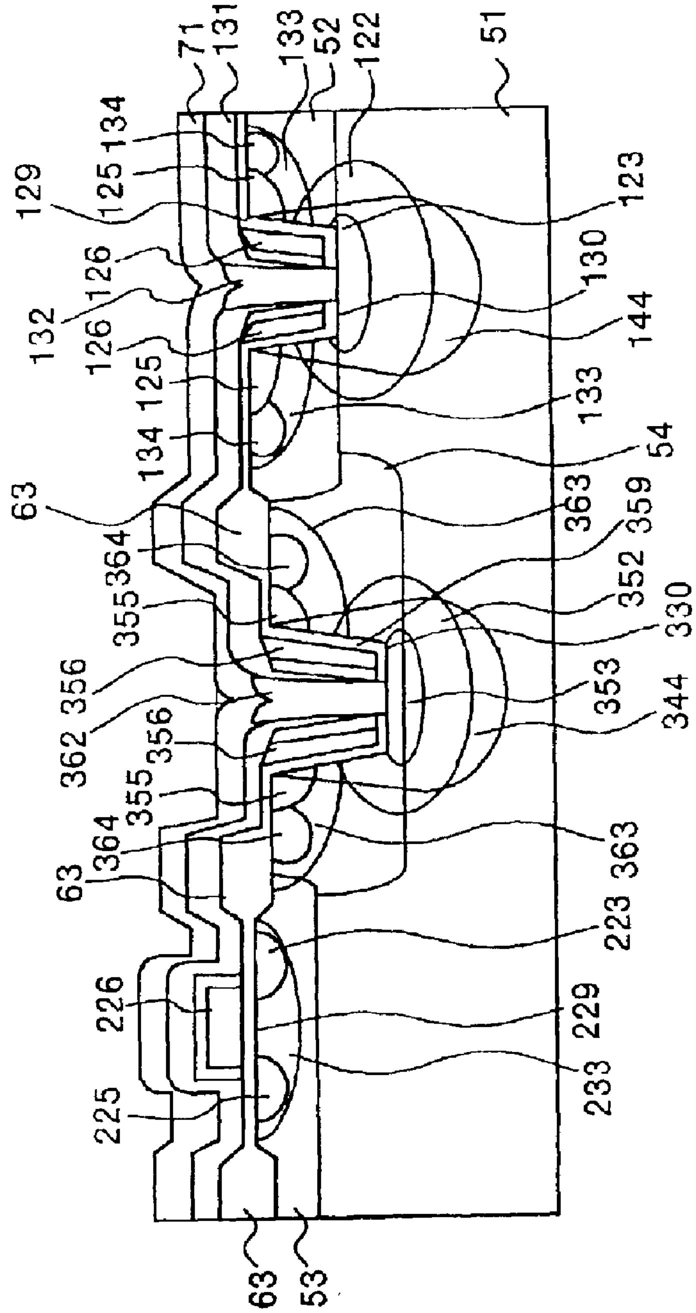

Subsequently, an interlayer insulating film 131 is laid over the substrate surface, and portions of the interlayer insulating film 131 inside the respective trenches 130 and 330 are etched away by self-alignment to form contact holes, which are then filled with respective drain polysilicon layers 132 and 362 (see FIG. 89). A passivation film 71 is formed over the substrate surface (see FIG. 90).

Subsequently, the passivation film 71 is patterned to form contact holes. A metal film is formed on the passivation film 71 and then patterned, whereby a drain electrode 127 and source electrodes 128 of the TLPM to be formed in the first p-well region 52, a drain electrode 357 and source electrodes 358 of the TLPM to be formed in the n-well region 54, and a drain electrode 227 and a source electrode 228 of the intended NMOS are formed at the same time. In this manner, a semiconductor device is completed in which the TLPM 100, the NMOS 200, and the TLPM 301 are integrated on the same semiconductor substrate 51 as shown in FIG. 71. Although in the example of FIG. 71 the p-well region 52 where the TLPM 100 is formed and the n-well region 54 where the TLPM 301 is formed are adjacent to each other, the semiconductor device can be manufactured in the same manner even where the TLPMs 100 and 301 are not adjacent to each other.

In the TLPM 100 shown in FIG. 71, even where the impurity concentration of the extended drain region 122 is increased to lower the on-resistance, the breakdown voltage can be kept high by making the first p-well region 52 deeper than the extended drain region 122.

In FIG. 71, in the case where a DC-DC converter having the n-type TLPM 100 and the p-type TLPM 301 is to be formed, the n-well region 54 is made deeper than the extended drain region 352 and the extended drain region 352 is formed in the n-well region 54, which provides the following advantage. To form a DC-DC converter, it is necessary to give the same potential to the drain electrodes 127 and 357 of the n-type TLPM 100 and the p-type TLPM 301. Therefore, if the extended drain region 352 were deeper than the n-well region 54, the extended drain region 352 would be connected to the p-type substrate 51 and they would have the same potential. On the other hand, since the source electrode 128 of the n-type TLPM 100 is at the same potential as the substrate 51, a short-circuit would develop between the source electrode 128 and the drain electrodes 127 and 357 via the substrate 51. The intended function of a DC-DC converter could not be attained. This problem can be avoided by making the n-well region 54 deeper than the extended drain region 352. That is, the extended drain region 352 can be isolated from the substrate 51 and hence a short-circuit does not develop between the source electrode 128 and the drain electrodes 127 and 357.

Figure 91:
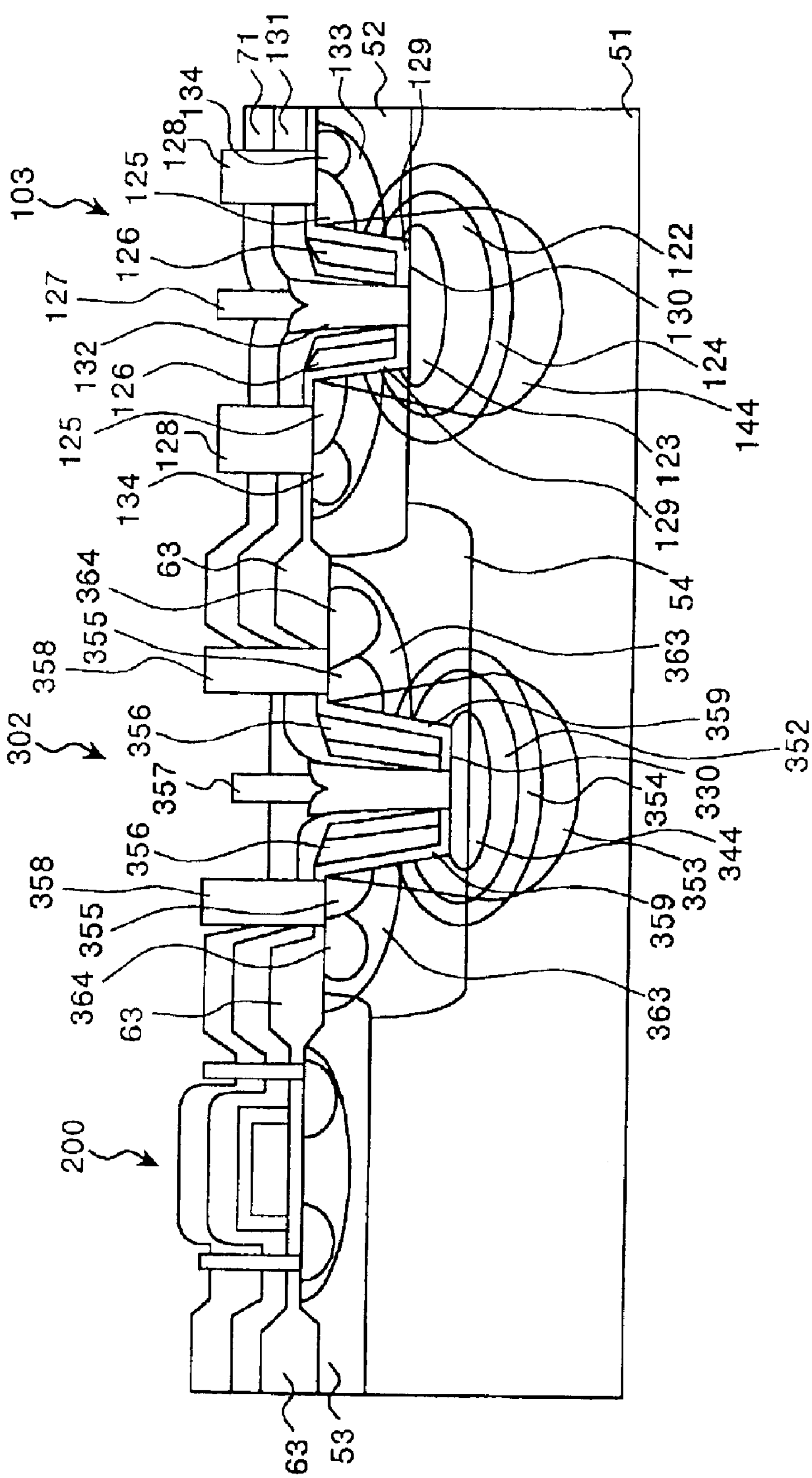
FIG. 91 is a vertical sectional view of a modification of the semiconductor device according to the fifth embodiment of the invention.
Figure 92:
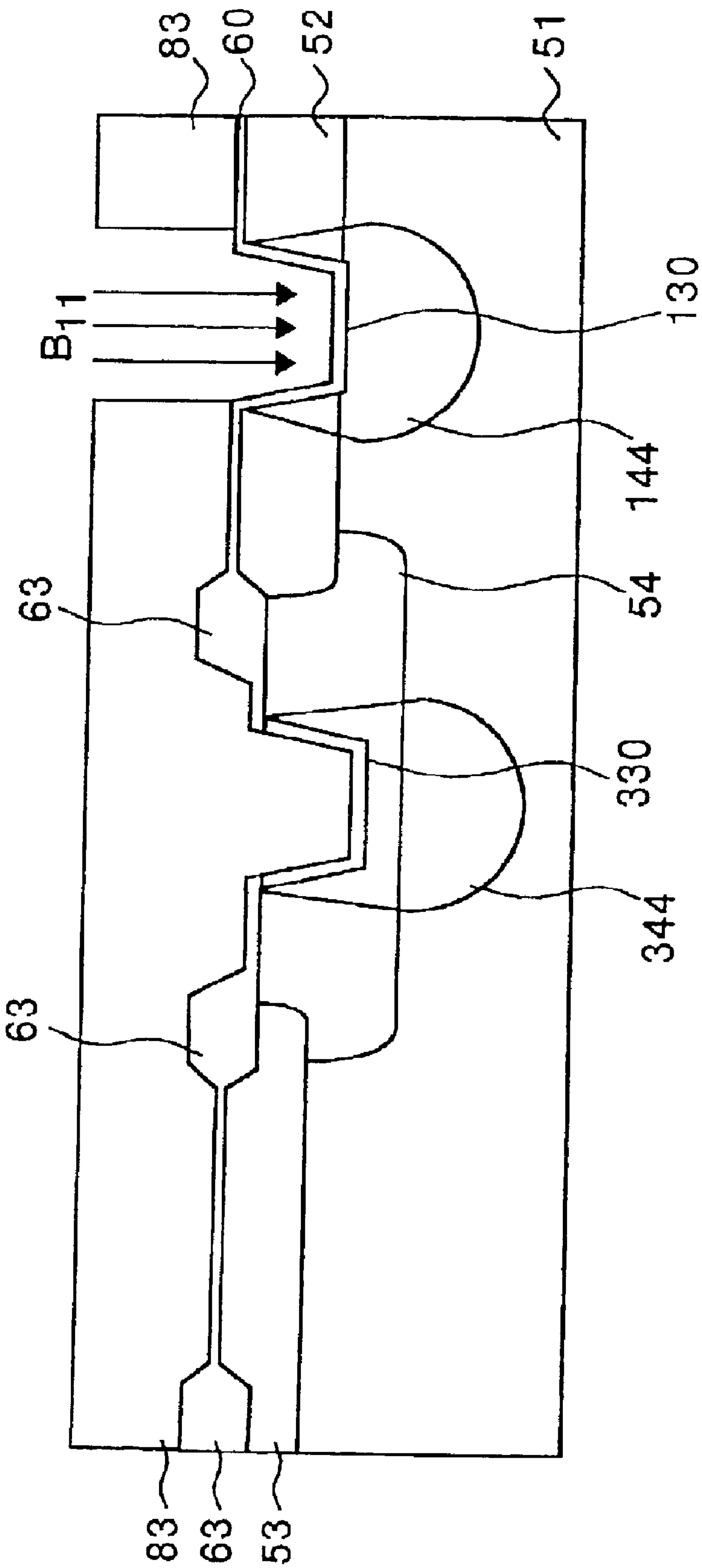
FIGS. 92–97 are vertical sectional views showing intermediate states of manufacture of the embodiment of the semiconductor device shown in FIG. 91.
Figure 93:
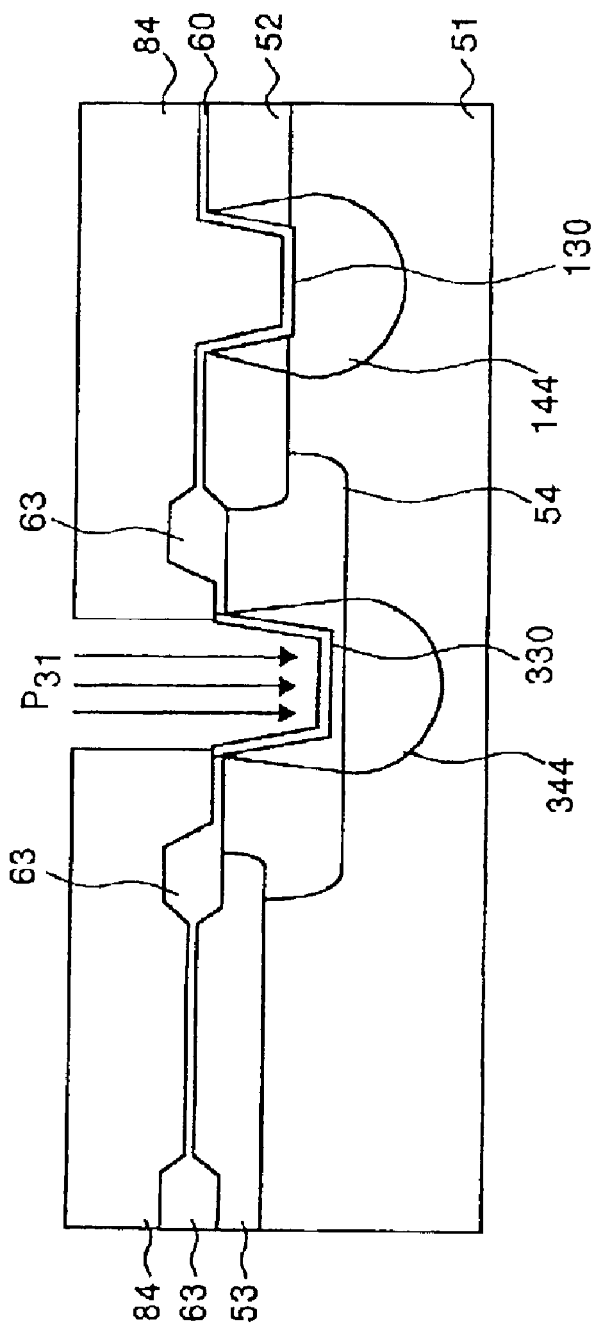

FIG. 91 shows another configuration that is provided with a TLPM 302 in which a n-type body region 354 is formed to surround the extended drain region 352. The TLPM 302 is formed in the following manner. After the field regions 144 and 344 and the selective oxidation films 63 for device isolation are formed, $B_{11}$ is ion-implanted into a region of the substrate 51 under the bottom surface of the trench 130 in the first p-well region 52 by using a mask 83 (see FIG. 92). After the mask 83 is removed, $P_{31}$ is ion-implanted into a region of the substrate 51 under the bottom surface of the trench 330 in the n-well region 54 by using a mask 84 (see FIG. 93). The operations of FIG. 92 and FIG. 93 may be reversed.

Figure 94:
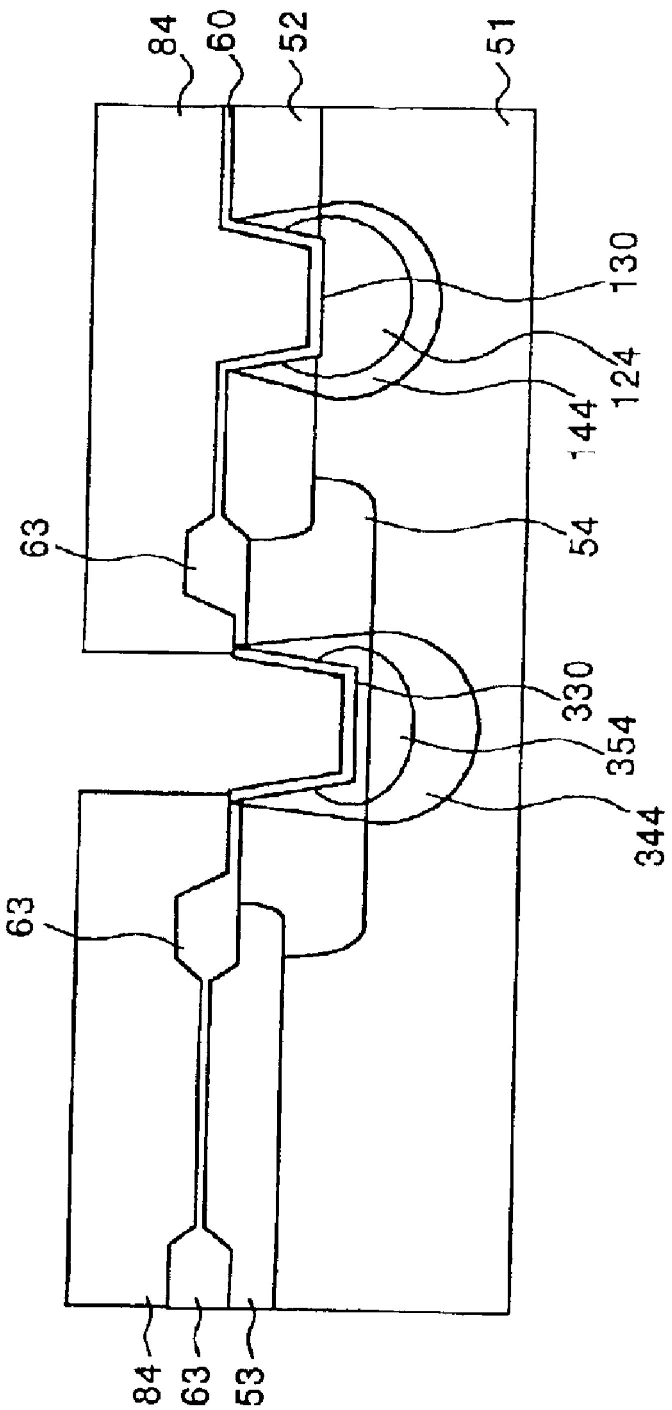
Figure 95:
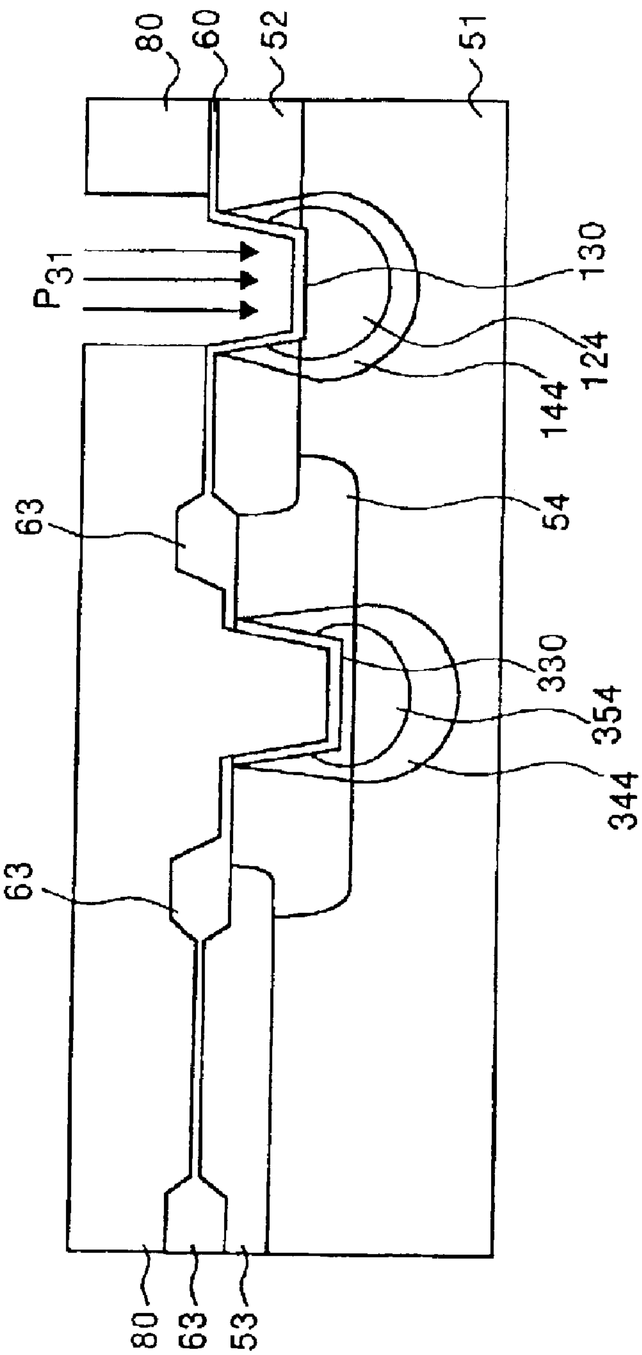
Figure 96:
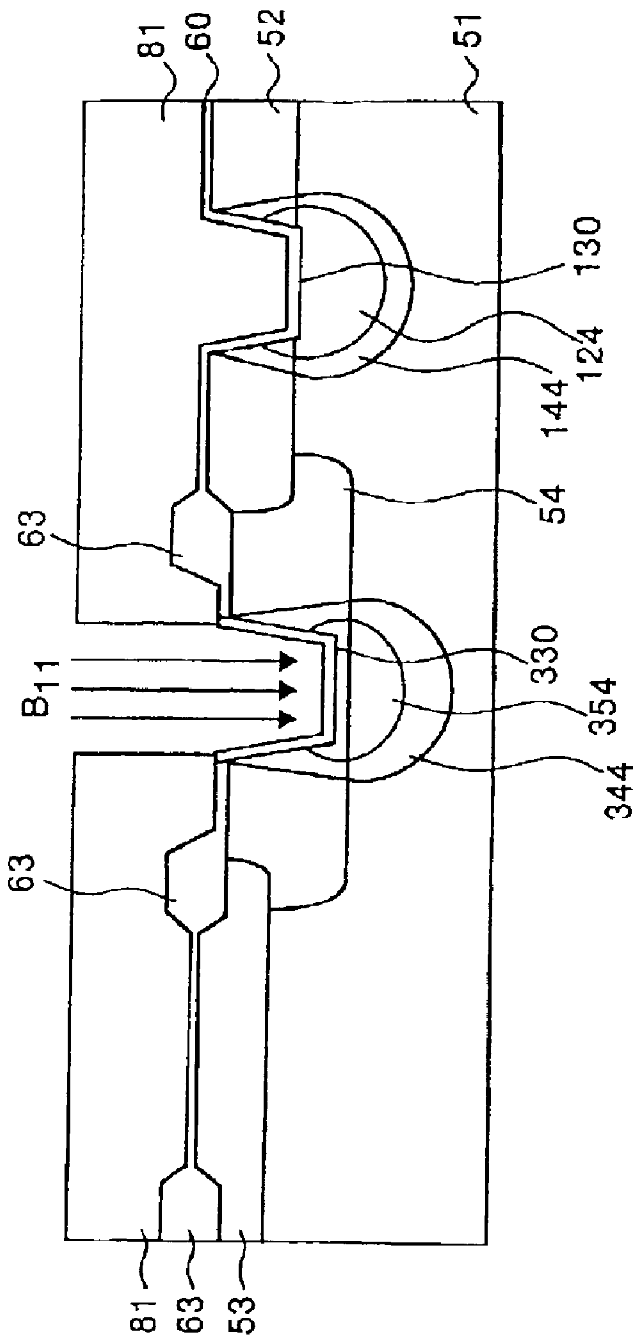

Then, thermal diffusion is performed to form body regions 124 and 354 for the respective trenches 130 and 330 (see FIG. 94). After the mask 84 is removed, $P_{31}$ is ion-implanted into a region of the substrate 51 under the bottom surface of the trench 130 in the first p-well region 52 by using a mask 80 (see FIG. 95). After the mask 80 is removed, $B_{11}$ is ion-implanted into a region of the substrate 51 under the bottom surface of the trench 330 in the n-well region 54 by using a mask 81 (see FIG. 96). The operations of FIG. 94 and FIG. 95 may be reversed.

Figure 97:
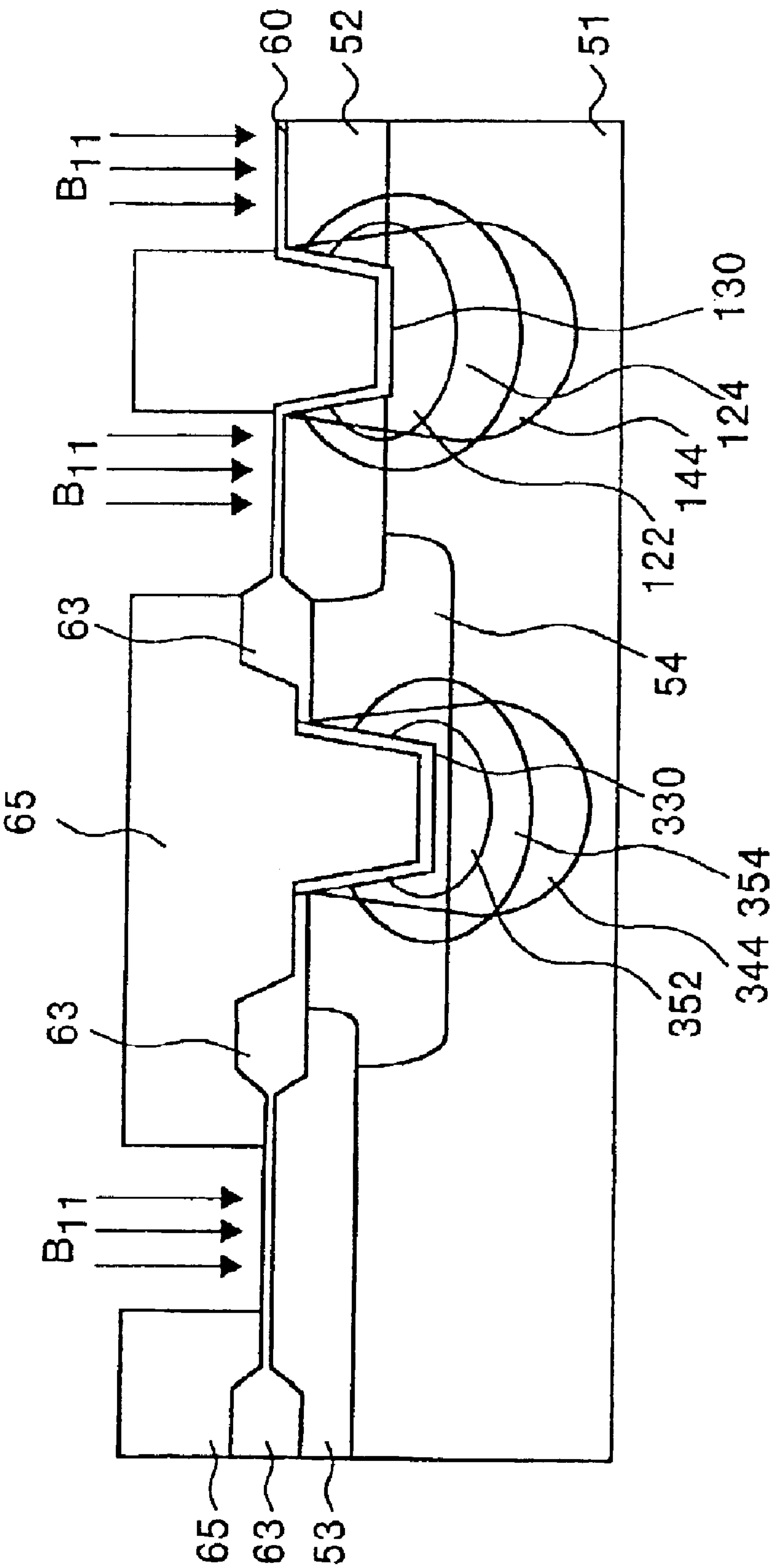

Then, extended drain regions 122 and 352 are formed for the respective trenches 130 and 330 by thermal diffusion. Then, $B_{11}$ is ion-implanted into channel forming regions of the TLPM to be formed in the first p-well region 52 and an NMOS forming region of the second p-well region 53 (see FIG. 97). The operations of FIGS. 80–90 are then executed in order and drain electrodes and source electrodes are formed.

As shown in FIGS. 91–97, in the fifth embodiment, the TLPM 100 (or 103) and the TLPM 301 (or 302) having different conductivity types are formed in the p-well region 52 and the n-well region 54. Therefore, as in the case of the first embodiment, a one-chip power IC that is small in size and low in on-resistance and cost can be obtained.

Figure 98:
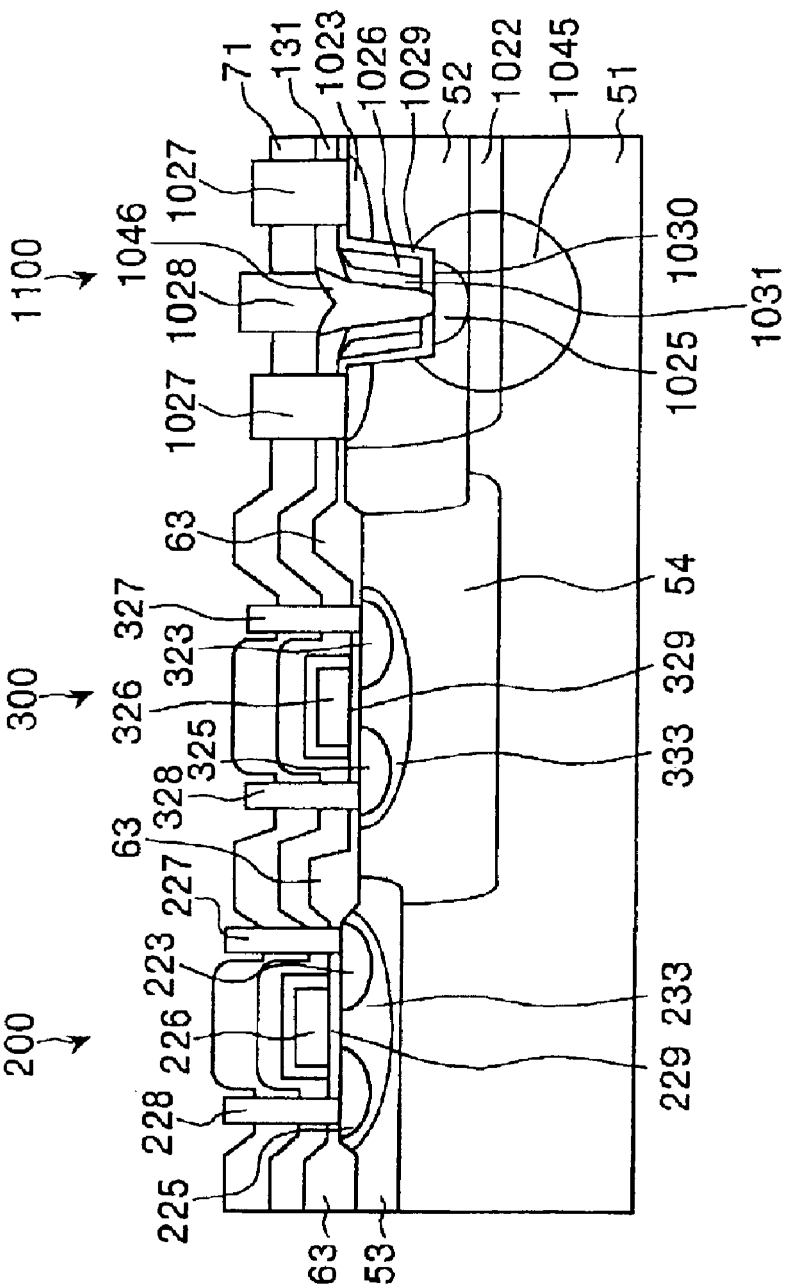
FIG. 98 is a vertical sectional view showing the configuration of a semiconductor device according to a sixth embodiment of the invention.

FIG. 98 is a vertical sectional view showing the configuration of a semiconductor device according to a sixth embodiment of the invention. As shown in FIG. 98, p-well regions 52 and 53 and an n-well region 54 are formed in a surface layer of a p-type semiconductor substrate 51. A TLPM 1100 of the second type, that is, the type that source contact is made at the bottom of a trench, is formed in the first p-well region 52, an NMOS 200 is formed in the second p-well region 53, and a PMOS 300 is formed in the n-well region 54. The TLPM 1100, the NMOS 200, and the PMOS 300 are isolated from each other by selective oxidation films 63.

The TLPM 1100 is described below. A trench 1030 is formed in the first p-well region 52. An n-type source region 1025 is provided under the bottom surface of the trench 1030. A p-type base region 1045 is provided adjacent to the bottom surface and a bottom portion of the side surface of the trench 1030 so as to surround the source region 1025. An n-type extended drain region 1022 that is deeper than the first p-well region 52 is provided outside the trench 1030.

N-type drain regions 1023 are provided in surface layers of the extended drain region 1022. A gate oxide film 1029, gate electrodes 1026, an interlayer insulating film 1031 (part of shadow oxide films 68 (described later)), and a source polysilicon layer 1046 are provided inside the trench 1030 in this order from the outside. A source electrode 1028 penetrates through a passivation film 71 and is in contact with the source polysilicon layer 1046, and is in electrical contact with the source region 1025 via the source polysilicon layer 1046. Drain electrodes 1027 penetrate through the passivation film 71 and an interlayer insulating film 131 and are in contact with the respective drain regions 1023.

The NMOS 200 and the PMOS 300 are the same as those of the first embodiment and hence will not be described. Regions, electrodes, etc. of the semiconductor device according to the sixth embodiment having the same names in the semiconductor device according to the first embodiment are given the same reference numerals as the latter and will not be described.

Figure 2:
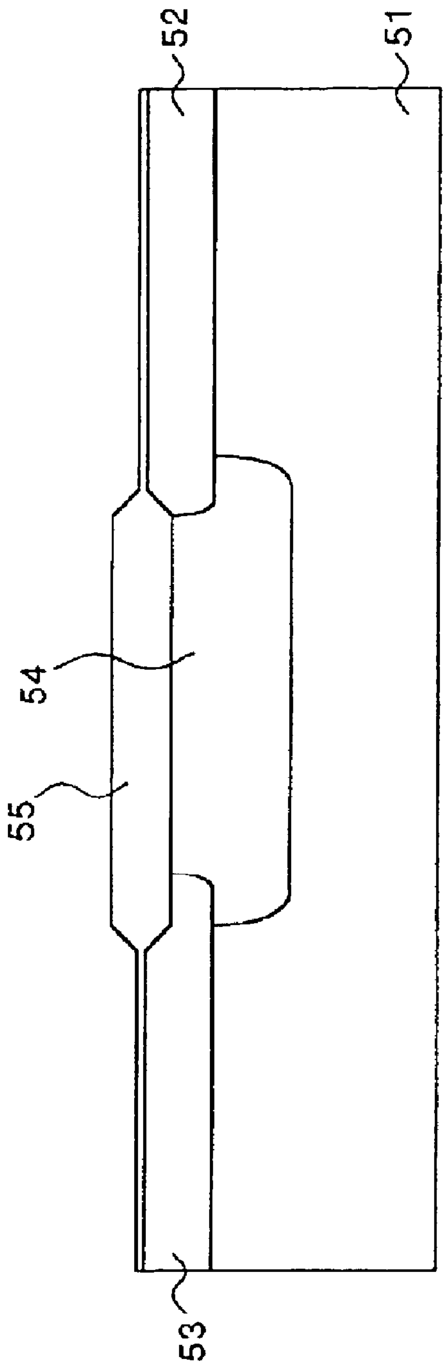
FIGS. 2–27 are vertical sectional views showing intermediate states of manufacture of the embodiment of the semiconductor device shown in FIG. 1.

A manufacturing process of the semiconductor device shown in FIG. 98 is described below. FIGS. 99–118 are vertical sectional views showing intermediate states of manufacture of the embodiment of the semiconductor device of FIG. 98. First, as shown in FIG. 2, phosphorus is ion-implanted into a surface layer of a semiconductor substrate 51 at a dose of $0.3\times10^{13}$ to $1.5\times10^{13}$ $cm^{-2}$, for example, and diffused, whereby an n-well region 54 is formed selectively. Then, boron is ion-implanted into the semiconductor substrate 51 at a dose of $0.5\times10^{13}$ to $1.5\times10^{13}$ $cm^{-2}$, for example, by using, as a mask, a selective oxidation film 55 that is formed on the n-well region 54 and diffusion is performed, whereby a first p-well region 52 and a second p-well region 53 are formed. The selective oxidation film 55 is thereafter removed completely (see FIG. 3).

Subsequently, a buffer oxide film 56 is formed on the substrate surface and a mask 2001 having a prescribed pattern is formed thereon. By using the mask 2001, an n-type impurity such as phosphorus is ion-implanted into the first p-well region 52 at a dose of $0.4\times10^{13}$ to $1.8\times10^{13}$ $cm^{-2}$, for example (see FIG. 99). Then, the implanted impurity is diffused to form an extended drain region 1022. After the mask 2001 is removed, a mask oxide film 57 having a thickness of 1 $\mu$m, for example, is laid on the buffer oxide film 56 (see FIG. 100).

Figure 101:
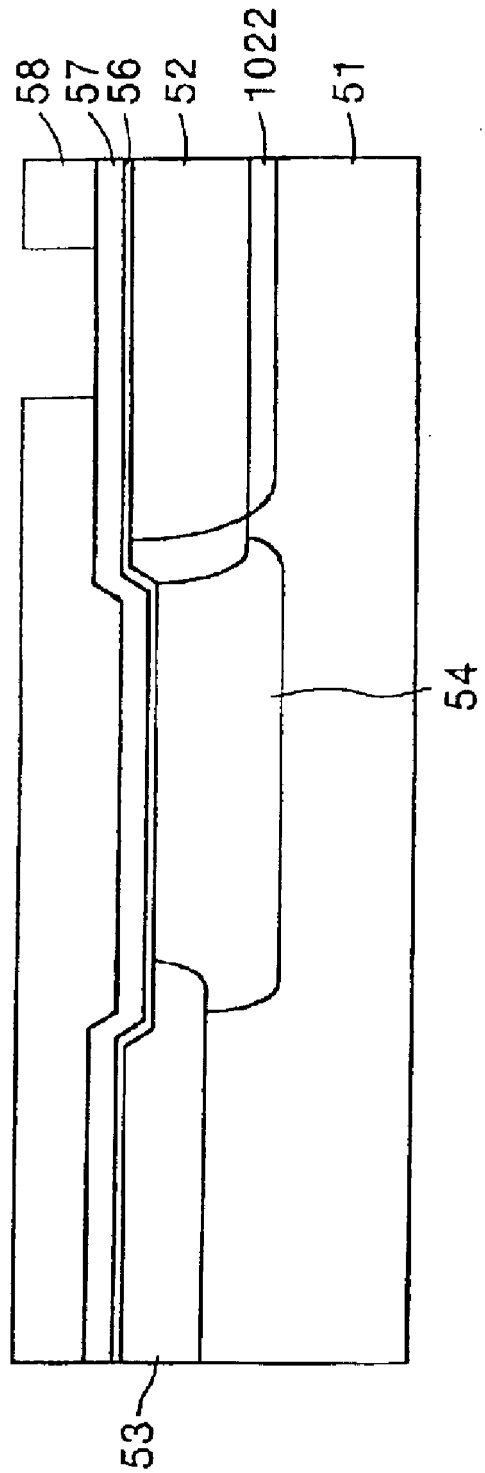
Figure 102:
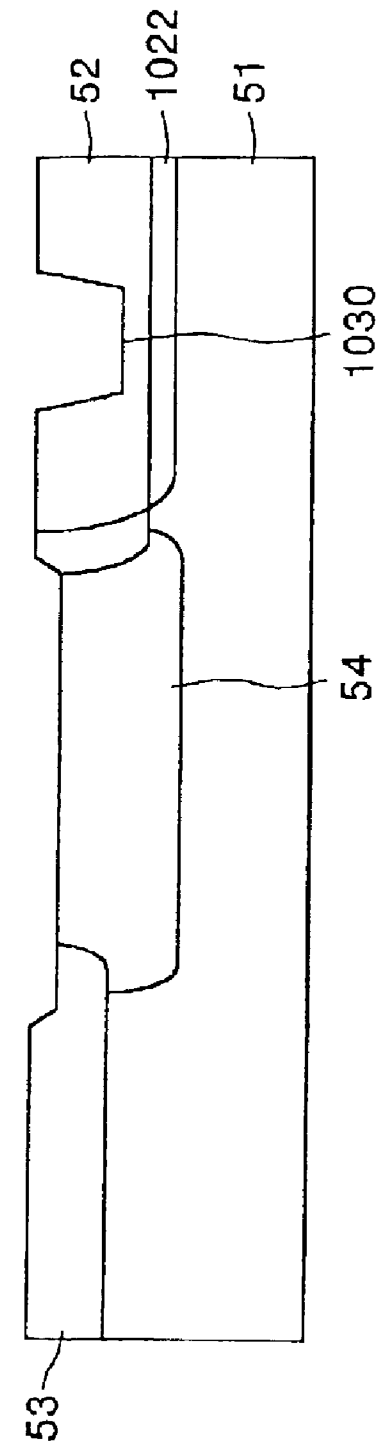
Figure 103:
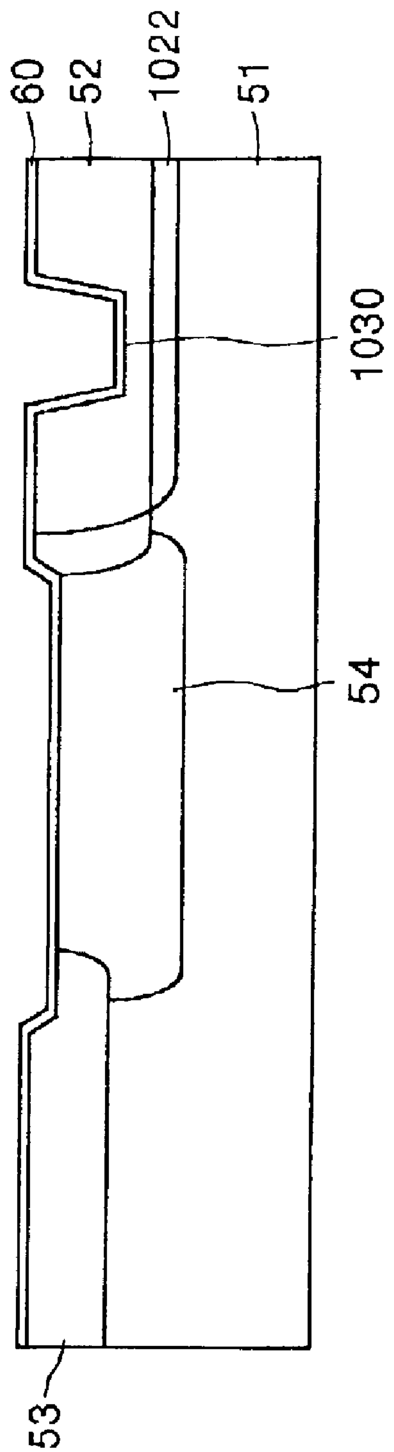
Figure 104:
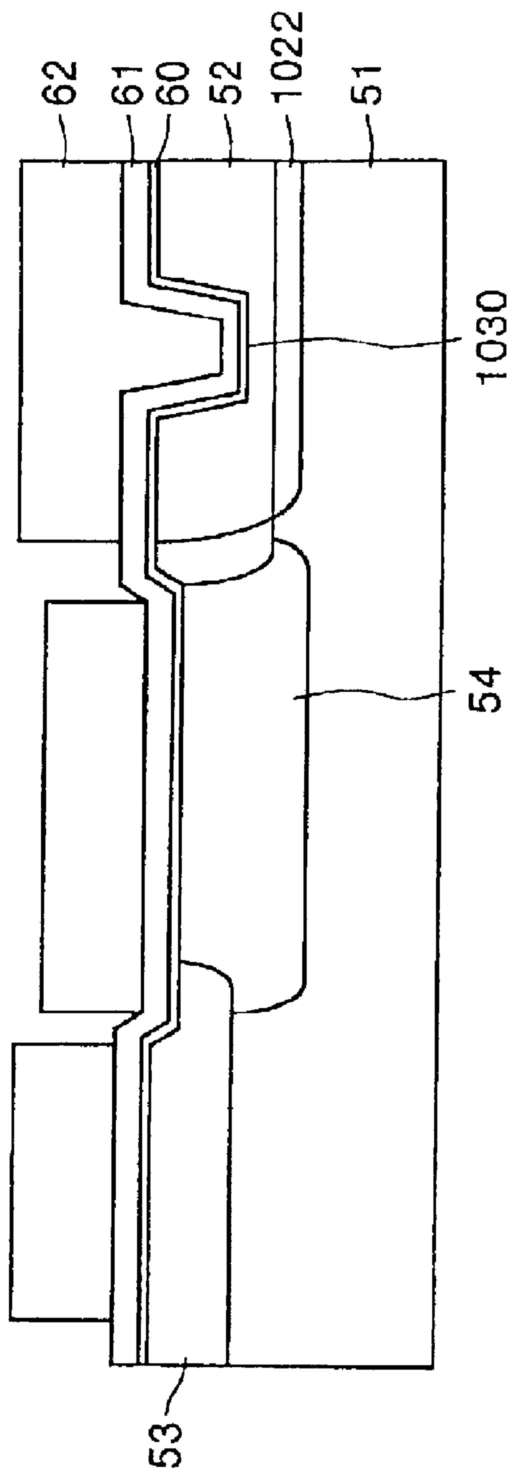
Figure 105:
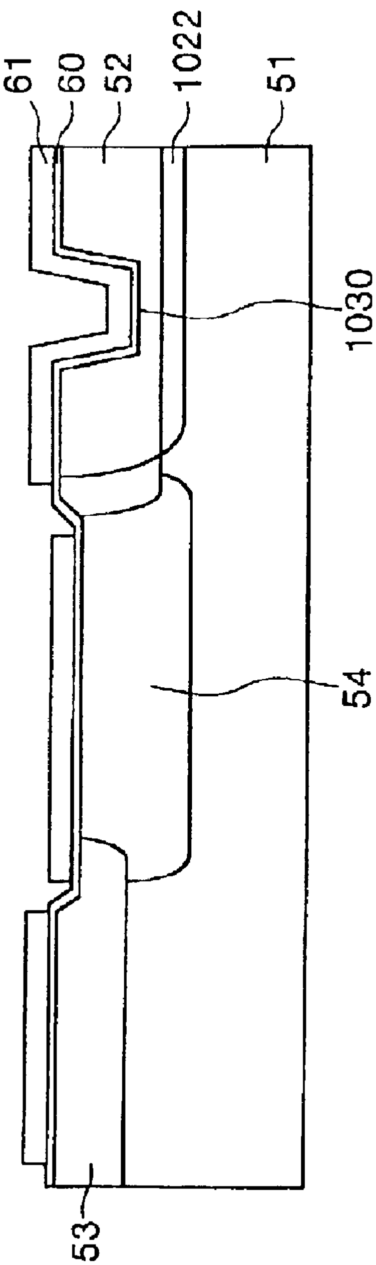
Figure 106:
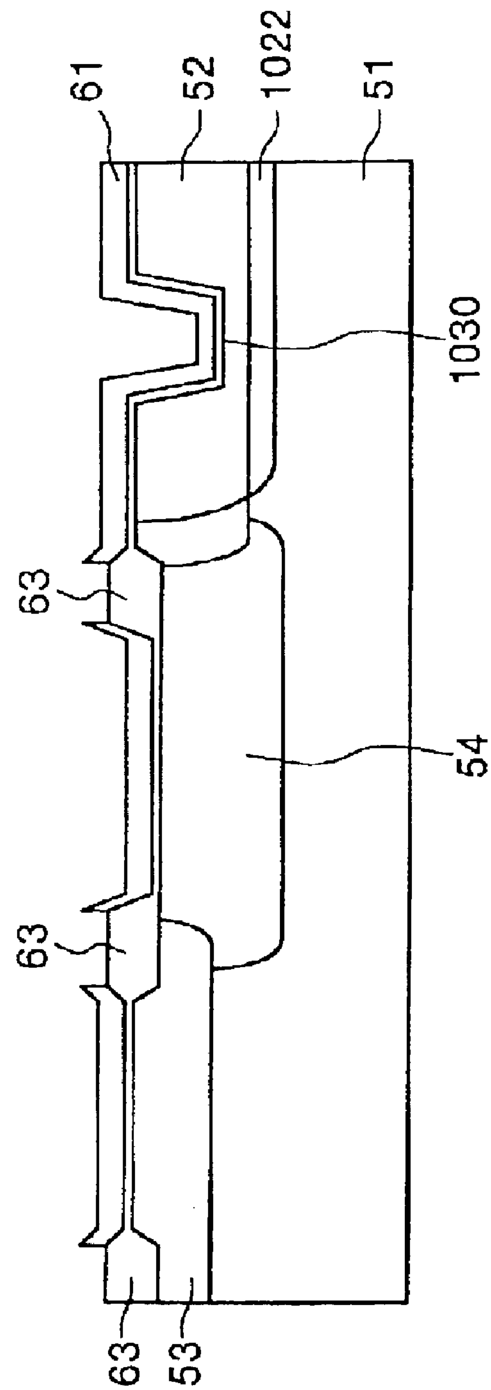
Figure 107:
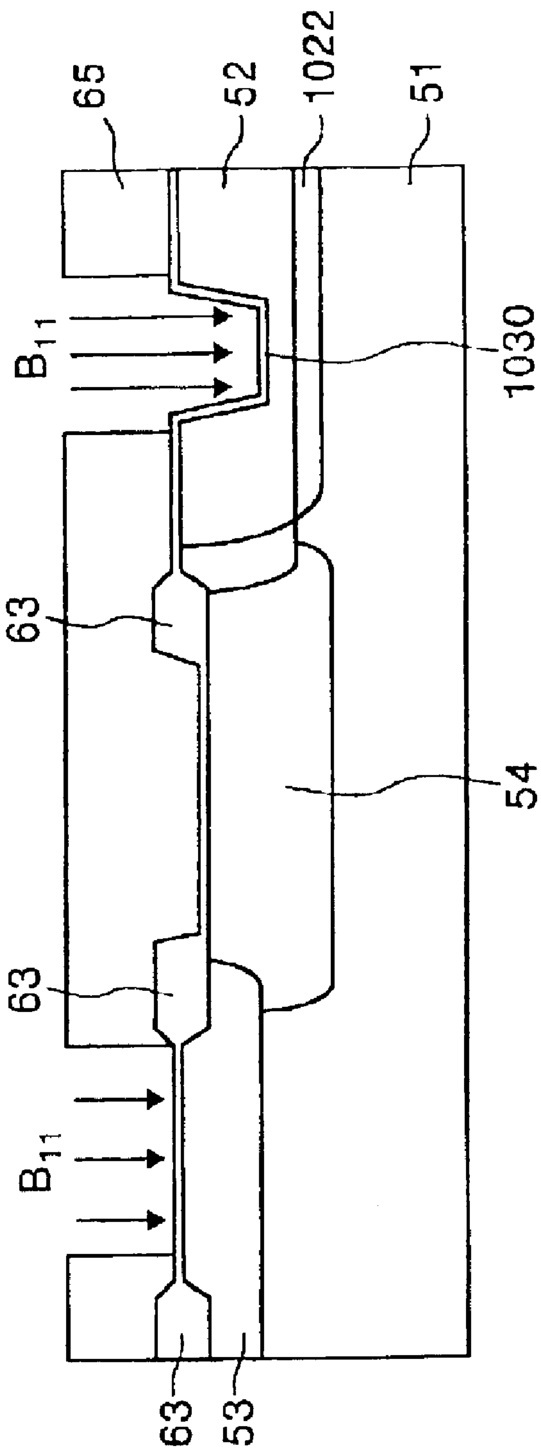
Figure 108:
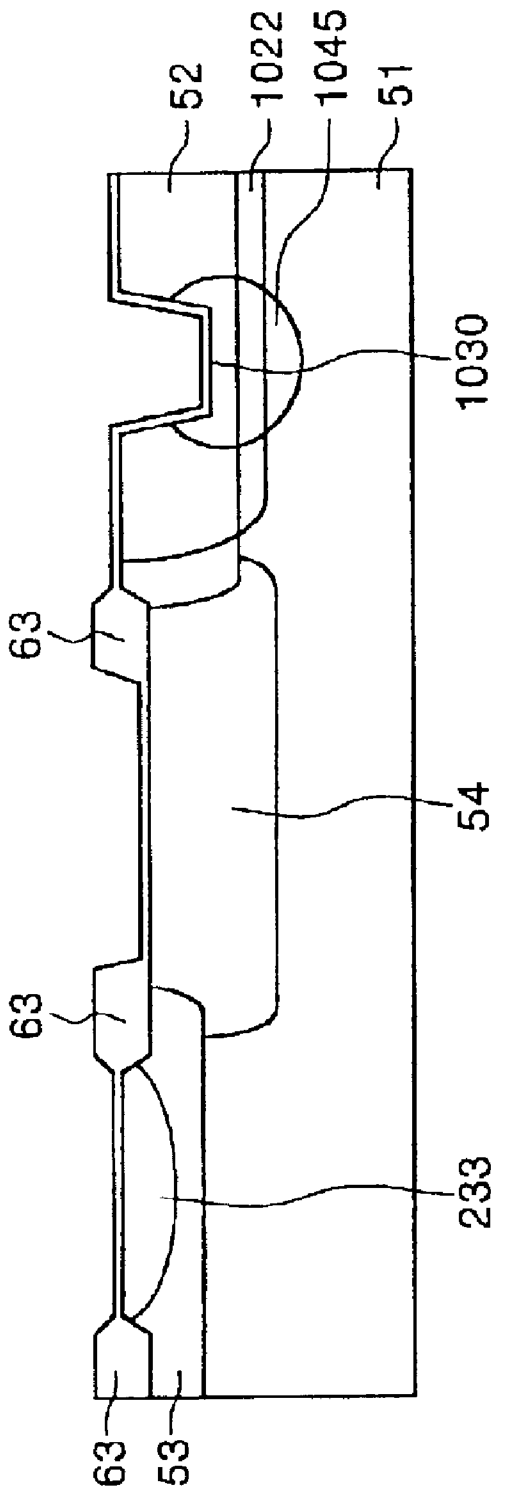
Figure 109:
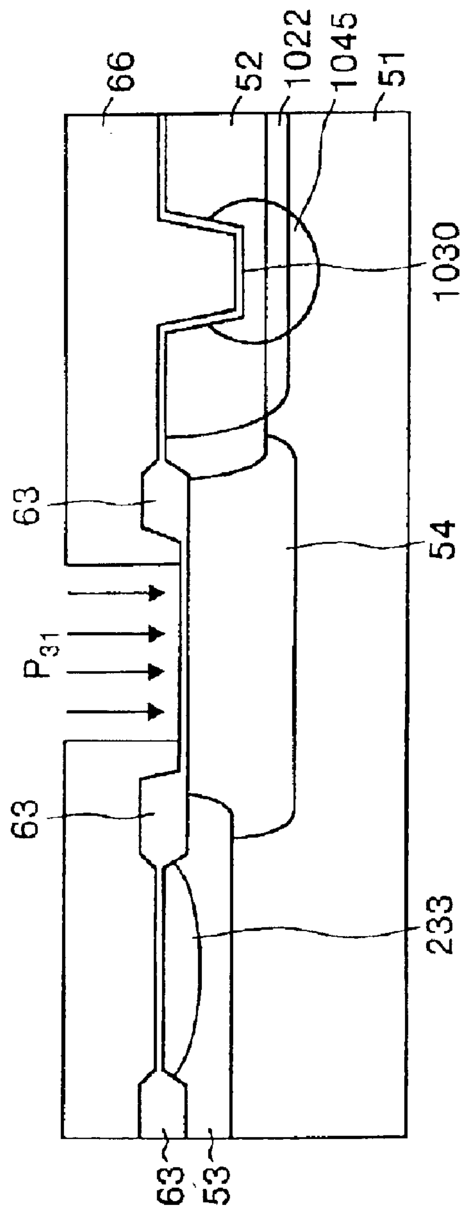
Figure 110:
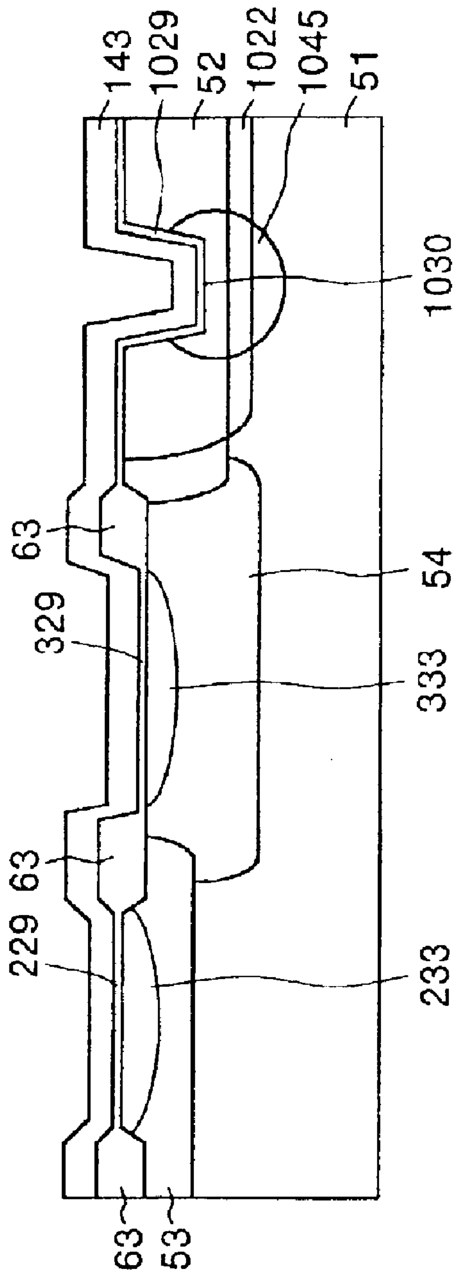

Then, a mask 58 having an opening in a trench forming area is formed on the mask oxide film 57 (see FIG. 101). The mask oxide film 57 is patterned by using the mask 58. After the mask 58 is removed, a trench 1030 of 2.0 $\mu$m deep by 3.0 $\mu$m wide, for example, is formed in the first p-well region 52 by trench etching (RIE). Then, all the oxide films on the substrate surface including the mask oxide film 57 are removed (see FIG. 102).

Subsequently, a buffer oxide film 60 is formed on the substrate surface and the surface of the trench 1030 (see FIG. 103), and a silicon nitride film 61 is formed thereon. A mask 62 having openings in device isolation areas is formed on the silicon nitride film 61 (see FIG. 104). The silicon nitride film 61 is patterned by using the mask 62, and the mask 62 is removed thereafter (see FIG. 105). Then, thermal oxidation is performed by using, as a mask, the silicon nitride film 61 remaining on the substrate surface to form selective oxidation films 63 for device isolation (see FIG. 106).

After the silicon nitride film 61 is removed and sacrificial oxidation is performed, a mask 65 having openings in areas corresponding to the trench 1030 and a future channel region of the intended NMOS is formed. A p-type impurity such as boron ($B_{11}$) is ion-implanted at a dose of $0.4\times10^{14}$ to $1\times10^{14}$ $cm^{-2}$, for example, by using the mask 65 (see FIG. 107) and diffused to form a base region 1045 under the bottom surface of the trench 1030 in the first p-well region 52 and, at the same time, a channel region 233 of the intended NMOS is formed in the second p-well region 53. The mask 65 is removed thereafter (see FIG. 108). With the above operations, the channel regions of the TLPM 1100 and the NMOS 200 can be formed at the same time by using the single mask 65, which reduces the cost per wafer.

Subsequently, after a mask 66 having an opening in an area corresponding to a future channel region of the intended PMOS is formed on the substrate surface, an n-type impurity such as phosphorus ($P_{31}$) is ion-implanted (see FIG. 109) and diffused, whereby a channel region 333 of the intended PMOS is formed in the n-well region 54. After the mask 66 and the thin oxide film on the substrate surface and the surface of the trench 1030 are removed, a gate oxide film 1029 of 0.06 to 0.1 μm in thickness is formed for the intended TLPM and gate oxide films 229 and 329 of 0.02 to 0.1 μm in thickness are formed for the intended NMOS and PMOS, respectively. The gate oxide films 1029, 229, and 329 of the intended TLPM, NMOS, and PMOS may be formed simultaneously without using masks, in which case the process is simplified and the cost is reduced. The operations of forming the base region 1045 and the channel region 233 and the operations of forming the channel region 333 may be reversed.

Figure 111:
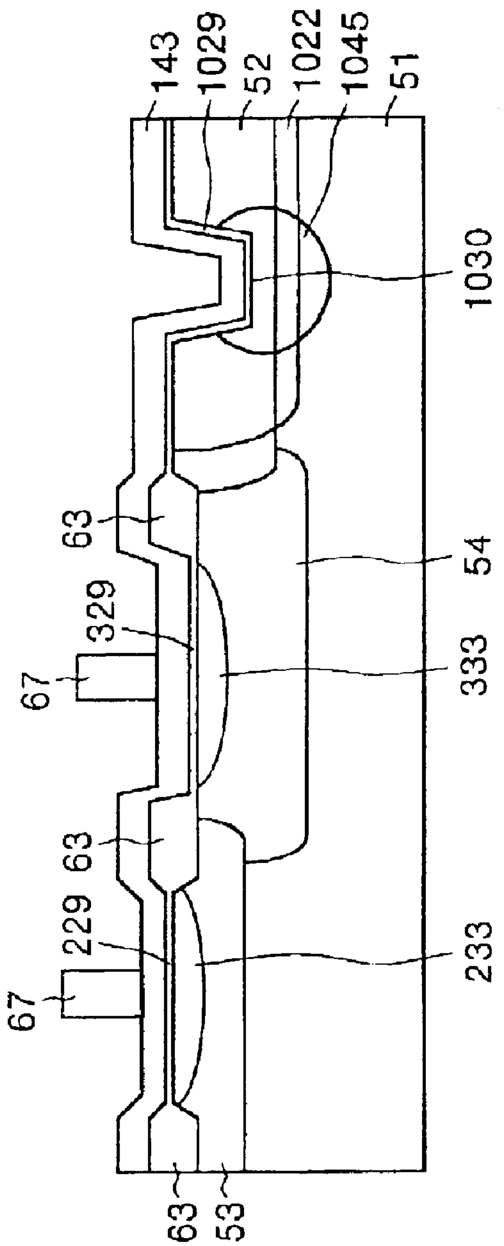
Figure 112:
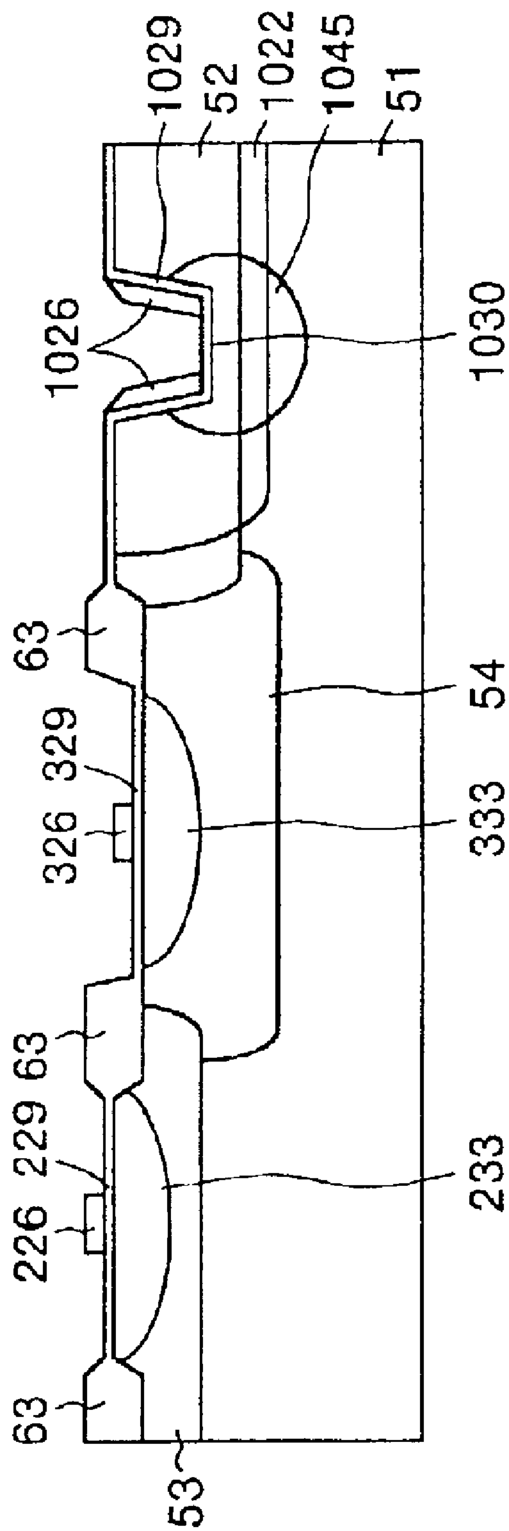

Subsequently, a polysilicon layer 143 is laid (see FIG. 110) and a mask 67 is formed only on those portions of the polysilicon layer 143 which are to become gate electrodes of the intended NMOS and PMOS (see FIG. 111). Anisotropic etching (RIE or the like) is performed on the polysilicon layer 143 by using the mask 67, in which a gate electrode 226 of the intended NMOS and a gate electrode 326 of the intended PMOS are formed and, at the same time, gate electrodes 1026 of the intended TLPM are formed inside the trench 1030 by self-alignment, simplifying the process and reducing the cost. The mask 67 is removed thereafter (see FIG. 112).

Figure 113:
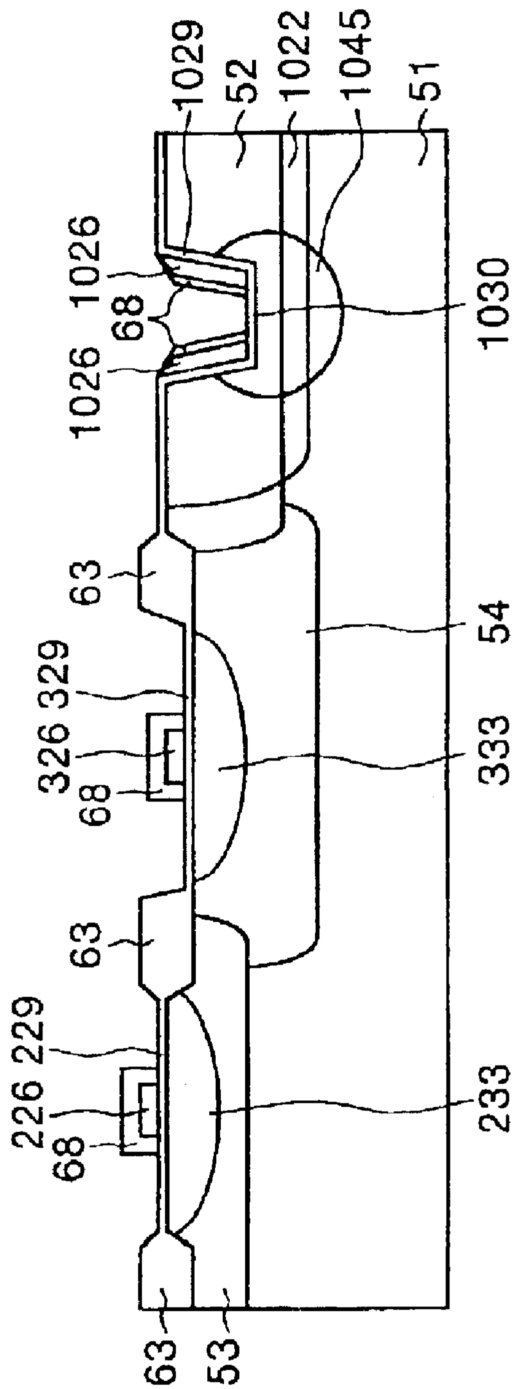

Subsequently, shadow oxide films 68 are formed to cover the gate electrodes 1026 of the intended TLPM, the gate electrode 226 of the intended NMOS, and the gate electrode 326 of the intended PMOS (see FIG. 113). After a mask 69 having openings in an area where to form a source region and drain regions of the intended TLPM and an NMOS forming area is formed on the substrate surface, an n-type impurity such as arsenic ($As_{75}$) is ion-implanted (see FIG. 114) and diffused. As a result, a source region 1025 of the intended TLPM is formed under the bottom surface of the trench 1030, drain regions 1023 of the intended TLPM are formed on both sides of the trench 1030, and a source region 225 and a drain region 223 of the intended NMOS are formed in the channel region 233 simultaneously.

After the mask 69 is removed, a mask 70 having an opening in a PMOS forming area is formed on the substrate surface and a p-type impurity such as boron ($B_{11}$) is ion-implanted (see FIG. 115) and diffused. As a result, a source region 325 and a drain region 323 of the intended PMOS are formed in the channel region 333. The mask 70 is removed thereafter (see FIG. 116). Then, an interlayer insulating film 131 is laid over the substrate surface, and a portion of the interlayer insulating film 131 inside the trench 1030 is etched away by self-alignment to form a contact hole. The inside of the trench 1030 is filled with a source polysilicon layer 1046 (see FIG. 117). Then, a passivation film 71 is formed over the substrate surface (see FIG. 118). The operations of forming the source region 1025, the drain regions 1023, the source region 225, and the drain region 223 and the operations of forming the source region 325 and the drain region 323 may be reversed.

Subsequently, the passivation film 71 is patterned to form contact holes. A metal film is formed on the passivation film 71 and then patterned to form, simultaneously, a source electrode 1028 of the intended TLPM that is in contact with the source polysilicon layer 1046, drain electrodes 1027 of the intended TLPM that are in contact with the respective drain regions 1023, a drain electrode 227 and a source electrode 228 of the intended NMOS that are in contact with the drain region 223 and the source region 225, respectively, and a drain electrode 327 and a source electrode 328 of the intended PMOS that are in contact with the drain region 323 and the source region 325, respectively. In this manner, a semiconductor device is completed in which the TLPM 1100, the NMOS 200, and the PMOS 300 are integrated on the same semiconductor substrate 51 as shown in FIG. 98.

Figure 265:
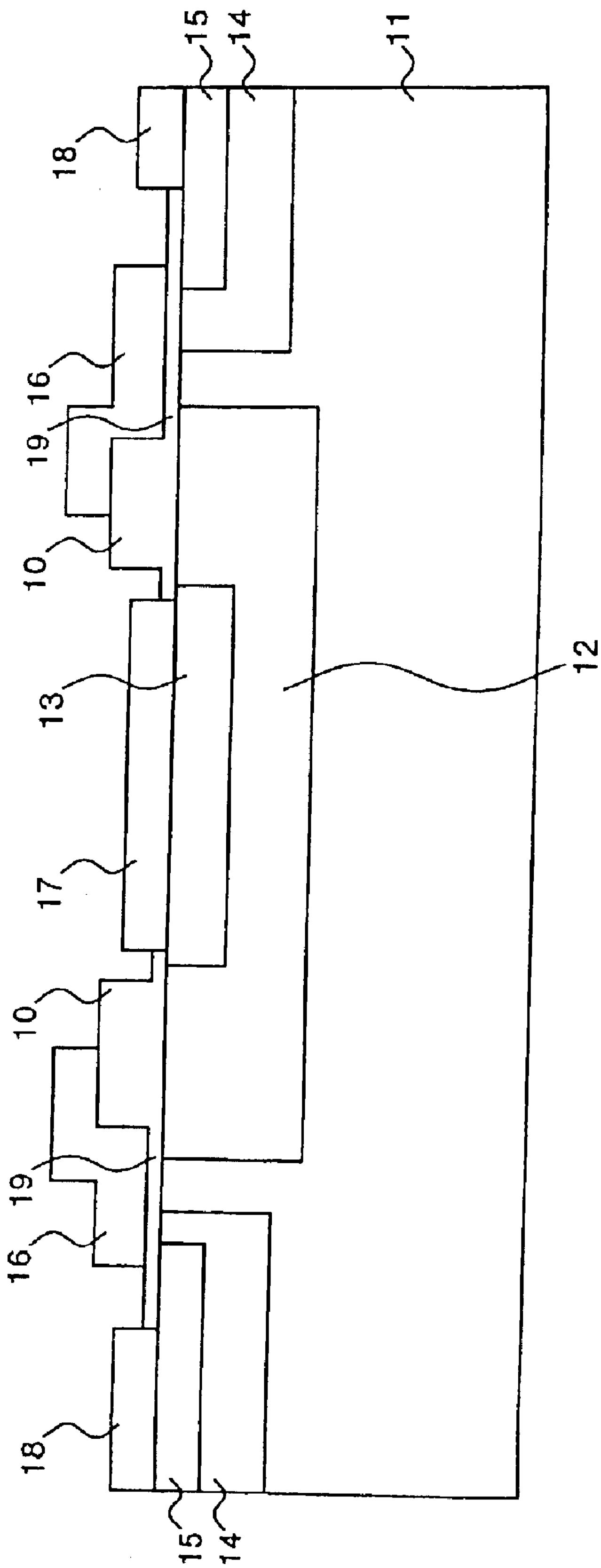
FIG. 265 is a vertical sectional view showing the configuration of a conventional n-channel planar power MOSFET.
Figure 266:
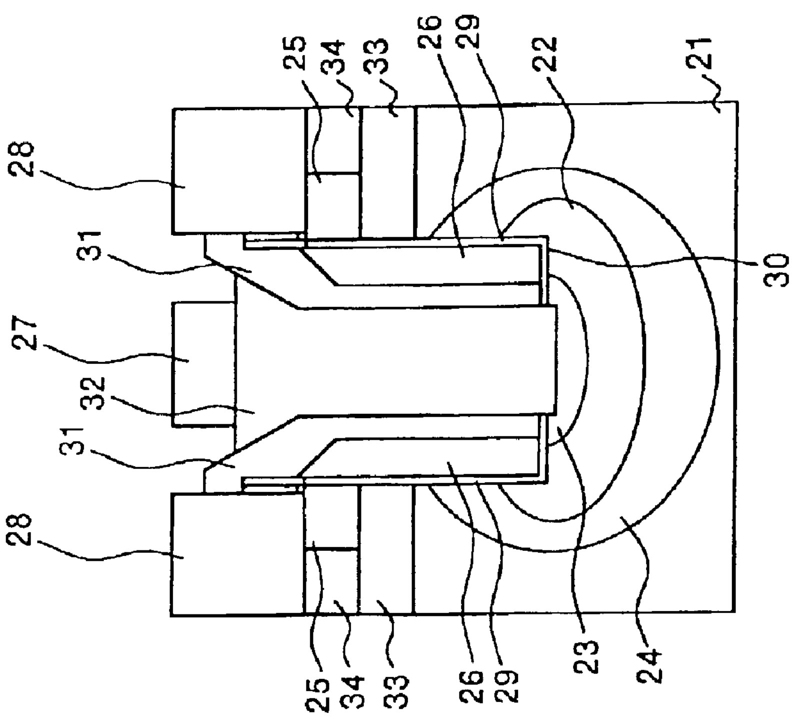
FIG. 266 is a vertical sectional view showing the configuration of a conventional TLPM having a drain contact at the bottom of a trench.
Figure 267:
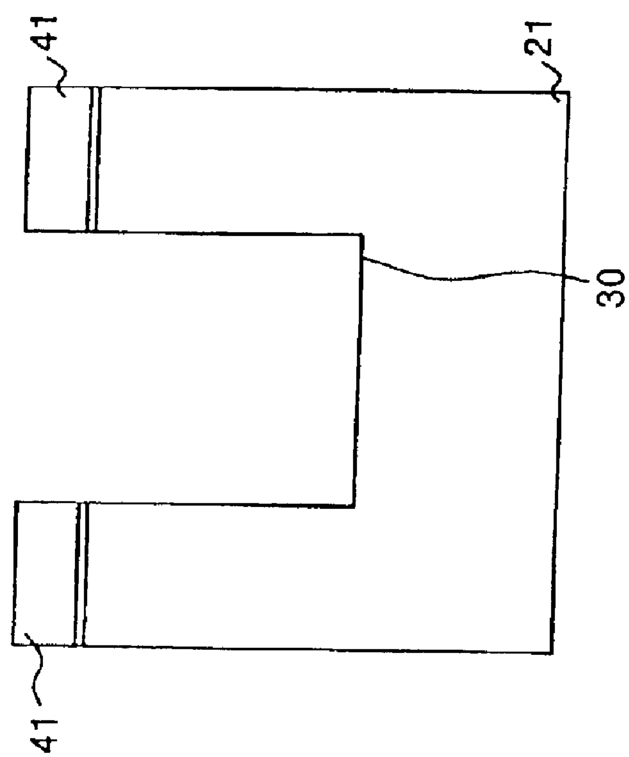
FIGS. 267–274 are vertical sectional views showing intermediate states of manufacture of the TLPM shown in FIG. 266.
Figure 268:
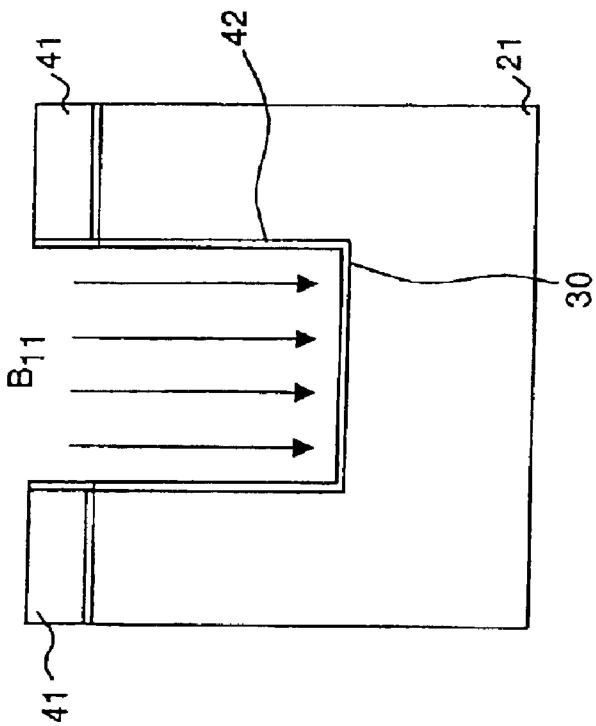
Figure 269:
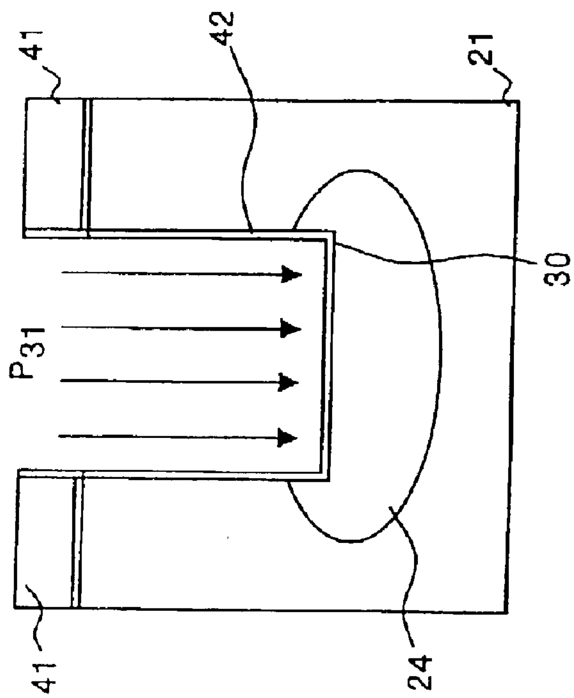
Figure 270:
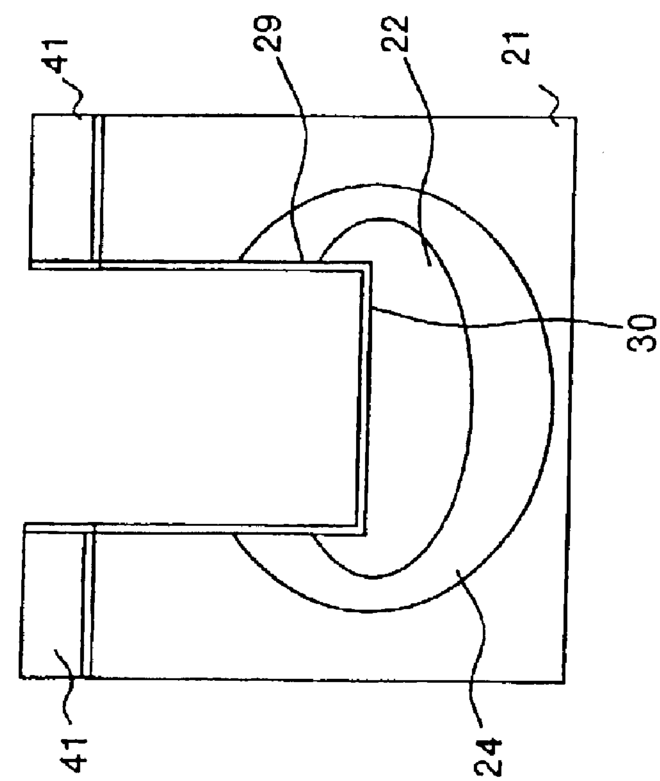
Figure 271:
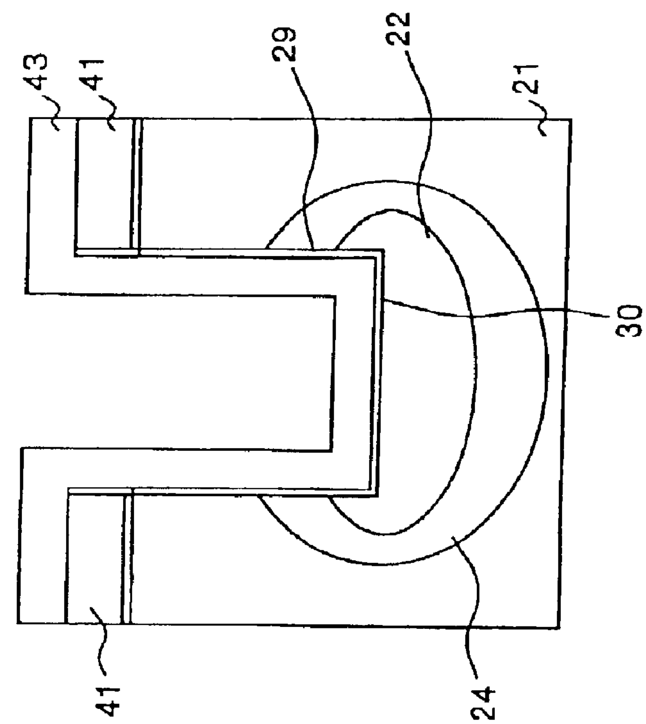
Figure 272:
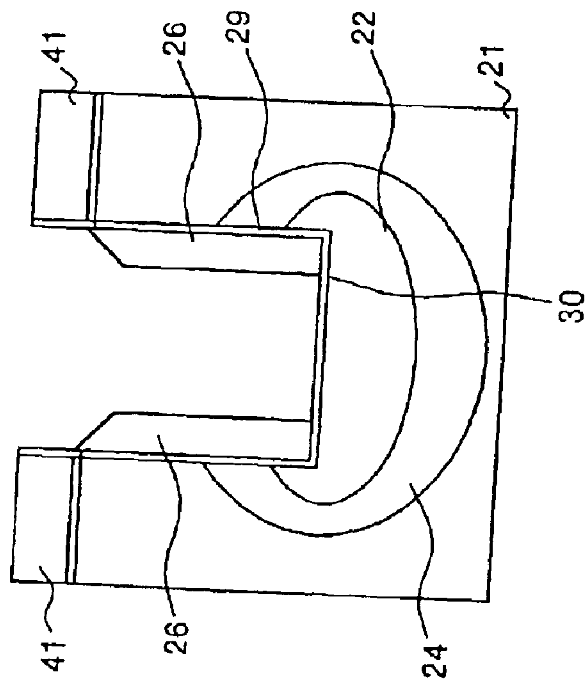
Figure 273:
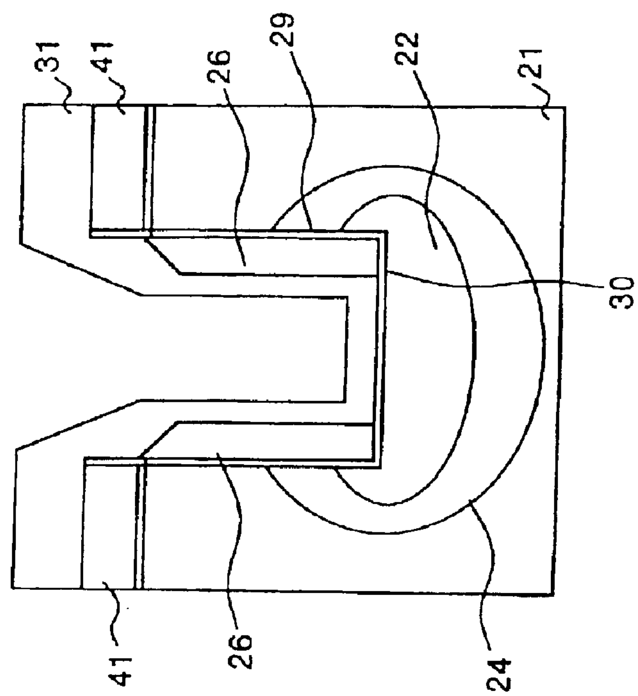
Figure 274:
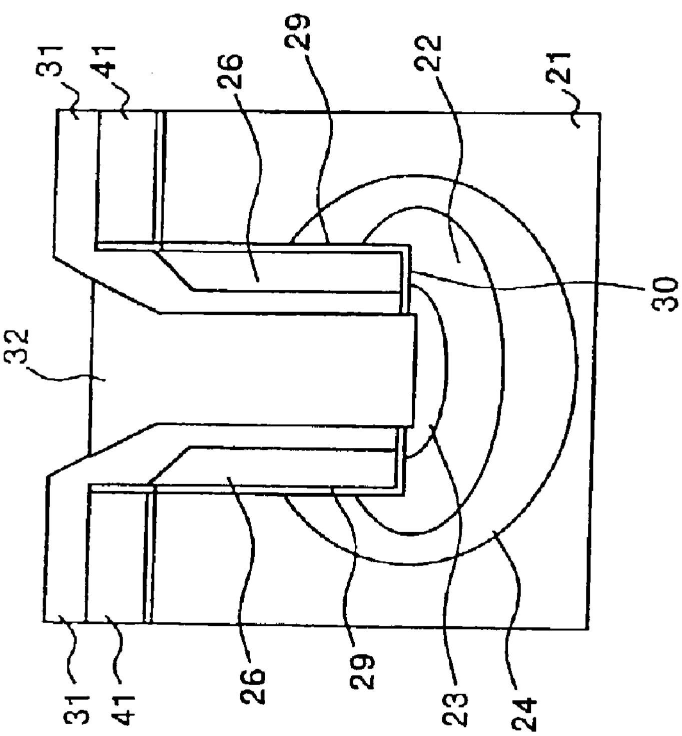
Figure 275:
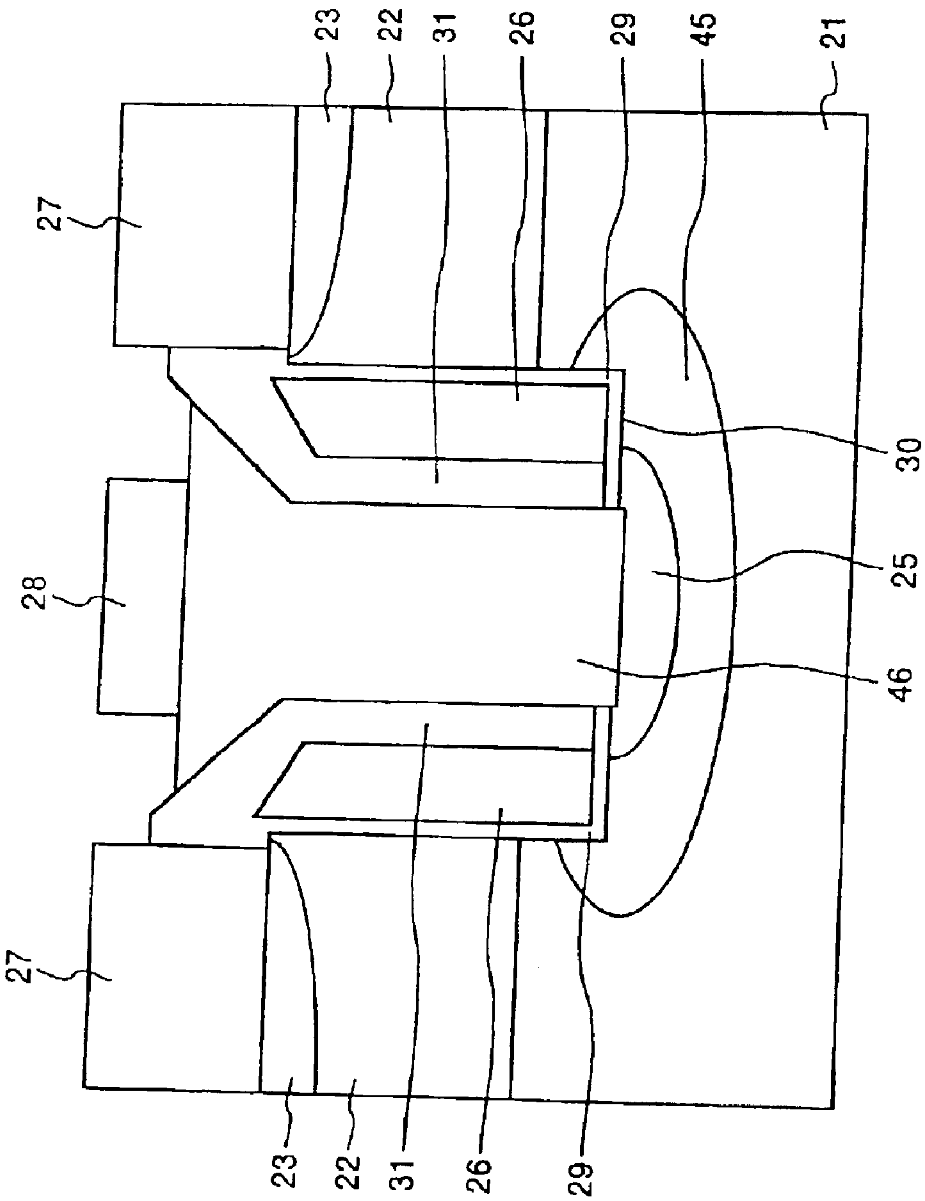
FIG. 275 is a vertical sectional view showing the configuration of a conventional TLPM having a source contact at the bottom of a trench.

In the device that is obtained according to the above-described manufacturing process, the impurity diffusion lengths in the depth direction from the substrate surface of the two p-well regions 52 and 53, the n-well region 1022, the extended drain region 1022, and the base region 1045 are, for example, 2.3 to 2.6 μm, 3.4 to 4.5 μm, 1.8 to 2.1 μm, and 1.1 to 1.2 μm, respectively. The TLPM 1100 has an on-resistance of 10 to 20 mΩ-$mm^2$ when the device breakdown voltage is about 30 to 40 V. This on-resistance value is ½ to ⅓ of the value of the conventional planar power MOSFET shown in FIG. 265 for the same device breakdown voltage.

In the TLPM 100 shown in FIG. 98, even where the impurity concentration of the extended drain region 1022 is increased to lower the on-resistance, the breakdown voltage can be kept high by making the first p-well region 52 deeper than the extended drain region 1022.

The p-type base region 1045 and the substrate 51 may be grounded in the following manner. First, in forming the contact holes by patterning the passivation film 71, another contact hole is formed at a position that is not located in any of the intended TLPM, PMOS, and NMOS. A p-type plug region is formed in the area of the additional contact hole. In patterning the metal film, a metal portion is left on the p-type plug region and an electrode is formed there. The p-type base region 1045 and the substrate 51 are prevented from floating by grounding the electrode to prevent decreasing the breakdown voltage of the TLPM 1100.

Figure 119:
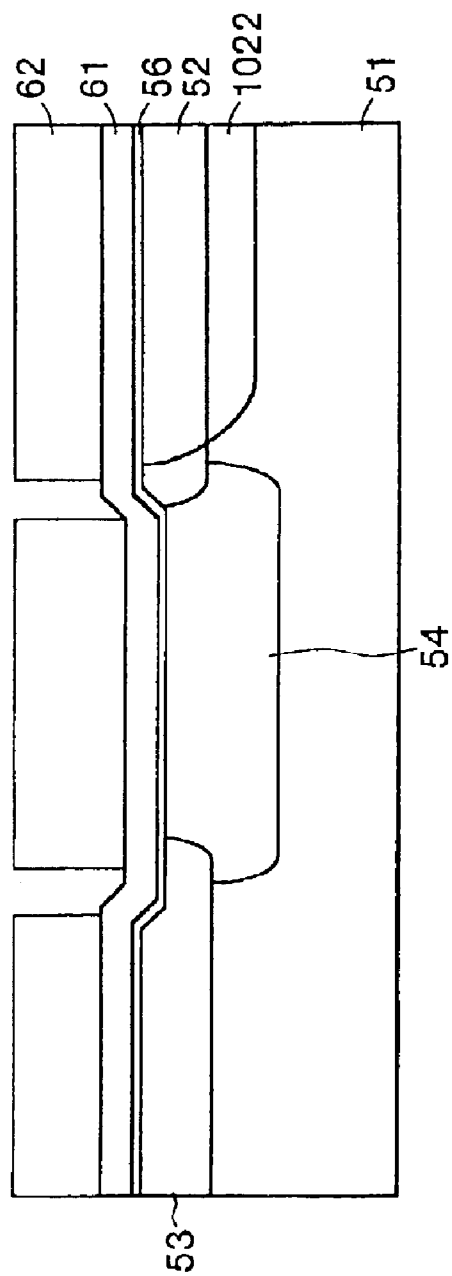
FIGS. 119–127 are vertical sectional views showing intermediate states of manufacture of the embodiment of the semiconductor device shown in FIG. 98 by another manufacturing method.
Figure 120:
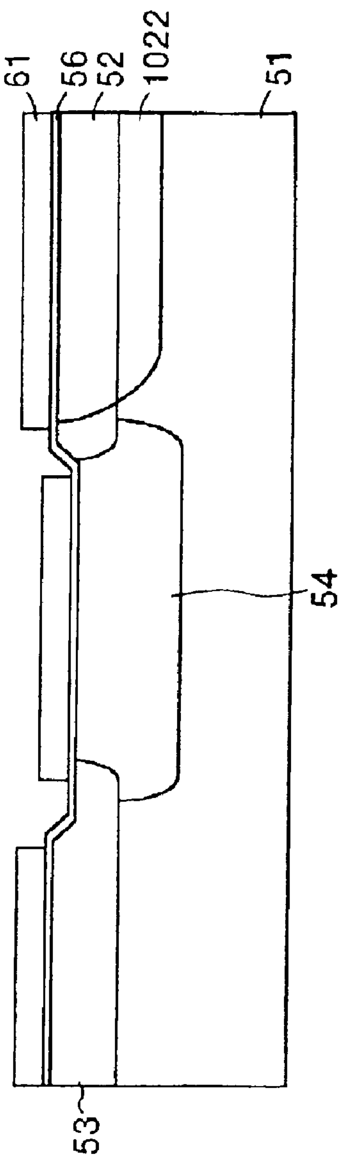
Figure 121:
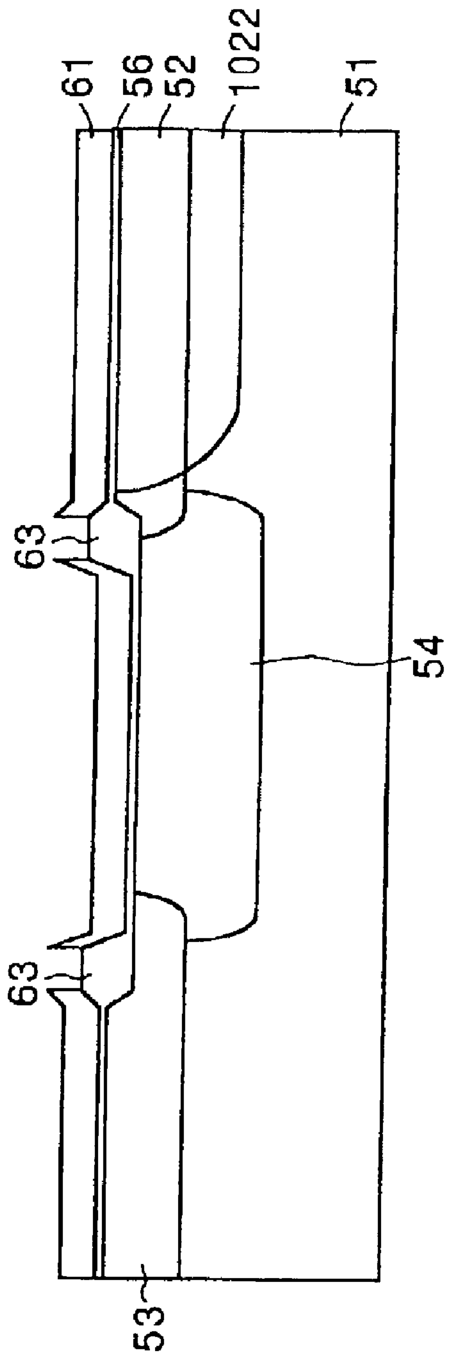
Figure 122:
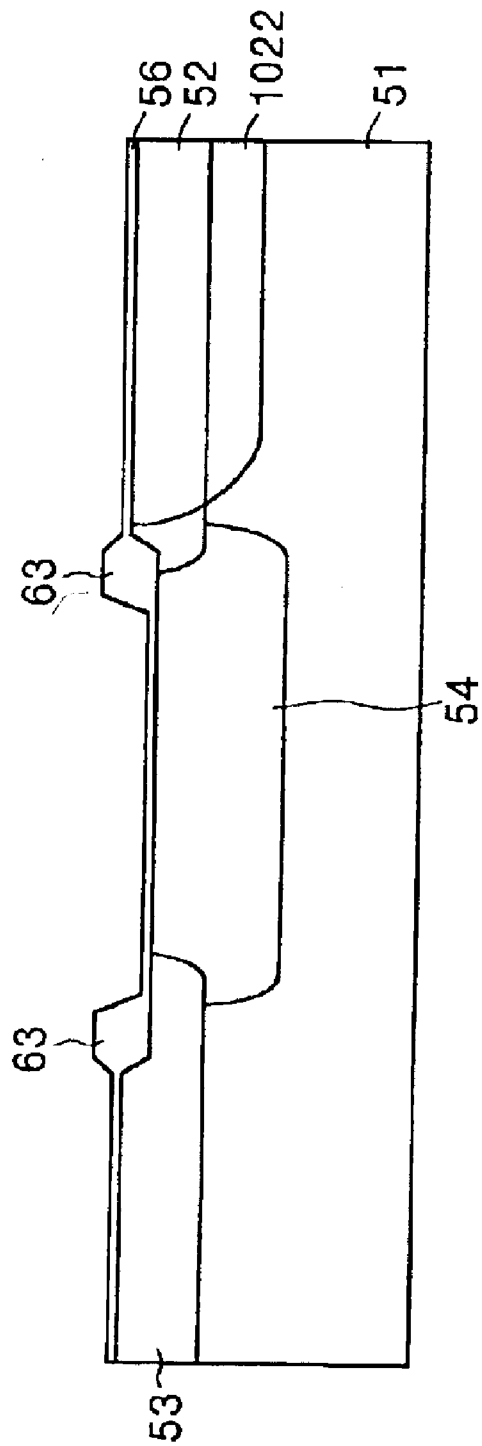

The trench 1030 may be formed after formation of the selective oxidation films 63 for device isolation. That is, an N-well region 54 and p-well regions 52 and 53 are formed selectively in a surface layer of a semiconductor substrate 51 and a buffer oxide film 56 and an extended drain region 1022 are formed by the operations of FIGS. 2, 3, 99, and 100. A silicon nitride film 61 is formed on the buffer oxide film 56 and a mask 62 having openings in device isolation areas is formed thereon (see FIG. 119). The silicon nitride film 61 is patterned by using the mask 62 and the mask 62 is removed (see FIG. 120). Thermal oxidation is performed by using, as a mask, the silicon nitride film 61 remaining on the substrate surface to form selective oxidation films 63 for device isolation (see FIG. 121). The silicon nitride film 61 is removed thereafter (see FIG. 122).

Figure 123:
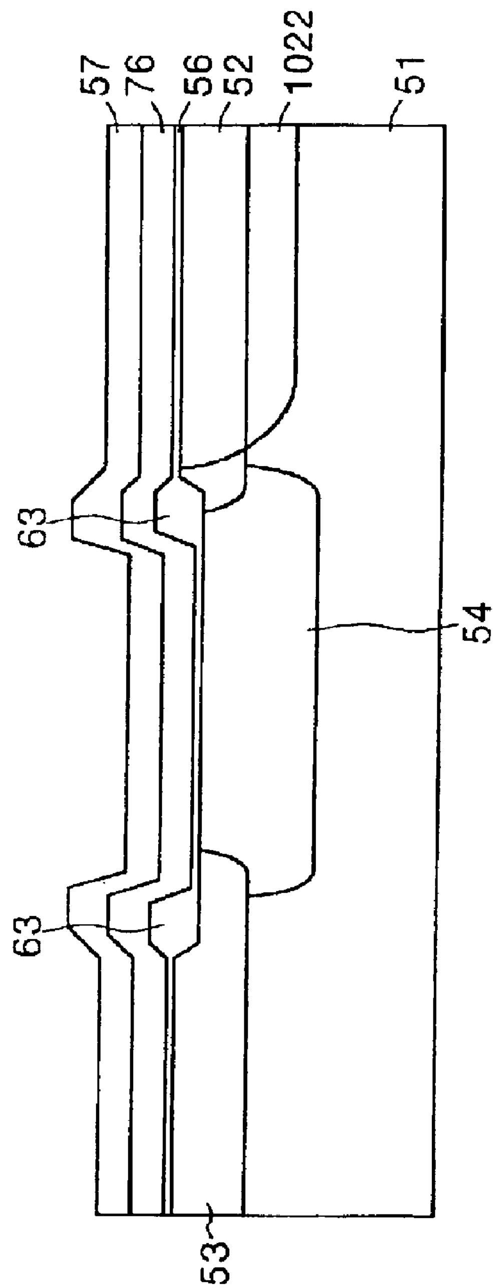
Figure 124:
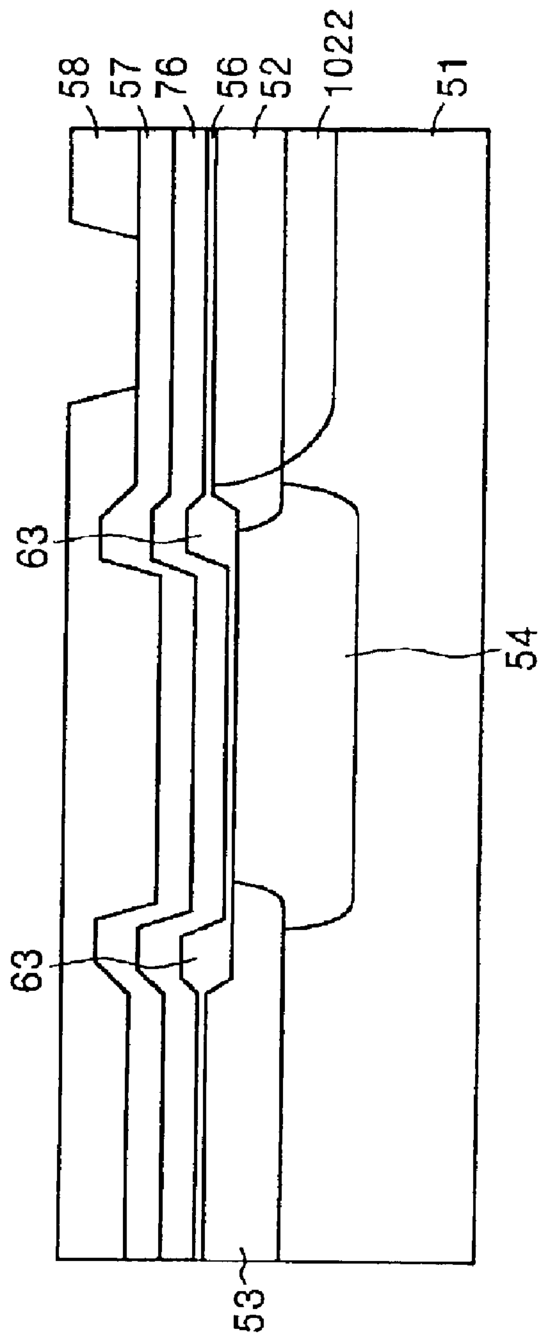
Figure 125:
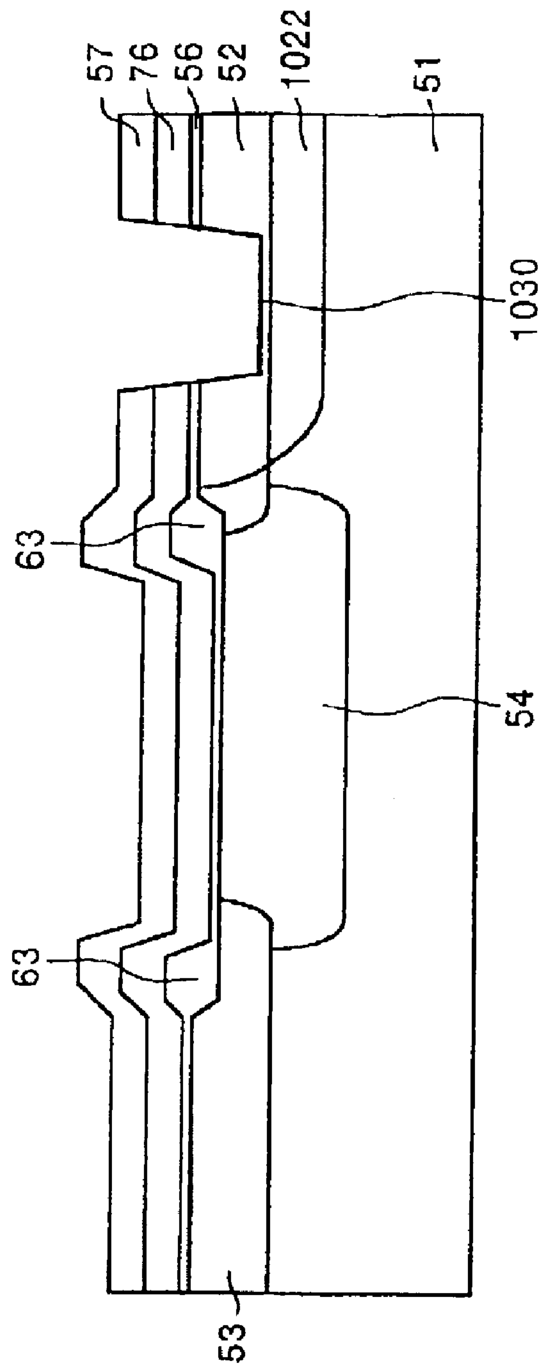
Figure 126:
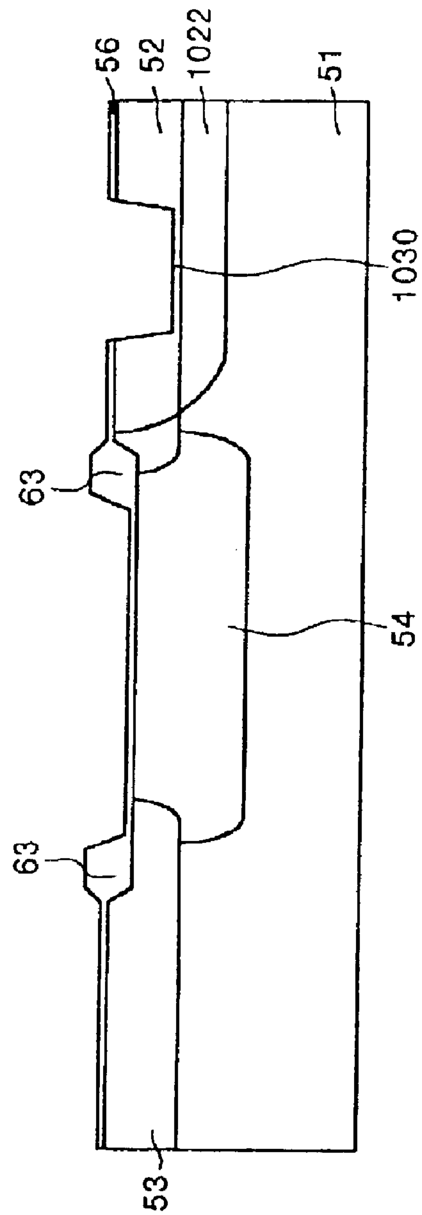
Figure 127:
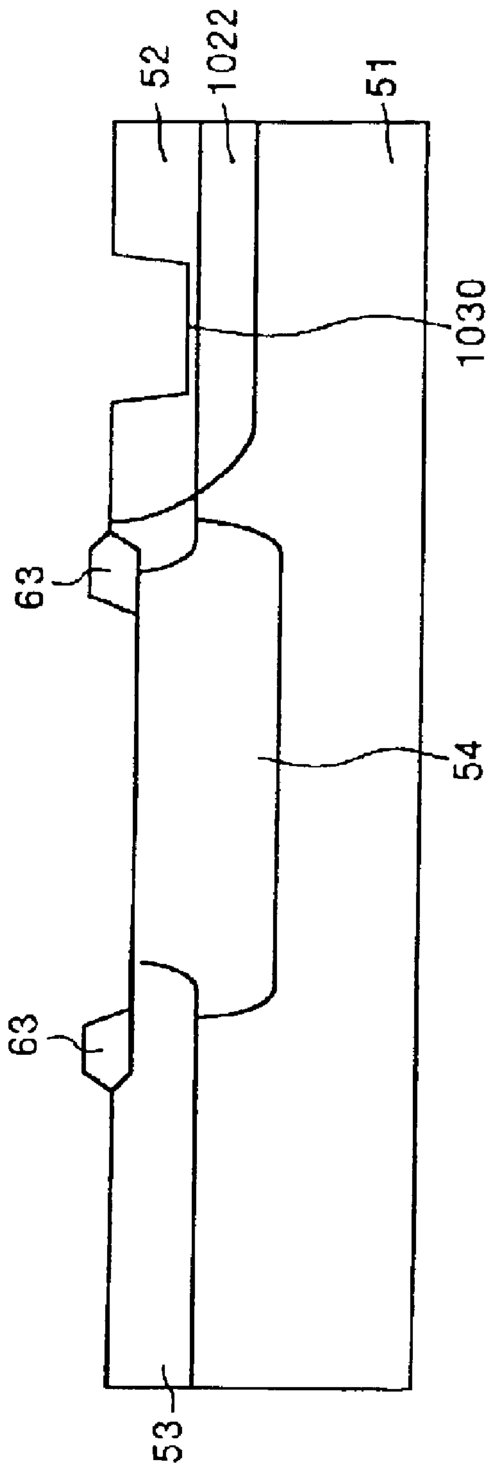

A silicon nitride film 76 is again laid on the substrate surface and a mask oxide film 57 is formed thereon (see FIG. 123). A mask 58 having an opening in a trench forming area is formed on the mask oxide film 57 (see FIG. 124). The mask oxide film 57 is patterned by using the mask 58. After the mask 58 is removed, a trench 1030 is formed by trench etching (see FIG. 125). After the mask oxide film 57 and the silicon nitride film 76 are removed (see FIG. 126), the buffer oxide film 56 on the substrate surface is removed while the selective oxidation films 63 are left (see FIG. 127). Then, buffer oxidation is performed again to form a mask 65 having openings in areas corresponding to the trench 1030 and a future channel region of the intended NMOS, and a p-type impurity such as boron ($B_{11}$) is ion-implanted. The operations of FIG. 108 and the following operations are executed thereafter.

In the above-described sixth embodiment, the gate electrodes 1026 of the TLPM 1100, the gate electrode 226 of the NMOS 200, and the gate electrode 326 of the PMOS 300 are formed by patterning the same polysilicon layer 143. The drain electrodes 1027 and the source electrode 1028 of the TLPM 1100, the drain electrode 227 and the source electrode 228 of the NMOS 200, and the drain electrode 327 and the source electrode 328 of the PMOS 300 are formed by patterning the same metal wiring layer. Therefore, the TLPM 1100, the NMOS 200, and the PMOS 300 can be connected to each other electrically via the metal wiring layer and the polysilicon layer 143. Since, unlike conventional cases, it is not necessary to perform wire bonding on a printed circuit board, a one-chip power IC can be obtained that is small in size and low in on-resistance and cost.

In the sixth embodiment, the base region 1045 of the TLPM 1100 and the channel region 233 of the NMOS 200 are formed at the same time, the gate electrodes 1026 of the TLPM 1100, the gate electrode 226 of the NMOS 200, and the gate electrode 326 of the PMOS 300 are formed at the same time, the drain regions 1023 and the source region 1025 of the TLPM 1100 and the drain region 223 and the source region 225 of the NMOS 200 are formed at the same time, and the drain electrodes 1027 and the source electrode 1028 of the TLPM 1100, the drain electrode 227 and the source electrode 228 of the NMOS 200, and the drain electrode 327 and the source electrode 328 of the PMOS 300 are formed at the same time. Thus, the sixth embodiment can prevent cost increase due to increase in the number of manufacturing operations.

Figure 128:
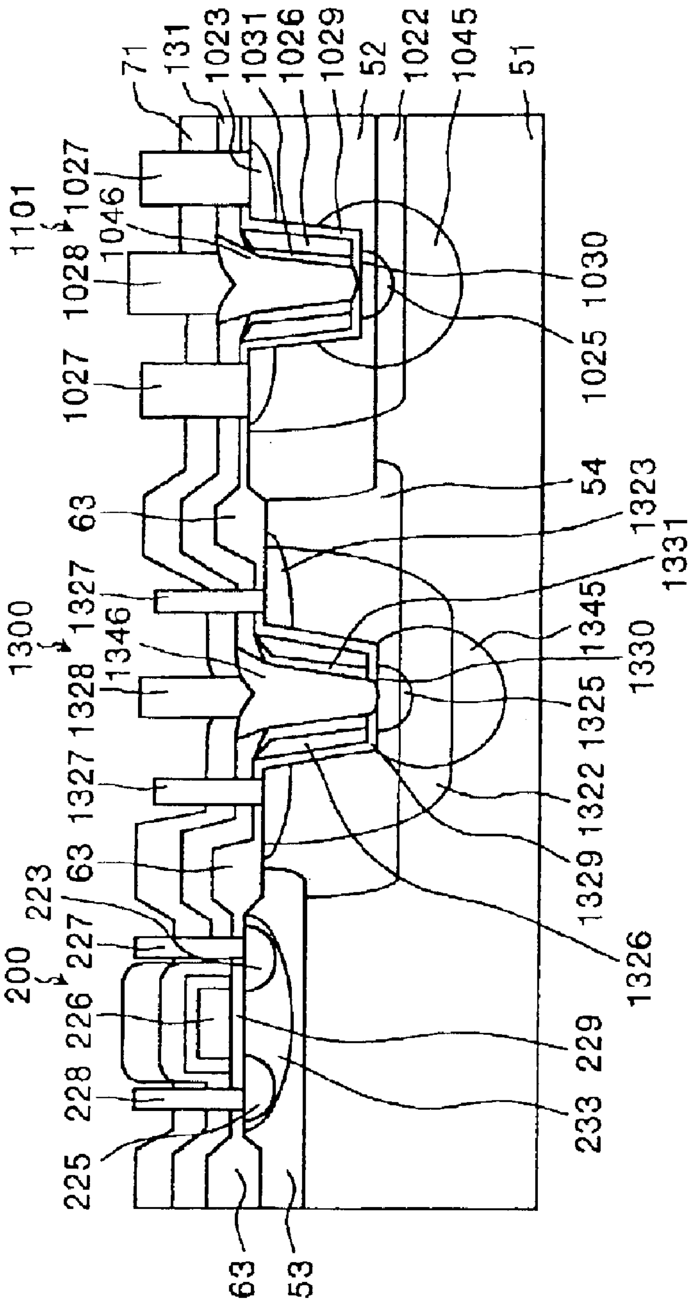
FIG. 128 is a vertical sectional view showing the configuration of a semiconductor device according to a seventh embodiment of the invention.

FIG. 128 is a vertical sectional view showing the configuration of a semiconductor device according to a seventh embodiment of the invention. As shown in FIG. 128, p-well regions 52 and 53 and an n-well region 54 are formed in a surface layer of a p-type semiconductor substrate 51. A first TLPM 1101 of the type (second type) that source contact is made at the bottom of a trench is formed in the first p-well region 52, an NMOS 200 is formed in the second p-well region 53, and a second TLPM 1300 of the type (second type) that source contact is made at the bottom of a trench is formed in the n-well region 54. The first TLPM 1101, the NMOS 200, and the second TLPM 1300 are isolated from each other by selective oxidation films 63.

The first TLPM 1101 is approximately the same as the TLPM 1100 (see FIG. 98) described in the sixth embodiment. Whereas in the TLPM 1100 of the sixth embodiment the n-type source region 1025 is located within the first p-well region 52, in the TLPM 1101 of the seventh embodiment the n-type source region 1025 bridges the first p-well region 52 and the n-type extended drain region 1022. The other part of the configuration of the first TLPM 1101 is the same as the TLPM 1100 of the sixth embodiment and hence will not be described. Regions, electrodes, etc. of the first TLPM 1101 having the same names in the TLPM 1100 of the sixth embodiment are given the same reference numerals as the latter.

The second TLPM 1300 will be described below. A trench 1330 is formed in the n-well region 54. A p-type source region 1325 is provided under the bottom surface of the trench 1330. An n-type base region 1345 is provided adjacent to the bottom surface of the trench 1330 to surround the source region 1325. A p-type extended drain region 1322 that is deeper than the n-well region 54 is provided outside the trench 1330.

P-type drain regions 1323 are provided in substrate surface layers of the extended drain region 1322. A gate oxide film 1329, gate electrodes 1326, an interlayer insulating film 1331 (part of shadow oxide films 68 (described later)), and a source polysilicon layer 1346 are provided inside the trench 1330 in this order from the outside. A source electrode 1328 penetrates through a passivation film 71 and is in contact with the source polysilicon layer 1346, and is in electrical contact with the source region 1325 via the source polysilicon layer 1346. Drain electrodes 1327 penetrate through the passivation film 71 and an interlayer insulating film 131 and are in contact with the respective drain regions 1323.

The NMOS 200 is the same as that of the first embodiment and hence will not be described. Regions, electrodes, etc. of the semiconductor device according to the sixth embodiment having the same names in the semiconductor device according to the first embodiment are given the same reference numerals as the latter and will not be described.

Figure 3:
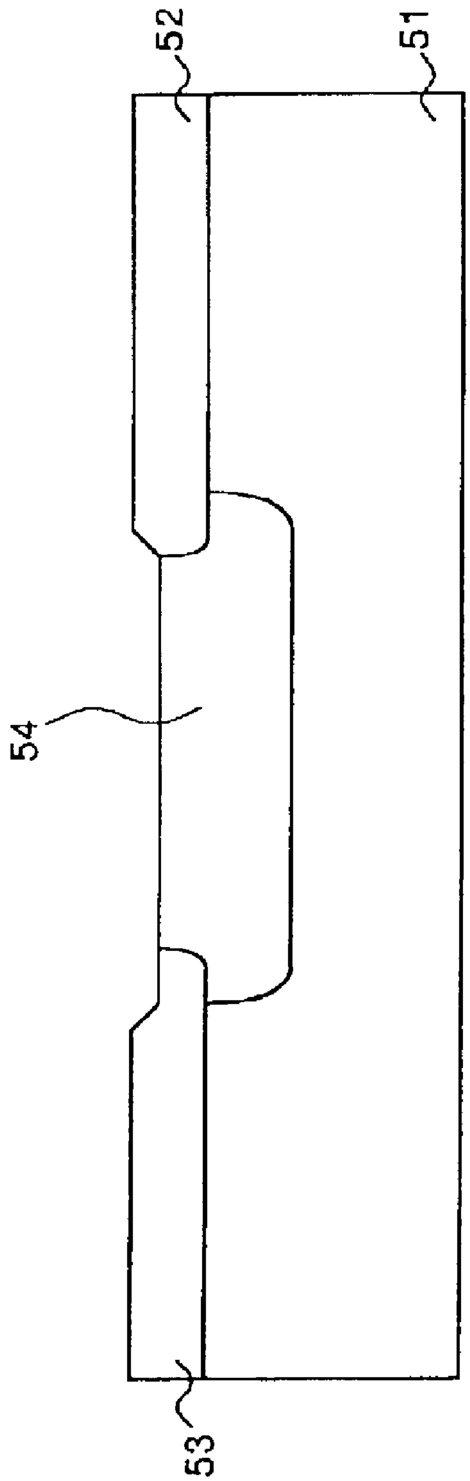
Figure 4:
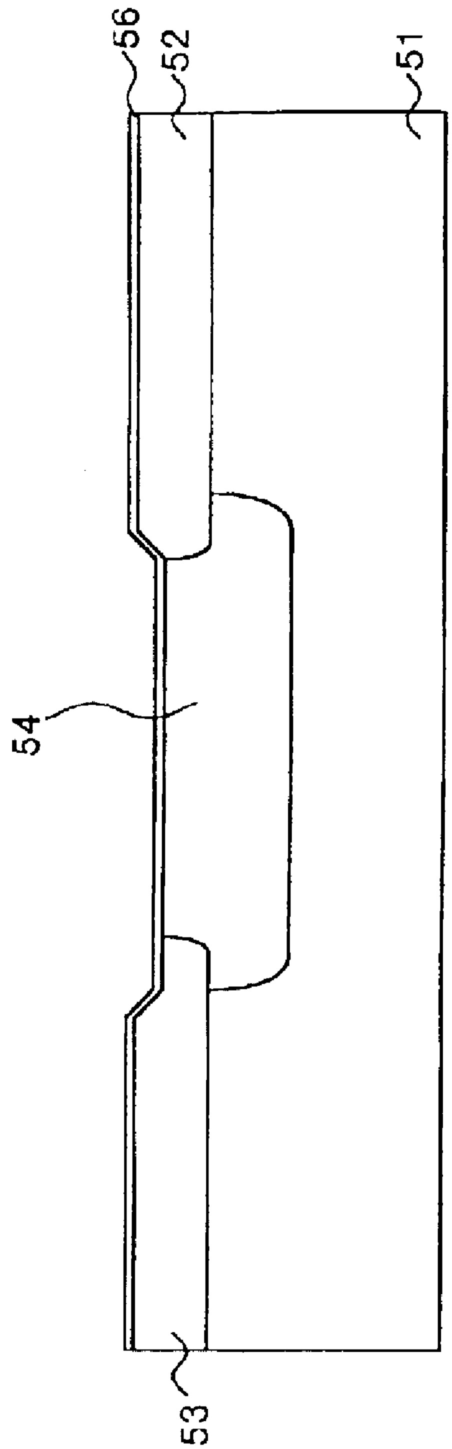
Figure 99:
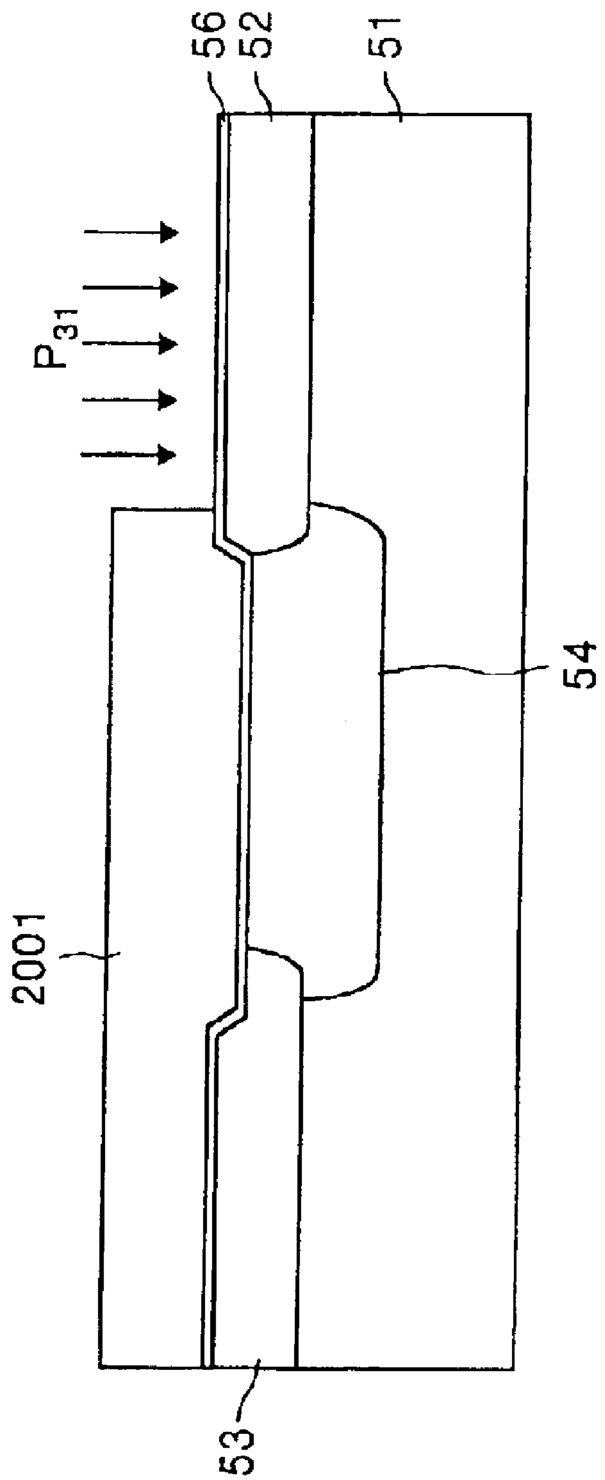
FIGS. 99–118 are vertical sectional views showing intermediate states of manufacture of the embodiment of the semiconductor device shown in FIG. 98.

A manufacturing process of the semiconductor device shown in FIG. 128 is described below. FIGS. 129–148 are vertical sectional views showing intermediate states of manufacture of the embodiment of the semiconductor device of FIG. 128. First, as shown in FIGS. 2, 3, and 99, an n-well region 54 and p-well regions 52 and 53 are formed selectively in a surface layer of a semiconductor substrate 51, a buffer oxide film 56 is formed, and an n-type impurity such as phosphorus ($P_{31}$) is ion-implanted into the first p-well region 52 at a dose of $0.4\times10^{13}$ to $1.8\times10^{13}$ $cm^{-2}$, for example.

Figure 129:
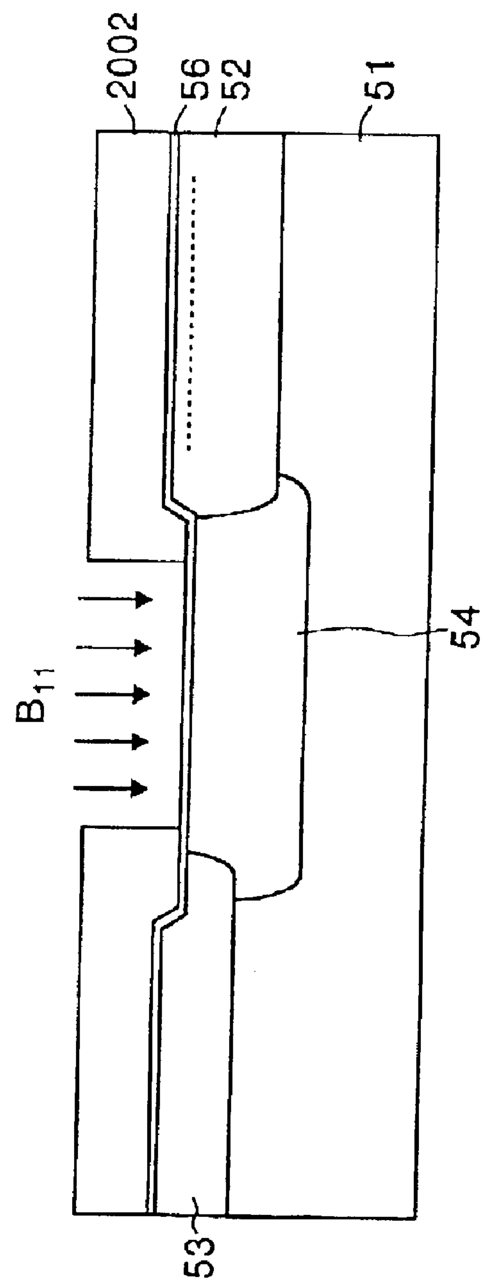
FIGS. 129–148 are vertical sectional views showing intermediate states of manufacture of the embodiment of the semiconductor device shown in FIG. 128.
Figure 130:
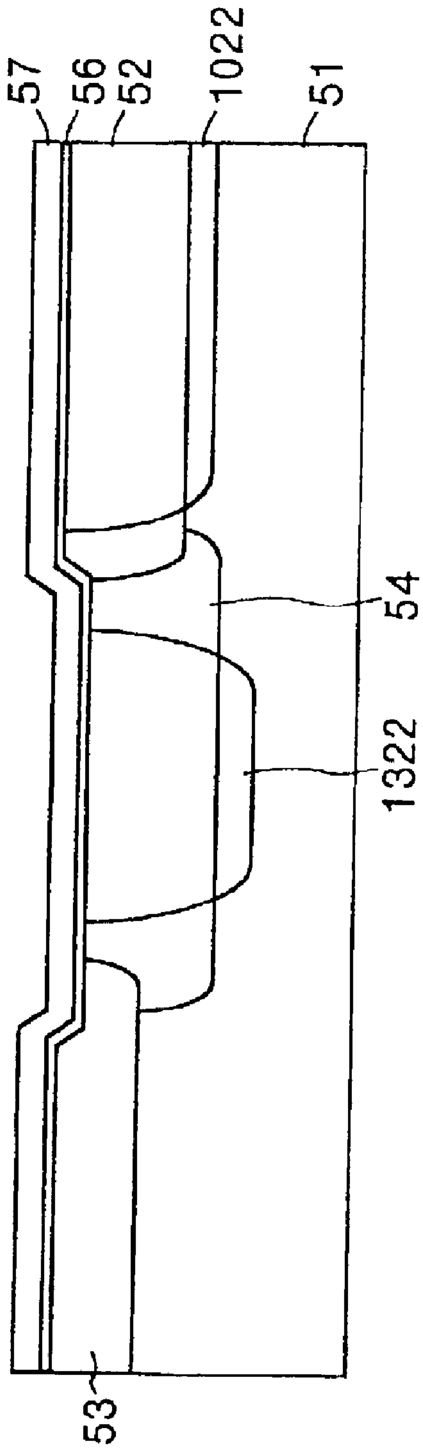

After the mask 2001 is removed, a mask 2002 having a prescribed pattern is formed and a p-type impurity such as boron ($B_{11}$) is ion-implanted into the n-well region 54 at a dose of $0.6\times10^{13}$ to $1.8\times10^{13}$ $cm^{-2}$, for example, by using the mask 2002 (see FIG. 129). The implanted impurities are diffused, whereby an n-type extended drain region 1022 and a p-type extended drain region 1322 are formed. After the mask 2002 is removed, a mask oxide film 57 having a thickness of 1 $\mu$m, for example, is laid on the buffer oxide film 56 (see FIG. 130).

Figure 131:
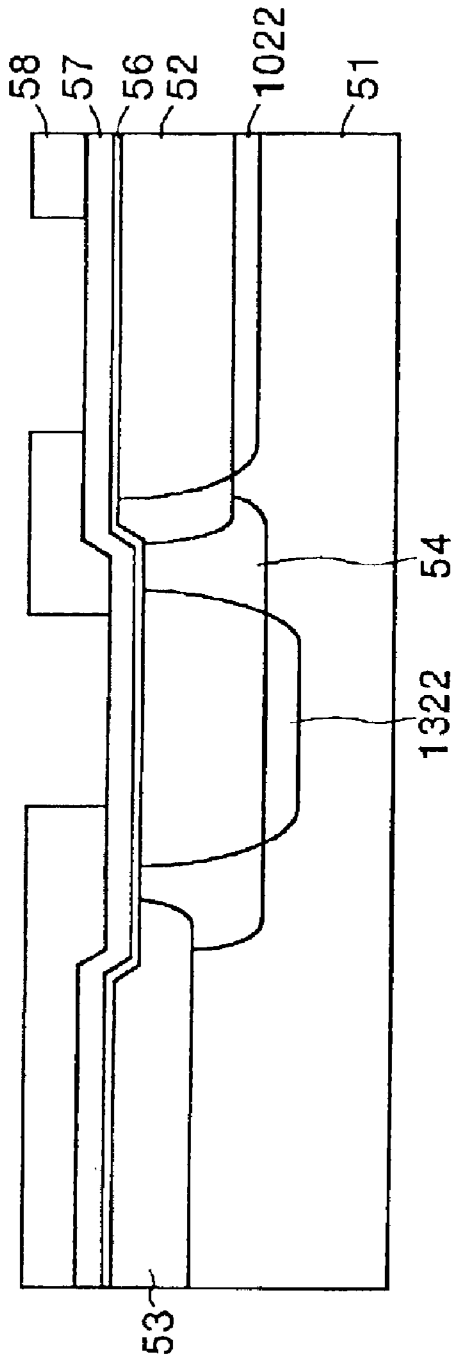
Figure 132:
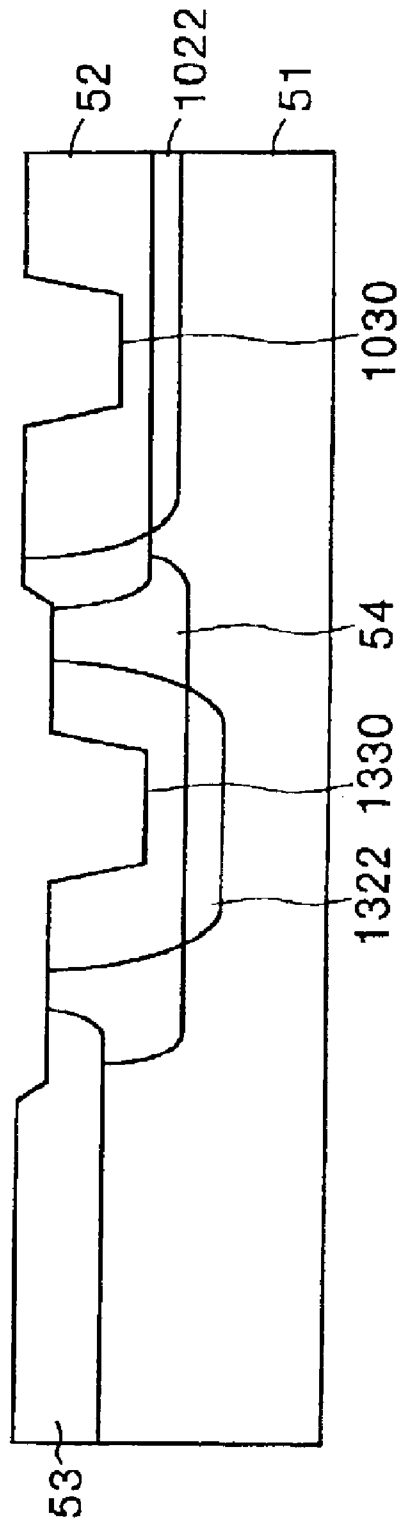
Figure 133:
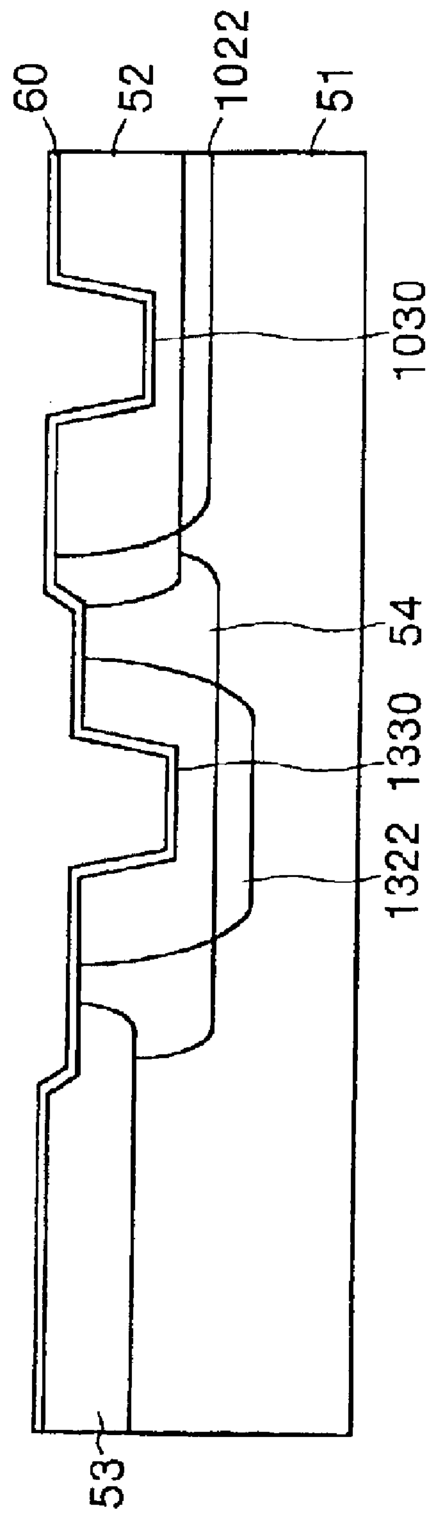

A mask 58 having openings in trench forming areas is formed on the mask oxide film 57 (see FIG. 131). The mask oxide film 57 is patterned by using the mask 58. After the mask 58 is removed, trench etching (RIE) is performed, whereby trenches 1030 and 1330 are formed in the first p-well region 52 and the n-well region 54, respectively, at the same time. To distinguish the two trenches 1030 and 1330 from each other, the trench 1030 in the first p-well region 52 will be called "first trench 1030" and the trench 1330 in the n-well region 54 will be called "second trench 1330." Then, all the oxide films on the substrate surface including the mask oxide film 57 are removed (see FIG. 132).

Figure 134:
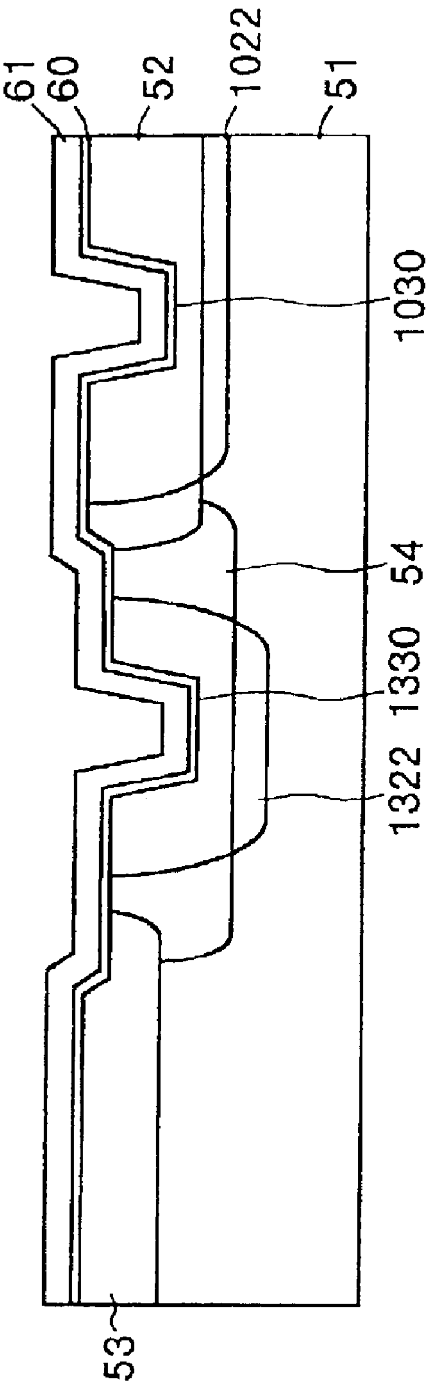
Figure 135:
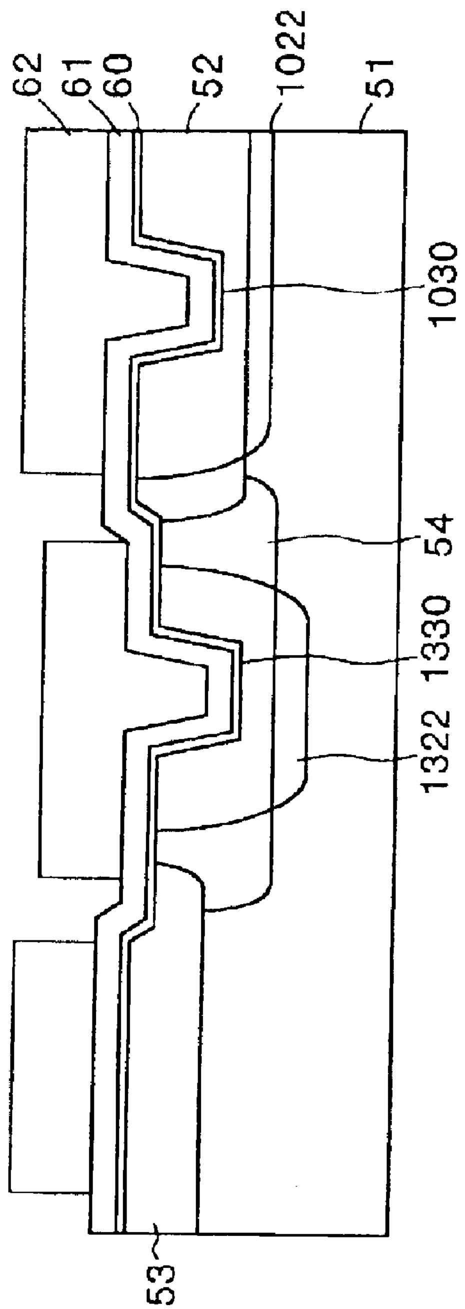
Figure 136:
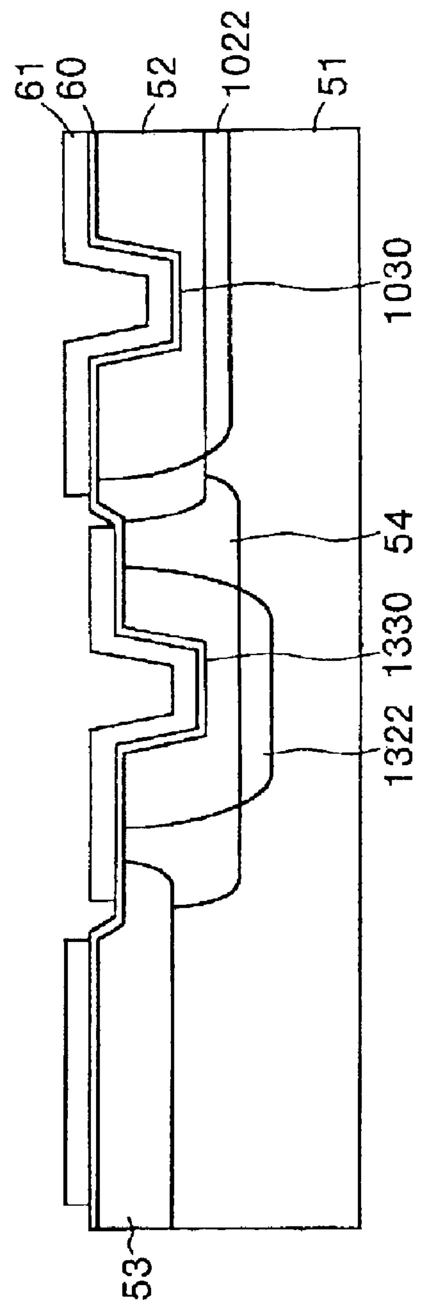
Figure 137:
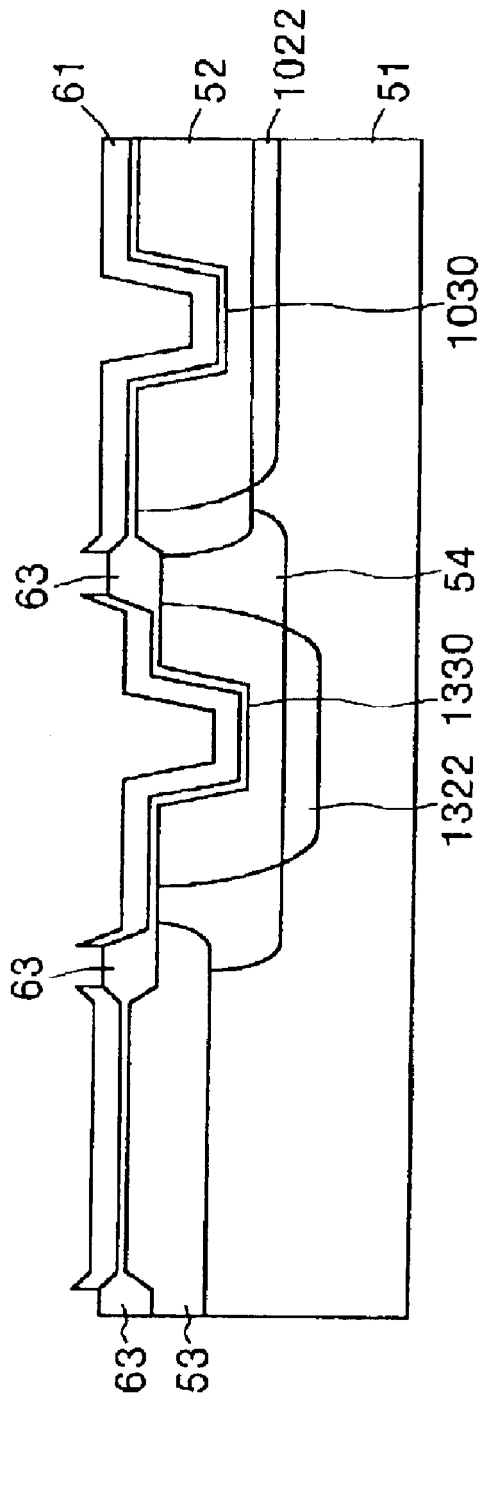
Figure 138:
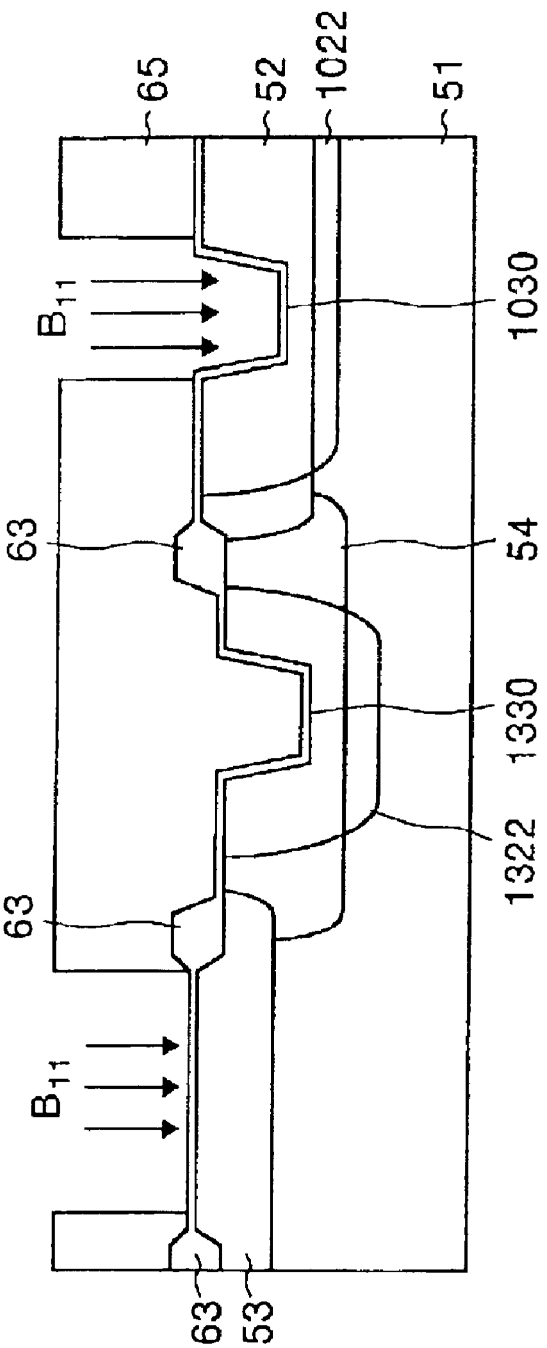
Figure 139:
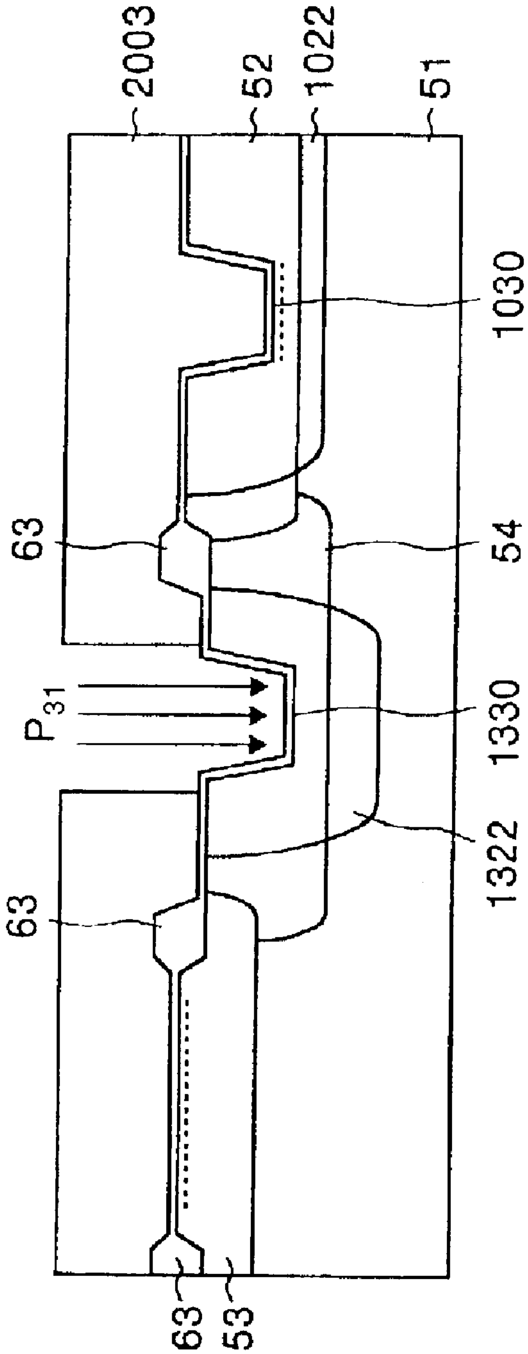
Figure 140:
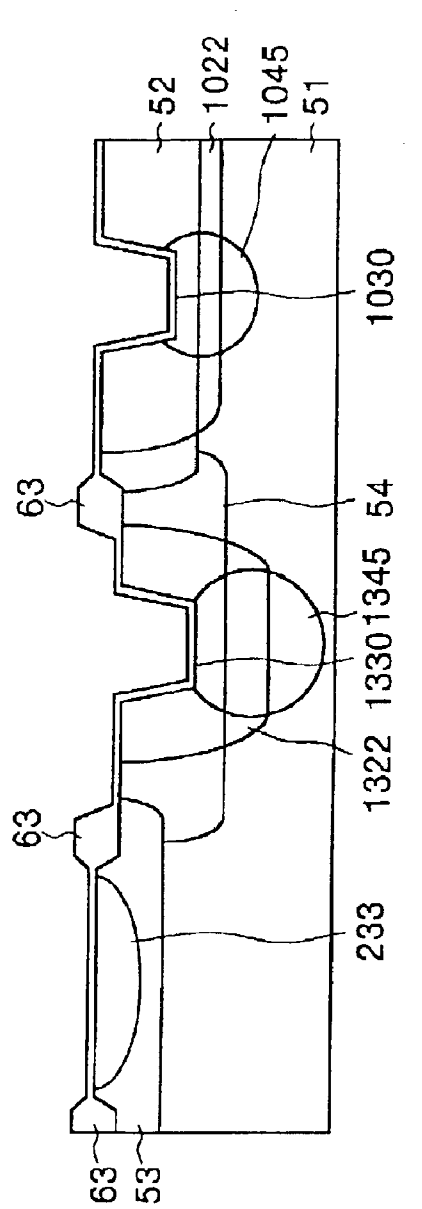
Figure 141:
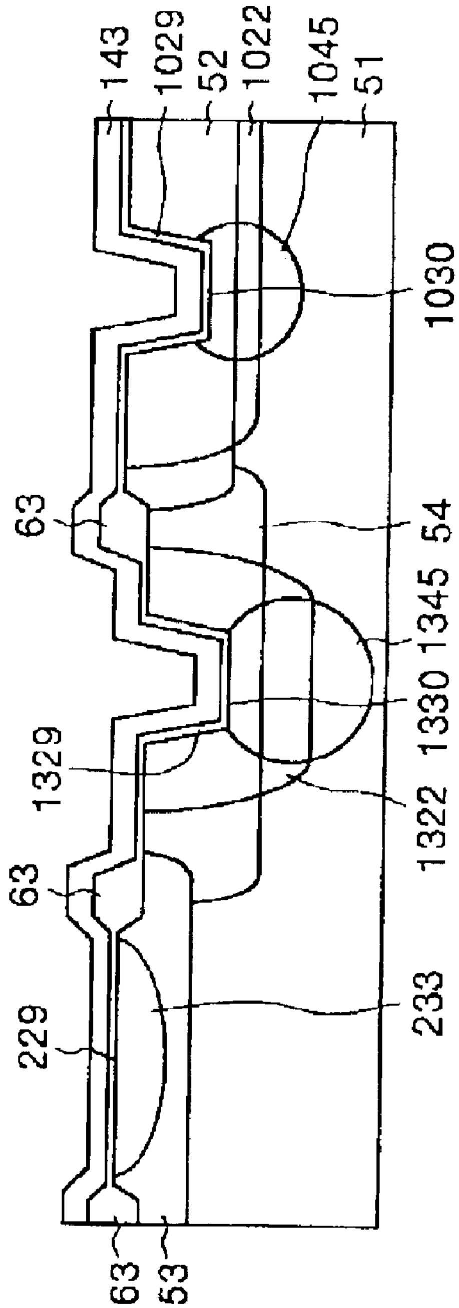

Subsequently, a buffer oxide film 60 is formed on the substrate surface and the surfaces of the trenches 1030 and 1330 (see FIG. 133), and a silicon nitride film 61 is formed thereon (see FIG. 134). A mask 62 having openings in device isolation areas is formed on the silicon nitride film 61 (see FIG. 135). The silicon nitride film 61 is patterned by using the mask 62, and the mask 62 is removed thereafter (see FIG. 136). Then, thermal oxidation is performed by using, as a mask, the silicon nitride film 61 remaining on the substrate surface to form selective oxidation films 63 for device isolation (see FIG. 137).

After the silicon nitride film 61 is removed and sacrificial oxidation is performed, a mask 65 having openings in areas corresponding to the first trench 1030 and a future channel region of the intended NMOS is formed. A p-type impurity such as boron ($B_{11}$) is ion-implanted at a dose of $0.4\times10^{14}$ to $1\times10^{14}$ $cm^{-2}$, for example, by using the mask 65 (see FIG. 138). After the mask 65 is removed, a mask 2003 having an opening over the second trench 1330 is formed. An n-type impurity such as phosphorus ($P_{31}$) is ion-implanted at a dose of $0.4\times10^{14}$ to $1\times10^{14}$ $cm^{-2}$, for example, by using the mask 2003 (see FIG. 139).

Then, the implanted impurities are diffused, whereby a p-type base region 1045 and an n-type base region 1345 are formed under the bottom surfaces of the first trench 1030 and the second trench 1330, respectively, and, at the same time, a channel region 233 of the intended NMOS is formed in the second p-well region 53. The mask 2003 is removed thereafter (see FIG. 140). The operations of FIG. 138 and FIG. 139 may be reversed.

After the thin oxide film on the substrate surface and the surfaces of the trenches 1030 and 1330 are removed, a gate oxide film 1029 of the intended first TLPM, a gate oxide film 229 of the intended NMOS, and a gate oxide film 1329 of the intended second TLPM are formed. The gate oxide films 1029, 1329, and 229 of the intended first TLPM, second TLPM, and NMOS may be formed simultaneously without using masks, in which case the process is simplified, and the cost is reduced.

Figure 142:
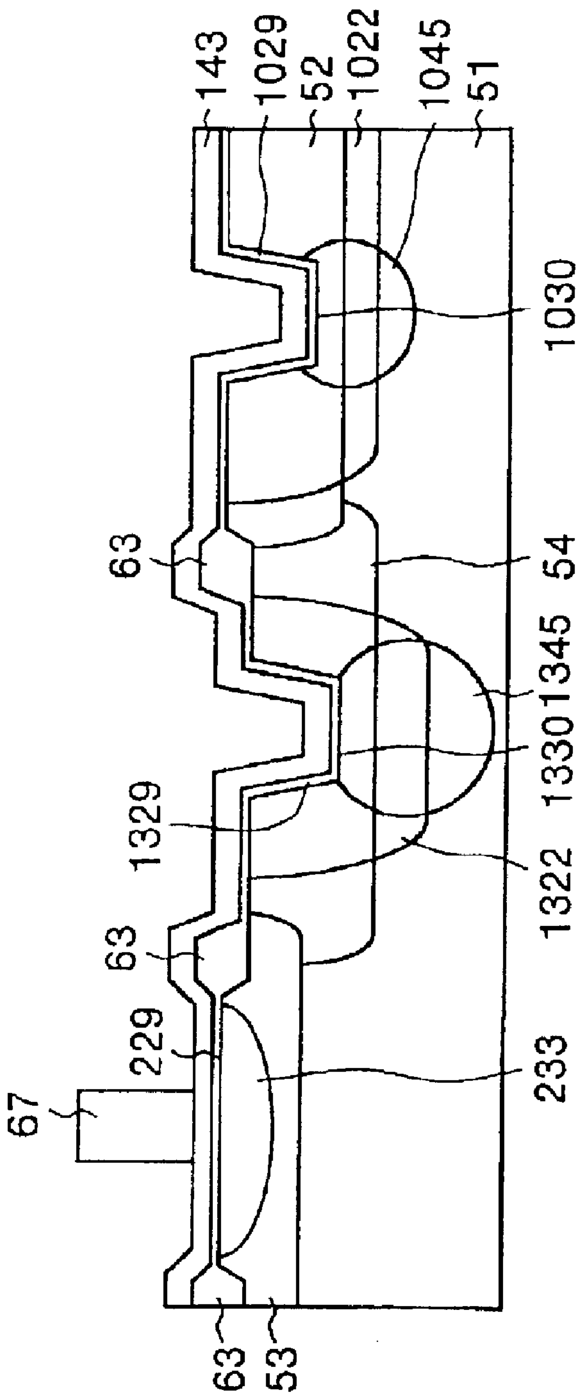
Figure 143:
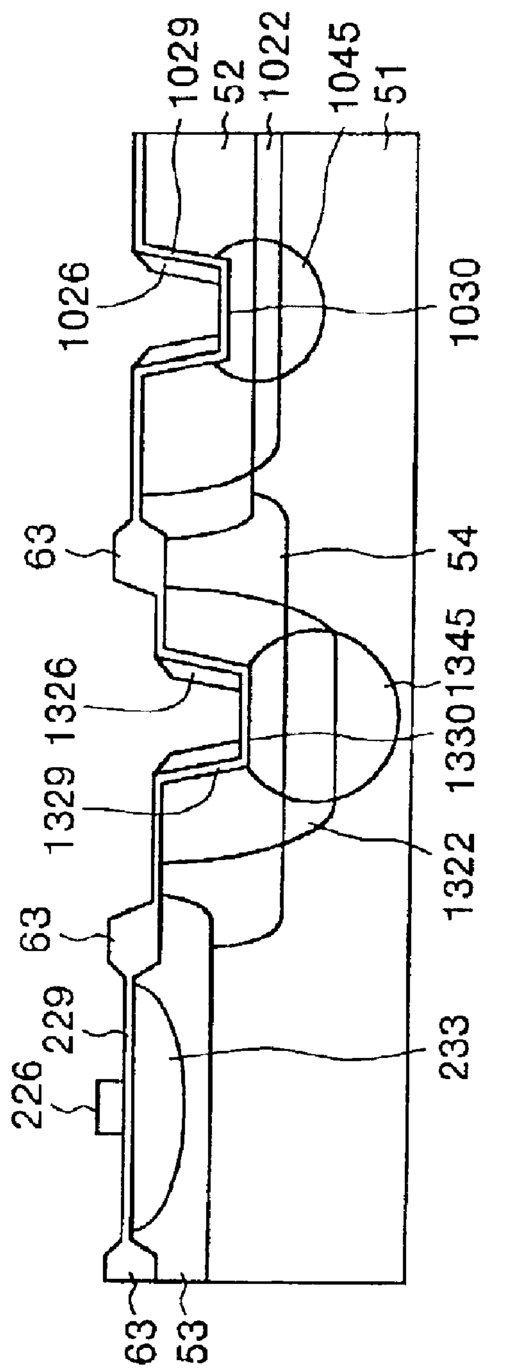

Subsequently, a polysilicon layer 143 is laid (see FIG. 141), and a mask 67 is formed only on those portions of the polysilicon layer 143 which are to become a gate electrode of the intended NMOS (see FIG. 142). Anisotropic etching (RIE or the like) is performed on the polysilicon layer 143 by using the mask 67 to form a gate electrode 226 of the intended NMOS and, at the same time, to form gate electrodes 1026 of the intended first TLPM and gate electrodes 1326 of the intended second TLPM inside the first and second trenches 1030 and 1330 by self-alignment, thus simplifying the process and reducing the cost. The mask 67 is removed thereafter (see FIG. 143).

Figure 144:
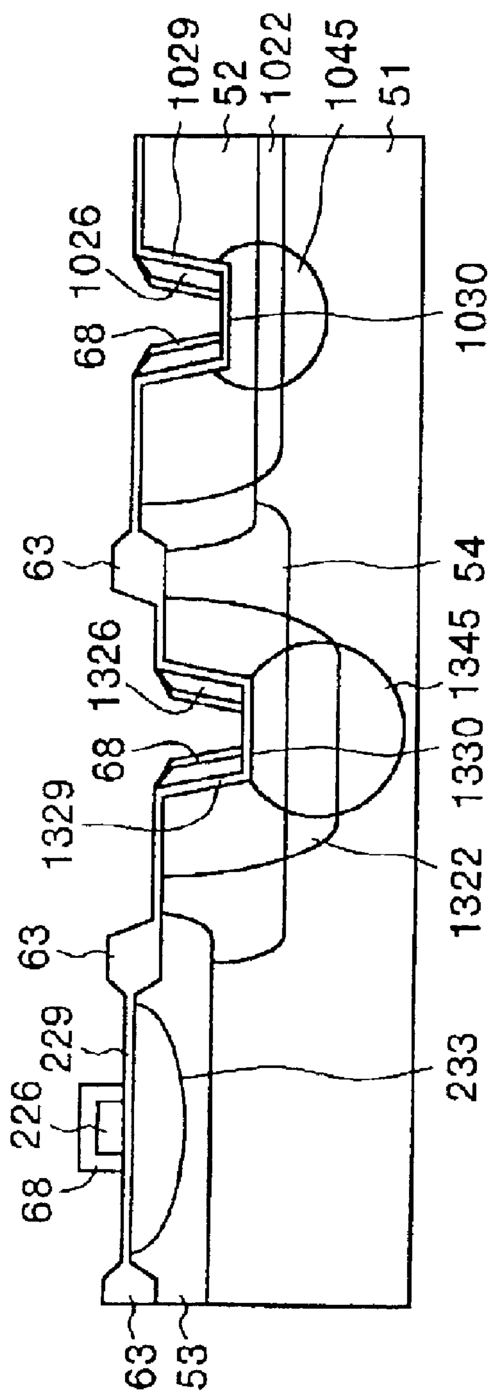
Figure 145:
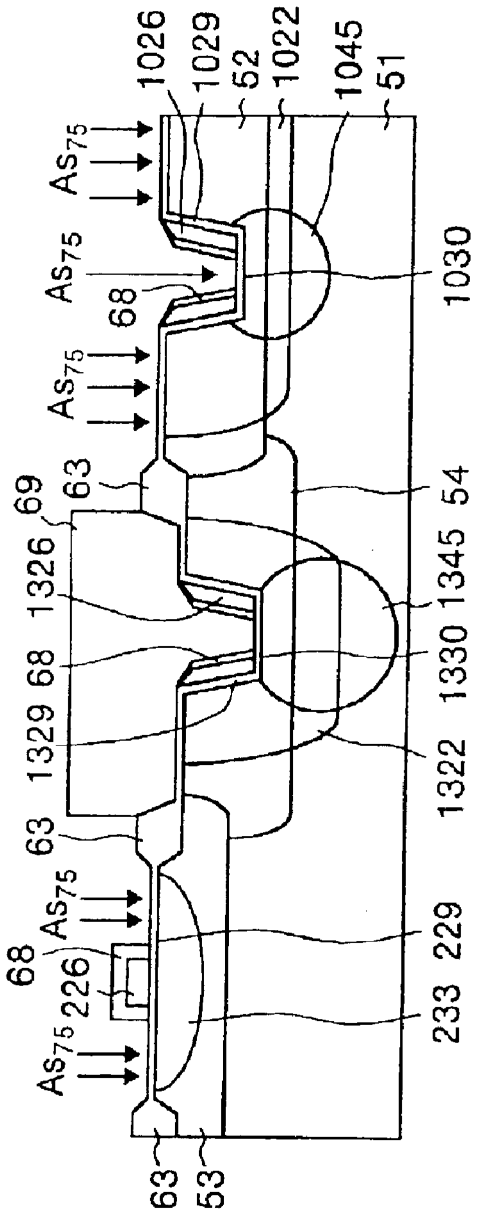
Figure 146:
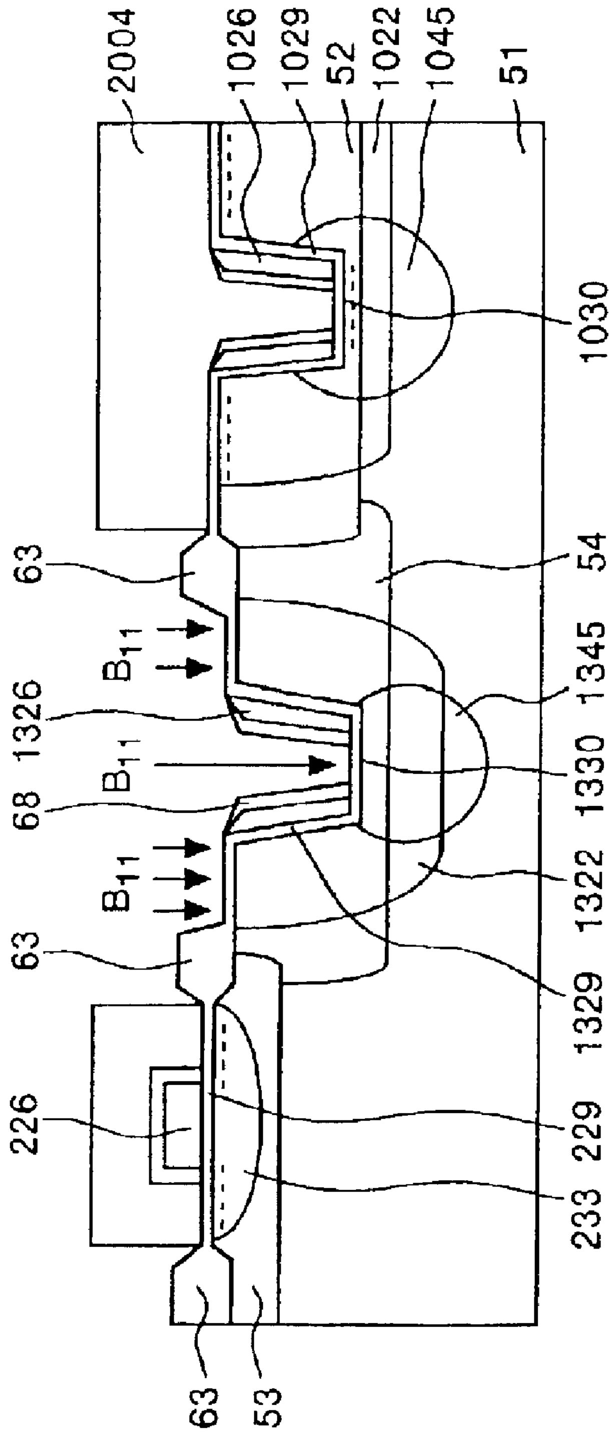
Figure 147:
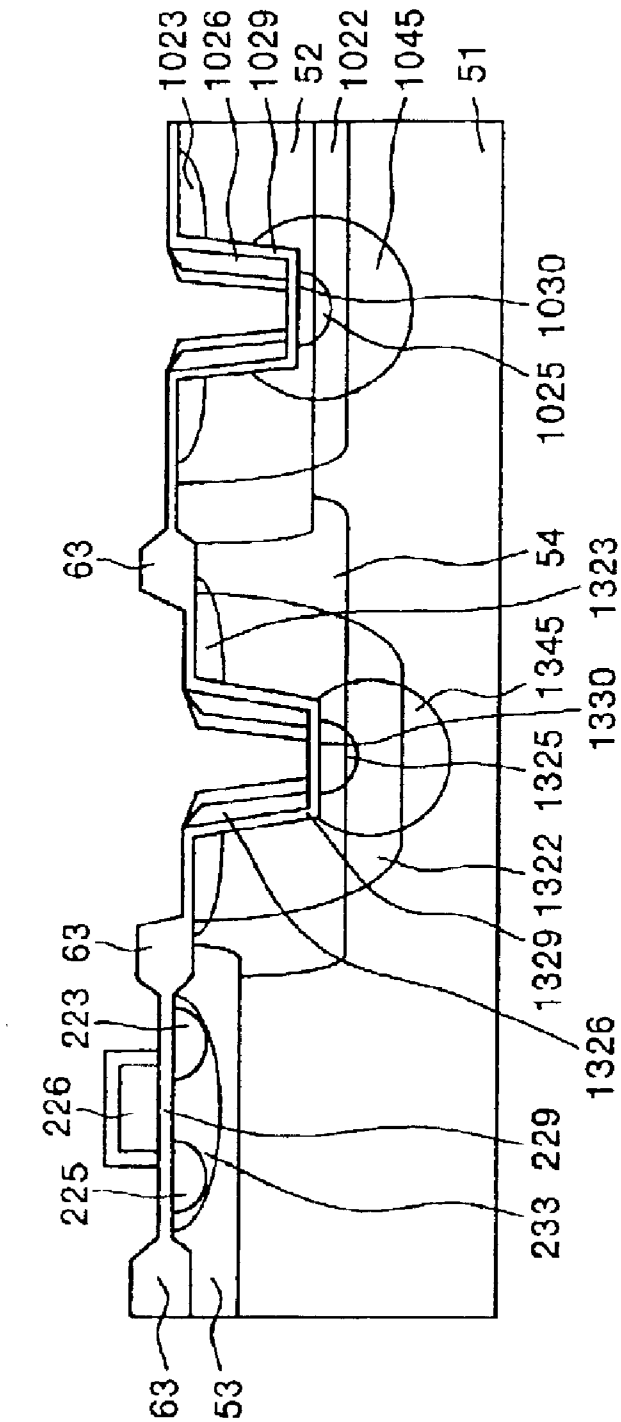
Figure 148:
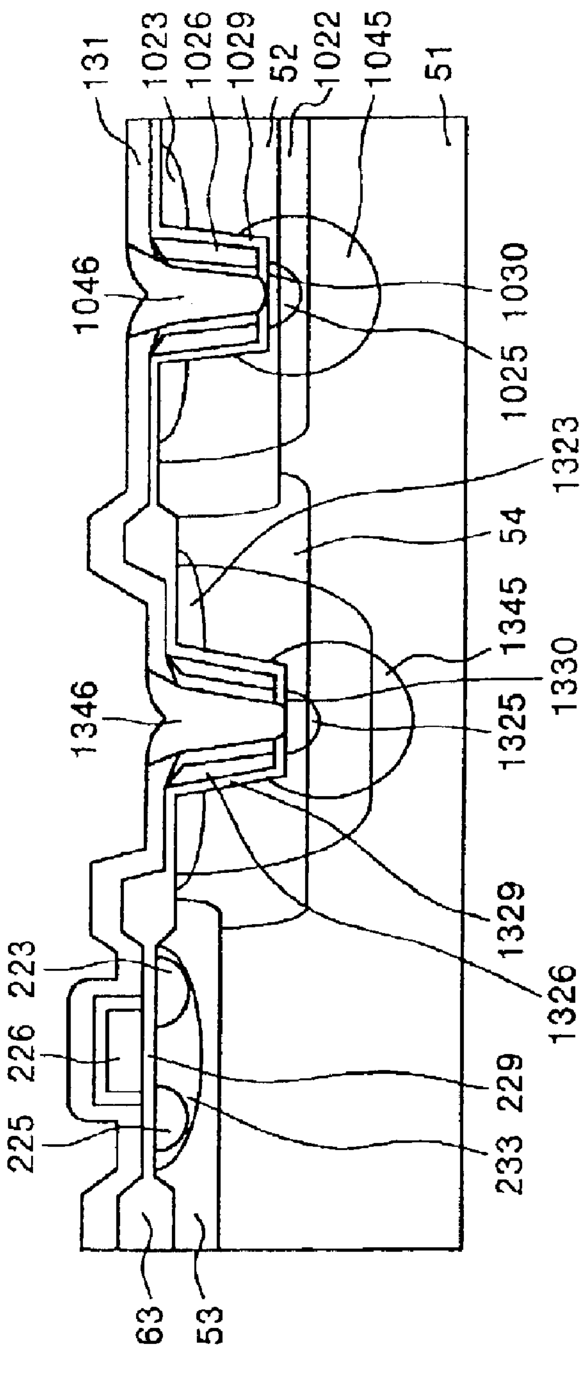

Subsequently, shadow oxide films 68 are formed to cover the gate electrodes 1026 and 1326 of the intended first and second TLPMs and the gate electrode 226 of the intended NMOS (see FIG. 144). After a mask 69 having openings in an area where to form a source region and drain regions of the intended first TLPM and an NMOS forming area is formed on the substrate surface, an n-type impurity such as arsenic ($As_{75}$) is ion-implanted (see FIG. 145). Then, a mask 2004 having an opening in an area corresponding to a future source region and drain regions of the intended second TLPM is formed, and a p-type impurity such as boron ($B_{11}$) is ion-implanted (see FIG. 146).

The implanted impurities are diffused, whereby a source region 1025 of the intended first TLPM is formed under the bottom surface of the first trench 1030, drain regions 1023 of the intended first TLPM are formed on both sides of the first trench 1030, a source region 1325 of the intended second TLPM is formed under the bottom surface of the second trench 1330, drain regions 1323 of the intended second TLPM are formed on both sides of the second trench 1330, and a source region 225 and a drain region 223 of the intended NMOS are formed in the channel region 233 simultaneously. The mask 2004 is removed thereafter (see FIG. 147). The operations of FIG. 145 and the operations of FIG. 146 may be reversed.

Subsequently, an interlayer insulating film 131 is laid over the substrate surface, and portions of the interlayer insulating film 131 inside the first and second trenches 1030 and 1330 are etched away by self-alignment to form contact holes. The inside of the first trench 1030 is filled with a source polysilicon layer 1046 and the inside of the second trench 1330 is filled with a source polysilicon layer 1346 (see FIG. 148). Then, a passivation film 71 is formed over the substrate surface and patterned to form contact holes.

A metal film is formed on the passivation film 71 and then patterned, whereby a source electrode 1028 of the intended first TLPM that is in contact with the source polysilicon layer 1046, drain electrodes 1027 of the intended first TLPM that are in contact with the respective drain regions 1023, a source electrode 1328 of the intended second TLPM that is in contact with the source polysilicon layer 1346, drain electrodes 1327 of the intended second TLPM that are in contact with the respective drain regions 1323, and a drain electrode 227 and a source electrode 228 of the intended NMOS that are in contact with the drain region 223 and the source region 225, respectively, are formed at the same time. In this manner, a semiconductor device is completed in which the first TLPM 1101, the NMOS 200, and the second TLPM 1300 are integrated on the same semiconductor substrate 51 as shown in FIG. 128.

In the device that is obtained according to the above-described manufacturing process, the impurity diffusion lengths in the depth direction from the substrate surface of the two p-well regions 52 and 53, the n-well region 1022, the n-type extended drain region 1022, the p-type extended drain region 1322, the p-type base region 1045, and the n-type base region 1345 are, for example, 2.3 to 2.6 μm, 3.4 to 4.5 μm, 1.8 to 2.1 μm, 2.3 to 2.6 μm, 1.1 to 1.2 μm, and 1.0 to 1.1 μm, respectively. The first TLPM 1101 has an on-resistance of 10 to 20 mΩ-$mm^2$ when the device breakdown voltage is about 30 to 40 V. The second TLPM 1300 has an on-resistance of 20 to 30 mΩ-$mm^2$ when the device breakdown voltage is about 30to 40 V. These on-resistance values are ½ to ⅓ of the value of the conventional planar power MOSFET shown in FIG. 265 for the same device breakdown voltage.

In the TLPN 101 shown in FIG. 128, even where the impurity concentration of the extended drain region 1022 is increased to lower the on-resistance, the breakdown voltage can be kept high by making the first p-well region 52 deeper than the extended drain region 1022.

The p-type base region 1045 of the TLPM 1101, the n-type base region 1345 of the TLPM 1300 and the substrate 51 may be grounded in the following manner. First, the well regions 52 and 54 are formed to be deeper than the extended drain regions 1022 and 1322 and are connected to the p-type base region 1045 and the n-type base region 1345, respectively. In forming the contact holes by patterning the passivation film 71, other openings are formed above the well regions 52 and 54. A p-type plug region and an n-type plug region are formed. In patterning the metal film, metal portions are left on the p-type plug region and the n-type plug region, and electrodes are formed there. The p-type base region 1045, the n-type base region 1345 and the substrate 51 are prevented from floating by grounding these electrodes to prevent the TLPMs 1101 and 1300 from being lowered in breakdown voltage.

In FIG. 128, in the case where a DC-DC converter having the n-type TLPM 1101 and the p-type TLPM 1300 is to be formed, the n-well region 54 is made deeper than the extended drain region 1322 and the extended drain region 1322 is formed in the n-well region 54, which provides the following advantage. To form a DC-DC converter, it is necessary to give the same potential to the drain electrodes 1027 and 1327 of the n-type TLPM 1101 and the p-type TLPM 1300. Therefore, if the extended drain region 1322 were deeper than the n-well region 54, the extended drain region 1322 would be connected to the p-type substrate 51 and they would have the same potential. On the other hand, where the source electrode 1028 of the n-type TLPM 1101 is grounded to the substrate 51 as described above to prevent reduction in breakdown voltage due to floating of the base region 1045, the source electrode 1028 has the same potential as the substrate 51. As a result, a short-circuit would develop between the source electrode 1028 and the drain electrodes 1027 and 1327 via the substrate 51. The intended function of a DC-DC converter could not be attained. This problem can be avoided by making the n-well region 54 deeper than the extended drain region 1322. That is, the extended drain region 1322 can be isolated from the substrate 51 and hence a short-circuit does not develop between the source electrode 1028 and the drain electrodes 1027 and 1327.

The above-described seventh embodiment can provide a one-chip power IC that is small in size and low in on-resistance and cost while preventing cost increase due to an increase in the number of manufacturing operations. Further, since a p-channel TLPM and an n-channel TLPM can be integrated on the same semiconductor substrate, the integration density can be increased to a large extent, and the area of a power MOSFET section can be reduced to about 40% of that of a conventional power IC in which p-channel planar power MOSFETs and n-channel planar power MOSFETs are integrated.

Figure 149:
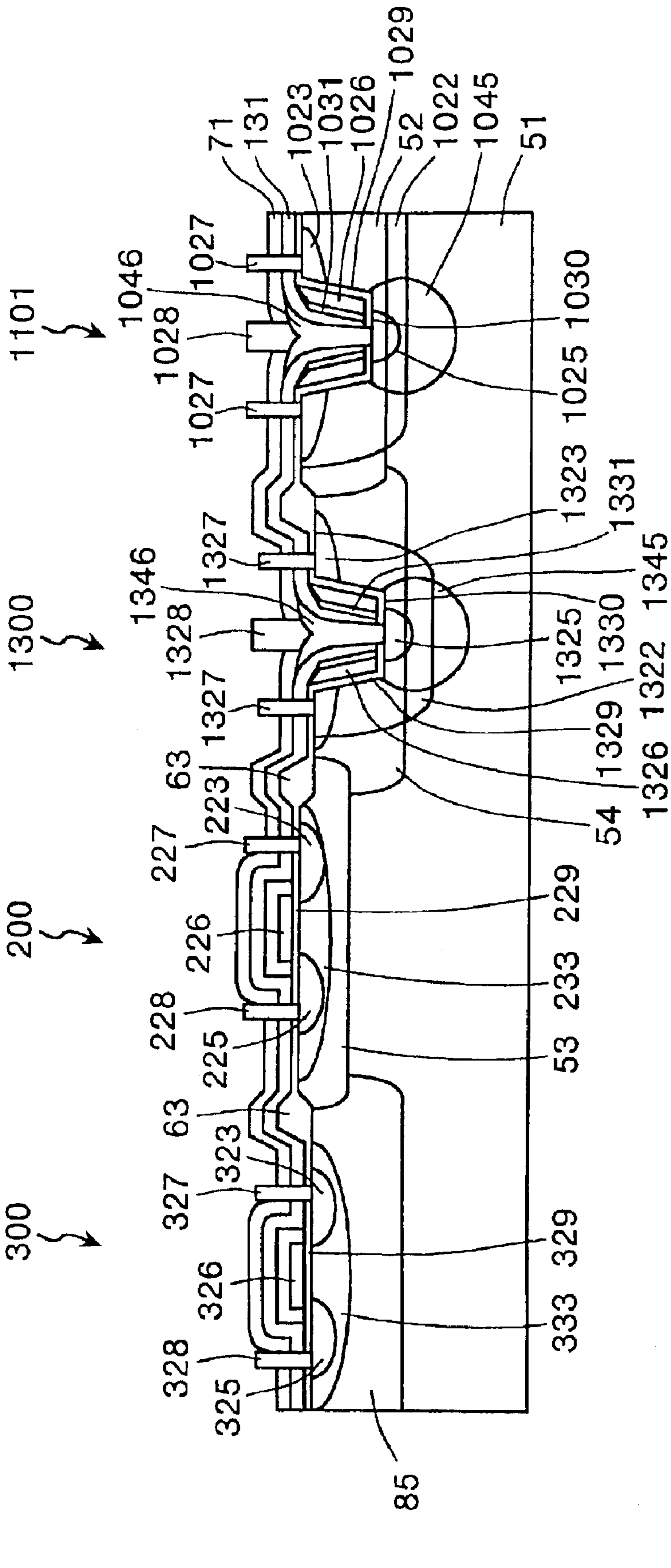
FIG. 149 is a vertical sectional view showing the configuration of a semiconductor device according to an eighth embodiment of the invention.

FIG. 149 is a vertical sectional view showing the configuration of a semiconductor device according to an eighth embodiment of the invention. As shown in FIG. 149, the semiconductor device according to the eighth embodiment has the PMOS 300 of the semiconductor device according to the first embodiment added to the semiconductor device according to the seventh embodiment. That is, a first p-well region 52, a first n-well region 54, a second p-well region 53, and a second n-well region 85 are formed in this order in a surface layer of a p-type semiconductor substrate 51. A first TLPM 1101 of the type (second type) that source contact is made at the bottom of a trench is formed in the first p-well region 52 and a second TLPM 1300 of the type (second type) that source contact is made at the bottom of a trench is formed in the first n-well region 54.

An NMOS 200 is formed in the second p-well region 53 and a PMOS 300 is formed in the second n-well region 85. The first TLPM 1101, the second TLPM 1300, the NMOS 200, and the PMOS 300 are isolated from each other by selective oxidation films 63. The configurations of the first TLPM 1101 and the second TLPM 1300 were described in the seventh embodiment and the configurations of the NMOS 200 and the PMOS 300 were described in the first embodiment, and hence those configurations will not be described again here.

A manufacturing process of the semiconductor device shown in FIG. 149 will be described below. FIGS. 150–173 are vertical sectional views showing intermediate states of manufacture of the embodiment of the semiconductor device of FIG. 149. First, a first n-well region 54 and a second n-well region 85 are formed selectively in a surface layer of a semiconductor substrate 51, and a first p-well region 52 and a second p-well region 53 are formed by using, as a mask, a selective oxidation film 55 that is formed on the n-well regions 54 and 85 (see FIG. 150). The selective oxidation film 55 is thereafter removed completely (see FIG. 151).

Then, a buffer oxide film 56 is formed on the substrate surface. A mask 2001 having a prescribed pattern is formed on the buffer oxide film 56, and an n-type impurity such as phosphorus ($P_{31}$) is ion-implanted into the first p-well region 52 by using the mask 2001 (see FIG. 152). After the mask 2001 is removed, a mask 2002 having a prescribed pattern is formed and a p-type impurity such as boron ($B_{11}$) is ion-implanted into the first n-well region 54 by using the mask 2002 (see FIG. 153). The implanted impurities are diffused, whereby an n-type extended drain region 1022 and a p-type extended drain region 1322 are formed. After the mask 2002 is removed, a mask oxide film 57 is laid on the buffer oxide film 56 (see FIG. 154).

Figure 155:
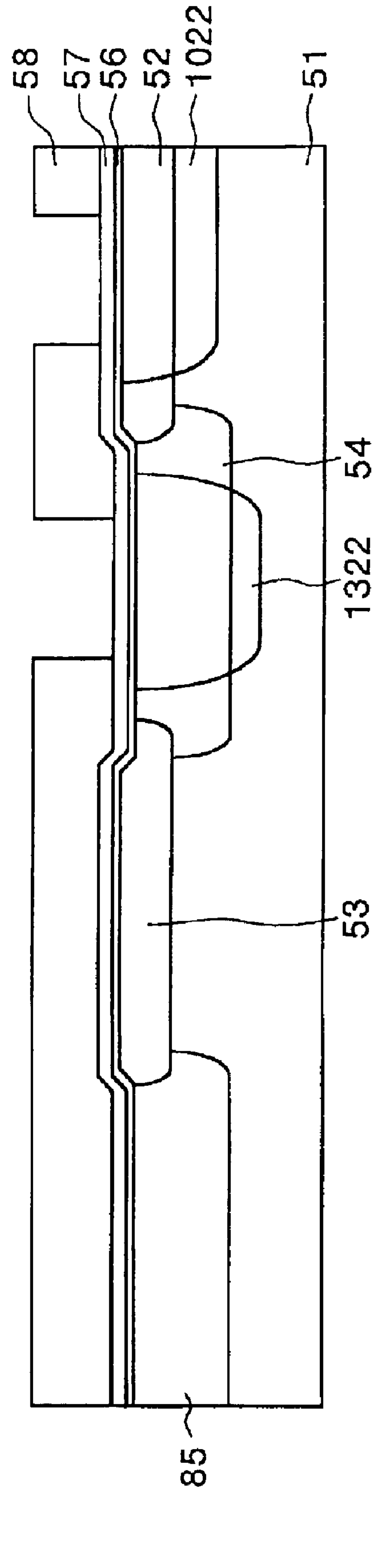
Figure 156:
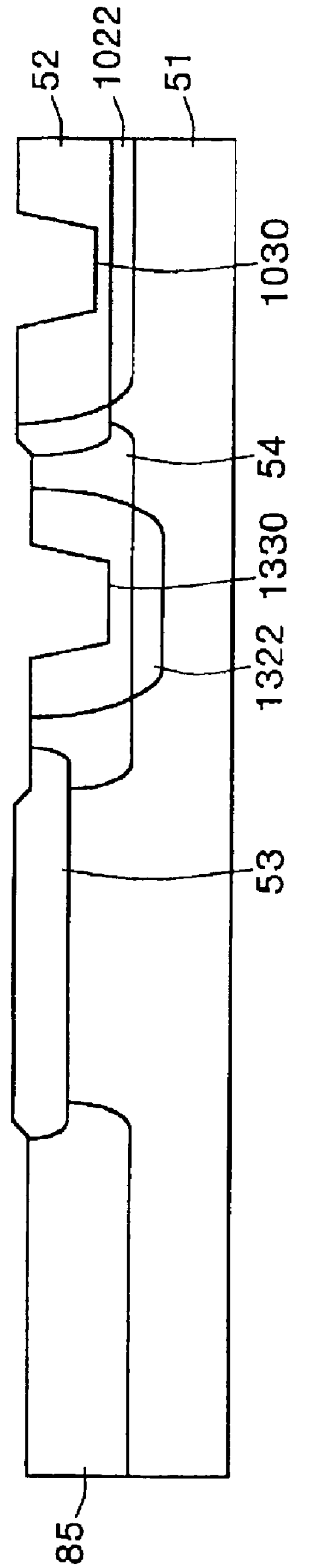
Figure 157:
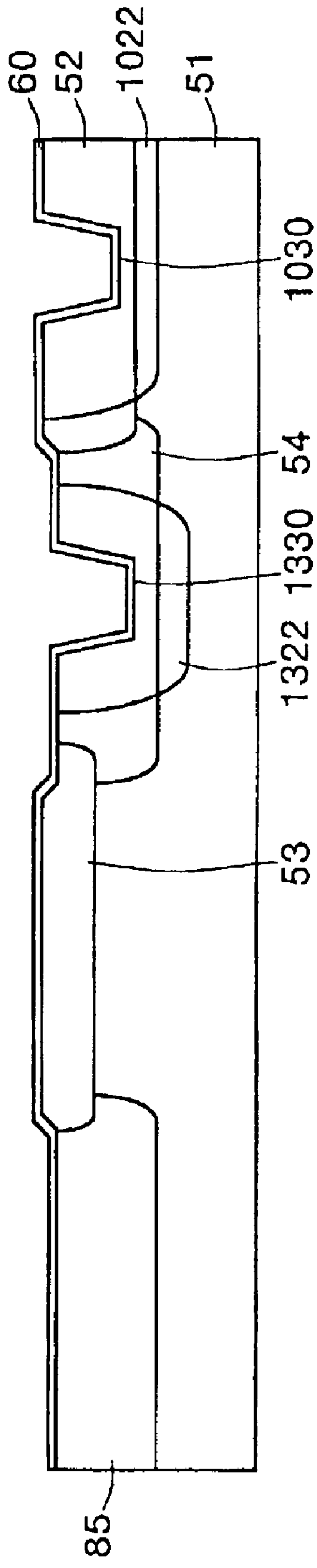

A mask 58 having openings in trench forming areas is formed on the mask oxide film 57 (see FIG. 155). The mask oxide film 57 is patterned by using the mask 58. After the mask 58 is removed, trench etching (RIE) is performed, whereby a first trench 1030 and a second trench 1330 are formed in the first p-well region 52 and the first n-well region 54, respectively, at the same time. Then, all the oxide films on the substrate surface including the mask oxide film 57 are removed (see FIG. 156).

Figure 158:
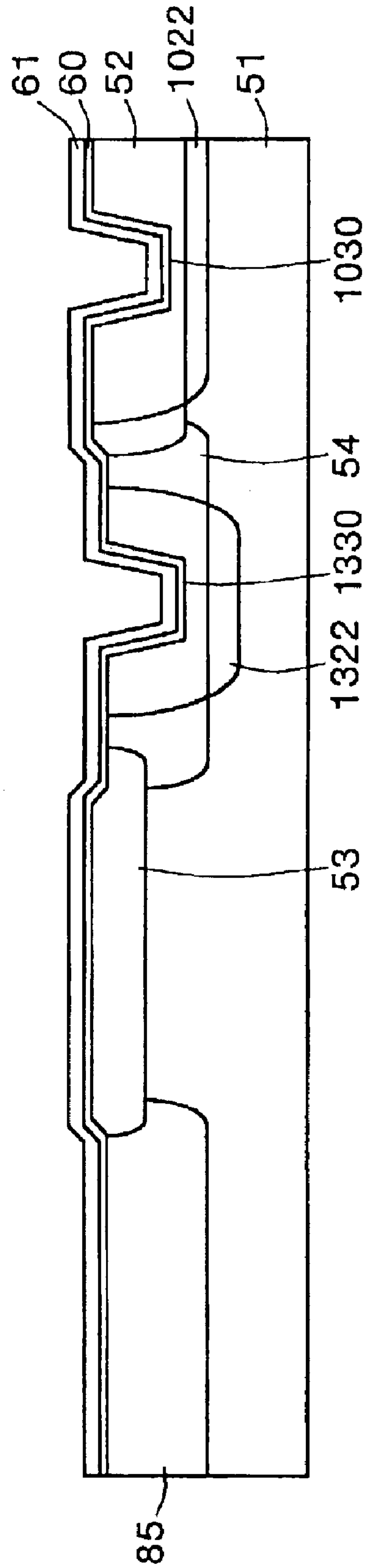
Figure 159:
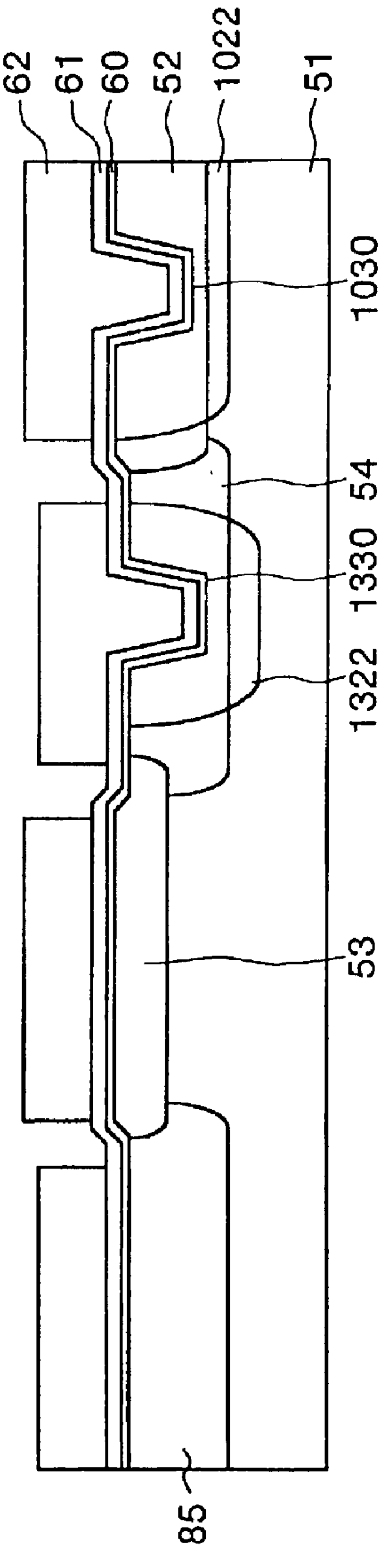
Figure 160:
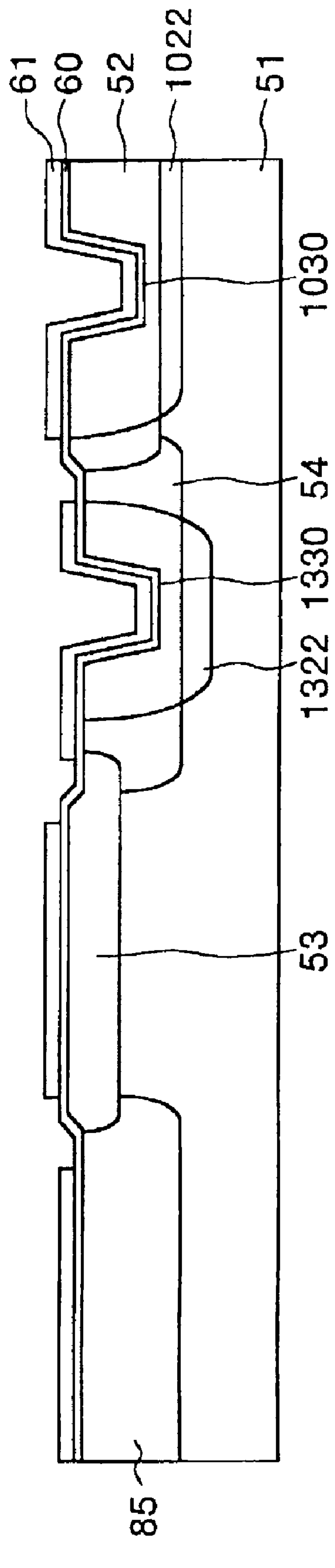
Figure 161:
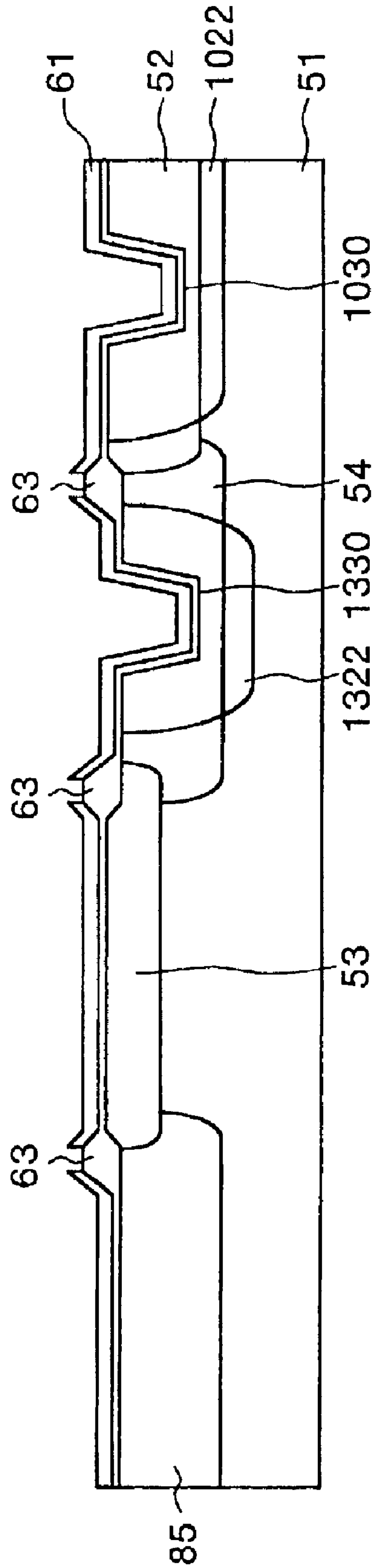
Figure 162:
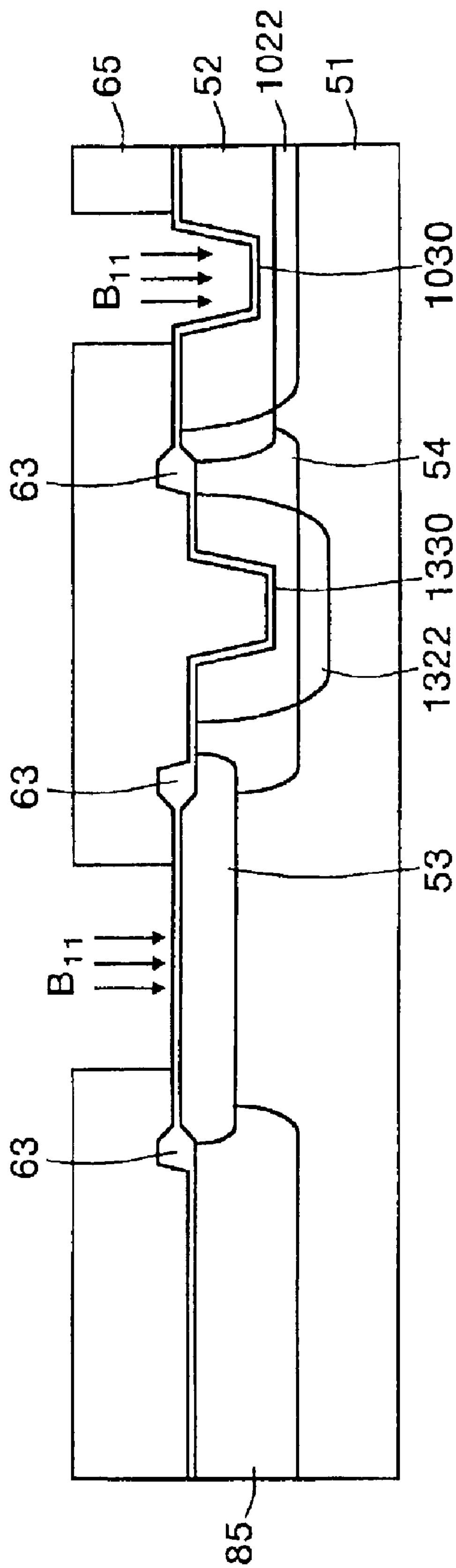
Figure 163:
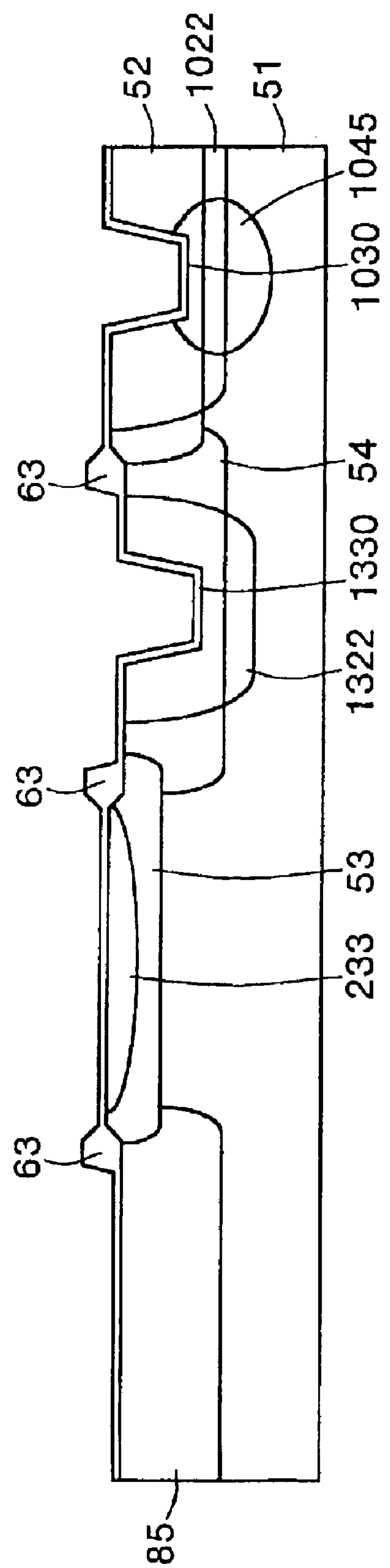
Figure 164:
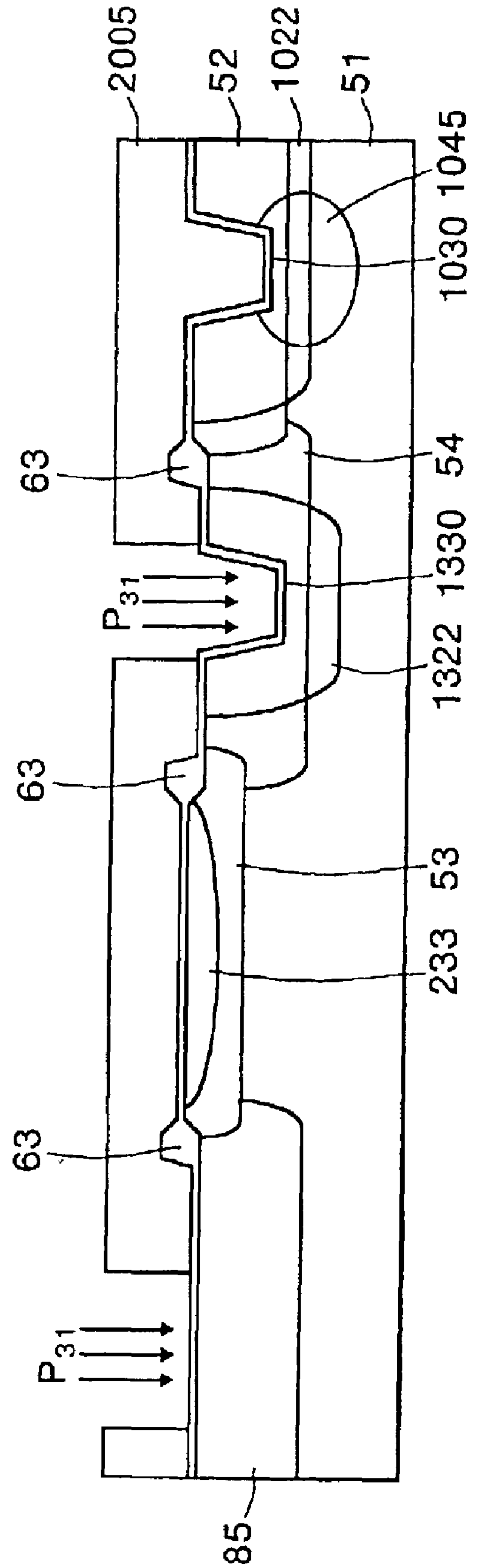

Subsequently, a buffer oxide film 60 is formed on the substrate surface and the surfaces of the trenches 1030 and 1330 (see FIG. 157) and a silicon nitride film 61 is formed thereon (see FIG. 158). A mask 62 having openings in device isolation areas is formed on the silicon nitride film 61 (see FIG. 159). The silicon nitride film 61 is patterned by using the mask 62, and the mask 62 is removed thereafter (see FIG. 160). Then, thermal oxidation is performed by using, as a mask, the silicon nitride film 61 remaining on the substrate surface to form selective oxidation films 63 for device isolation (see FIG. 161).

After the silicon nitride film 61 is removed and sacrificial oxidation is performed, a mask 65 having openings in areas corresponding to the first trench 1030 and a future channel region of the intended NMOS is formed. A p-type impurity such as boron ($B_{11}$) is ion-implanted by using the mask 65 (see FIG. 162). The implanted impurity is diffused, whereby a p-type base region 1045 is formed under the bottom surface of the first trench 1030 and a channel region 233 of the intended NMOS is formed in the second p-well region 53. The mask 65 is removed thereafter (see FIG. 163).

Then, a mask 2005 having openings in areas corresponding to the second trench 1330 and a future channel region of the intended PMOS is formed. An n-type impurity for example, phosphorus ($P_{31}$), is ion-implanted by using the mask 2005 (see FIG. 164). The implanted impurity is diffused, forming an n-type base region 1345 under the bottom surface of the second trench 1330 and a channel region 333 of the intended PMOS in the second n-well region 85.

Figure 165:
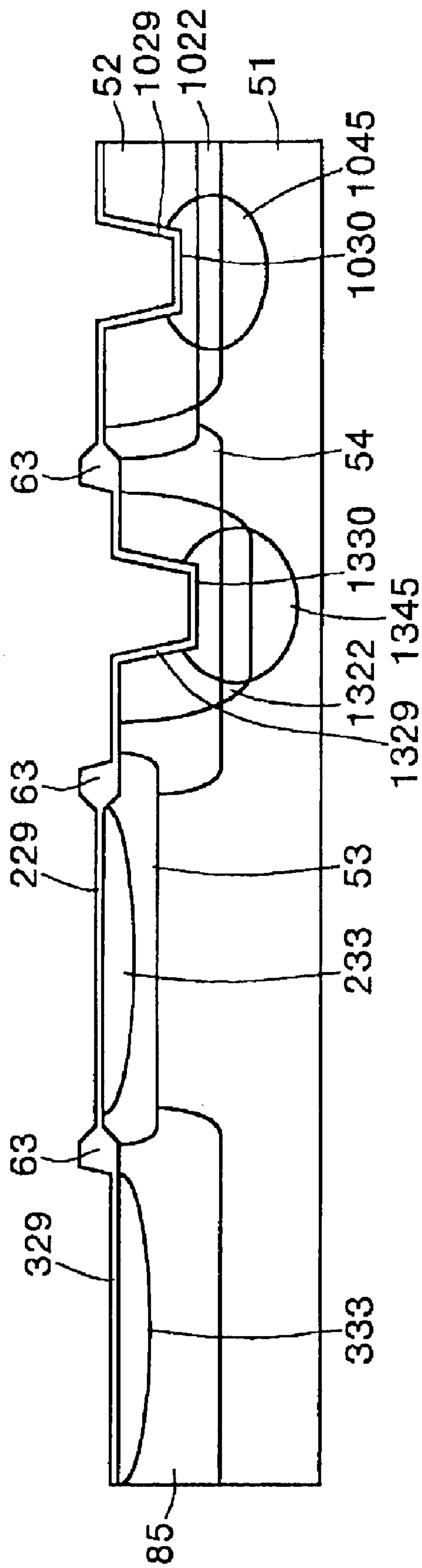

After the mask 2005 is removed and the thin oxide film on the substrate surface and the surfaces of the trenches 1030 and 1330 are removed, a gate oxide film 1029 of the intended first TLPM, a gate oxide film 1329 of the intended second TLPM, a gate oxide film 229 of the intended NMOS, and a gate oxide film 329 of the intended PMOS are formed (see FIG. 165). The gate oxide films 1029, 1329, 229, and 329 of the intended first TLPM, second TLPM, NMOS, and PMOS may be formed simultaneously without using masks, in which case the process is simplified and the cost is reduced. The operations of FIGS. 162 and 163 and the operations of FIGS. 164 and 165 may be reversed.

Figure 166:
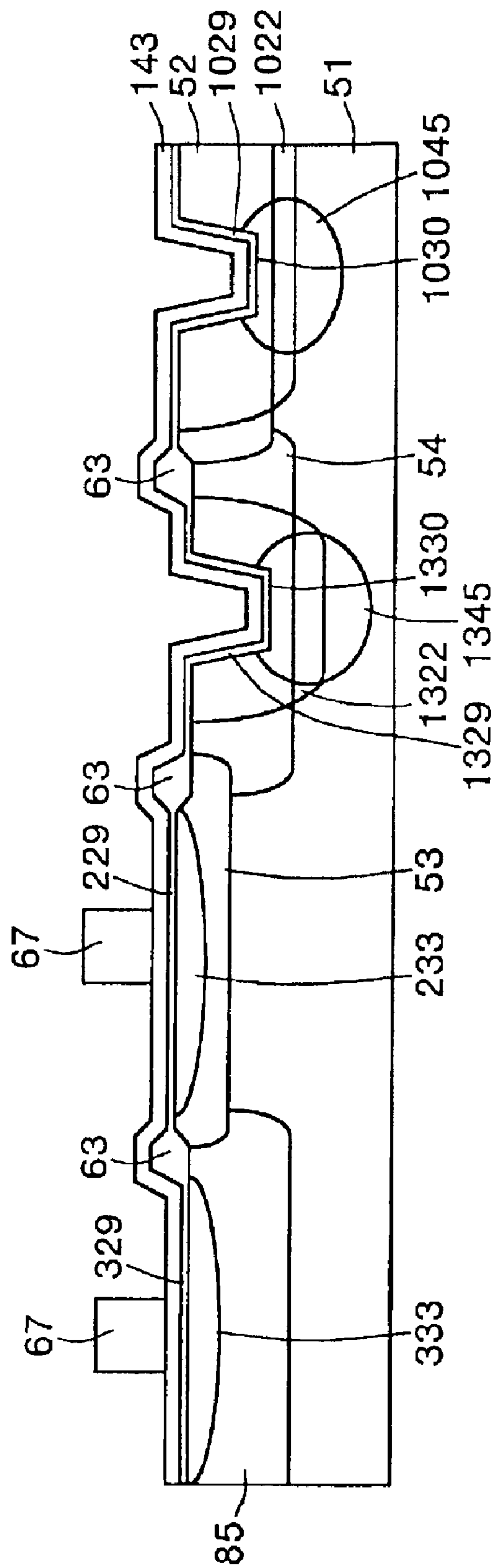
Figure 167:
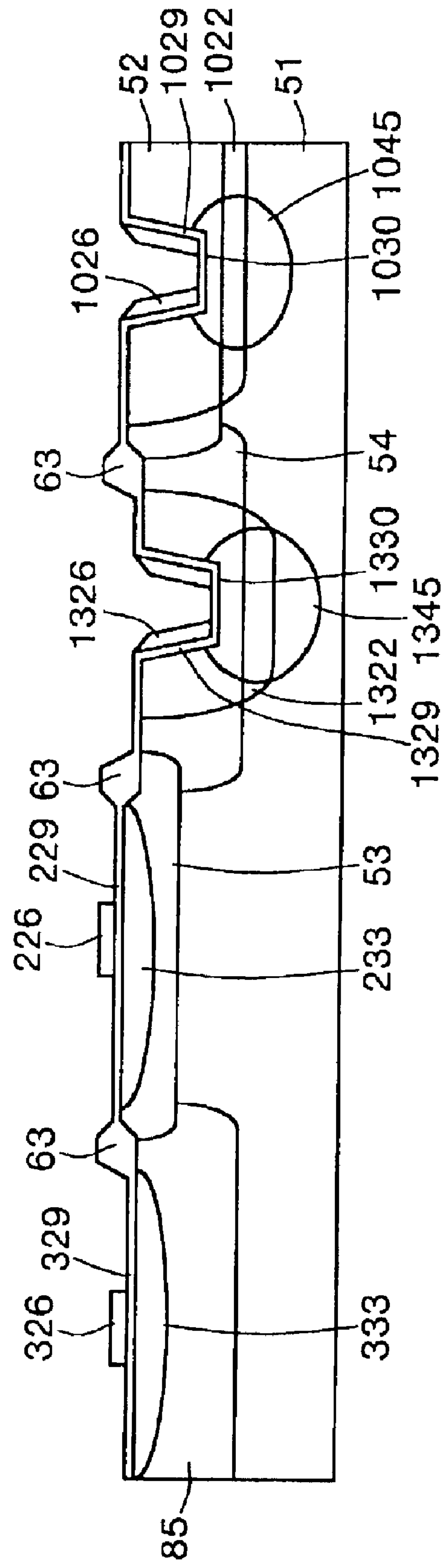

Subsequently, a polysilicon layer 143 is laid on the gate oxide films 1029, 1329, 229, and 329 and a mask 67 is formed only on those portions of the polysilicon layer 143 which are to become gate electrodes of the intended NMOS and PMOS (see FIG. 166). Anisotropic etching (RIE or the like) is performed on the polysilicon layer 143 by using the mask 67, whereby gate electrodes 226 and 326 of the intended NMOS and PMOS are formed and, at the same time, gate electrodes 1026 of the intended first TLPM and gate electrodes 1326 of the intended second TLPM are formed inside the first and second trenches 1030 and 1330 by self-alignment, simplifying the process and reducing the cost. The mask 67 is removed thereafter (see FIG. 167).

Figure 168:
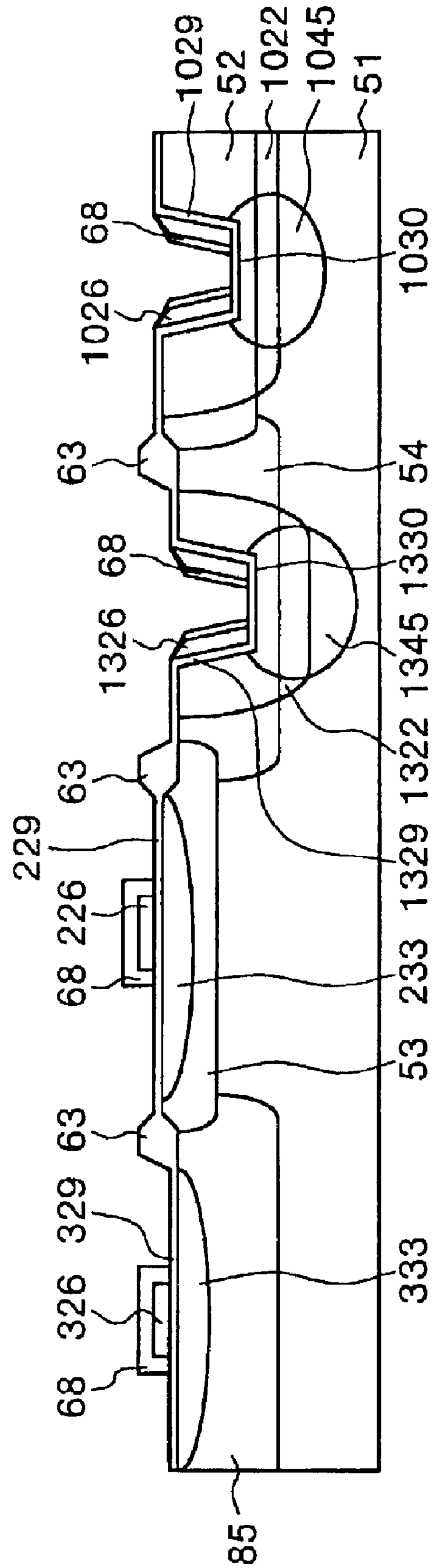
Figure 169:
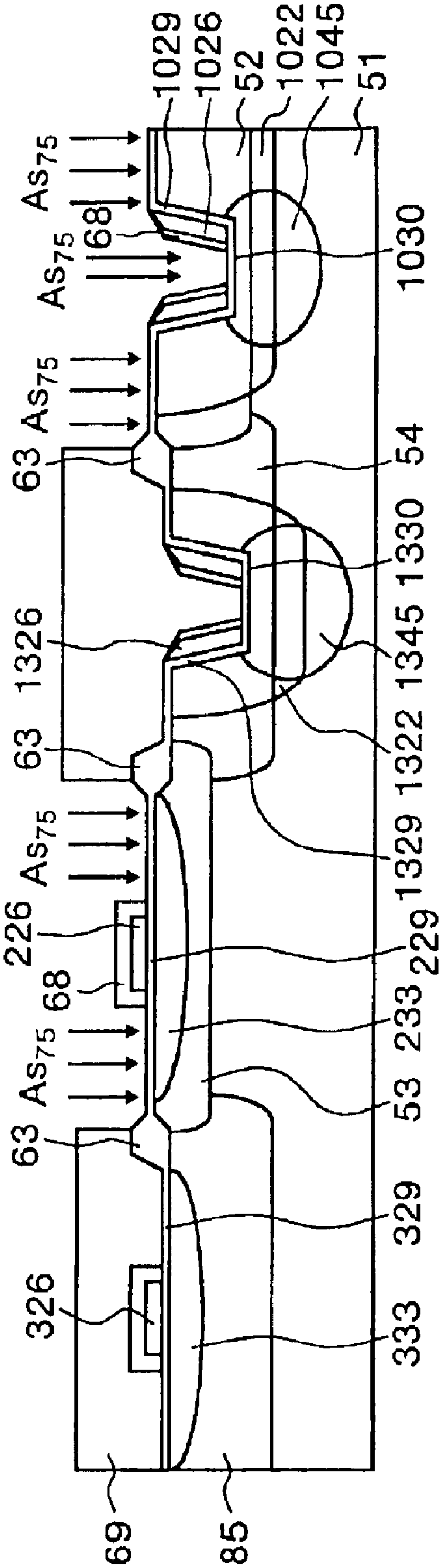

Subsequently, shadow oxide films 68 are formed to cover the gate electrodes 1026 and 1326 of the intended first and second TLPMs and the gate electrodes 226 and 326 of the intended NMOS and PMOS (see FIG. 168). After a mask 69 having openings in an area in which a source region and drain regions of the intended first TLPM and an NMOS forming area is formed on the substrate surface, an n-type impurity such as arsenic ($As_{75}$) is ion-implanted (see FIG. 169). The implanted impurity is diffused to form a source region 1025 of the intended first TLPM under the bottom surface of the first trench 1030, drain regions 1023 of the intended first TLPM on both sides of the first trench 1030, and a source region 225 and a drain region 223 of the intended NMOS are formed in the channel region 233 simultaneously.

Figure 170:
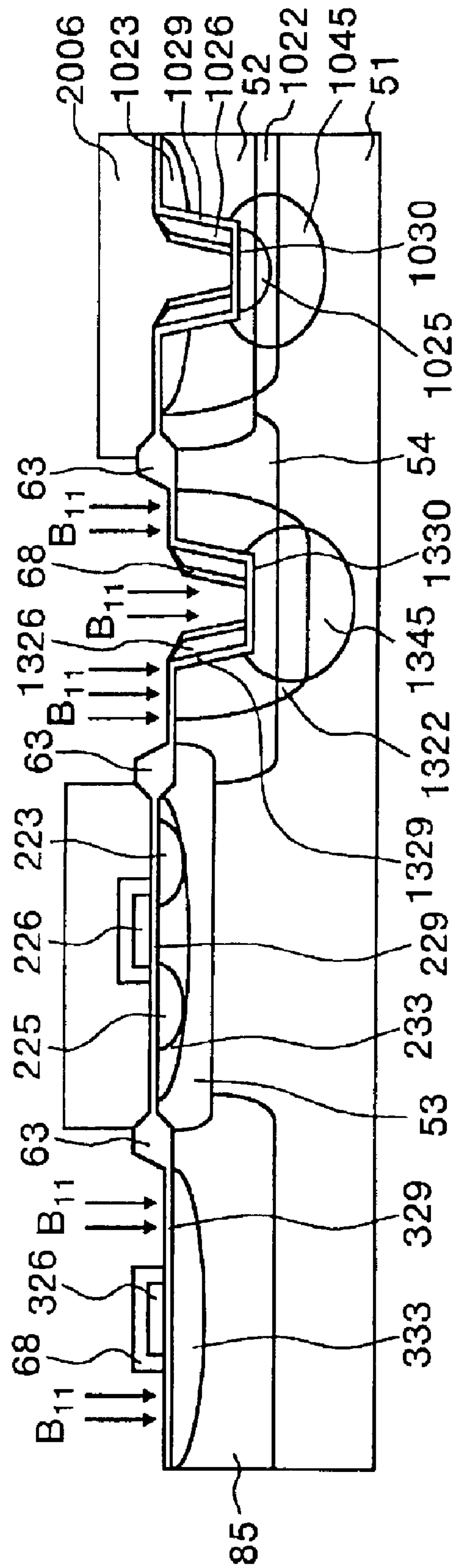
Figure 171:
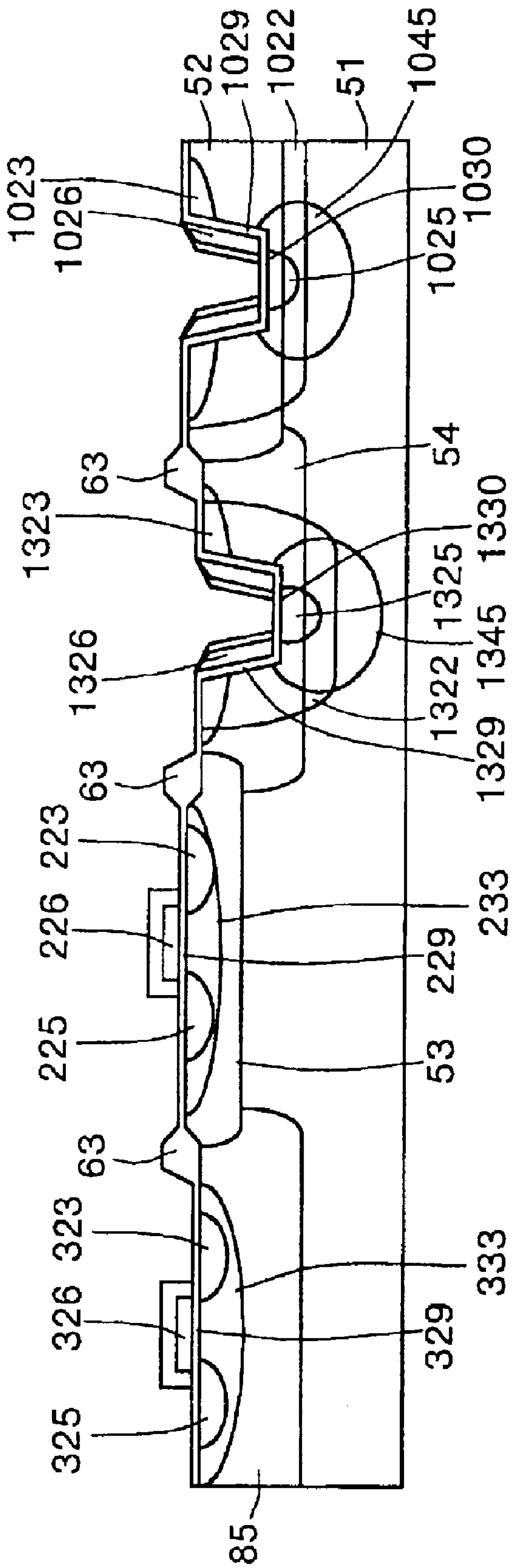
Figure 172:
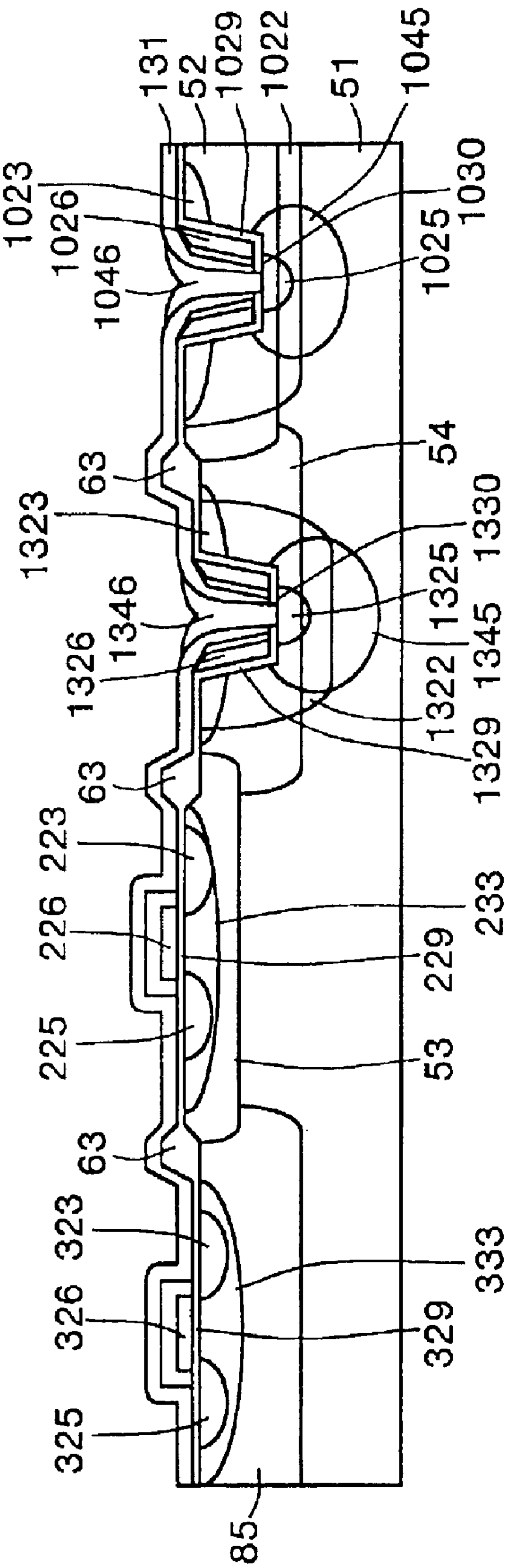
Figure 173:
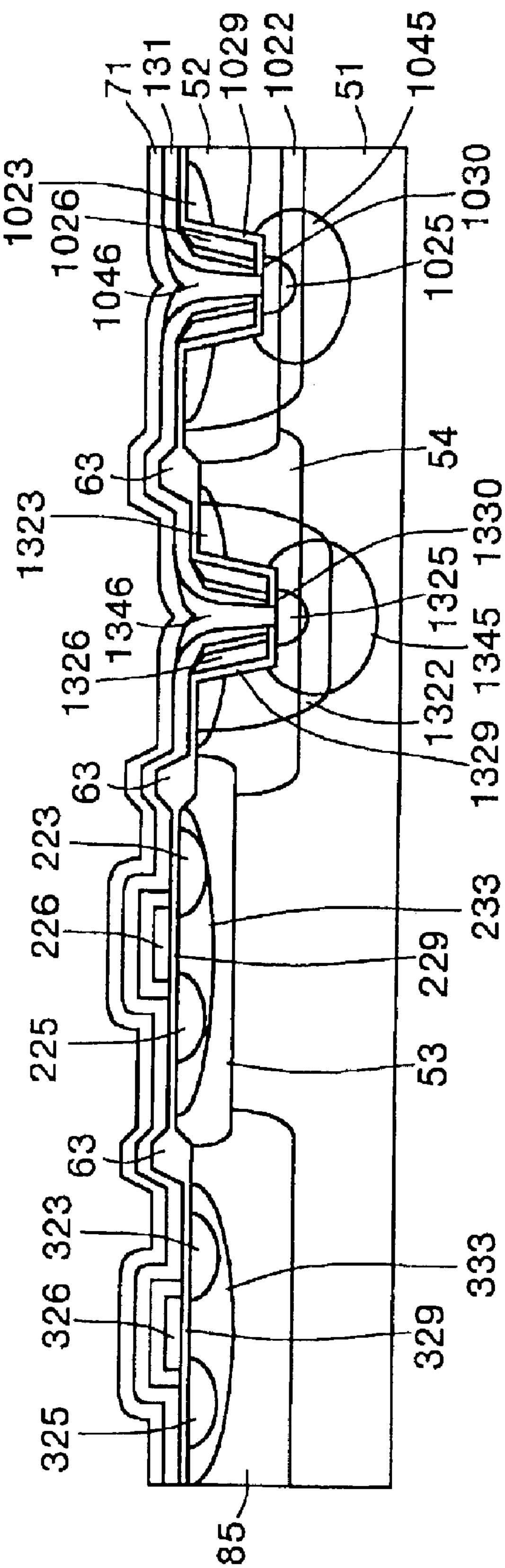

Then, a mask 2006 having openings in an area where to form a source region and drain regions of the intended second TLPM and a PMOS forming area is formed, and a p-type impurity such as boron ($B_{11}$) is ion-implanted (see FIG. 170). The implanted impurity is diffused, forming a source region 1325 of the intended second TLPM under the bottom surface of the second trench 1330, drain regions 1323 of the intended second TLPM on both sides of the second trench 1330, and a source region 325 and a drain region 323 of the intended PMOS in the channel region 333 simultaneously. The mask 2006 is removed thereafter (see FIG. 171). The operations of FIG. 169 and FIG. 170 may be reversed.

Subsequently, an interlayer insulating film 131 is laid over the substrate surface, and portions of the interlayer insulating film 131 inside the first and second trenches 1030 and 1330 are etched away by self-alignment to form contact holes. The inside of the first trench 1030 is filled with a source polysilicon layer 1046 and the inside of the second trench 1330 is filled with a source polysilicon layer 1346 (see FIG. 172). Then, a passivation film 71 is formed over the substrate surface (see FIG. 173). Contact holes are formed through the passivation film 71 and the interlayer insulating film 131.

A metal film is formed on the passivation film 71 and then patterned, forming a source electrode 1028 of the intended first TLPM that is in contact with the source polysilicon layer 1046, drain electrodes 1027 of the intended first TLPM that are in contact with the respective drain regions 1023, a source electrode 1328 of the intended second TLPM that is in contact with the source polysilicon layer 1346, drain electrodes 1327 of the intended second TLPM that are in contact with the respective drain regions 1323, a drain electrode 227 and a source electrode 228 of the intended NMOS that are in contact with the drain region 223 and the source region 225, respectively, and a drain electrode 327 and a source electrode 328 of the intended PMOS that are in contact with the drain region 323 and the source region 325, respectively, are formed at the same time. In this manner, a semiconductor device is completed in which the first TLPM 1101, the second TLPM 1300, the NMOS 200, and the PMOS 300 are integrated on the same semiconductor substrate 51 as shown in FIG. 149.

The above-described eighth embodiment can provide a one-chip power IC that is small in size and low in on-resistance and cost while preventing cost increase due to an increase in the number of manufacturing operations. A p-channel TLPM and an n-channel TLPM can be integrated on the same semiconductor substrate. Further, the area of a power IC chip in which TLPMs as power MOSFETs and a control circuit using planar PMOSs and NMOSs are integrated can be reduced to about a half of the area of a conventional power IC chip.

Figure 174:
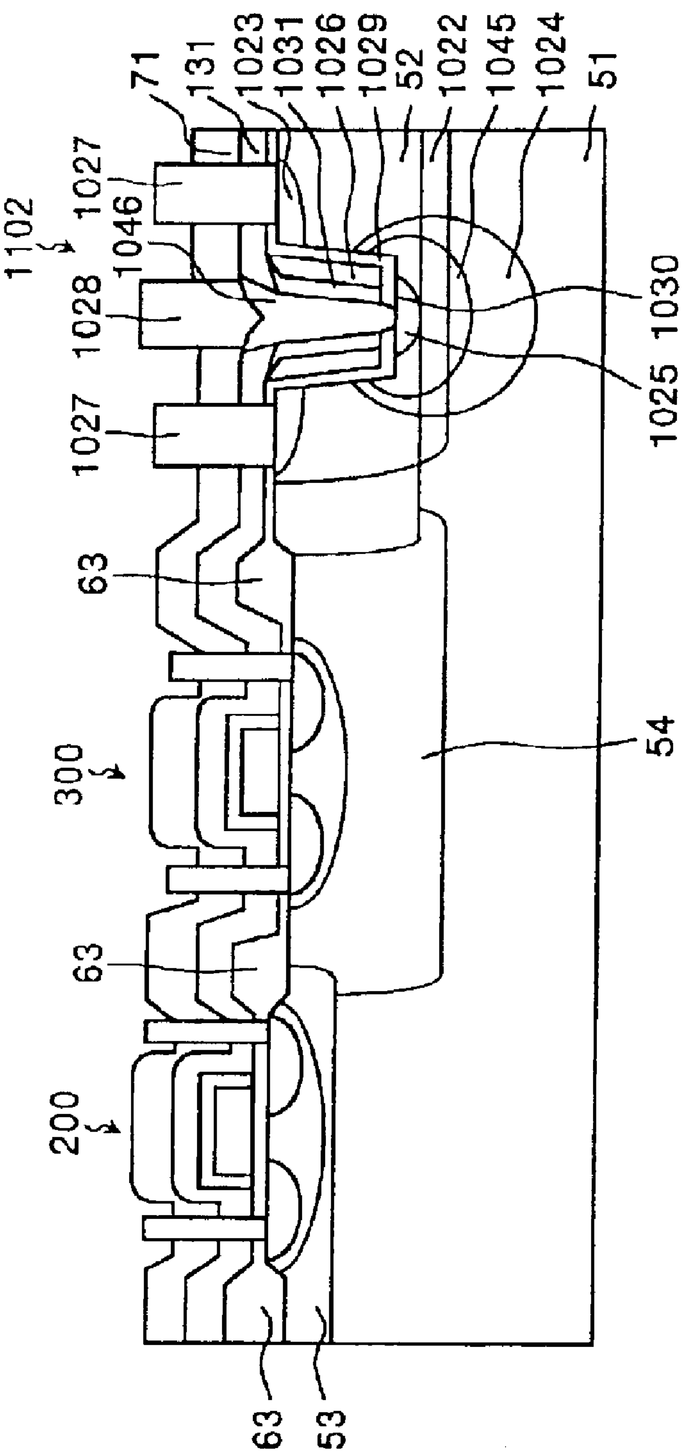
FIG. 174 is a vertical sectional view showing the configuration of a semiconductor device according to a ninth embodiment of the invention.

FIG. 174 is a vertical sectional view showing the configuration of a semiconductor device according to a ninth embodiment of the invention. As shown in FIG. 174, the semiconductor device according to the ninth embodiment alters in the semiconductor device of FIG. 98 according to the sixth embodiment by replacing the TLPM 1100 with a TLPM 1102 that is obtained by adding a p-type body region 1024 to the TLPM 1100. The p-type body region 1024 is provided under the bottom surface of the trench 1030 of the TLPM 1102 so as to surround the p-type base region 1045. The other part of the configuration is the same as in the sixth embodiment. Regions, electrodes, etc. having the same names in the sixth embodiment are given the same reference numerals as the latter and will not be described.

Figure 100:
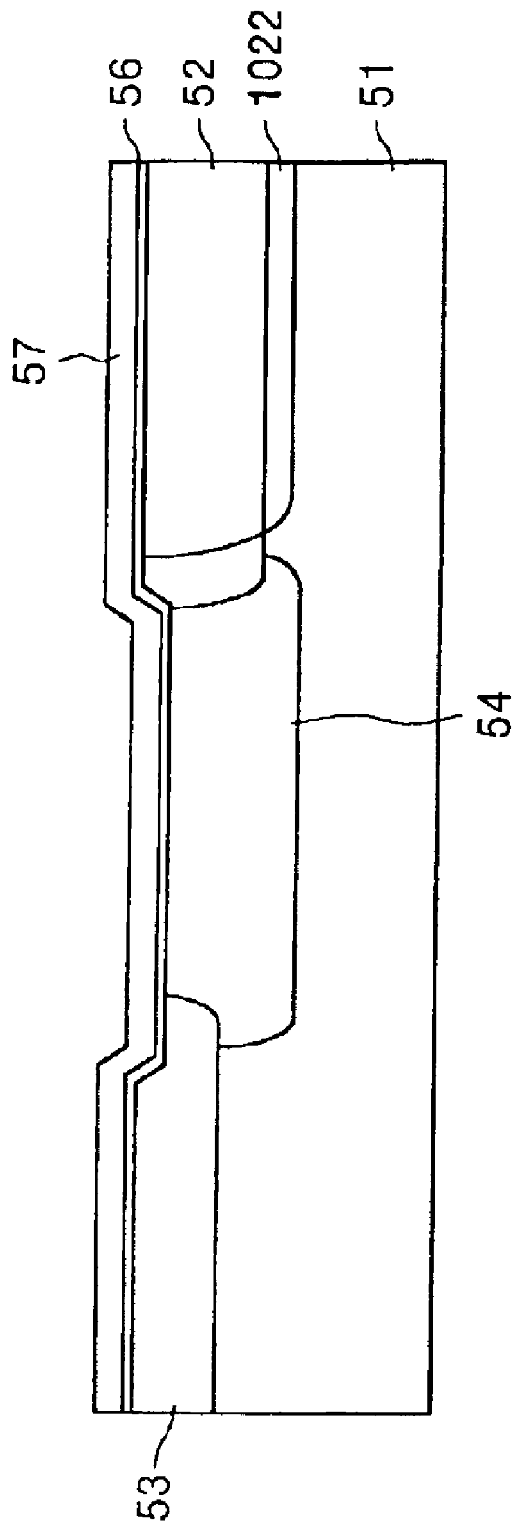
Figure 175:
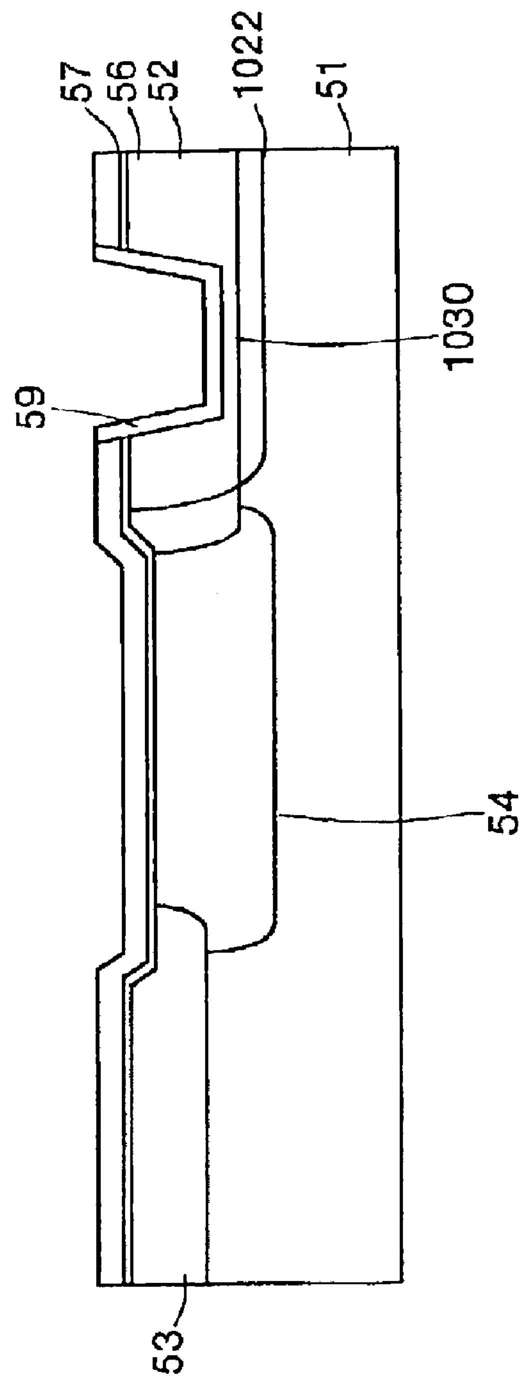
FIGS. 175–177 are vertical sectional views showing intermediate states of manufacture of the embodiment of the semiconductor device shown in FIG. 174.
Figure 176:
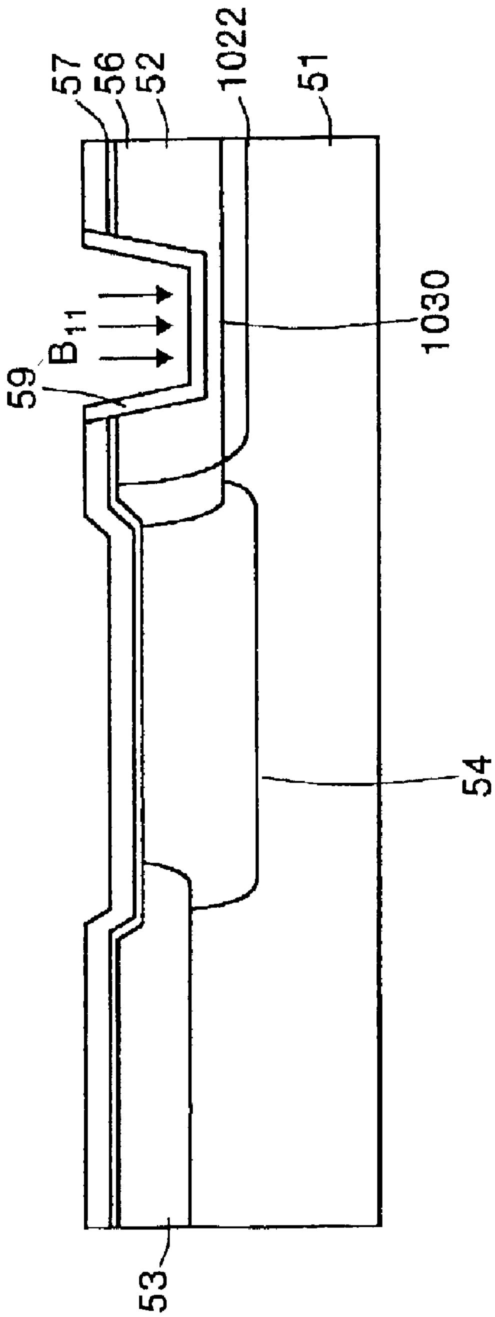
Figure 177:
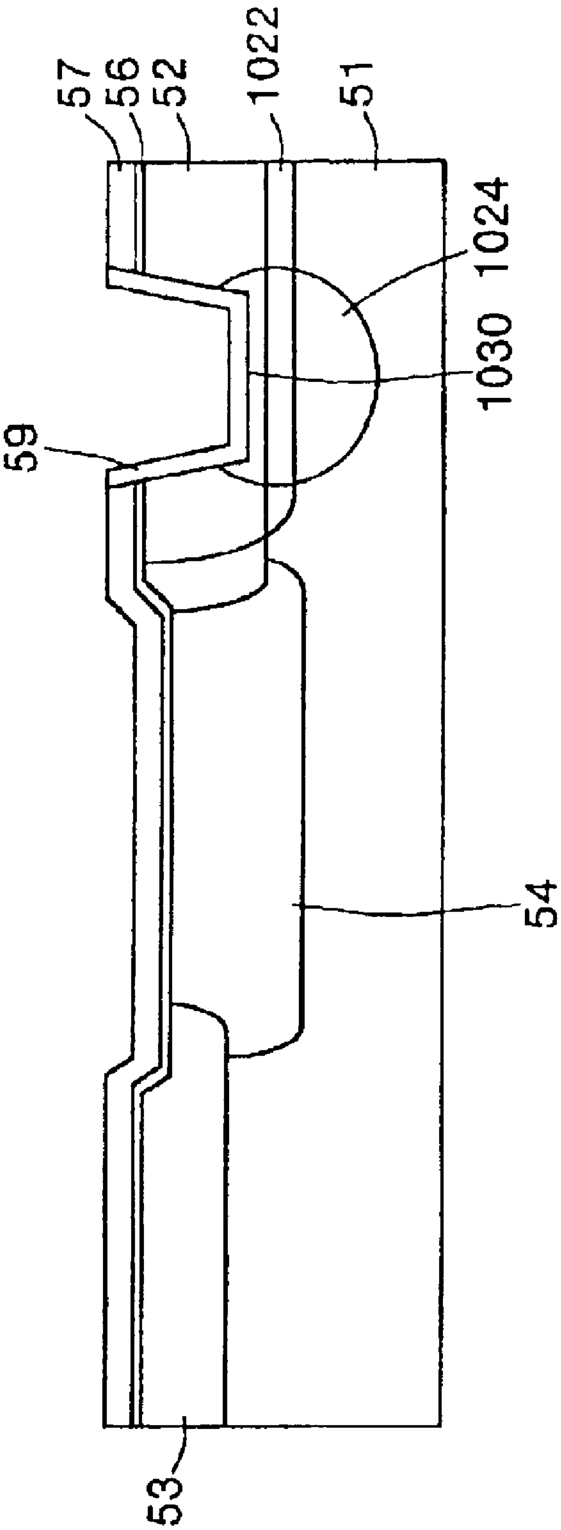

A manufacturing process of the semiconductor device shown in FIG. 174 is described below. FIGS. 175–177 are vertical sectional views showing intermediate states of manufacture of an embodiment of the semiconductor device of FIG. 174. First, as shown in FIGS. 2 and 3, an n-well region 54, a first p-well region 52, and a second p-well region 53 are formed in a surface layer of a semiconductor substrate 51. Then, an extended drain region 1022 is formed as shown in FIGS. 99 and 100. Then, a mask 58 having an opening in a trench forming area is formed on a mask oxide film 57 as shown in FIG. 101.

The mask oxide film 57 is patterned by using the mask 58. After the mask 58 is removed, trench etching (RIE) is performed to form a trench 1030 in the first p-well region 52. A buffer oxide film 59 is formed on the surface of the trench 1030 (see FIG. 175). Then, a p-type impurity such as boron ($B_{11}$) is ion-implanted through the bottom surface of the trench 1030 (see FIG. 176). The implanted impurity is diffused, forming a body region 1024 under the bottom surface of the trench 1030 (see FIG. 177). The subsequent operations are the same as the operations of FIGS. 102–118. Thus, a semiconductor device is completed in which the TLPM 1102 having the p-type body region 1204, the NMOS 200, and the PMOS 300 are integrated.

The trench 1030 may be formed after formation of the selective oxidation films 63 for device isolation. That is, an N-well region 54 and a first p-well region 52, and a second p-well region 53 are formed in a surface layer of a semiconductor substrate 51 and an extended drain region 1022 are formed by the operations of FIGS. 2, 3, 99, and 100.

Figure 178:
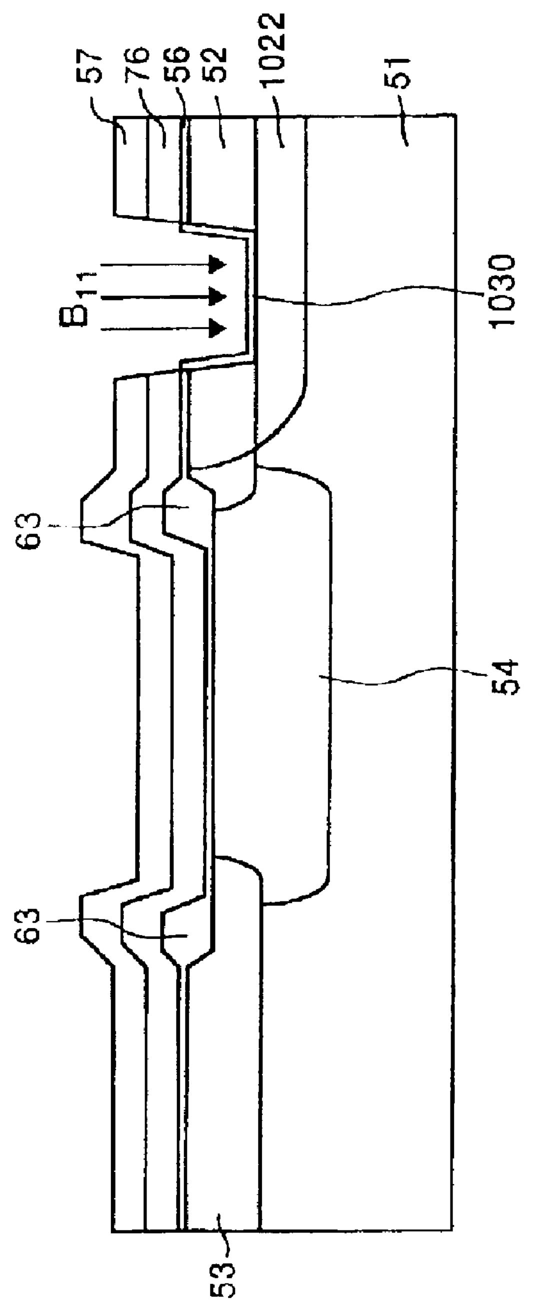
FIGS. 178–180 are vertical sectional views showing intermediate states of manufacture of the embodiment of the semiconductor device shown in FIG. 174 by another manufacturing method.
Figure 179:
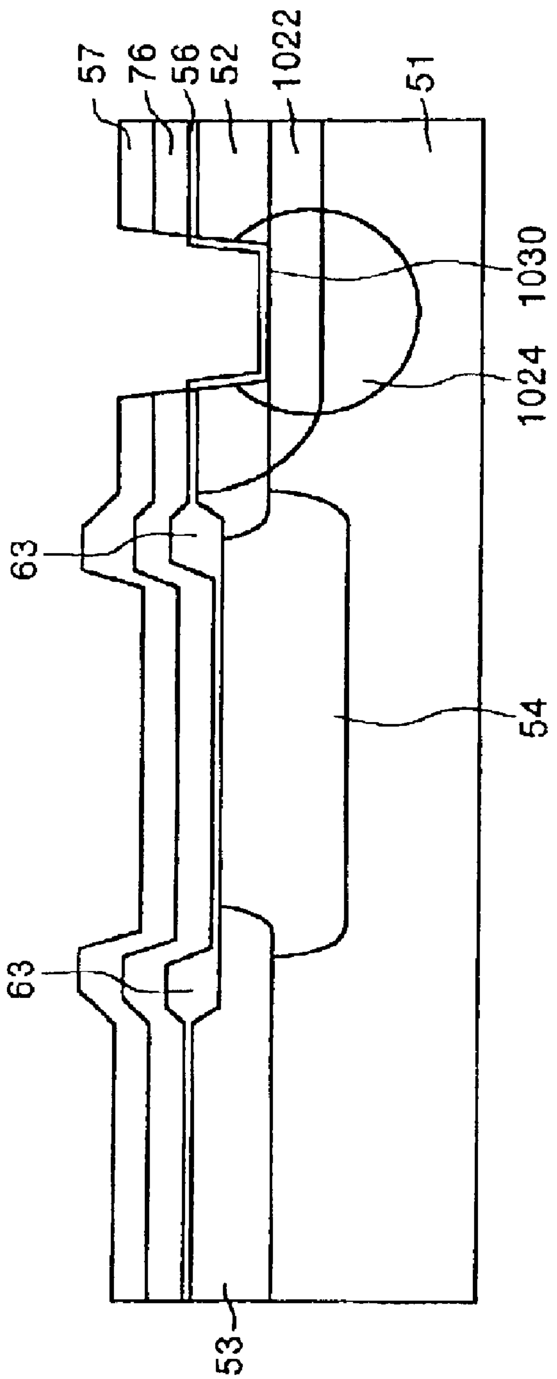
Figure 180:
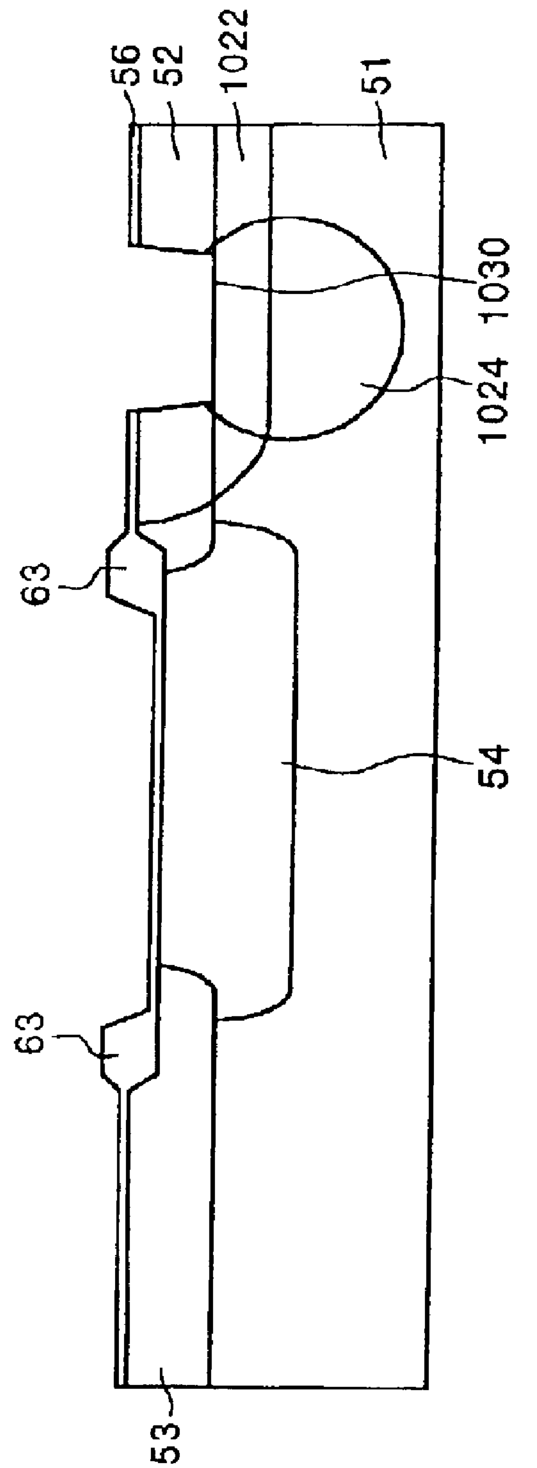

Subsequently, selective oxidation films 63 for device isolation are formed, and a trench 1030 is formed by the operations of FIGS. 119–125. Then, sacrificial oxidation is performed on the surface of the trench 1030, and a p-type impurity such as boron ($B_{11}$) is ion-implanted through the bottom surface of the trench 1030 (see FIG. 178). The implanted impurity is diffused to form a body region 1024 under the bottom surface of the trench 1030 (see FIG. 179). The mask oxide film 57, the silicon nitride film 76, and the sacrificial oxide film in the trench 1030 are removed thereafter (see FIG. 180). The operations of FIG. 127 and the following operations are executed thereafter.

The above-described ninth embodiment provides a one-chip power IC that is small in size and low in on-resistance and cost while preventing cost increase due to an increase in the number of manufacturing operations. Further, the p-type body region 1024 prevents the two parts of the n-type extended drain region 1022 from joining together under the trench 1030 and separates the substrate 51 from the p-type base region 145 electrically, thereby preventing occurrence of a punch-through phenomenon and latch-up and hence provides an advantage that the TLPM 1102 has a high breakdown voltage and a low on-resistance.

Figure 181:
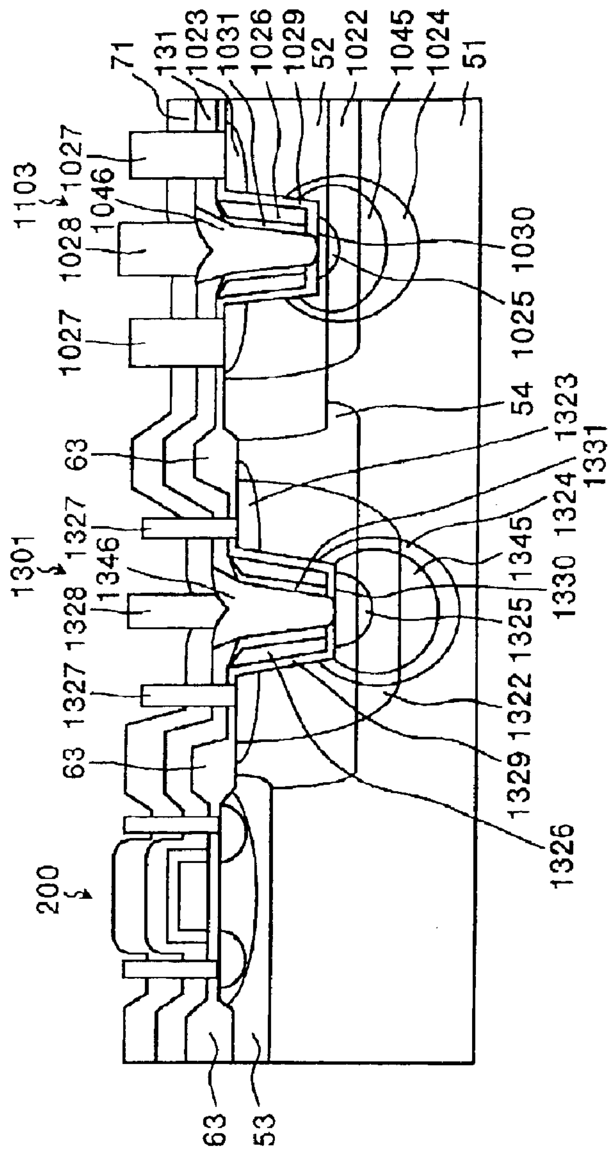
FIG. 181 is a vertical sectional view showing the configuration of a semiconductor device according to a tenth embodiment of the invention.
Figure 182:
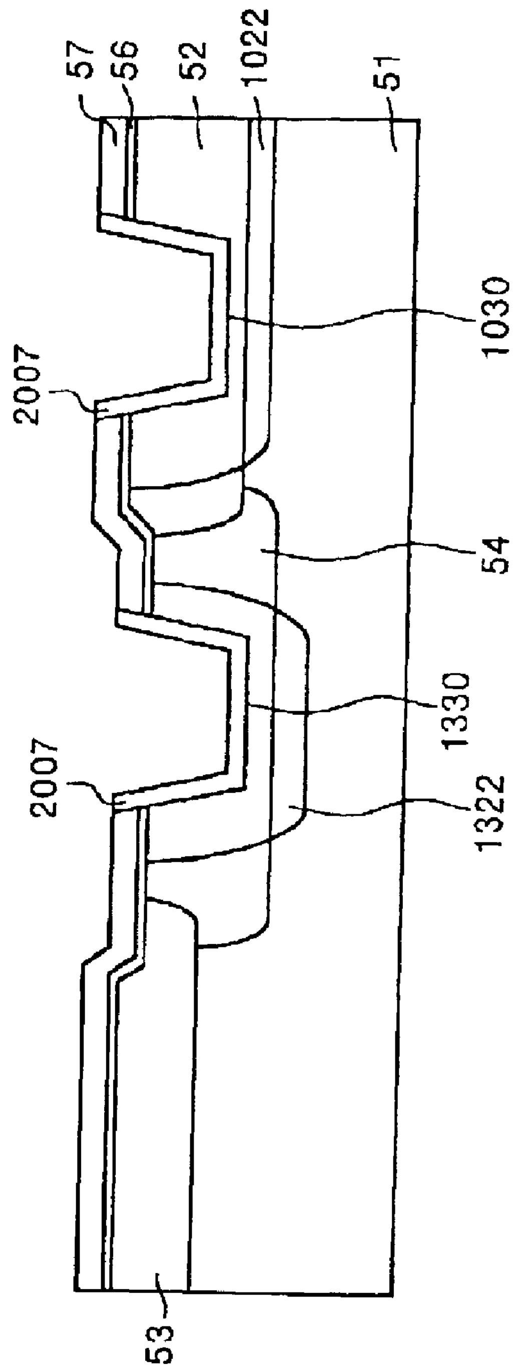
FIGS. 182–186 are vertical sectional views showing intermediate states of manufacture of the embodiment of the semiconductor device shown in FIG. 181.
Figure 183:
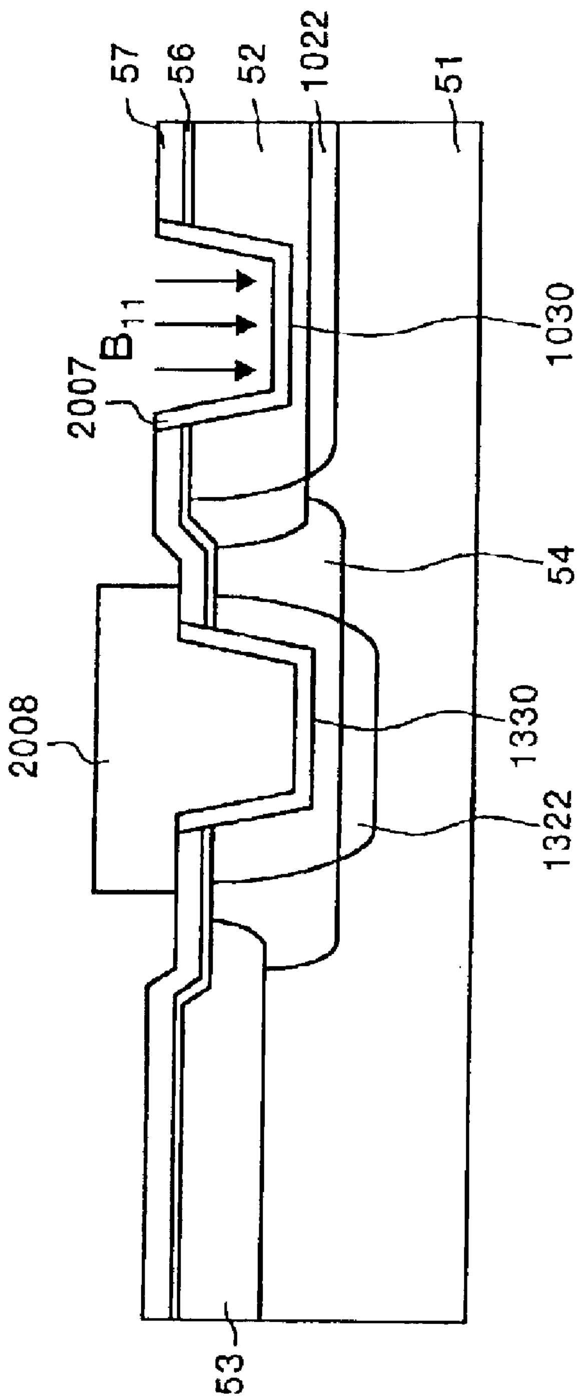
Figure 184:
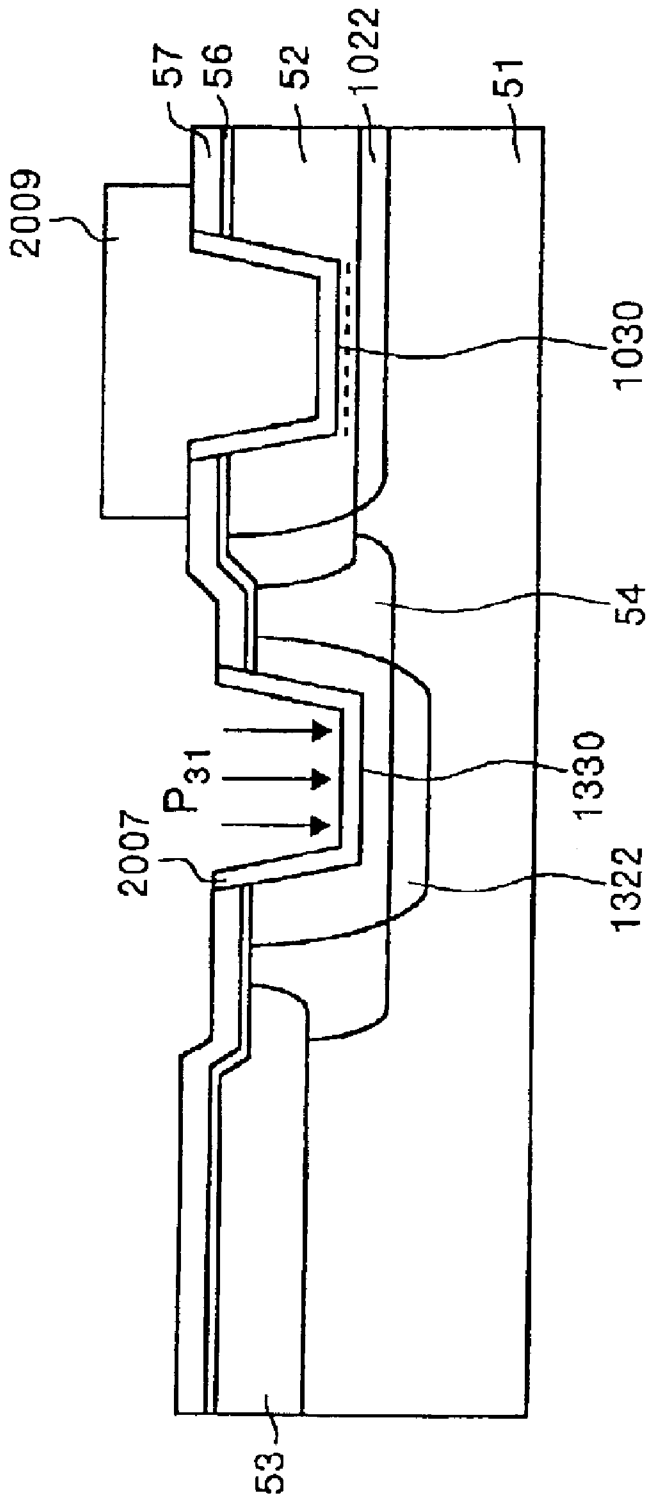

FIG. 181 is a vertical sectional view showing the configuration of a semiconductor device according to a tenth embodiment of the invention. As shown in FIG. 181, the semiconductor device according to the tenth embodiment alters the semiconductor device of FIG. 128 according to the seventh embodiment by using a TLPM 1103 that is obtained by adding a p-type body region 1024 to the TLPM 1101 in the first p-well region 52 instead of the TLPM 1101 and a TLPM 1301 that is obtained by adding an n-type body region 1324 to the TLPM 1300 in the n-well region 54 instead of the TLPM 1300.

The p-type body region 1024 is provided under the bottom surface of the trench 1030 of the TLPM 1103 to surround the p-type base region 1045. The n-type body region 1324 is provided under the bottom surface of the trench 1330 of the TLPM 1301 so as to surround the n-type base region 1345. The other part of the configuration is the same as in the seventh embodiment. Regions, electrodes, etc. having the same names in the seventh embodiment are given the same reference numerals as the latter and will not be described.

A manufacturing process of the semiconductor device shown in FIG. 181 will be described below. FIGS. 182–186 are vertical sectional views showing intermediate states of manufacture of the embodiment of the semiconductor device of FIG. 181. First, as shown in FIGS. 2 and 3, an n-well region 54, a first p-well region 52, and a second p-well region 53 are formed in a surface layer of a semiconductor substrate 51. Then, as shown in FIGS. 99 and 129–131, an n-type extended drain region 1022 and a p-type extended drain region 1322 are formed, a mask oxide film 57 is formed, and a mask 58 having openings in trench forming areas is laid thereon.

The mask oxide film 57 is patterned by using the mask 58. After the mask 58 is removed, trench etching (RIE) is performed to form a first trench 1030 and a second trench 1330. Buffer oxide films 2007 are formed on the surfaces of the trenches 1030 and 1330 (see FIG. 182). After the second trench 1330 is covered with a mask 2008, a p-type impurity such as boron ($B_{11}$) is ion-implanted through the bottom surface of the first trench 1030 (see FIG. 183). After the mask 2008 is removed, the first trench is covered with a mask 2009 and an n-type impurity such as phosphorus ($P_{31}$) is ion-implanted through the bottom surface of the second trench 1330 (see FIG. 184).

Figure 185:
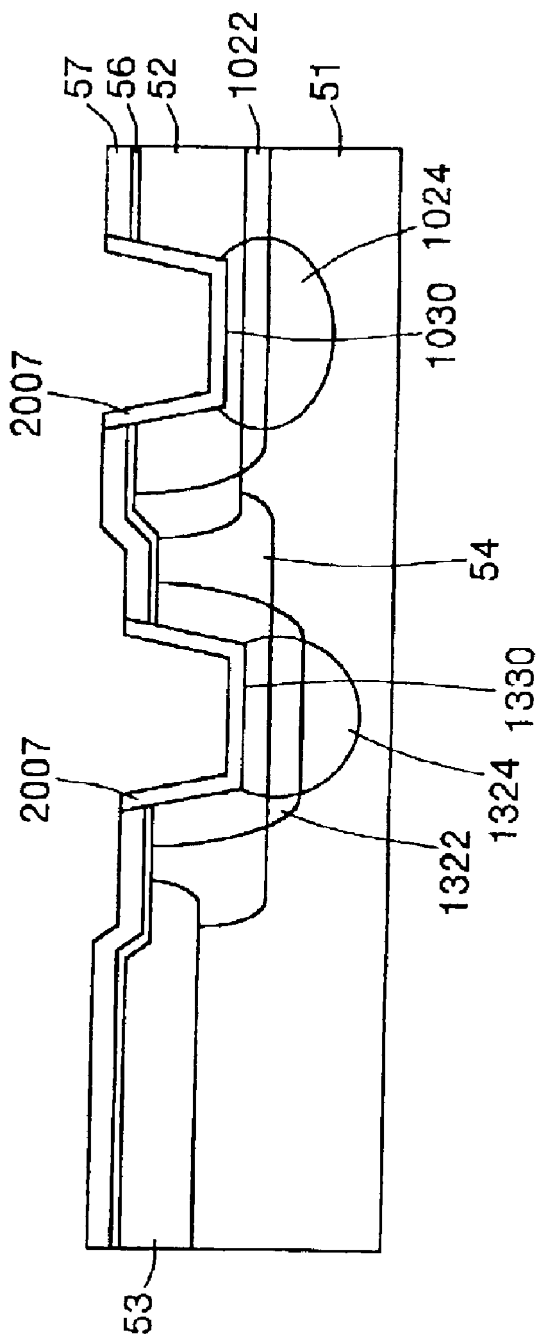
Figure 186:
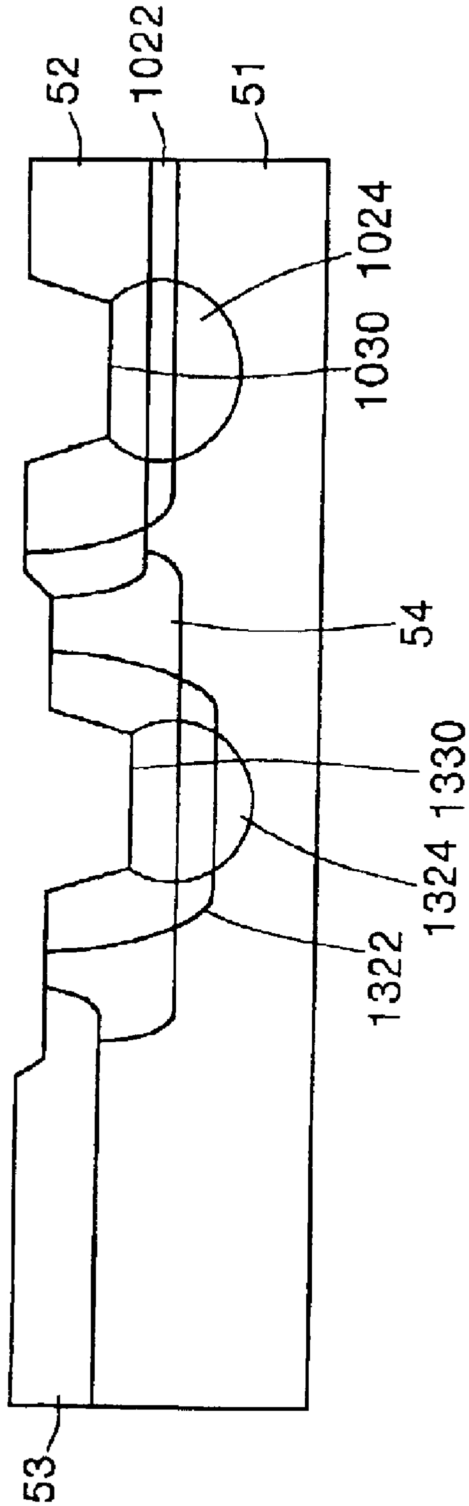

After the mask 2009 is removed, the implanted impurities are diffused, whereby a p-type body region 1024 and an n-type body region 1324 are formed at the same time (see FIG. 185). All the oxide films on the substrate surface including the mask oxide film 57 are removed thereafter (see FIG. 186). The subsequent operations are the same as the operations of FIGS. 133–148. Thus, a semiconductor device is completed in which the TLPM 1103 having the p-type body region 1024, the TLPM 1301 having the n-type body region 1324, and the NMOS 200 are integrated on the same semiconductor substrate 51 as shown in FIG. 181. The operations of FIG. 183 and FIG. 184 may be reversed.

Figure 187:
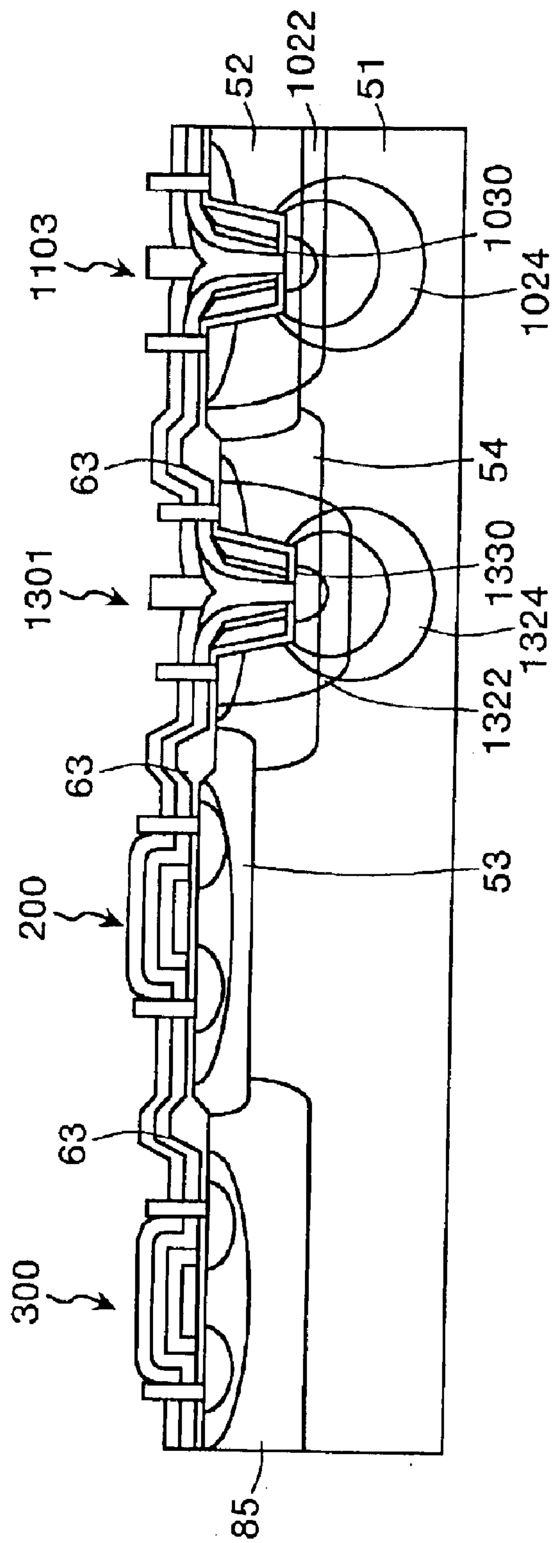
FIGS. 187–189 are vertical sectional views of other semiconductor devices according to the tenth embodiment of the invention.

As shown in FIG. 187, in the semiconductor device of FIG. 149 according to the eighth embodiment, the first TLPM 1101 may be replaced by the TLPM 1103 having the p-type body region 1024 and the second TLPM 1300 may be replaced by the TLPM 1301 having the n-type body region 1324.

The above-described tenth embodiment provides a one-chip power IC that is small in size and low in on-resistance and cost while preventing cost increase due to an increase in the number of manufacturing operations. The tenth embodiment also provides the following advantage. If the dose of the n-type extended drain region 1022 is as high as about $2\times10^{13}$ $cm^{-2}$, for example, the diffusion length of the n-type extended drain region 1022 is greater than the sum of the depth of the first trench 1030 and the diffusion length of the p-type base region 1045, and the breakdown voltage tends to decrease due to the punch-through phenomenon. Similarly, if the dose of the p-type extended drain region 1322 is as high as about $2\times10^{13}$ $cm^{-2}$, for example, the diffusion length of the p-type extended drain region 1322 is greater than the sum of the depth of the second trench 1330 and the diffusion length of the n-type base region 1345, and the breakdown voltage tends to decrease due to the punch-through phenomenon and latch-up.

The tenth embodiment can solve the above problem because the p-type body region 1024 prevents the two parts of the n-type extended drain region 1022 from joining together under the first trench 1030 and the n-type body region 1324 prevents the two parts of the p-type extended drain region 1322 from joining together under the second trench 1330, thus preventing occurrence of a punch-through phenomenon and latch-up.

Figure 188:
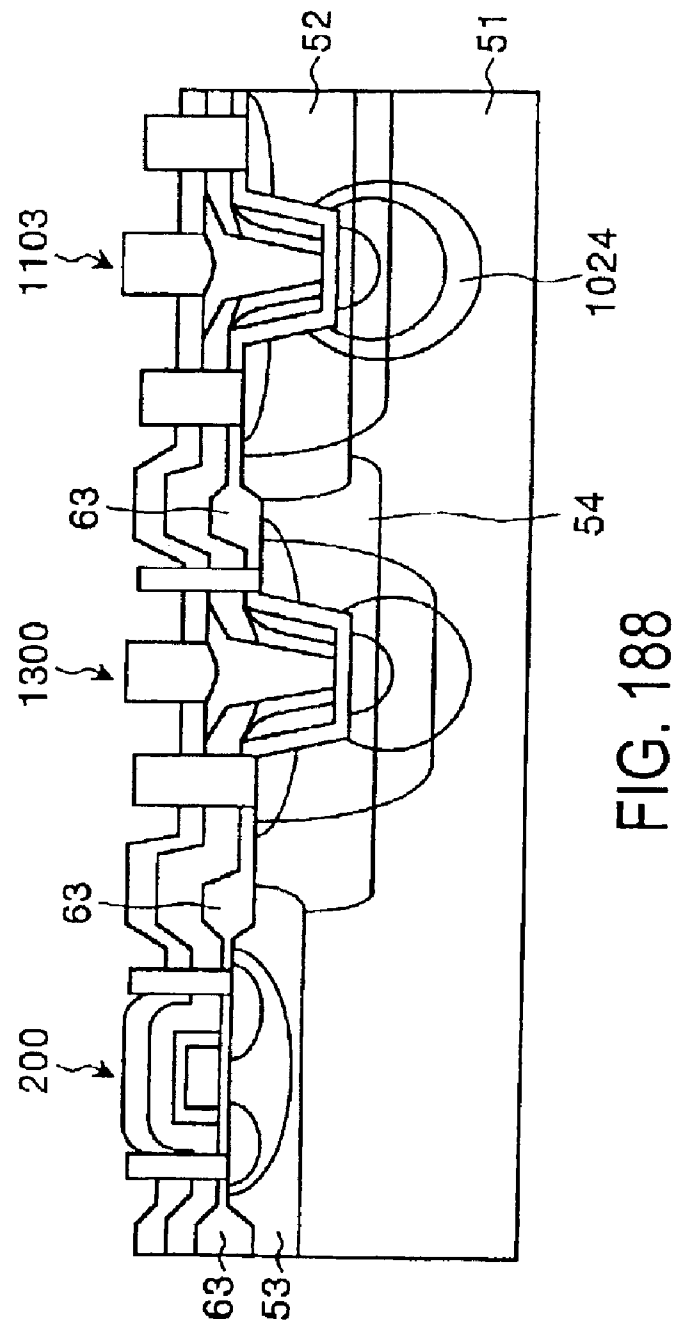
Figure 189:
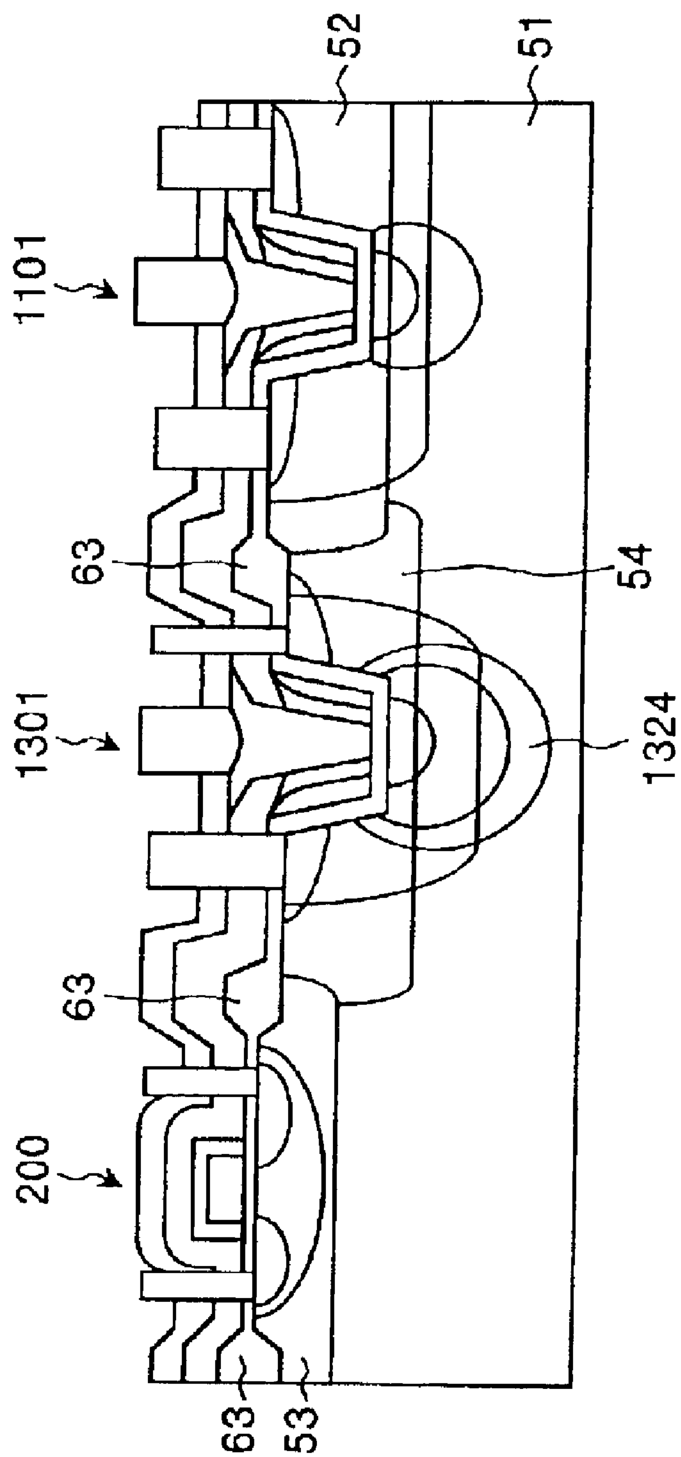

FIG. 188 shows another configuration in which the TLPM 1103 having the p-type body region 1204 is formed in the first p-well region 52 instead of the first TLPM 1101 and the second TLPM having no n-type body region is formed in the n-well region 54. FIG. 189 shows a further configuration in which the TLPM 1101 having no p-type body region is formed in the first p-well region 52 and the TLPM 1301 having the n-type body region 1324 is formed in the n-well region 54 instead of the second TLPM 1300. Each configuration can prevent occurrence of a punch-through phenomenon and latch-up.

Figure 190:
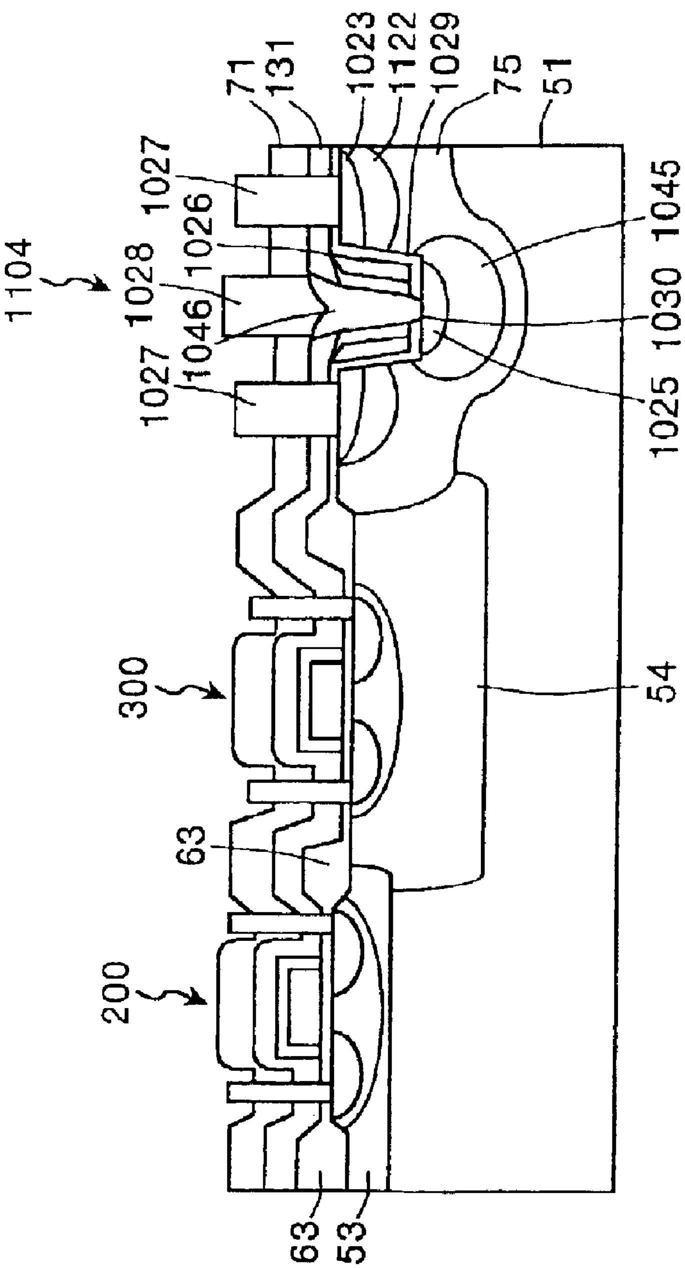
FIG. 190 is a vertical sectional view showing the configuration of a semiconductor device according to an eleventh embodiment of the invention.

FIG. 190 is a vertical sectional view showing the configuration of a semiconductor device according to an eleventh embodiment of the invention. As shown in FIG. 190, in the semiconductor device according to the eleventh embodiment, a TLPM 1104 is formed in a first p-well region 75 having a generally constant depth including under the trench 1030 and n-type extended drain regions 1122 are formed on both sides of the trench 1030 in the first p-well region 75 so as to surround the respective n-type drain regions 1023. The other part of the configuration of the TLPM 1104 is the same as that of the TLPM 1100 of the semiconductor device shown in FIG. 98 and hence will not be described. Regions, electrodes, etc. having the same names in the sixth embodiment are given the same reference numerals as the latter and will not be described.

A manufacturing process of the semiconductor device shown in FIG. 190 is described below. FIGS. 191–195 are vertical sectional views showing intermediate states of manufacture of the semiconductor device shown in FIG. 190. First, as shown in FIGS. 37–43, an n-well region 54 is formed in a surface layer of a semiconductor substrate 51, a trench 1030 is formed, a first p-well region 75 and a second p-well region 53 are formed at the same time, and the oxide films on the surfaces of the trench 1030 and the substrate surface are removed.

Figure 191:
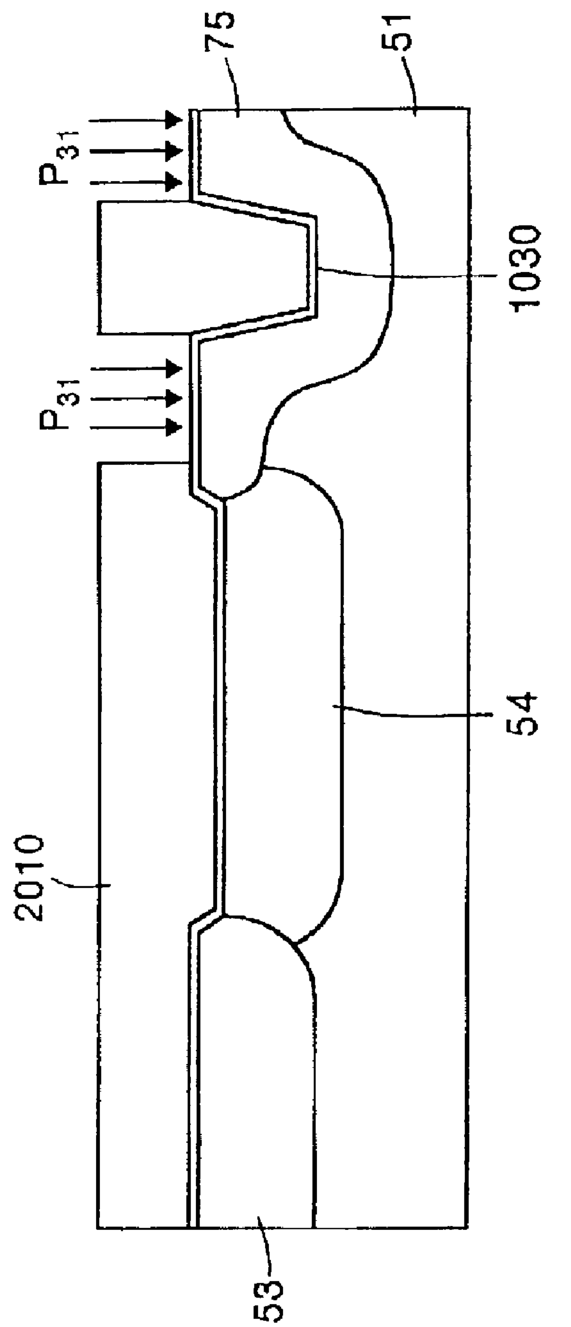
FIGS. 191–195 are vertical sectional views showing intermediate states of manufacture of the embodiment of the semiconductor device shown in FIG. 190.

After buffer oxidation is performed, a mask 2010 having openings in areas corresponding to portions of the first p-well region 75 on both side of the trench 1030 is formed and an n-type impurity such as phosphorus ($P_{31}$) is ion-implanted (see FIG. 191). The inside of the trench 1030 is also covered with the mask 2010 as shown in FIG. 191 to prevent occurrence of a punch-through phenomenon and latch-up due to deep diffusion of the n-type impurity under the bottom surface of the trench 1030. The embodiment shown in FIG. 191 also realizes a high breakdown voltage and a low on-resistance.

Figure 192:
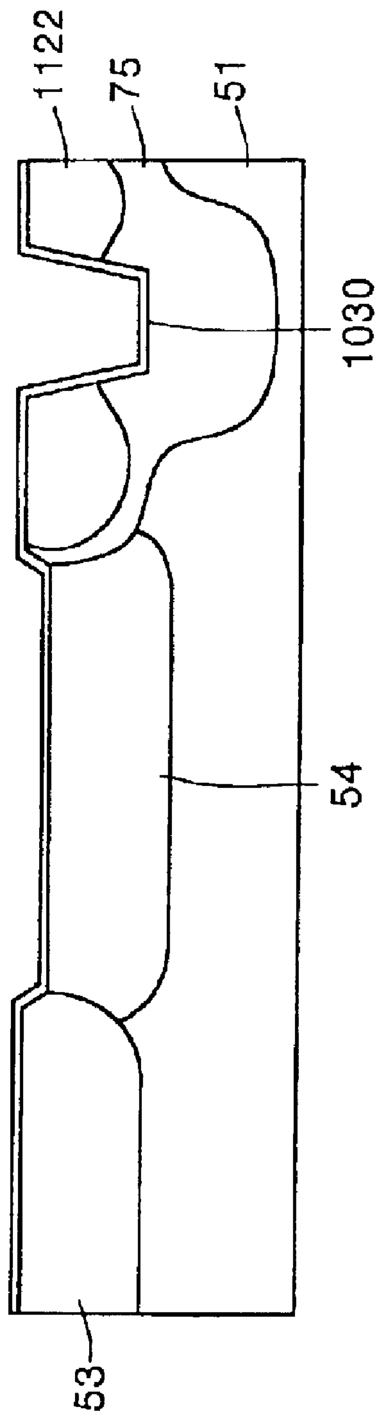
Figure 193:
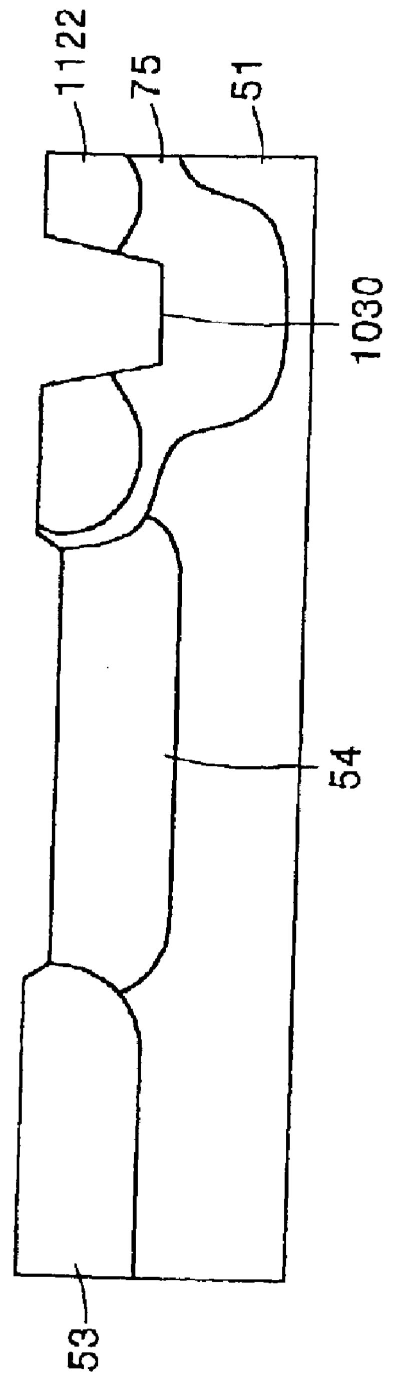
Figure 194:
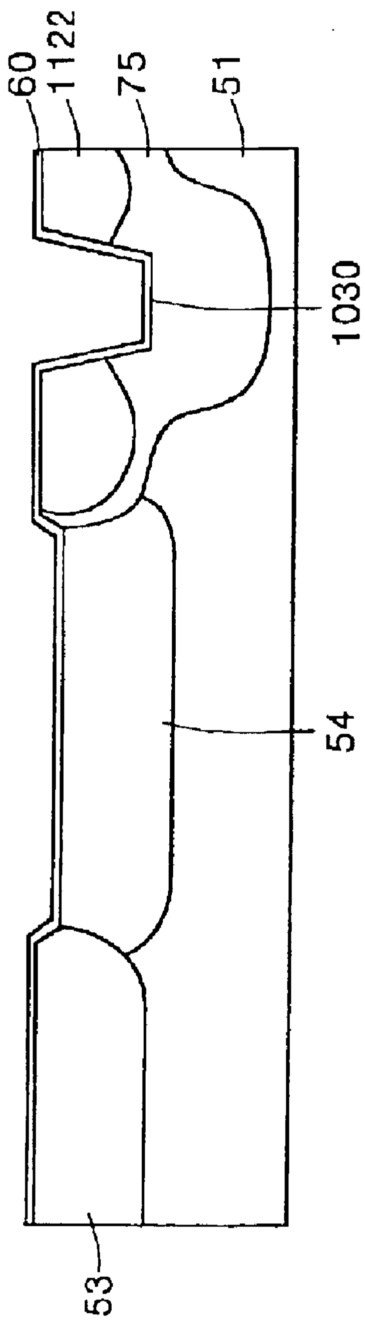
Figure 195:
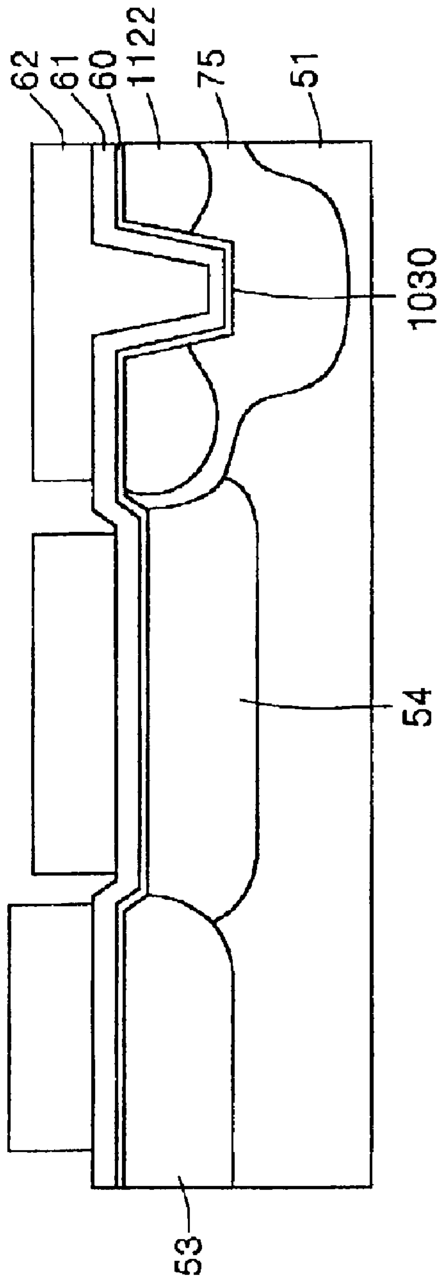

After the mask 2010 is removed, the implanted impurity is diffused, forming n-type extended drain regions 1122 outside the side surfaces of the trench 1030 (see FIG. 192). The oxide film on the surface of the trench 1030 and the substrate surface is removed thereafter (see FIG. 193). Then, a buffer oxide film 60 is formed again on the substrate surface and the surface of the trench 1030 (see FIG. 194). A silicon nitride film 61 is formed on the buffer oxide film 60, and a mask 62 having openings in device isolation areas is formed thereon (see FIG. 195). The subsequent operations are the same as the operations of FIGS. 105–118. In this manner, a semiconductor device having the configuration of FIG. 190 is completed.

Figure 196:
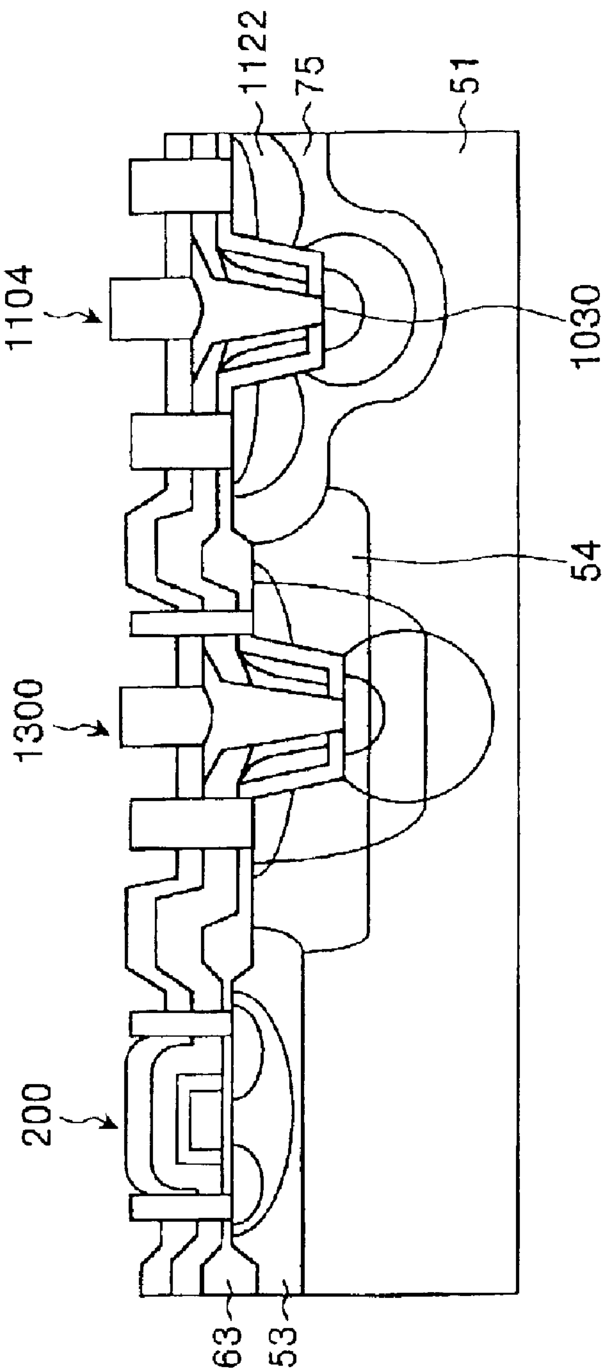
FIG. 196 is a vertical sectional view showing the configuration of another semiconductor device according to the eleventh embodiment of the invention.

The concept of the eleventh embodiment can be applied to the semiconductor device of FIG. 128 according to the seventh embodiment. FIG. 196 shows a configuration in which, instead of the TLPM 1101 of the seventh embodiment, the TLPM 1104 is formed in the first p-well region 75 having a generally constant depth including under the trench 1030, and the n-type extended drain regions 1122 are formed on both sides of the trench 1030 in the first p-well region 75 to surround the respective n-type drain regions 1023. It is also possible to apply the concept of the eleventh embodiment to the semiconductor device of FIG. 149 according to the eighth embodiment.

The above-described eleventh embodiment provides a one-chip power IC that is small in size and low in on-resistance and cost while preventing cost increase due to increase in the number of manufacturing operations. Further, since the first p-well region 75 is formed after the formation of the trench 1030, the diffusion length of the p-well region 75 can be increased by the depth of the trench 1030. Since the n-type extended drain regions 1122 are formed by performing ion implantation on portions on both sides of the trench 1030, the diffusion lengths of the n-type extended drain regions 1122 can be decreased. Therefore, the eleventh embodiment provides an advantage that the punch-through phenomenon and latch-up can be prevented without forming a p-type body region.

A semiconductor device according to a twelfth embodiment of the invention alters the semiconductor device according to the sixth embodiment by replacing the TLPM 1100 by a TLPM 1105 having a barrier metal layer inside the trench 1030. The base region 1045 is grounded via a p-type plug region. Regions, electrodes, etc. having the same names in the sixth embodiment are given the same reference numerals as the latter and will not be described.

Figure 197:
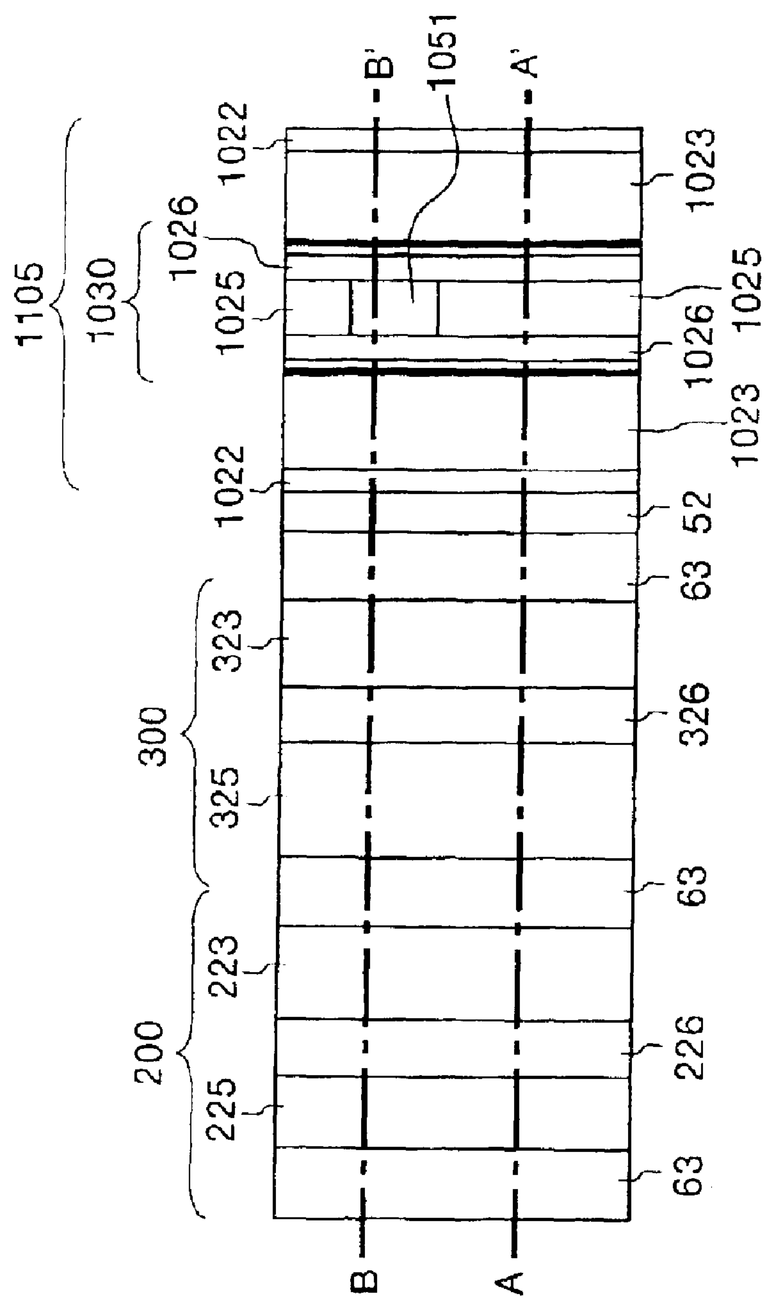
FIG. 197 shows an impurity plan layout of a semiconductor device according to a twelfth embodiment of the invention.

FIG. 197 shows an impurity plan layout of the semiconductor device according to the twelfth embodiment of the invention. As shown in FIG. 197, the source region 225, the gate electrode 226, and the drain region 223 of the NMOS 200 are arranged sequentially adjacent to the left-end selective oxidation film 63. The source region 325, the gate electrode 326, and the drain region 323 of the PMOS 300 are arranged sequentially, the source region 325 being located by the side of the drain region 223 of the NMOS 200 with the selective oxidation film 63 interposed in-between.

The first p-well region 52 is located by the side of the drain region 323 of the PMOS 300 with the selective oxidation film 63 interposed in-between. The extended drain region 1022, the drain region 1023, the trench 1030, the drain region 1023, and the extended drain region 1022 of the TLPM 1105 are arranged sequentially adjacent to the first p-well region 52. In part of the area of the trench 1030, the p-type plug region 1051 is located between the two gate electrodes 1026. In the remaining parts of the area of the trench 1030, the source region 1025 is located between the two gate electrodes 1026.

Figure 199:
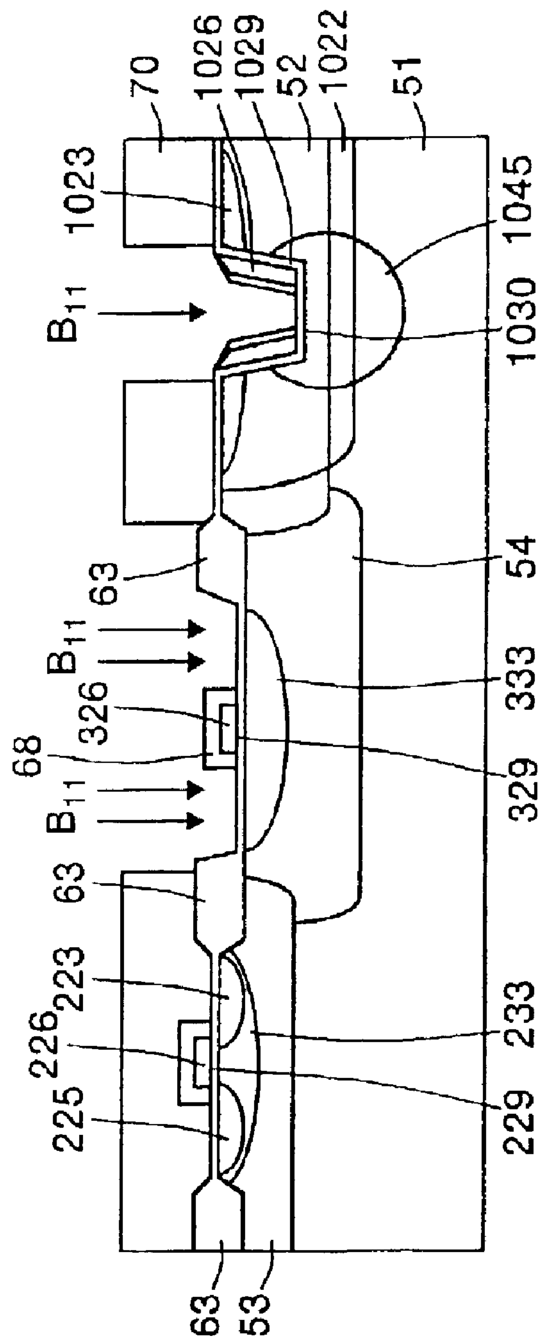
Figure 200:
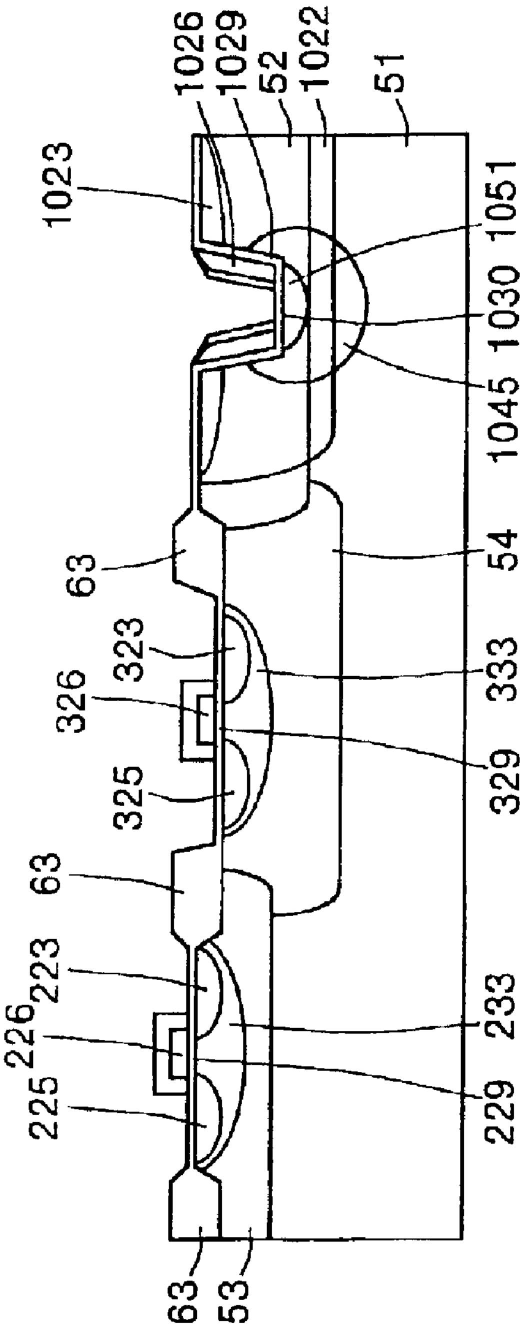
Figure 201:
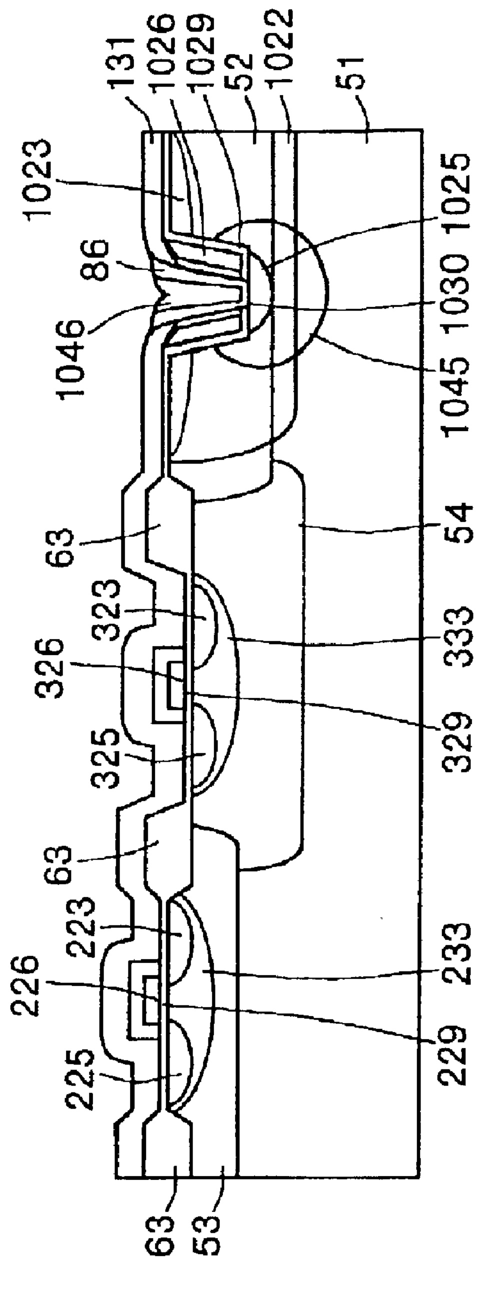
FIG. 201 is a vertical sectional view taken along line A–A' in FIG. 197 and showing an intermediate state of manufacture of the twelfth embodiment of the semiconductor device.

A manufacturing process of the semiconductor device according to the twelfth embodiment is described below with reference to FIGS. 198–202. FIG. 201 is a vertical sectional view taken along line A–A' in FIG. 197 and showing an intermediate state of manufacture, and FIGS. 198–200 and 202 are vertical sectional views taken along line B–B' in FIG. 197 and showing intermediate states of manufacture. In FIG. 197, line A–A' passes through the source region 1025 and line B–B' passes through the plug region 1051. First, as shown in FIGS. 2, 3, and 99–113, an n-well region 54, a first p-well region 52, a second p-well region 53, an extended drain region 1022, a trench 1030, selective oxidation films 63, a base region 1045, a channel region 233 of the intended NMOS, a channel region 333 of the intended PMOS, gate oxide films 1029, 229, and 329, gate electrodes 1026, 226, and 326, and shadow oxide films 68 are formed.

Figure 114:
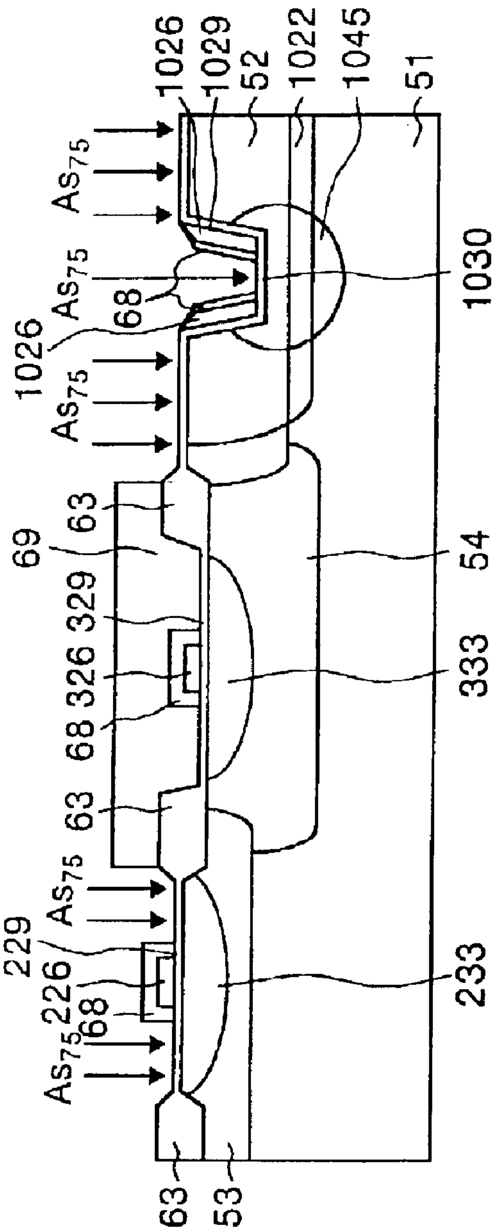
Figure 198:
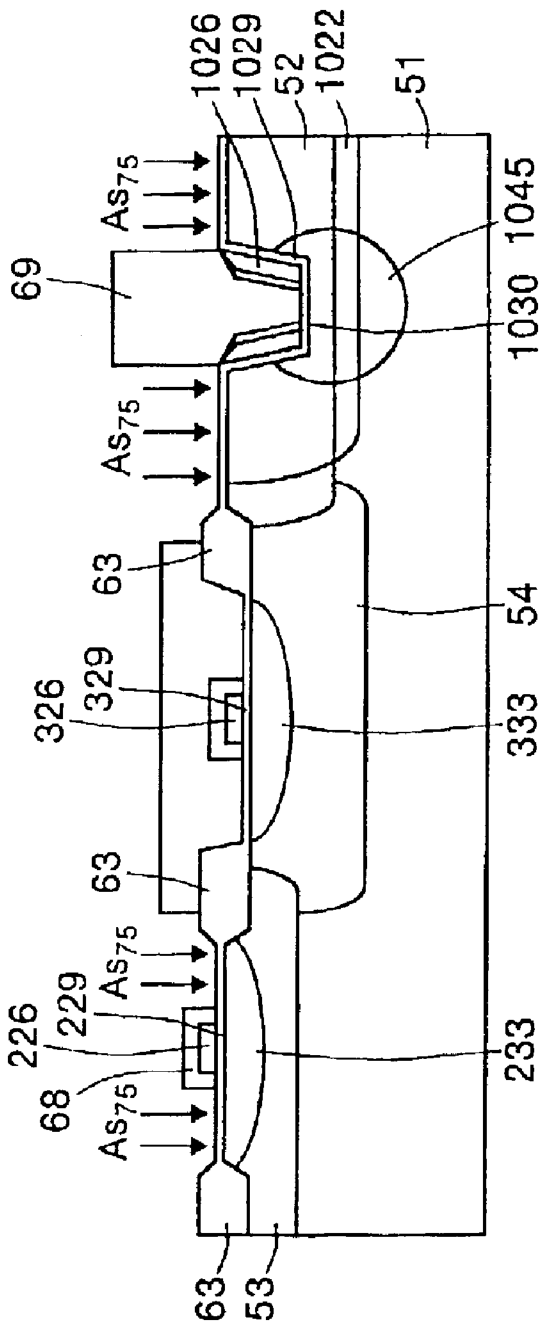
FIGS. 198–200 are vertical sectional views taken along line B–B' in FIG. 197 and showing intermediate states of manufacture of the twelfth embodiment of the semiconductor device.

Subsequently, in the area corresponding to line A–A' in FIG. 197, as shown in FIG. 114, a mask 69 having openings in an area corresponding to a future source region and drain regions of the intended TLPM and an NMOS forming area is formed on the substrate surface. At this time, in the area corresponding to line B–B' in FIG. 197, as shown in FIG. 198, not only a PMOS forming area, but also a future source region of the intended TLPM, that is, the inside of the trench 1030, is covered with the mask 69. An n-type impurity such as arsenic ($As_{75}$) is ion-implanted.

Figure 115:
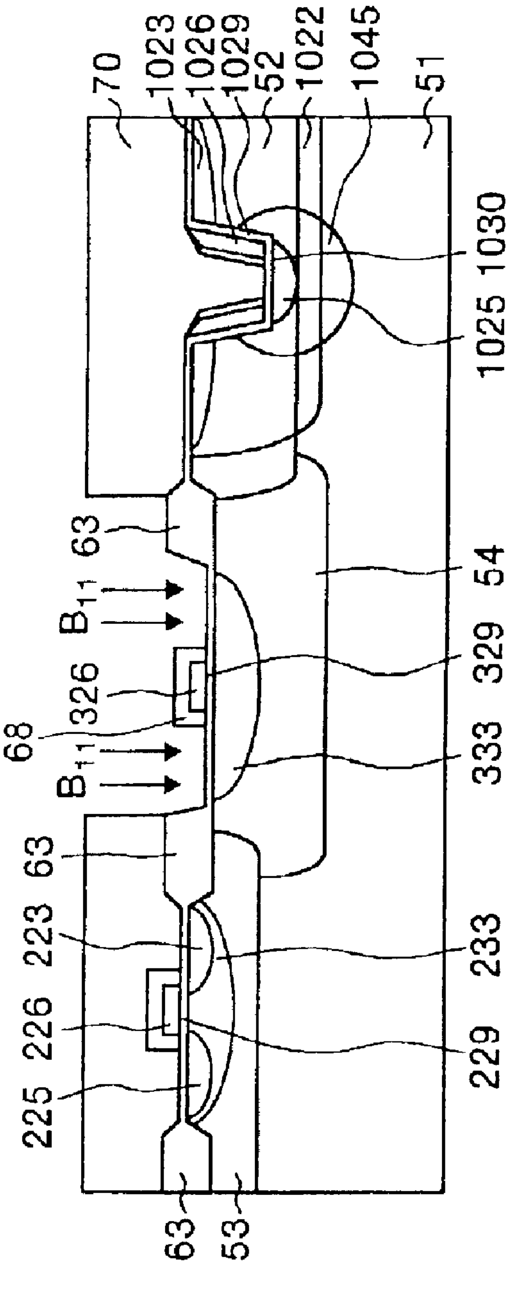

The implanted impurity is then diffused. As a result, in the area corresponding to line A–A' in FIG. 197, as shown in FIG. 115, a source region 1025 of the intended TLPM is formed under the bottom surface of the trench 1030, drain regions 1023 of the intended TLPM are formed on both sides of the trench 1030, and a source region 225 and a drain region 223 of the intended NMOS are formed in the channel region 233 simultaneously. In the area corresponding to line B–B' in FIG. 197, as shown in FIG. 199, the drain regions 1023 of the intended TLPM are formed on both sides of the trench 1030 and the source region 225 and the drain region 223 of the intended NMOS are formed in the channel region 233 simultaneously.

After the mask 69 is removed, in the area corresponding to line A–A' in FIG. 197, as shown in FIG. 115, a mask 70 having an opening in a PMOS forming area is formed on the substrate surface. At this time, in the area corresponding to line B–B' in FIG. 197, as shown in FIG. 199, the mask 70 has a pattern with an opening not only in the PMOS forming area, but also in the area of the trench 1030. A p-type impurity such as boron ($B_{11}$) is ion-implanted.

Figure 116:
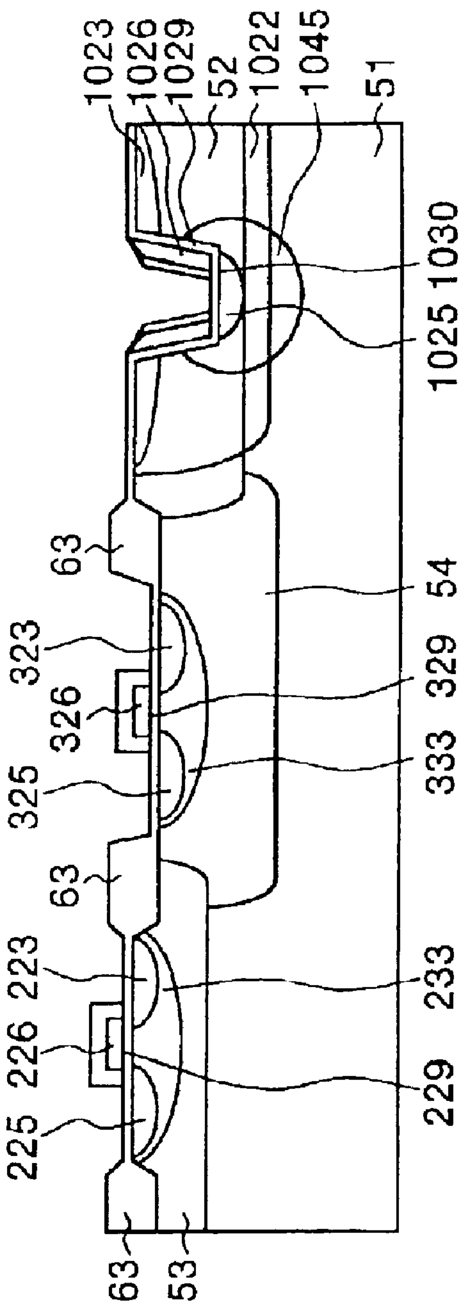
Figure 117:
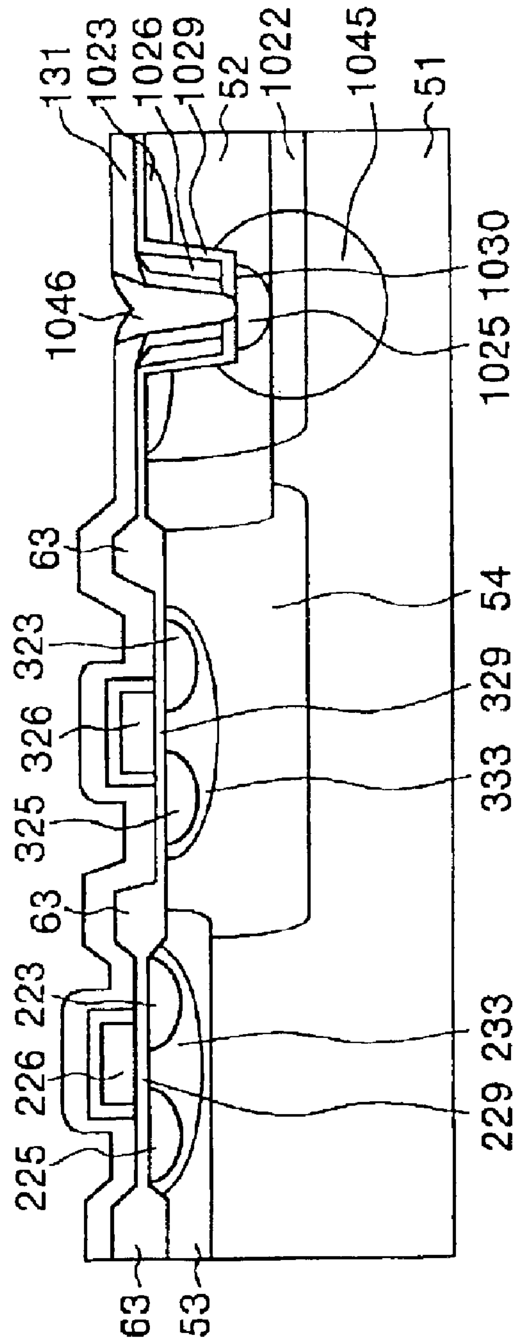

The implanted impurity is then diffused. As a result, in the area corresponding to line A–A' in FIG. 197, as shown in FIG. 116, a source region 325 and a drain region 323 of the intended PMOS are formed in the channel region 333. In the area corresponding to line B–B' in FIG. 197, as shown in FIG. 200, a p-type plug region 1051 is formed under the bottom surface of the trench 1030, and the source region 325 and the drain region 323 of the intended PMOS are formed in the channel region 333 simultaneously. Strictly, the plan layout of FIG. 197 is a layout in the state of FIGS. 116 and 200.

Figure 202:
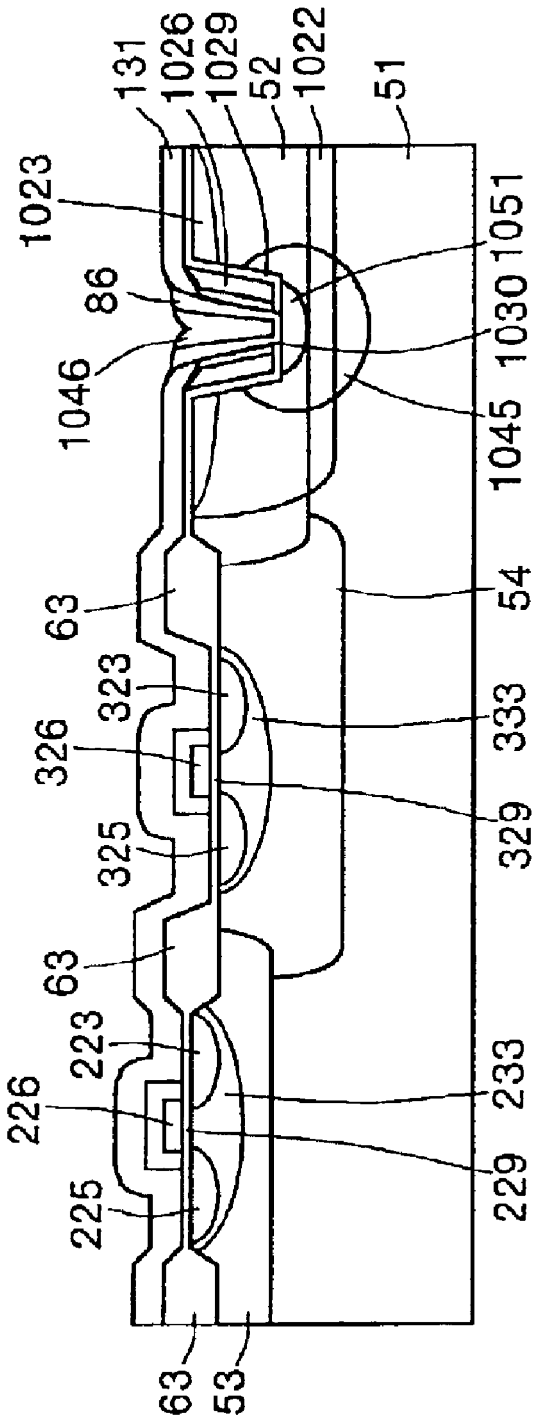
FIG. 202 is a vertical sectional view taken along line B–B' in FIG. 197 and showing an intermediate state of manufacture of the twelfth embodiment of the semiconductor device.

After the mask 70 is removed, an interlayer insulating film 131 is laid over the substrate surface. A portion of the interlayer insulating film 131 inside the trench 1030 is etched away by self-alignment to form a contact hole. In the area corresponding to line A–A' in FIG. 197, as shown in FIG. 201, a barrier metal layer 86 is formed inside the trench 1030 to be in contact with the source region 1025, and the inside of the barrier metal layer 86 is filled with a source polysilicon 1046. In this state, in the area corresponding to line B–B' in FIG. 197, as shown in FIG. 202, the barrier metal layer 86 is in contact with the plug region 1051 that is located under the bottom surface of the trench 1030. The barrier metal layer 86 is insulated from the gate electrodes 1026 by the insulating film.

Figure 118:
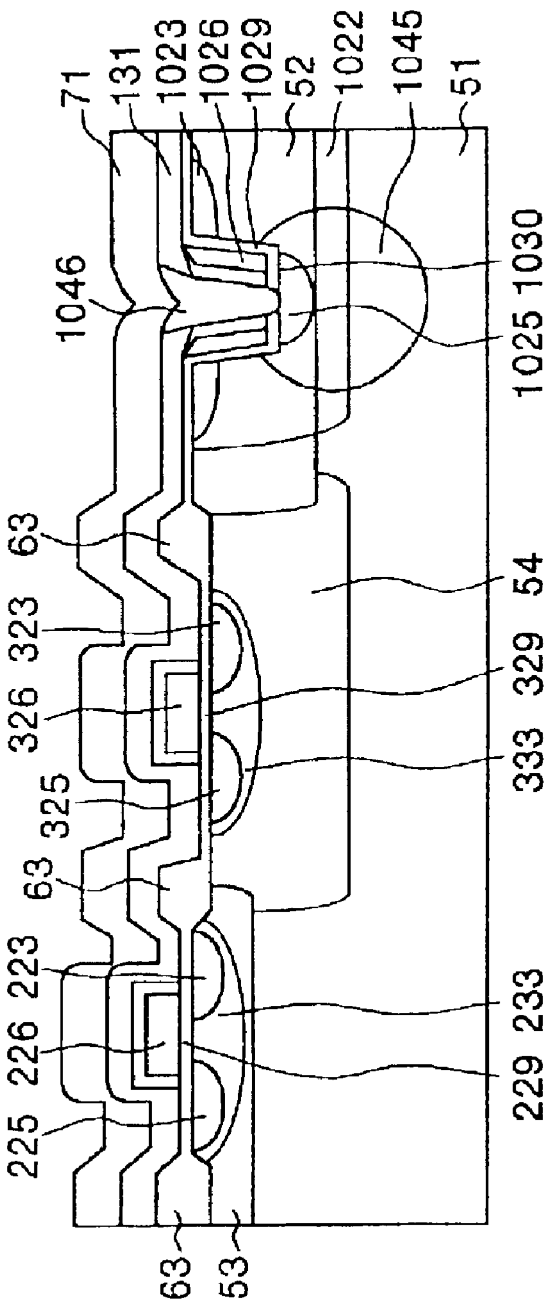

Then, as shown in FIG. 118, a passivation film 71 is formed over the substrate surface and contact holes are formed through the passivation film 71 and the interlayer insulating film 131. A metal film is formed and patterned, forming source electrodes and drain electrodes .

The above-described twelfth embodiment can provide a one-chip power IC that is small in size and low in on-resistance and cost while preventing cost increase due to increase in the number of manufacturing operations. The twelfth embodiment also provides the following advantages. The source polysilicon layer 1046 has a high impurity concentration and is of a p or n conductivity type. In the case of the n type, without the barrier metal layer 86, a pn diode structure, rather than an ohmic contact, would be formed as a result of contact between the n-type source polysilicon layer 1046 and the p-type plug region 1051. Similarly, if the source polysilicon layer 1046 is of a p type, without the barrier metal layer 86, a pn diode structure, rather than an ohmic contact, would be formed as a result of contact between the p-type source polysilicon layer 1046 and the n-type source region 1025.

The above problem is solved by forming the barrier metal layer 86 according to the twelfth embodiment. Irrespective of whether the source polysilicon layer 1046 is of an n type or a p type, the source polysilicon layer 1046 is electrically connected to each of the p-type plug region 1051 and the n-type source region 1025 with a low resistance. Grounding the source and the substrate in this manner provides advantages that floating is prevented in the p-type base region 1045 and channels, and the TLPM 1105 is prevented from having a decreased breakdown voltage.

Figure 203:
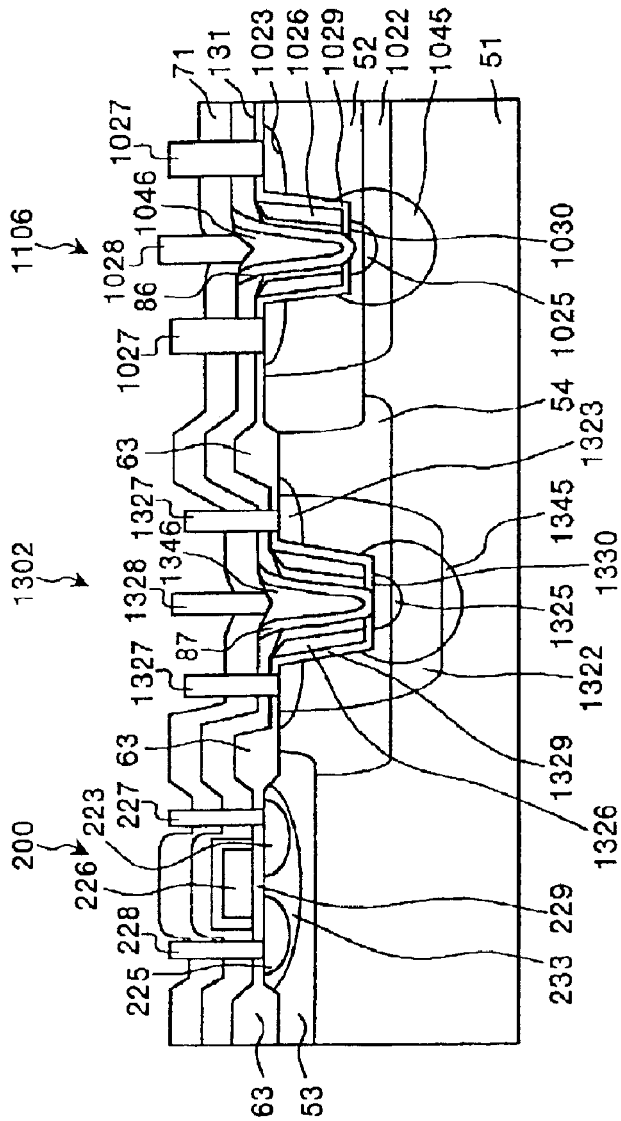
FIG. 203 is a vertical sectional view showing the configuration of a semiconductor device according to a thirteenth embodiment of the invention.

FIG. 203 is a vertical sectional view showing the configuration of a semiconductor device according to a thirteenth embodiment of the invention. As shown in FIG. 203, the semiconductor device according to the thirteenth embodiment is a semiconductor device according to the seventh embodiment in which the first TLPM 1101 is replaced by a TLPM 1106 having a barrier metal layer 86 inside the trench 1030 and in which the second TLPM 1300 is replaced by a TLPM 1302 having a barrier metal layer 87 inside the trench 1330. Regions, electrodes, etc. having the same names in the seventh embodiment are given the same reference numerals as the latter and will not be described.

Figure 204:
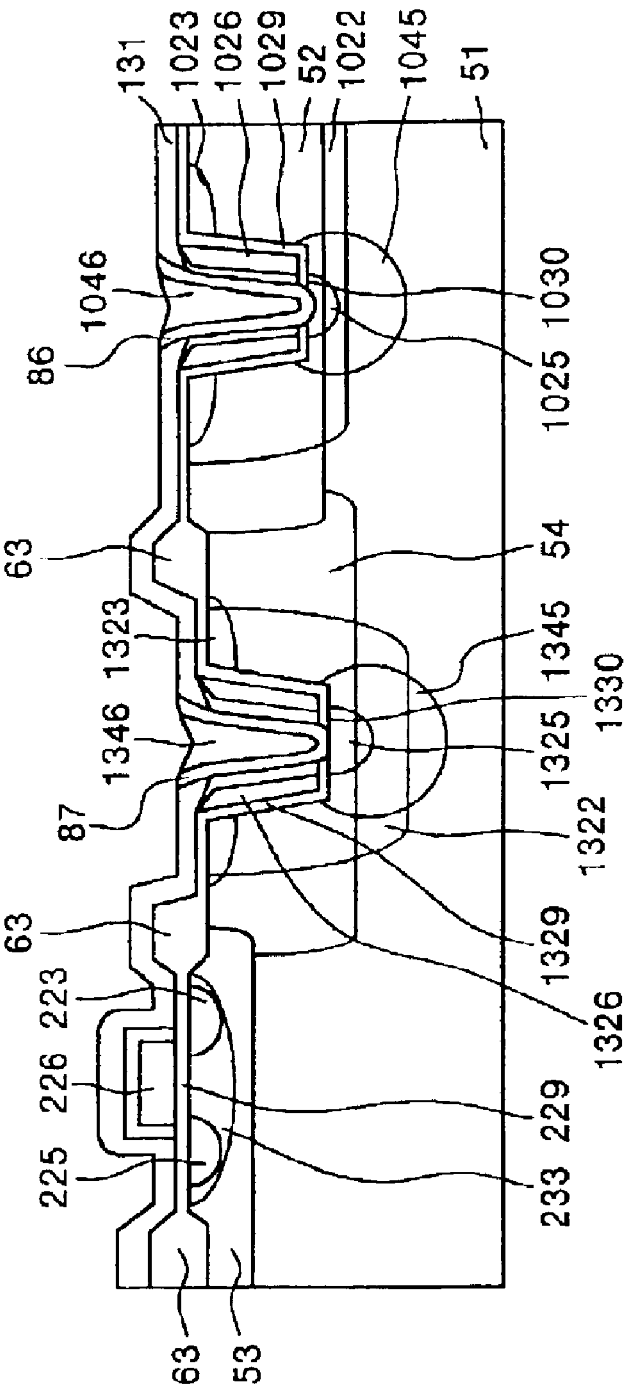
FIG. 204 is a vertical sectional view showing an intermediate state of manufacture of the embodiment of the semiconductor device shown in FIG. 203.

A manufacturing process of the semiconductor device shown in FIG. 203 will be described below. FIG. 204 is a vertical sectional view showing an intermediate state of manufacture of the embodiment of the semiconductor device shown in FIG. 203. First, as shown in FIGS. 2, 3, 99, and 129–147, an n-well region 54, p-well regions 52 and 53, an n-type extended drain region 1022, a p-type extended drain region 1322, a first trench 1030, a second trench 1330, selective oxidation films 63, a p-type base region 1045, an n-type base region 1345, a channel region 233 of the NMOS 200, gate oxide films 1029, 229, and 1329, gate electrodes 226, 1026, and 1326, an n-type source region 1025 and n-type drain regions 1023 of the first TLPM 1106, a p-type source region 1325 and p-type drain regions 1323 of the second TLPM 1302, and a source region 225 and a drain region 223 of the NMOS 200 are formed.

Subsequently, an interlayer insulating film 131 is formed over the substrate, and portions of the interlayer insulating film 131 inside the first trench 1030 and the second trench 1330 are etched away by self-alignment to form contact holes. A barrier metal layer 86 is formed inside the first trench 1030 so as to be in contact with the n-type source region 1025 under the bottom surface of the trench 1030. A barrier metal layer 87 is formed inside the second trench 1330 to be in contact with the p-type source region 1325 under the bottom surface of the trench 1330. Then, the inside of the barrier metal layer 86 in the first trench 1030 and the inside of the barrier metal layer 87 in the second trench 1330 are filled with polysilicon, forming a source polysilicon layer 1046 of the first TLPM 1106 and a source polysilicon layer 1346 of the second TLPM 1302 simultaneously (see FIG. 204). The barrier metal layers 86 and 87 are insulated from the gate electrodes 1026 and 1326 by the insulating films.

Then, a passivation film 71 is formed over the substrate surface and contact holes are formed through the passivation film 71 and the interlayer insulating film 131. A metal film is formed and patterned, forming source electrodes and drain electrodes. A semiconductor device having the configuration of FIG. 203 is thus completed.

Figure 205:
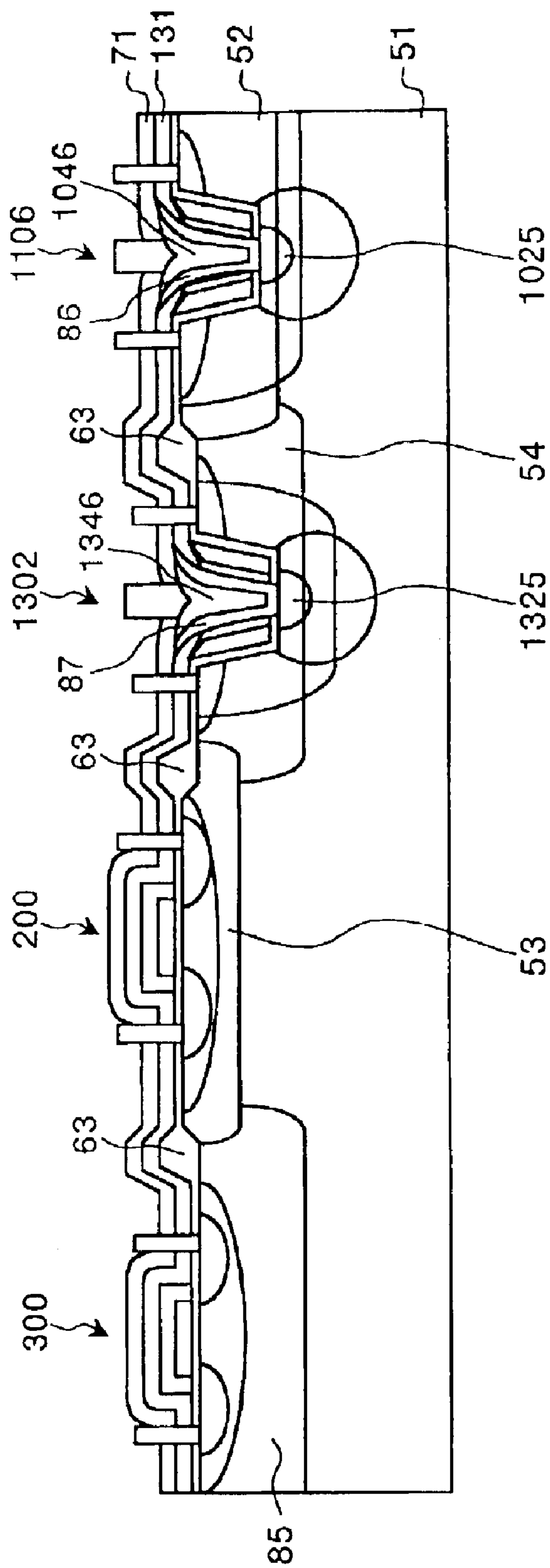
FIG. 205 is a vertical sectional view showing the configuration of another semiconductor device according to the thirteenth embodiment of the invention.

FIG. 205 shows another configuration in which in the semiconductor device of FIG. 149 according to the eighth embodiment the first TLPM 1101 is replaced by the TLPM 1106 having the barrier metal layer 86 inside the trench 1030, and the second TLPM 1300 is replaced by the TLPM 1302 having the barrier metal layer 87 inside the trench 1330.

The above-described thirteenth embodiment provides a one-chip power IC that is small in size and low in on-resistance and cost while preventing cost increase due to an increase in the number of manufacturing operations. The thirteenth embodiment also provides the following advantages. The source polysilicon layers 1046 and 1346 have a high impurity concentration and are of a p or n conductivity type. In the case of the n type, without the barrier metal layer 87, a pn diode structure, rather than an ohmic contact, is formed as a result of contact between the n-type source polysilicon layer 1346 and the p-type source region 1325. Similarly, if the source polysilicon layers 1046 and 1346 are of a p type, without the barrier metal layer 86, a pn diode structure, rather than an ohmic contact, is formed as a result of contact between the p-type source polysilicon layer 1046 and the n-type source region 1025.

The above problem can be solved by forming the barrier metal layers 86 and 87 according to the thirteenth embodiment. Irrespective of whether the source polysilicon layers 1046 and 1346 are of an n type or a p type, the source polysilicon layers 1046 and 1346 are electrically connected to the n-type source region 1025 and the p-type plug region 1051, respectively, with low resistances. Further, the number of masks is smaller than when the source polysilicon layers 1046 and 1346 are formed separately, which contributes to cost reduction.

A semiconductor device according to a fourteenth embodiment of the invention is a semiconductor device according to the seventh embodiment wherein the first TLPM 1101 is replaced by a TLPM 1106 having a barrier metal layer inside the trench 1030, and the second TLPM 1300 is replaced by a TLPM 1302 having a barrier metal layer 87 inside the trench 1330. Further, the p-type base region 1045 and the n-type base region 1345 are grounded via a p-type plug region and an n-type plug region, respectively. Regions, electrodes, etc. having the same names in the seventh embodiment are given the same reference numerals as the latter and will not be further described.

Figure 206:
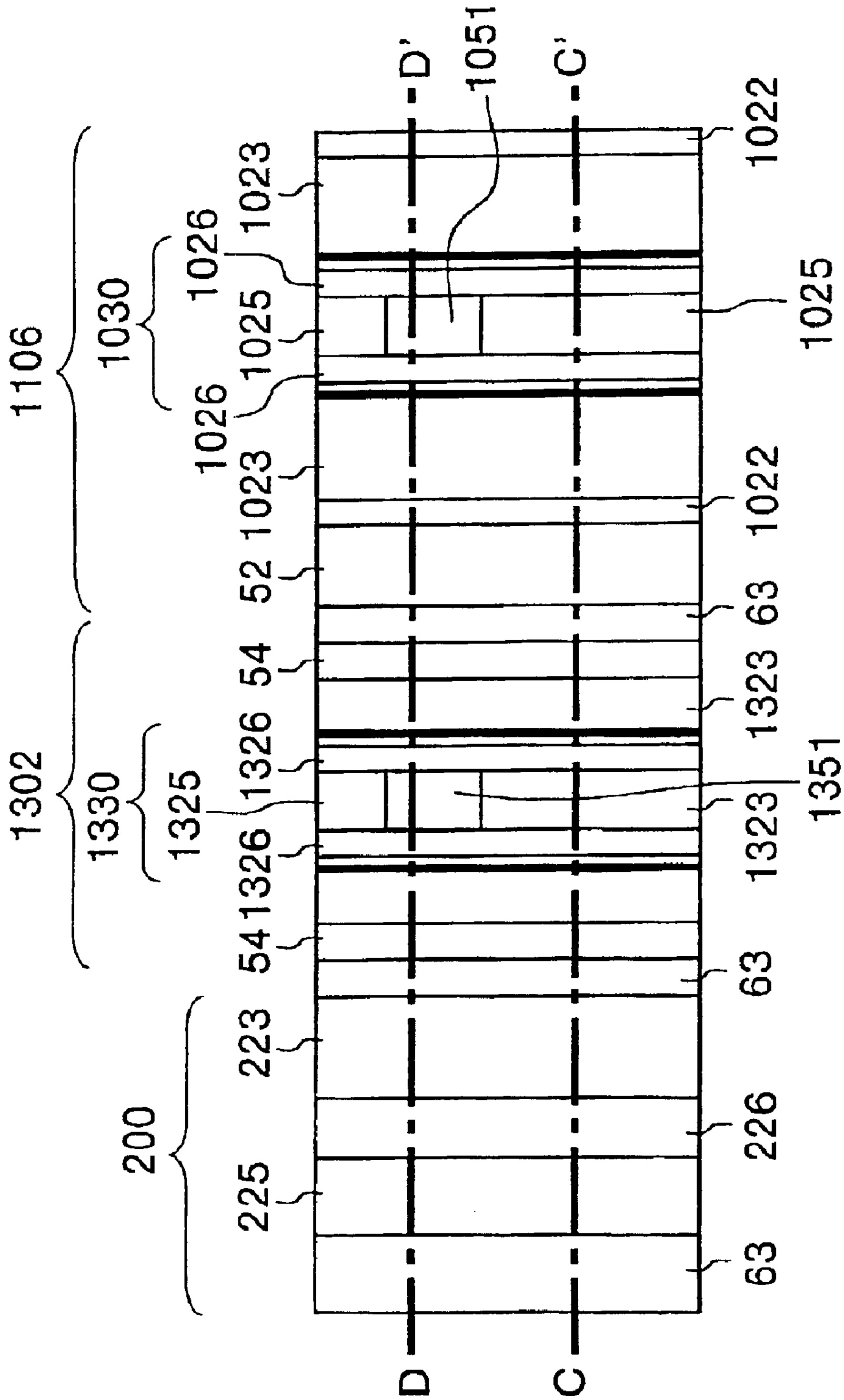
FIG. 206 shows an impurity plan layout of a semiconductor device according to a fourteenth embodiment of the invention.

FIG. 206 shows an impurity plan layout of the semiconductor device according to the fourteenth embodiment of the invention. As shown in FIG. 206, the source region 225, the gate electrode 226, and the drain region 223 of the NMOS 200 are arranged in this order adjacent to the left-end selective oxidation film 63. The n-well region 54 is located by the side of the drain region 223 with the selective oxidation film 63 interposed in-between. The drain region 1323, the trench 1330, and the drain region 1323 of the second TLPM 1302 and the n-well region 54 are arranged sequentially adjacent to the n-well region 54. In part of the area of the trench 1330, the n-type plug region 1351 is located between the two gate electrodes 1326. In the remaining parts of the area of the trench 1330, the source region 1325 is located between the two gate electrodes 1326.

The first p-well region 52 is located by the side of the n-well region 54 with the selective oxidation film 63 interposed in between. The extended drain region 1022, the drain region 1023, the trench 1030, the drain region 1023, and the extended drain region 1022 of the first TLPM 1106 are arranged sequentially adjacent to the first p-well region 52. In part of the area of the trench 1030, the p-type plug region 1051 is located between the two gate electrodes 1026. In the remaining parts of the area of the trench 1030, the source region 1025 is located between the two gate electrodes 1026.

In FIG. 206, line C–C' passes through the source regions 1025 and 1325. A vertical sectional view taken along line C–C' of the semiconductor device is the same as shown in FIG. 203. That is, in the first TLPM 1106, the source polysilicon layer 1046 is electrically connected, with a low resistance, to the n-type source region 1025 via the barrier metal layer 86 in the trench 1030. Similarly, in the second TLPM 1302, the source polysilicon layer 1346 is electrically connected, with a low resistance, to the p-type source region 1325 via the barrier metal layer 87 in the trench 1330.

Figure 207:
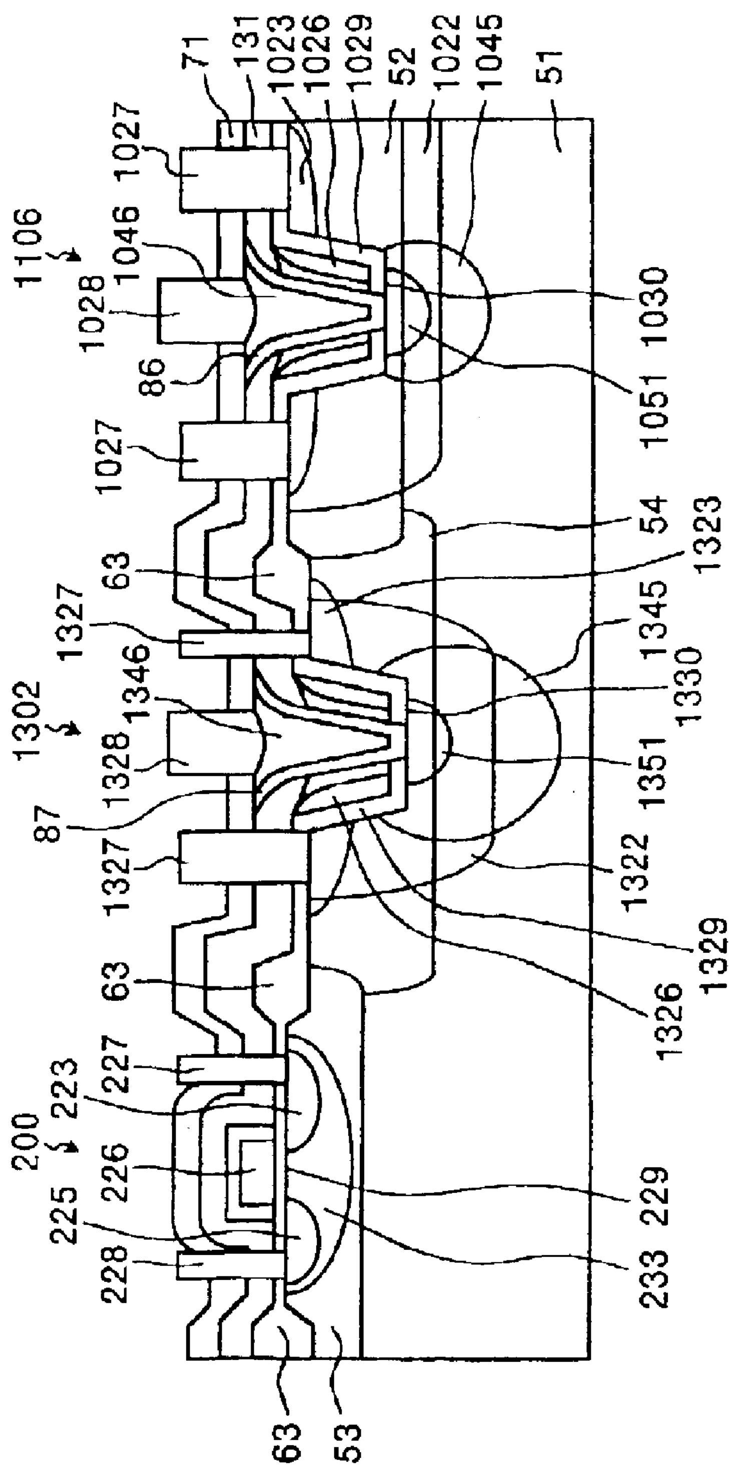
FIG. 207 is a vertical sectional view taken along line D–D' in FIG. 206 and showing the configuration of the fourteenth embodiment of the semiconductor device.

In FIG. 206, line D–D' passes through the plug regions 1051 and 1351. A vertical sectional view taken along line D–D' of the semiconductor device is the same as shown in FIG. 207. That is, in the first TLPM 1106, the source polysilicon layer 1046 is electrically connected, with a low resistance, to the p-type plug region 1051 via the barrier metal layer 86 in the trench 1030. Similarly, in the second TLPM 1302, the source polysilicon layer 1346 is electrically connected, with a low resistance, to the n-type plug region 1351 via the barrier metal layer 87 in the trench 1330.

The above-described fourteenth embodiment provides a one-chip power IC that is small in size and low in on-resistance and cost, while preventing cost increase due to an increase in the number of manufacturing operations. The fourteenth embodiment also provides the following advantages. The source polysilicon layers 1046 and 1346 have a high impurity concentration and are of a p or n conductivity type. In the case of the n type, without the barrier metal layer 87, a pn diode structure, rather than an ohmic contact, is formed as a result of contact between the n-type source polysilicon layer 1346 and the p-type source region 1325. Without the barrier metal layer 86, a pn diode structure, rather than an ohmic contact, is formed as a result of contact between the n-type source polysilicon layer 1046 and the p-type source region 1051.

Similarly, if the source polysilicon layers 1046 and 1346 are of a p type, without the barrier metal layer 86, a pn diode structure, rather than an ohmic contact, is formed as a result of contact between the p-type source polysilicon layer 1046 and the n-type source region 1025. Without the barrier metal layer 87, a pn diode structure, rather than an ohmic contact, is formed as a result of contact between the p-type source polysilicon layer 1346 and the n-type plug region 1351.

The above problem can be solved by forming the barrier metal layers 86 and 87 according to the fourteenth embodiment. Irrespective of whether the source polysilicon layers 1046 and 1346 are of an n type or a p type, the source polysilicon layer 1046 is electrically connected to the n-type source region 1025 and the p-type plug region 1051 with a low resistance, and the source polysilicon layer 1346 is electrically connected to the p-type source region 1325 and the n-type plug region 1351 with a low resistance. Grounding the sources and the substrate in this manner provides advantages that floating is prevented in the base regions 1045 and 1345 that act as channels, and the TLPMs 1106 and 1302 are prevented from being reduced in breakdown voltage. Further, since the source polysilicon layers 1046 and 1346 can be formed at the same time, the number of masks is smaller than when the source polysilicon layers 1046 and 1346 are formed separately, which contributes to cost reduction.

Figure 208:
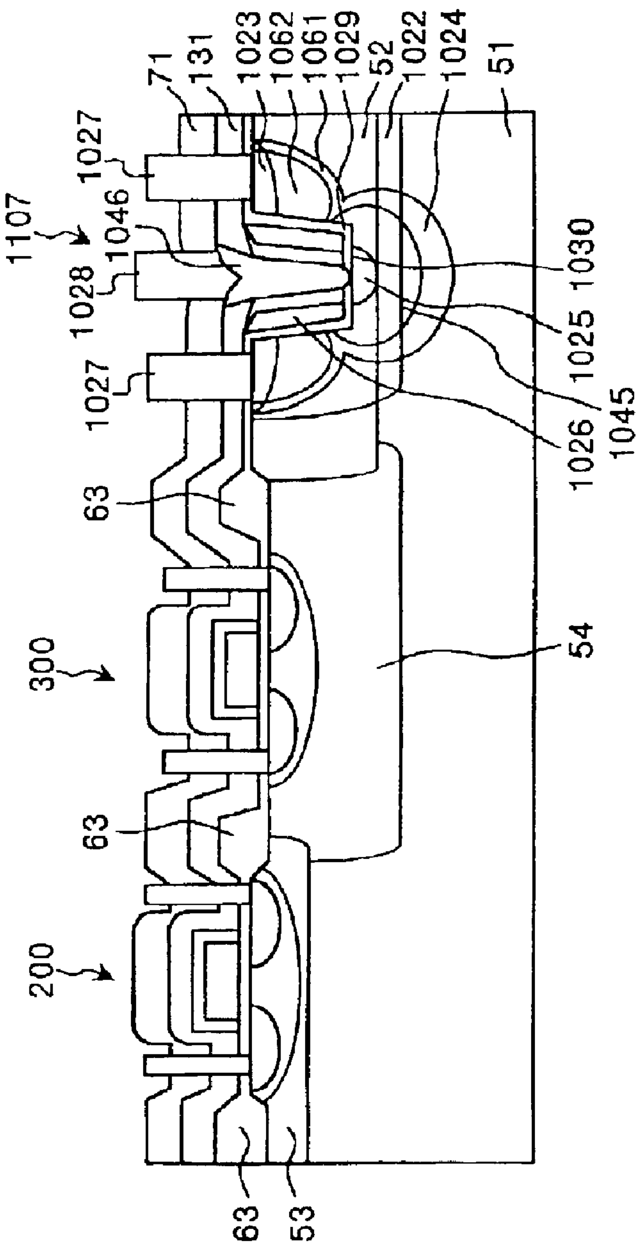
FIG. 208 is a vertical sectional view showing the configuration of a semiconductor device according to a fifteenth embodiment of the invention.
Figure 209:
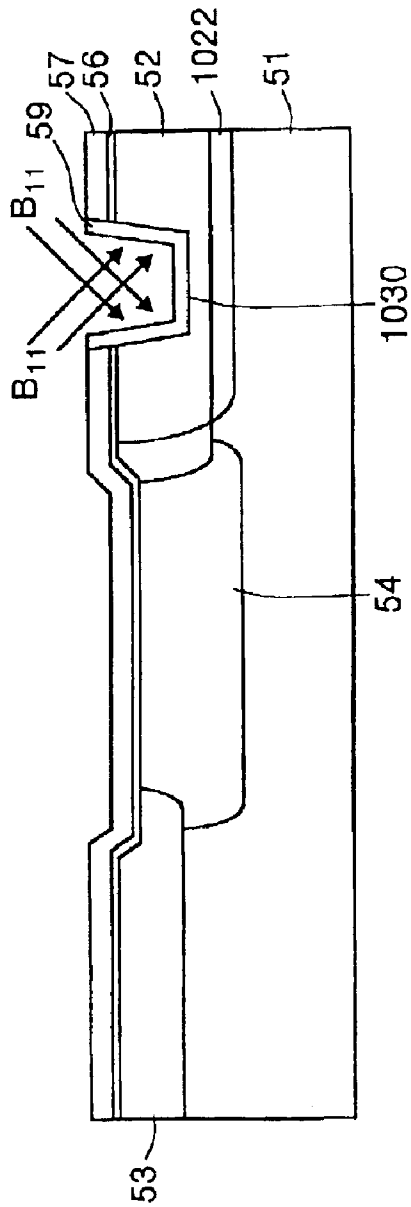
FIGS. 209–212 are vertical sectional views showing intermediate states of manufacture of the embodiment of the semiconductor device shown in FIG. 208.

FIG. 208 is a vertical sectional view showing the configuration of a semiconductor device according to a fifteenth embodiment of the invention. As shown in FIG. 208, the semiconductor device according to the fifteenth embodiment is such that in the semiconductor device of FIG. 98 according to the sixth embodiment in which a TLPM 1107 is formed in the first p-well region 52 instead of the TLPM 1100. The TLPM 1107 is a p-type body region 1024 that is additionally provided under the bottom surface of the trench 1030 of the TLPM 1100, and p-type body regions 1061 and second n-type extended drain regions 1062 are additionally provided adjacent to the side surfaces of the trench 1030 of the TLPM 1100. The second n-type extended drain regions 1062 are formed in the respective p-type body regions 1061. The other part of the configuration is the same as in the sixth embodiment. Regions, electrodes, etc. having the same names in the sixth embodiment are given the same reference numerals as the latter and will not be described.

A manufacturing process of the semiconductor device shown in FIG. 208 will be described below. FIGS. 209–212 are vertical sectional views showing intermediate states of manufacture of the embodiment of the semiconductor device of FIG. 208. First, as shown in FIGS. 2, 3, 99, and 100, an n-well region 54, a first p-well region 52, a second p-well region 53, and an extended drain region 1022 are formed. Then, a trench 1030 is formed in the first p-well region 52. After a buffer oxide film 59 is formed on the surface of the trench 1030, a p-type impurity such as boron ($B_{11}$) is ion-implanted obliquely through the side surfaces of the trench 1030 (see FIG. 209).

Figure 210:
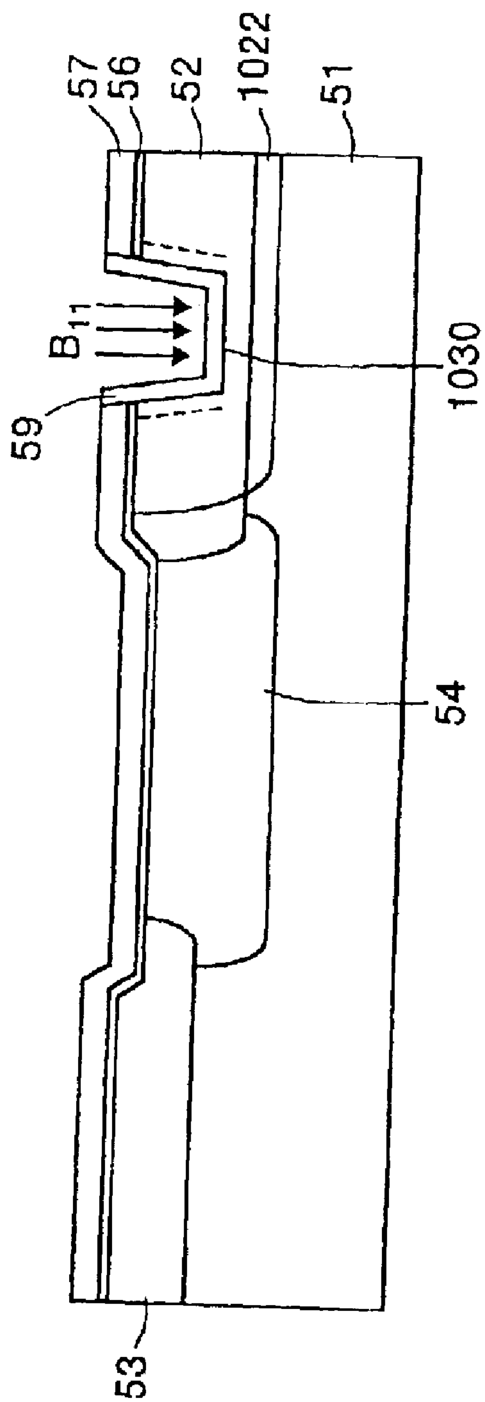
Figure 211:
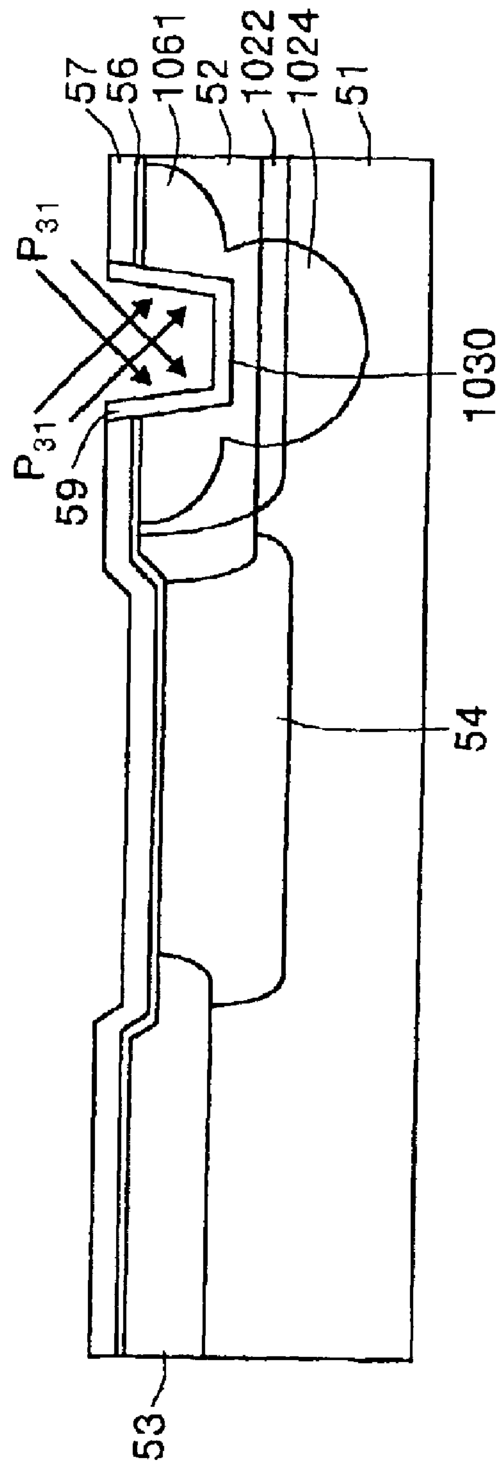
Figure 212:
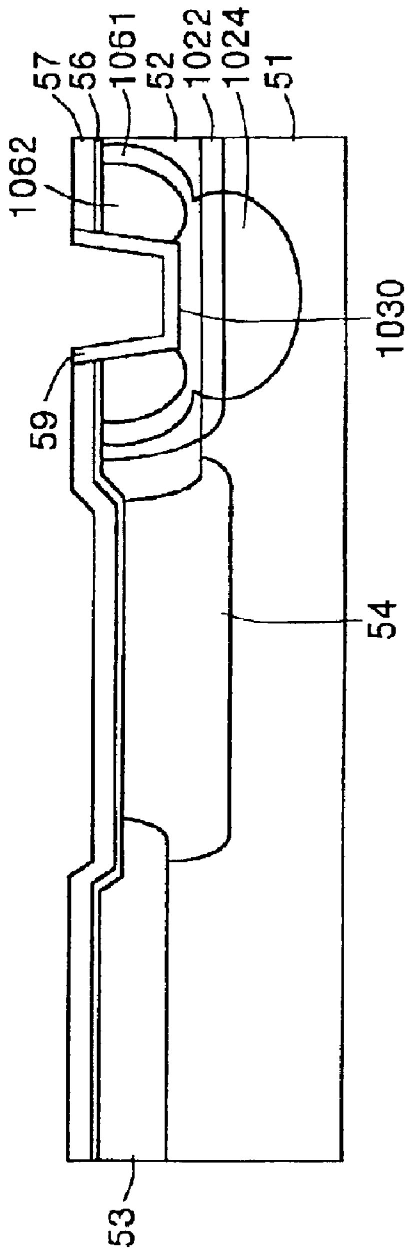

Subsequently, a p-type impurity such as boron ($B_{11}$) is ion-implanted through the bottom surface of the trench 1030 (see FIG. 210). The implanted impurity is diffused, whereby a body region 1024 is formed under the bottom surface of the trench 1030 and body regions 1061 are formed adjacent to the side surfaces of the trench 1030 (they are formed at the same time). Then, an n-type impurity such as phosphorus ($P_{31}$) is ion-implanted obliquely through the side surfaces of the trench 1030 (see FIG. 211). The implanted impurity is diffused to form second n-type extended drain regions 1062 adjacent to the side surfaces of the trench 1030 (see FIG. 212). The subsequent operations are the same as the operations of FIGS. 102–118.

Figure 213:
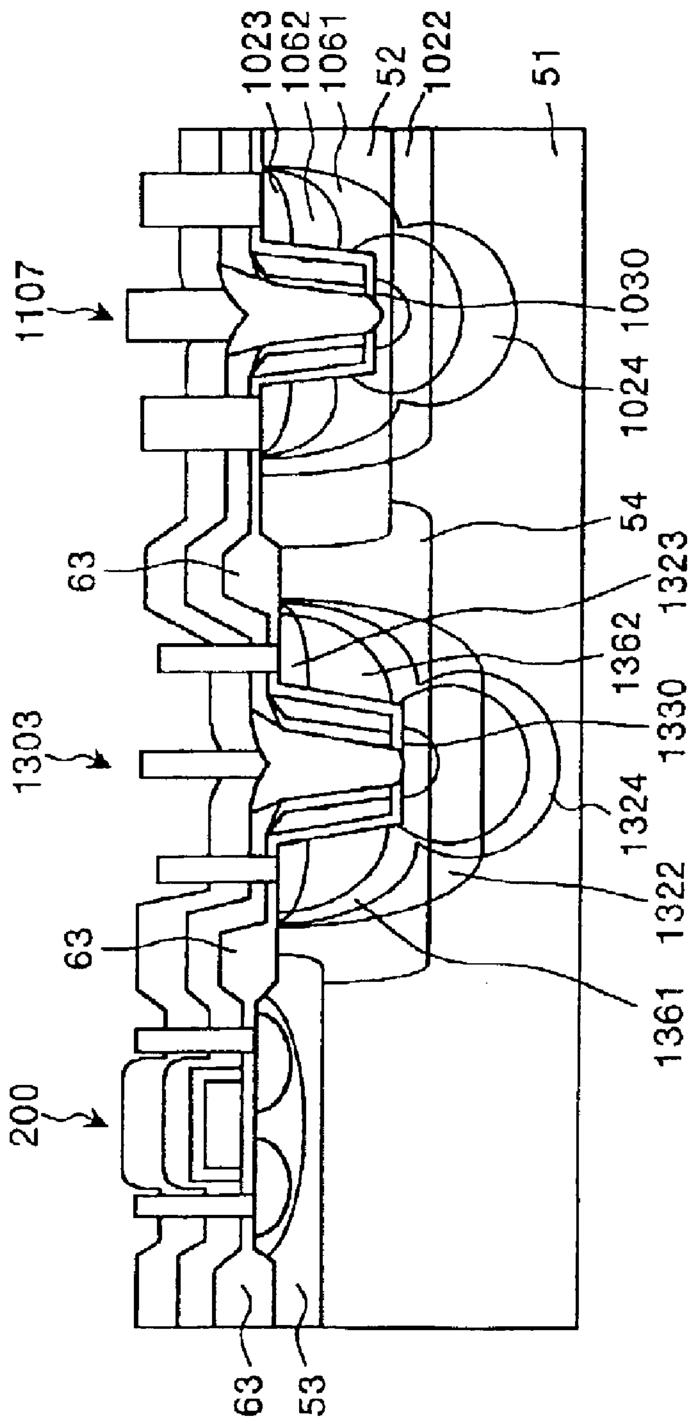
FIGS. 213 and 214 are vertical sectional views showing the configurations of other semiconductor devices according to the fifteenth embodiment of the invention.
Figure 214:
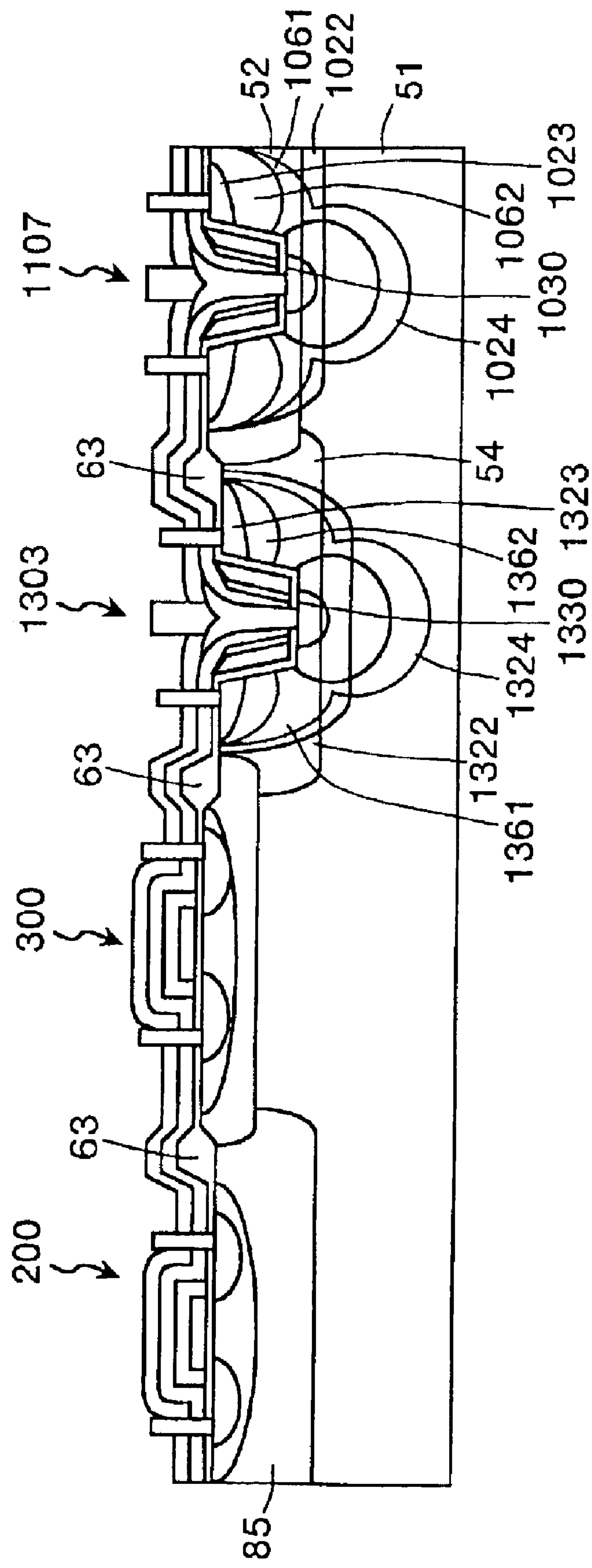

FIG. 213 shows the semiconductor device of FIG. 128 according to the seventh embodiment in which the first TLPM 1101 is replaced by the TLPM 1107, and the second TLPM 1300 is replaced by a TLPM 1303. The TLPM 1107 has a p-type body region 1024 additionally provided under the bottom surface of the trench 1030, and the p-type body regions 1061 and the second n-type extended drain regions 1062 are additionally provided adjacent to the side surfaces of the trench 1030. The TLPM 1303 has an n-type body region 1324 is additionally provided under the bottom surface of a trench 1330, and n-type body regions 1361 and second p-type extended drain regions 1362 are additionally provided adjacent to the side surfaces of the trench 1330. FIG. 214 shows a further semiconductor device in which the semiconductor device of FIG. 149 according to the eighth embodiment is modified in the similar manner.

In the second TLPM 1303, the n-type body regions 1324 and 1361 and the second p-type extended drain regions 1362 are formed in the same manner as the p-type body regions 1024 and 1061 and the second n-type extended drain regions 1062 of the first TLPM 1107 are formed except that the conductivity types of the impurities implanted are opposite.

The above-described fifteenth embodiment provides a one-chip power IC that is small in size and low in on-resistance and cost while preventing cost increase due to increase in the number of manufacturing operations. The fifteenth embodiment also provides the following advantages. Since the p-type body regions 1061 and the second n-type extended drain regions 1062 exist adjacent to the side surfaces of the trench 1030, the concentration of the n-type impurity can be made constant adjacent to the side surfaces of the trench 1030, and the on-resistance due to a concentration distribution can be decreased. Further, a high breakdown voltage can be obtained because charge balance is kept between the p-type body regions 1061 and the second n-type extended drain regions 1062 even if the n-type impurity is ion-implanted through the side surfaces of the trench 1030 at a relatively high concentration. The same advantages are obtained for the second TLPM 1303.

Figure 215:
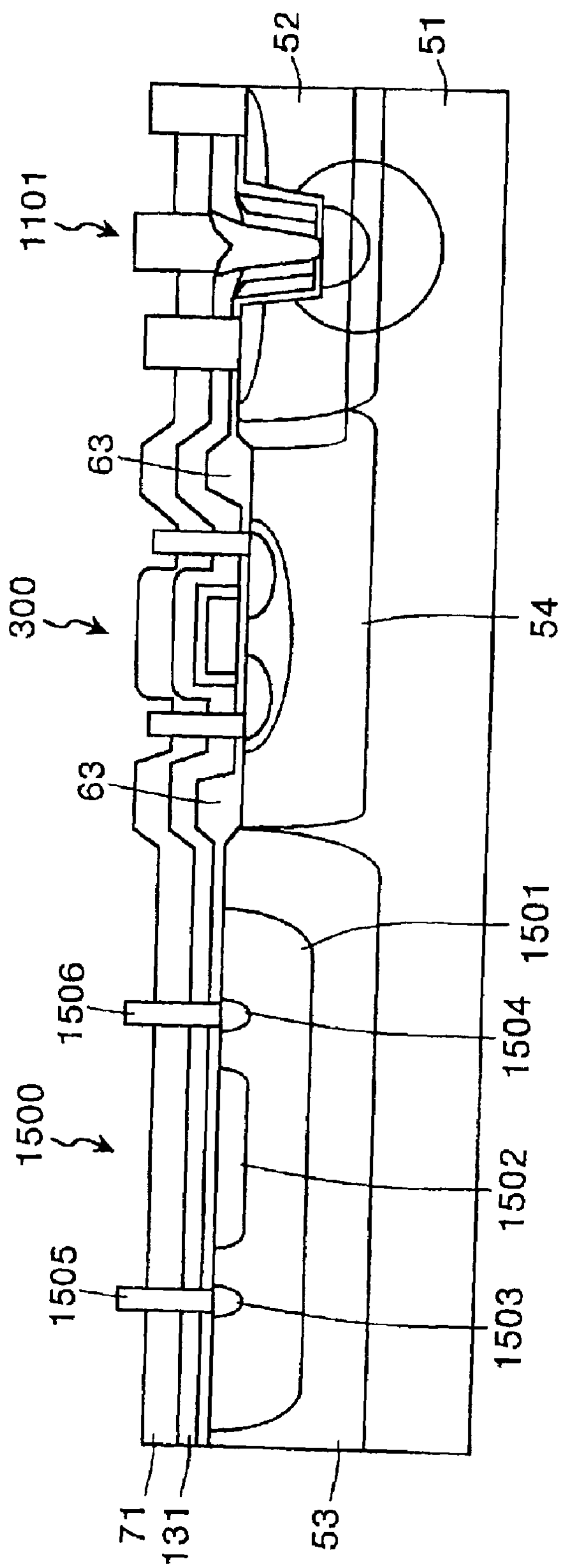
FIG. 215 is a vertical sectional view showing the configuration of a semiconductor device according to a sixteenth embodiment of the invention.
Figure 216:
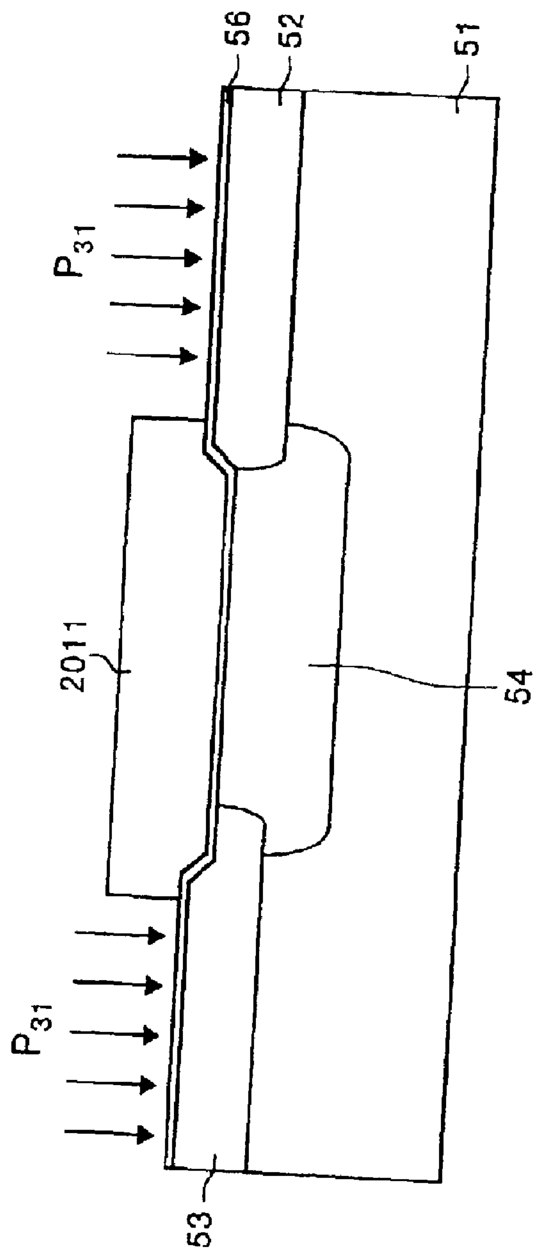
FIGS. 216–223 are vertical sectional views showing intermediate states of manufacture of the embodiment of the semiconductor device shown in FIG. 215.
Figure 217:
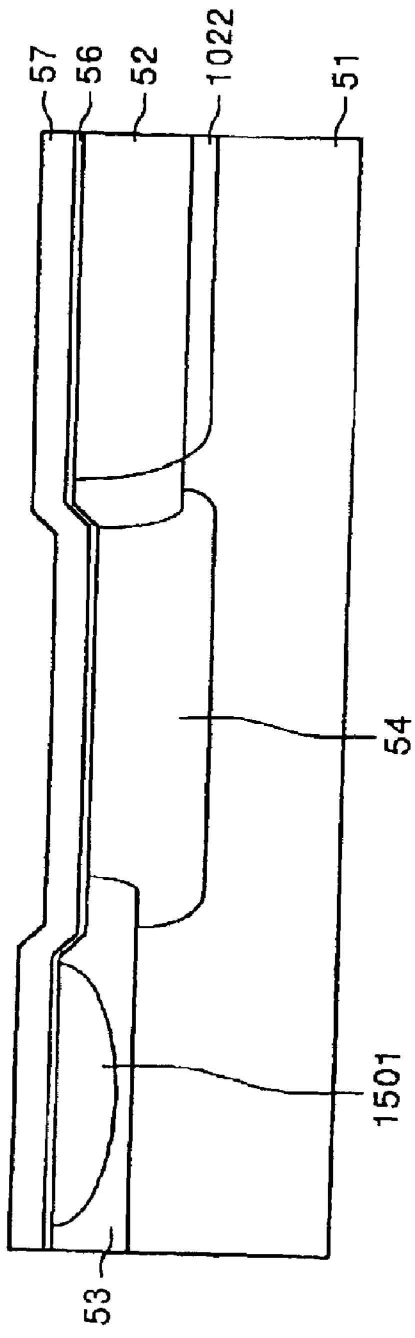
Figure 218:
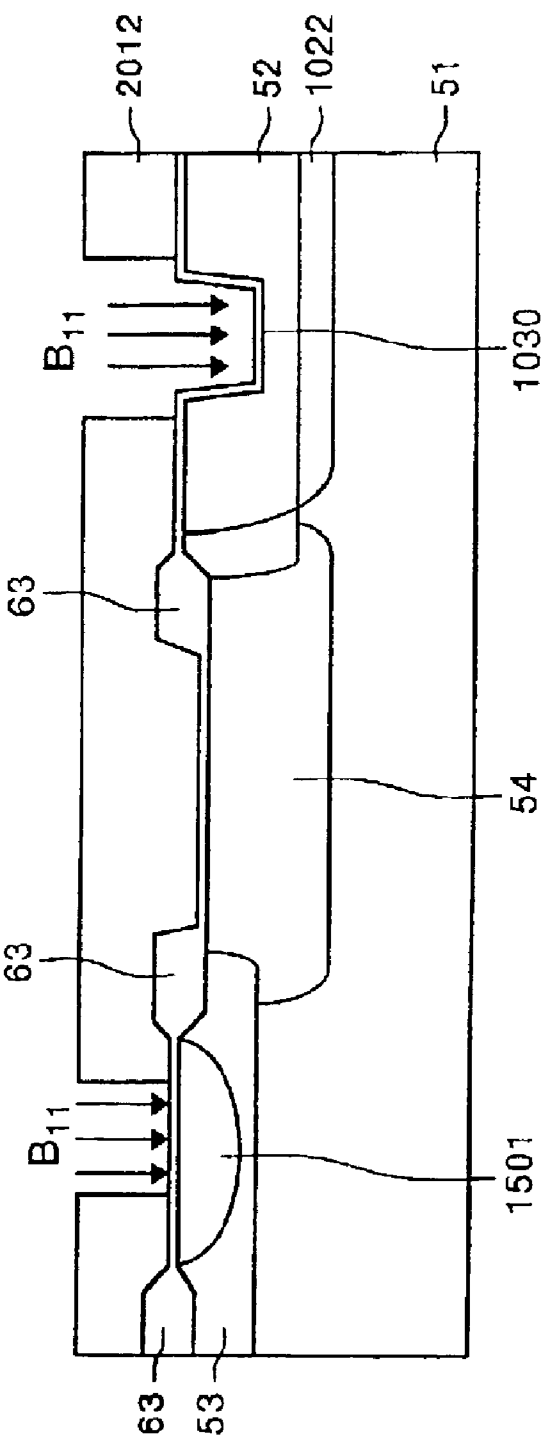
Figure 219:
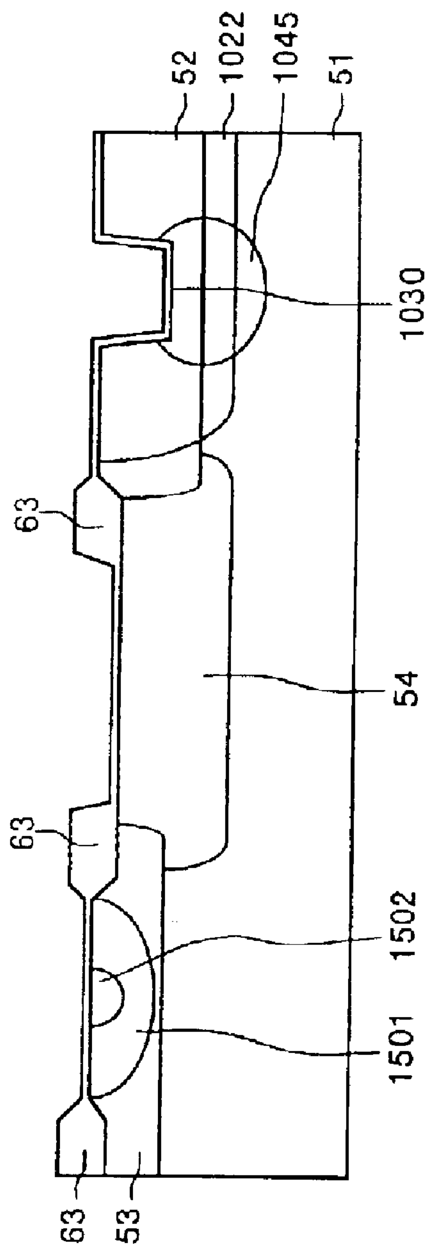
Figure 220:
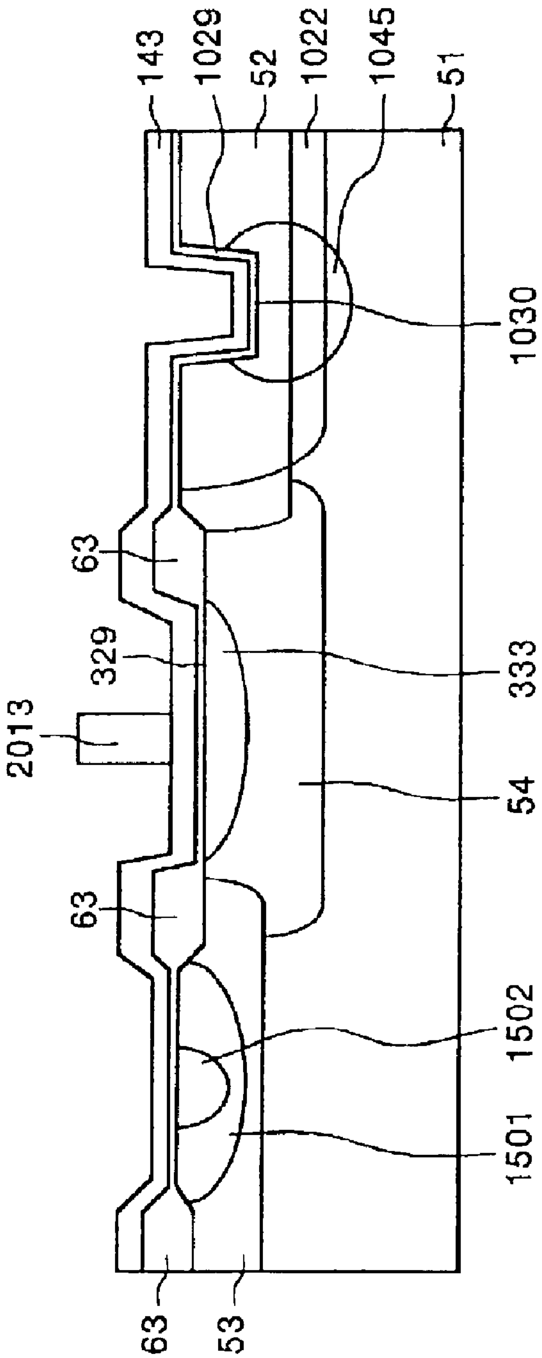
Figure 221:
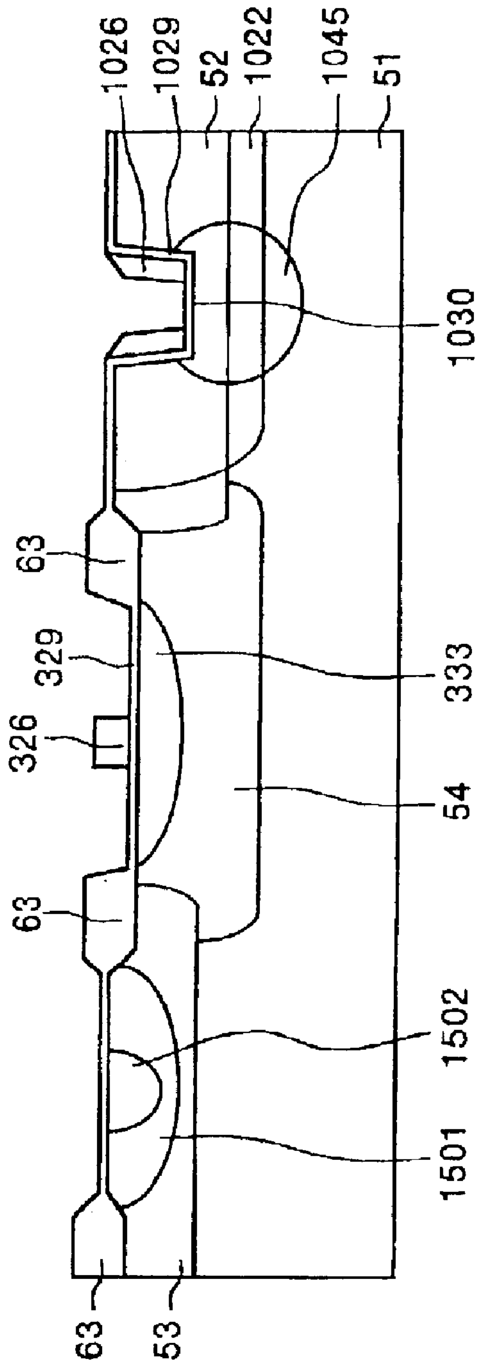
Figure 222:
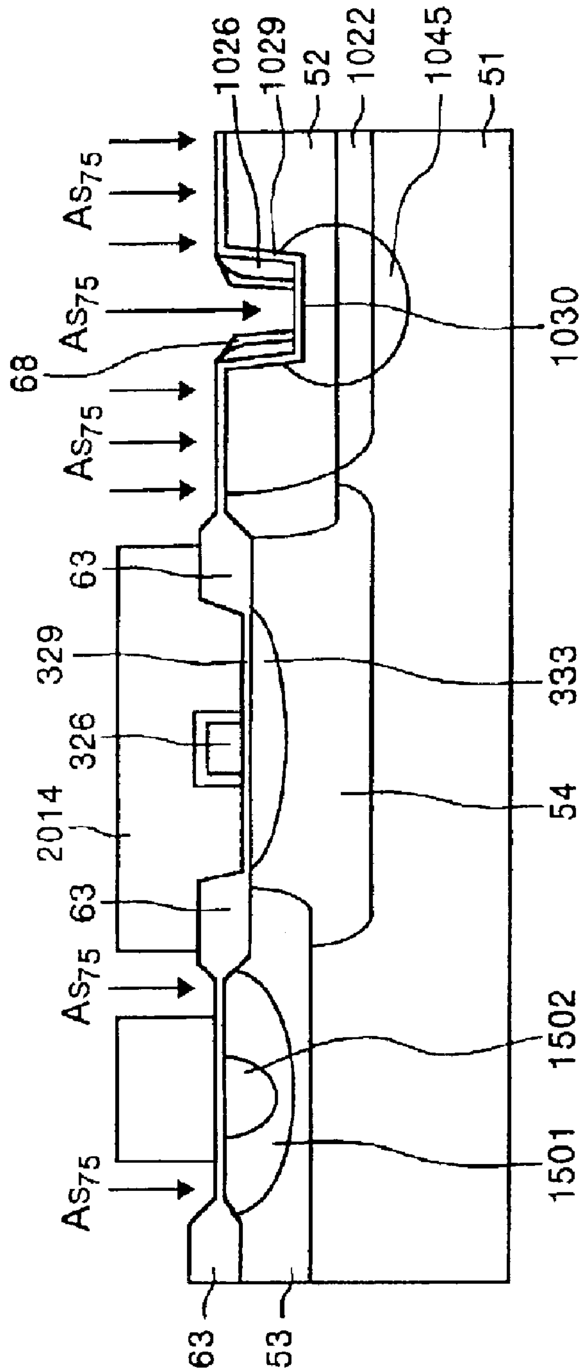
Figure 223:
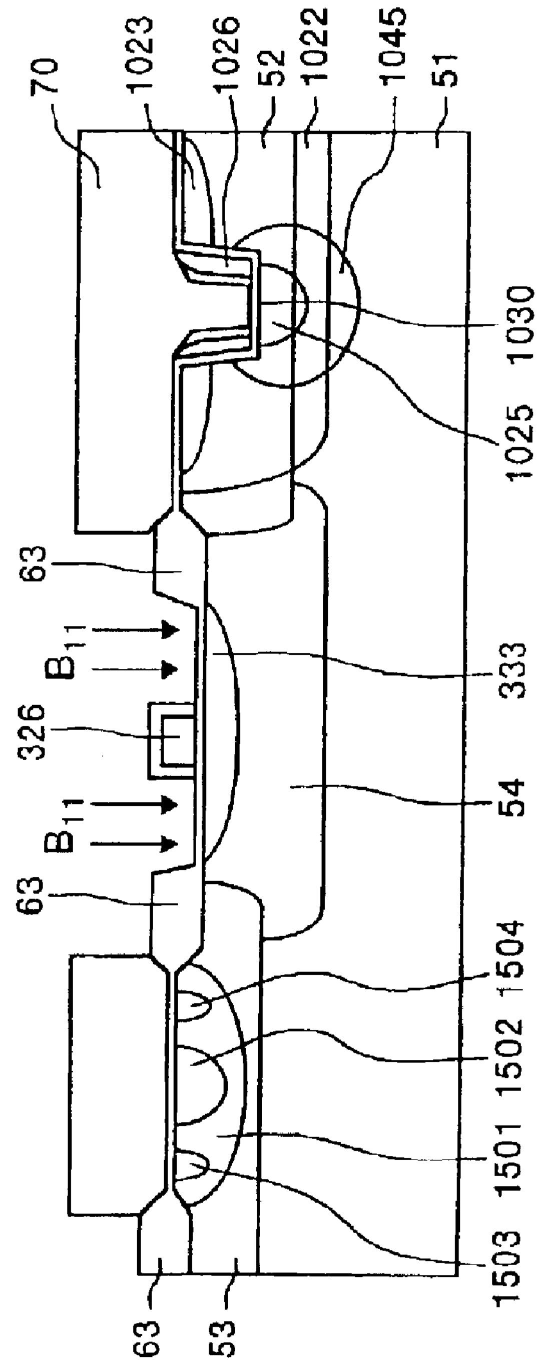

In a semiconductor device according to a sixteenth embodiment of the invention, a resistance element and a TLPM are integrated on the same semiconductor substrate. FIG. 215 is a vertical sectional view showing the configuration of the semiconductor device according to the sixteenth embodiment. As shown in FIG. 215, a TLPM (e.g., the TLPM 1101 of the seventh embodiment) is formed in a first p-well region 52. A PMOS 300 is formed in an n-well region 54 and a resistance element 1500 is formed in a second p-well region 53.

An n-well region 1501 is formed in the second p-well region 53. High-concentration n-type contact regions 1503 and 1504 are formed in the n-well region 1501 and are isolated from each other by a p-type offset region 1502. Electrodes 1505 and 1506 are in contact with the respective n-type contact regions 1503 and 1504.

A manufacturing process of the semiconductor device shown in FIG. 215 is described below. FIGS. 216–223 are vertical sectional views showing intermediate states of manufacture of the semiconductor device of FIG. 215. First, as shown in FIGS. 2 and 3, an n-well region 54, a first p-well region 52, and a second p-well region 53 are formed. After a buffer oxide film 56 is formed on the substrate surface, a mask 2011 having a prescribed pattern is formed and an n-type impurity such as phosphorus ($P_{31}$) is ion-implanted into the first p-well region 52 and the second p-well region 53 (see FIG. 216).

Alternatively, an n-type impurity such as phosphorus ($P_{31}$) may be ion-implanted separately into the first p-well region 52 and the second p-well region 53 by using two masks. In this case, by properly setting the concentrations of the n-well region 54 and the n-well region 1501 in the second p-well region 53, it is possible to make the n-well region 54 and the n-well region 1501 hard to join together and thereby prevent interaction between the PMOS 300 and the resistance element 1500.

Subsequently, the implanted impurity is diffused, whereby an extended drain region 1022 in formed in the first p-well region 52 and an n-well region 1501 is formed in the second p-well region 53. After the mask 2011 is removed, a mask oxide film 57 is formed on the buffer oxide film 56 (see FIG. 217). A trench 1030 is formed in the first p-well region 52 by patterning the mask oxide film 57, and selective oxidation films 63 for device isolation are formed.

Then, a mask 2012 having openings over the trench 1030 and a future offset region of the intended resistance element is formed. A p-type impurity such as boron ($B_{11}$) is ion-implanted (see FIG. 218) and diffused, whereby a base region 1045 is formed under the bottom surface of the trench 1030 in the first p-well region 52 and, at the same time, an offset region 1502 is formed in the n-well region 1501 of the second p-well region 53. The mask 2012 is removed thereafter (see FIG. 219).

Subsequently, a channel region 333 of the intended PMOS and gate oxide films 1029 and 329 are formed and a polysilicon layer 143 is laid. A mask 2013 is formed only on a portion of the polysilicon layer 143 that is to become a gate electrode of the intended PMOS (see FIG. 220). A gate electrode 326 of the intended PMOS and gate electrodes 1026 of the intended TLPM are formed by anisotropic etching (RIE or the like). The mask 2013 is removed thereafter (see FIG. 221). Then, shadow oxide films 68 are formed. After a mask 2014 having openings in areas corresponding to a future source region and drain regions of the intended TLPM and future n-type contact regions of the intended resistance element is formed, an n-type impurity such as arsenic ($As_{75}$) is ion-implanted (see FIG. 222).

The implanted impurity is diffused, whereby a source region 1025 of the intended TLPM is formed under the bottom surface of the trench 1030, drain regions 1023 of the intended TLPM are formed on both sides of the trench 1030, and n-type contact regions 1503 and 1504 of the intended resistance element are formed. After the mask 2014 is removed, a p-type impurity such as boron ($B_{11}$) is ion-implanted by using a mask 70 having an opening in a PMOS forming area (see FIG. 223).

A source region and a drain region of the intended PMOS are formed by diffusion of the implanted impurity. Then, an interlayer insulating film 131 is laid, a contact hole is formed through it to reach the bottom surface of the trench 1030, and the inside of the trench 1030 is filled with a source polysilicon layer. Then, a passivation film 71 is formed and contact holes are formed. Finally, source electrodes and drain electrodes are formed and electrodes 1505 and 1506 that are in contact with the respective n-type contact regions 1503 and 1504 of the resistance element 1500 are formed. The operations of FIG. 222 and FIG. 223 may be reversed.

According to the sixteenth embodiment, the resistance element 1500 and the TLPM 1101 can be integrated on the same semiconductor substrate. Therefore, TLPMs can be incorporated into analog ICs in general by integrating such resistance elements and TLPMs and bipolar transistors, capacitance elements, etc. on the same semiconductor substrate. Thus, the sixteenth embodiment can provide an analog IC having lower power consumption than a conventional analog IC using planar power MOSFETs.

Figure 224:
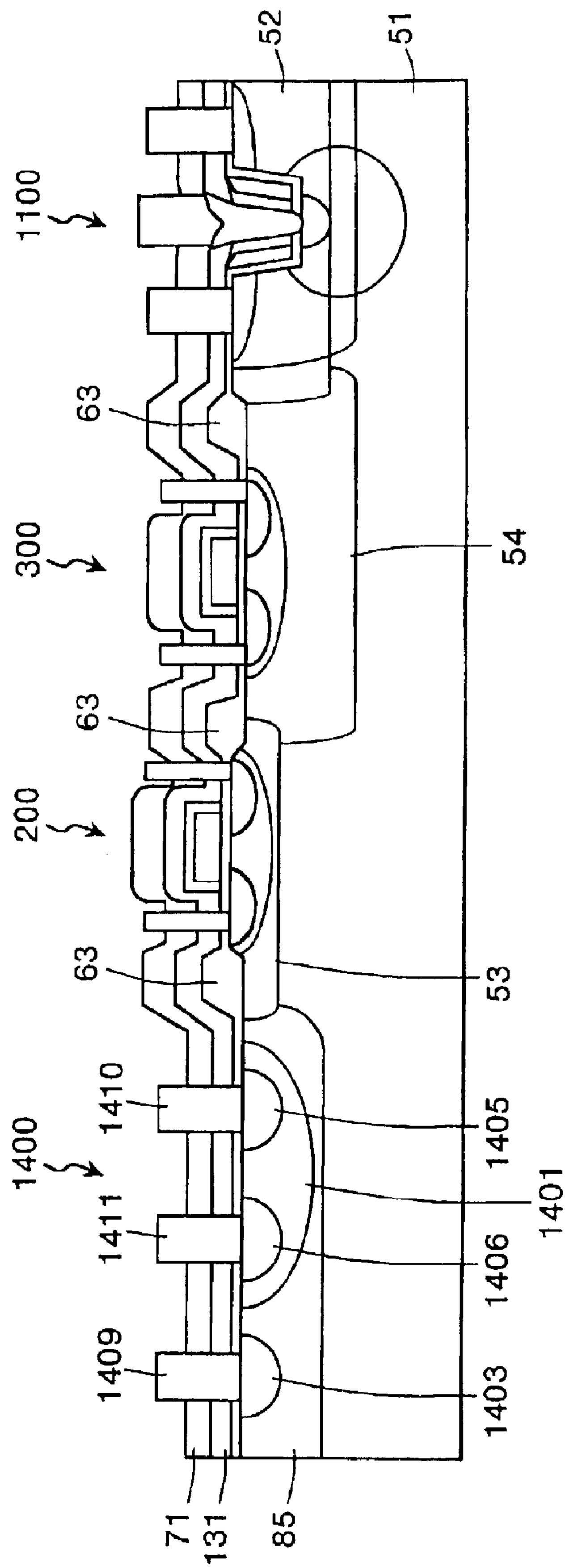
FIG. 224 is a vertical sectional view showing the configuration of a semiconductor device according to a seventeenth embodiment of the invention.
Figure 225:
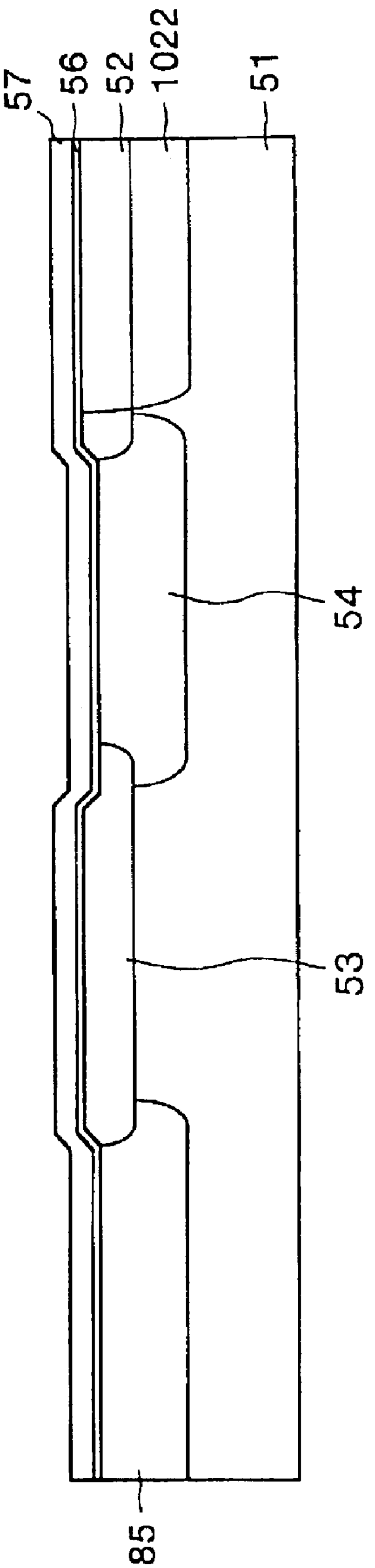
FIGS. 225–237 are vertical sectional views showing intermediate states of manufacture of the embodiment of the semiconductor device shown in FIG. 224.
Figure 226:
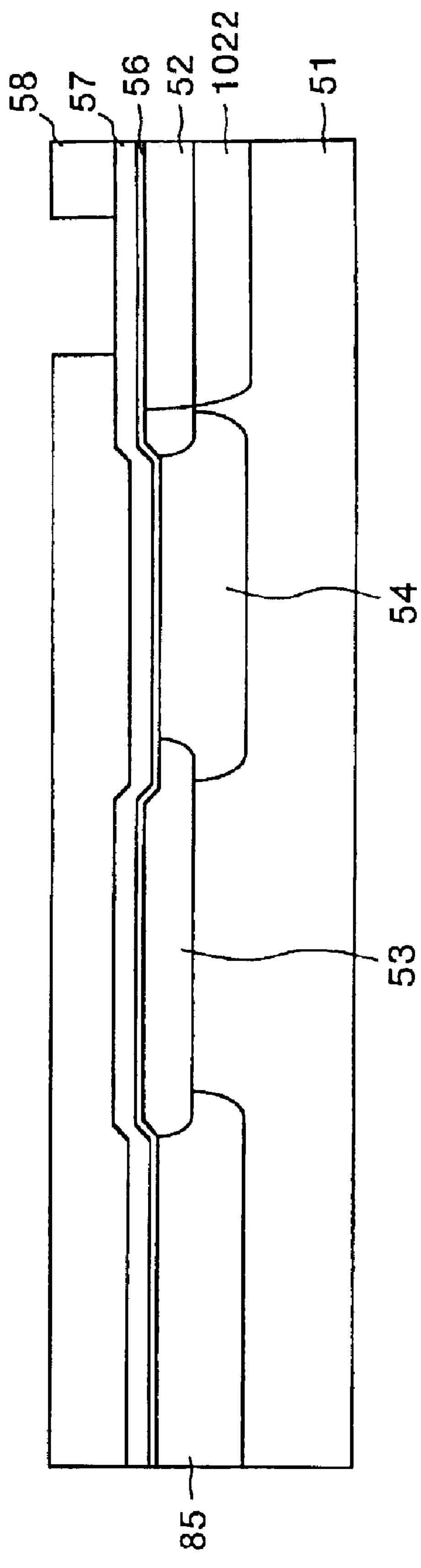
Figure 227:
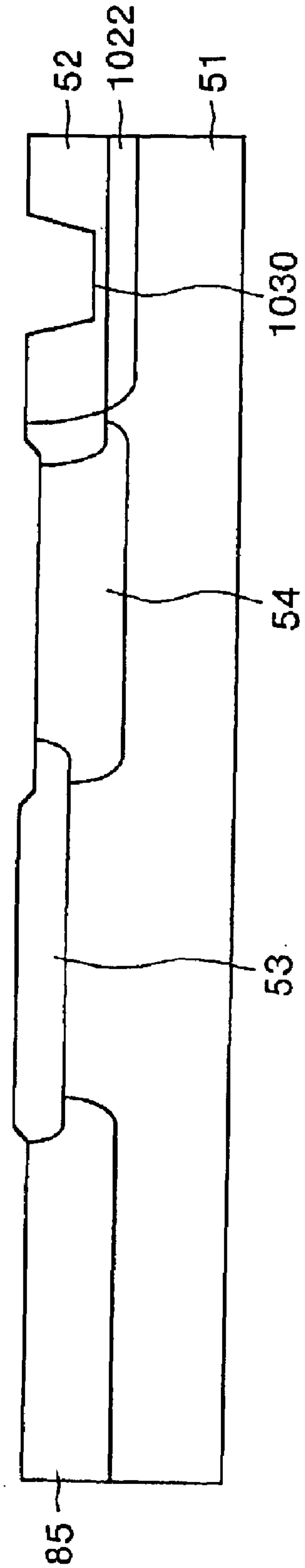
Figure 228:
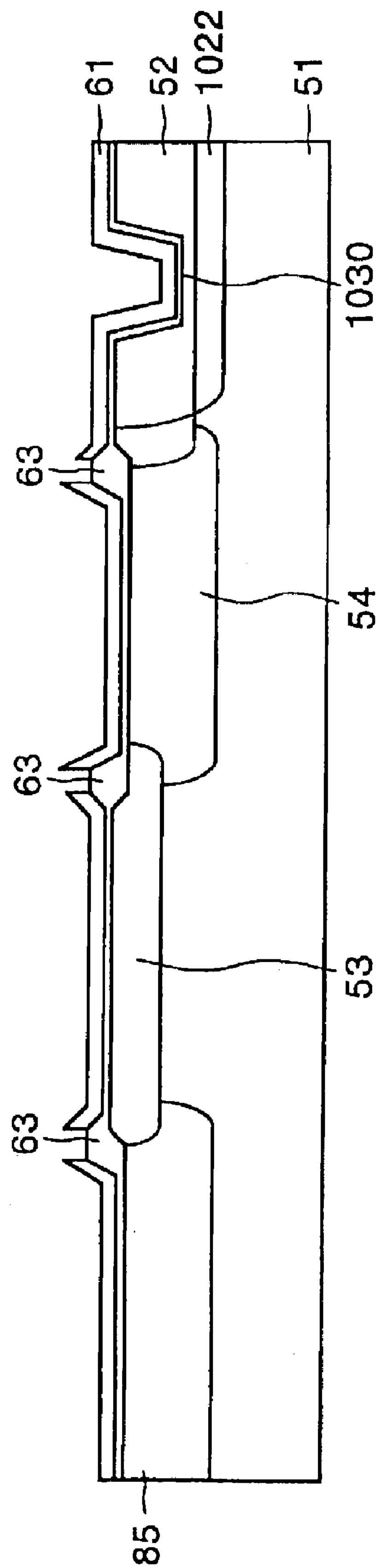
Figure 229:
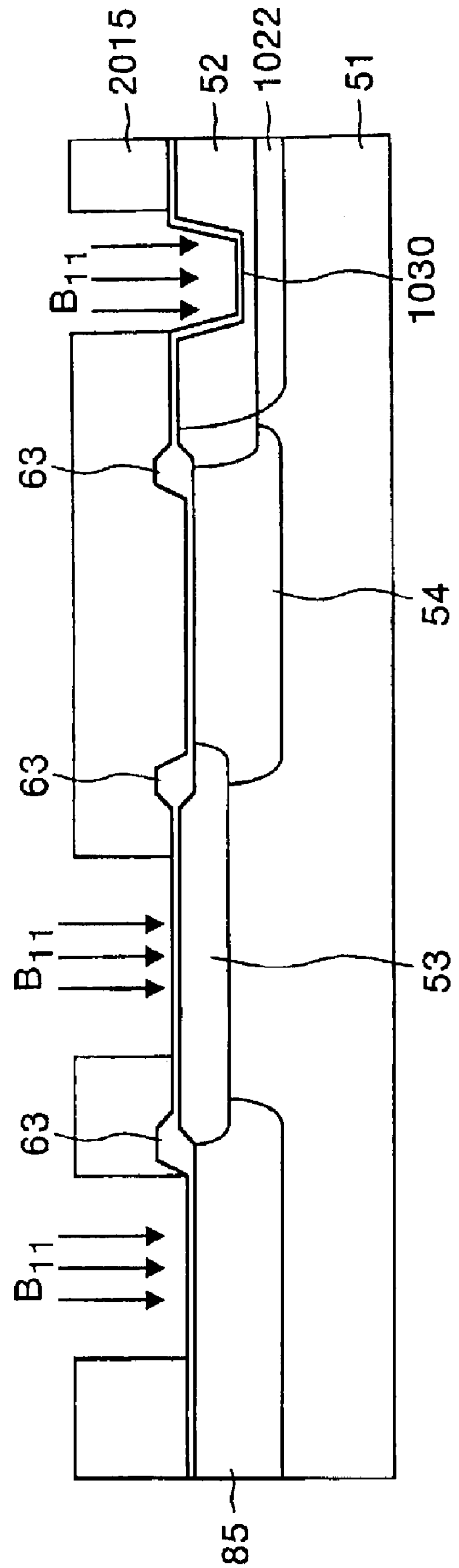
Figure 230:
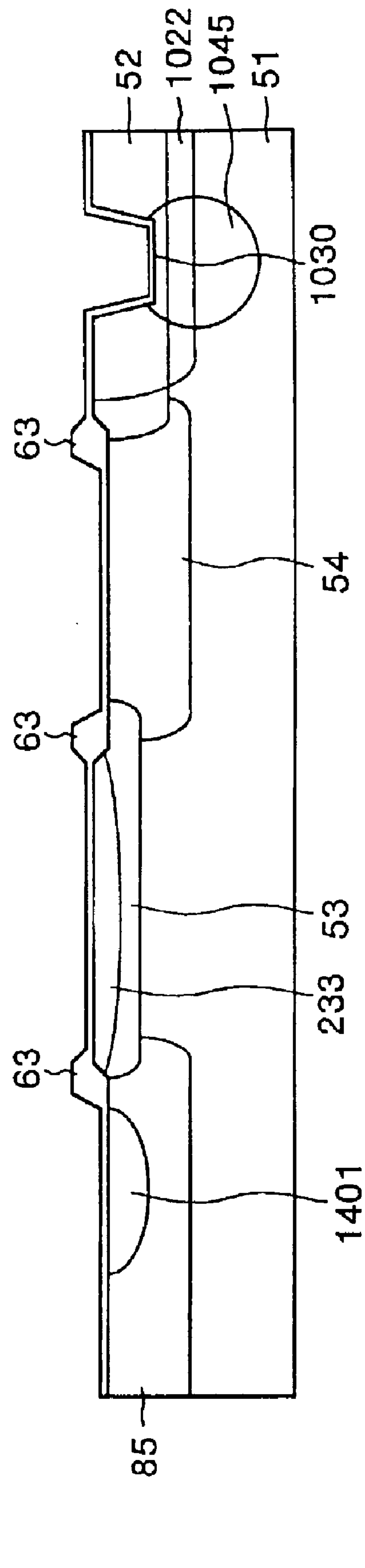

A semiconductor device according to a seventeenth embodiment of the invention integrates a bipolar transistor and a TLPM on the same semiconductor substrate. FIG. 224 is a vertical sectional view showing the configuration of the semiconductor device according to the seventeenth embodiment. As shown in FIG. 224, a TLPM (e.g., the TLPM 1100 of the sixth embodiment), a PMOS 300, an NMOS 200, and a bipolar transistor 1400 are formed in a first p-well region 52, a first n-well region 54, a second p-well region 53, and a second n-well region 85, respectively.

A p-type offset region 1401 and an n-type collector region 1403 are formed in the second n-well region 85. A p-type base region 1405 and an n-type emitter region 1406 are formed in the p-type offset region 1401. A collector electrode 1409, a base electrode 1410, and an emitter electrode 1411 are in contact with the collector region 1403, the base region 1405, and the emitter region 1406, respectively.

Figure 150:
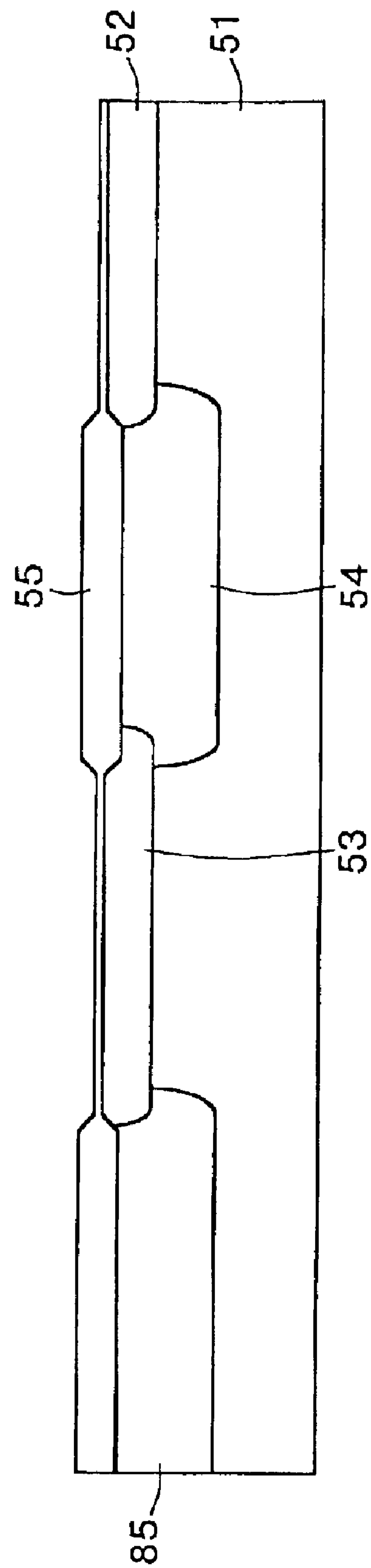
FIGS. 150–173 are vertical sectional views showing intermediate states of manufacture of the embodiment of the semiconductor device shown in FIG. 149.
Figure 151:
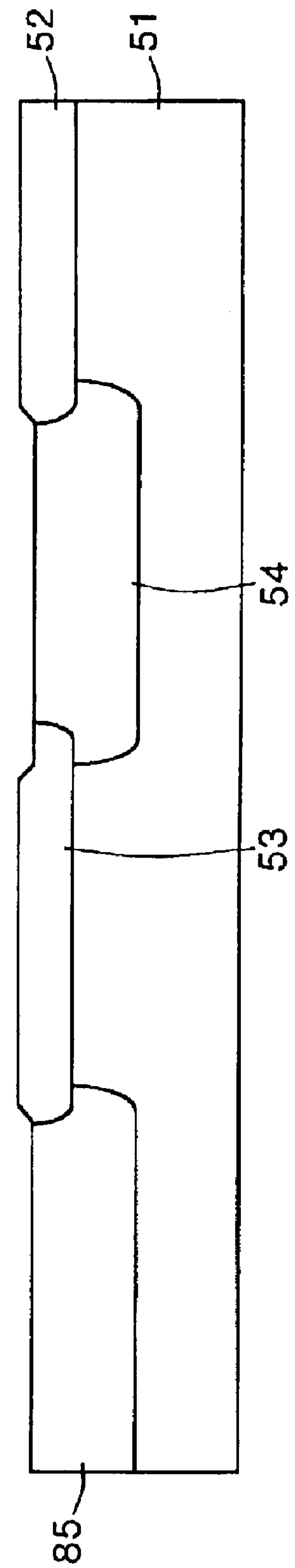
Figure 152:
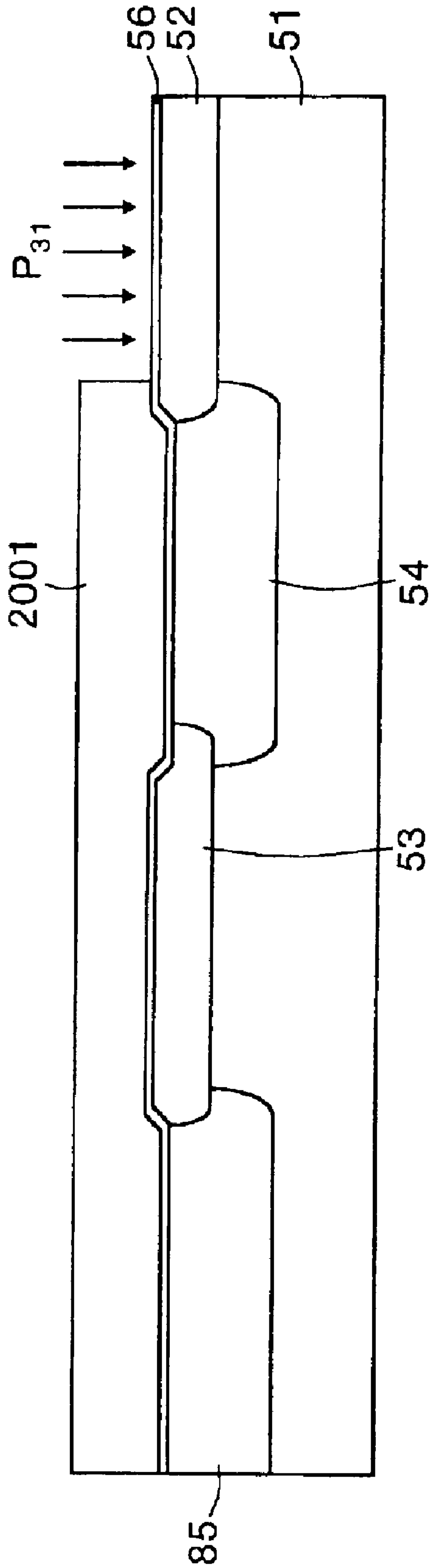
Figure 153:
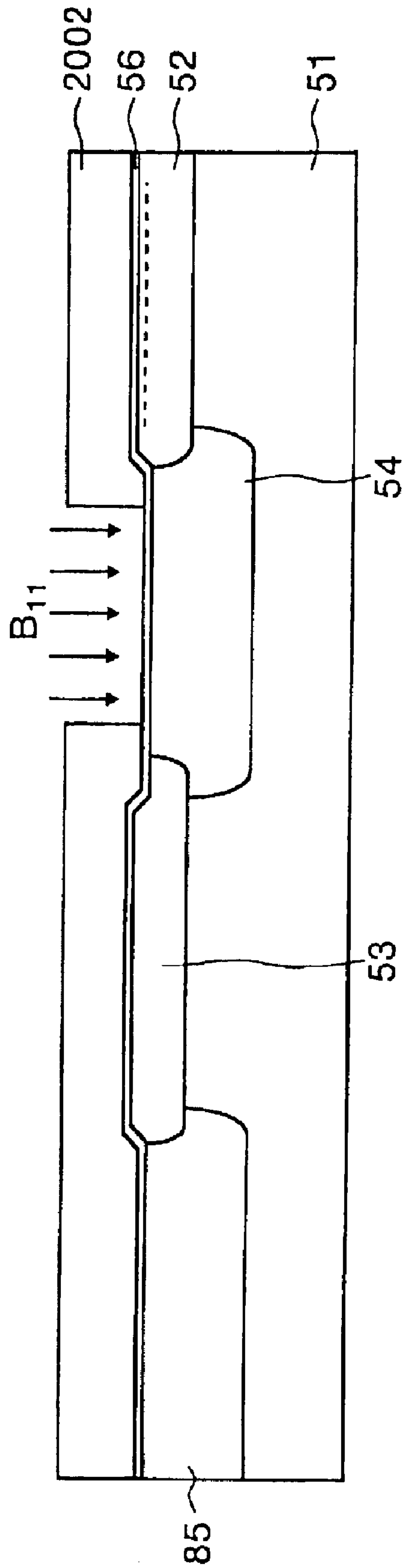
Figure 154:
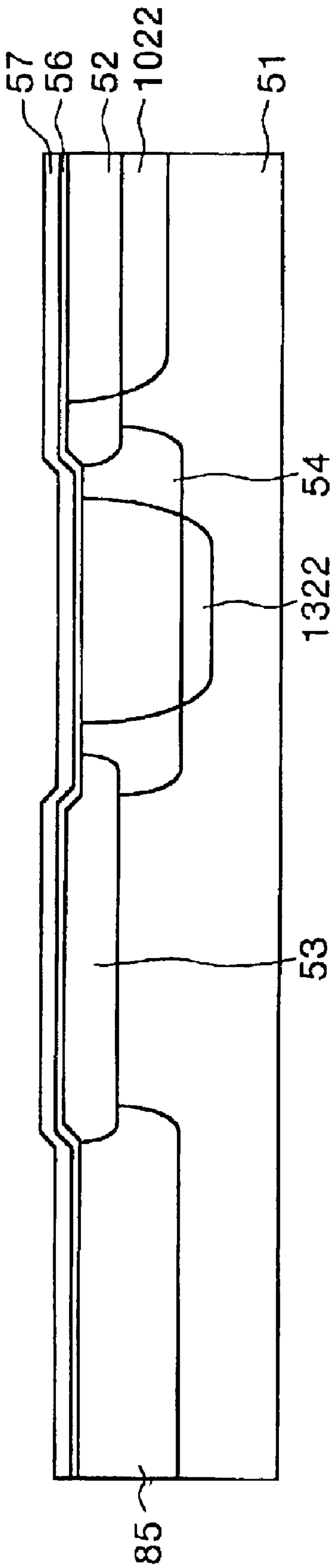

A manufacturing process of the semiconductor device shown in FIG. 224 will be described below. FIGS. 225–237 are vertical sectional views showing intermediate states of manufacture of the semiconductor device of FIG. 224. First, as shown in FIGS. 150–152, a first p-well region 52, a second p-well region 53, a first n-well region 54, and a second n-well region 85 are formed, a buffer oxide film 56 is formed, and an n-type impurity such as phosphorus ($P_{31}$) is ion-implanted into the first p-well region 52.

The implanted impurity is diffused to form an extended drain region 1022 in the first p-well region 52. Then, a mask oxide film 57 is laid on the buffer oxide film 56 (see FIG. 225) and a mask 58 having an opening in a trench forming area is formed (see FIG. 226). The mask oxide film 57 is patterned by using the mask 58 to form a trench 1030 in the first p-well region 52. All the oxide films on the substrate surface including the mask oxide film 57 are removed thereafter (see FIG. 227). Then, selective oxidation films 63 for device isolation are formed by using a patterned silicon nitride film 61 (see FIG. 228).

After the silicon nitride film 61 is removed and sacrificial oxidation is performed, a mask 2015 having openings over the trench 1030, a future channel region of the intended NMOS, and a future offset region of the intended bipolar transistor. A p-type impurity such as boron ($B_{11}$) is ion-implanted by using the mask 2015 (see FIG. 229). The implanted impurity is diffused, whereby a p-type base region 1045 is formed under the bottom surface of the trench 1030, a channel region 233 of the intended NMOS is formed in the second p-well region 53, and a p-type offset region 1401 is formed. The mask 2015 is removed thereafter (see FIG. 230).

Figure 231:
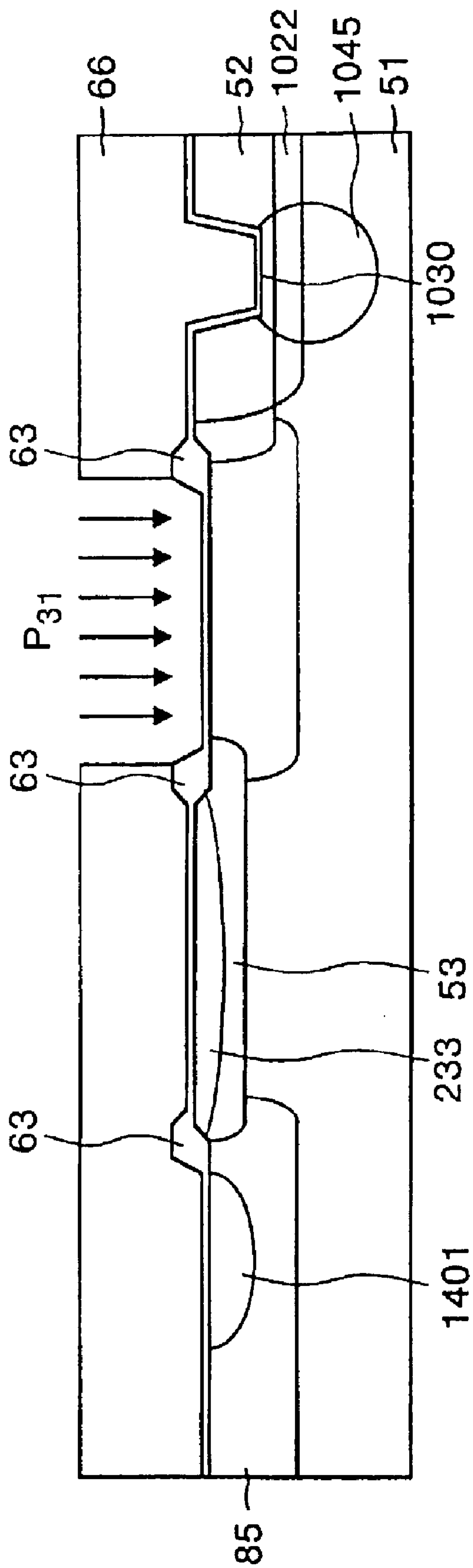
Figure 232:
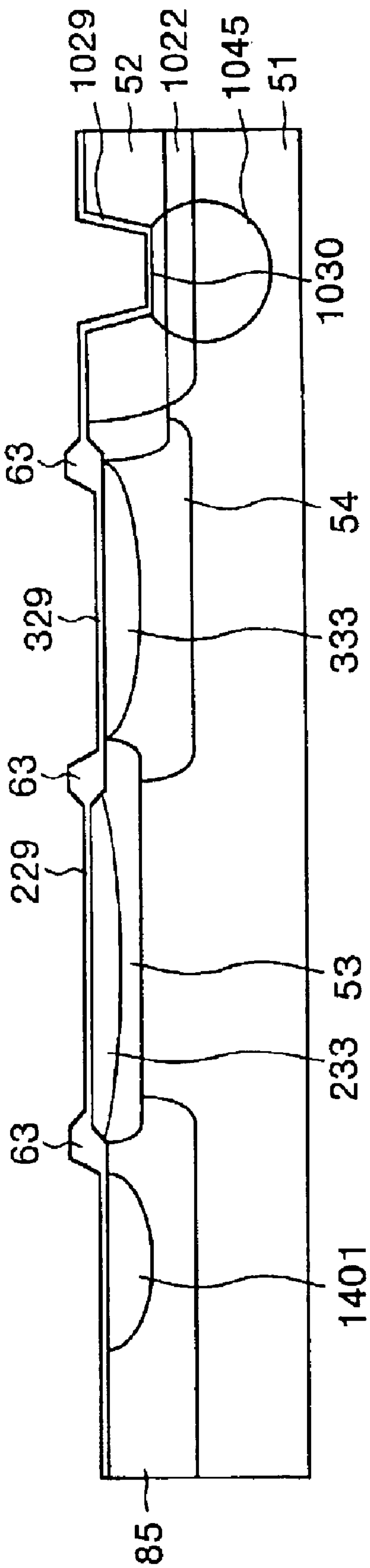
Figure 233:
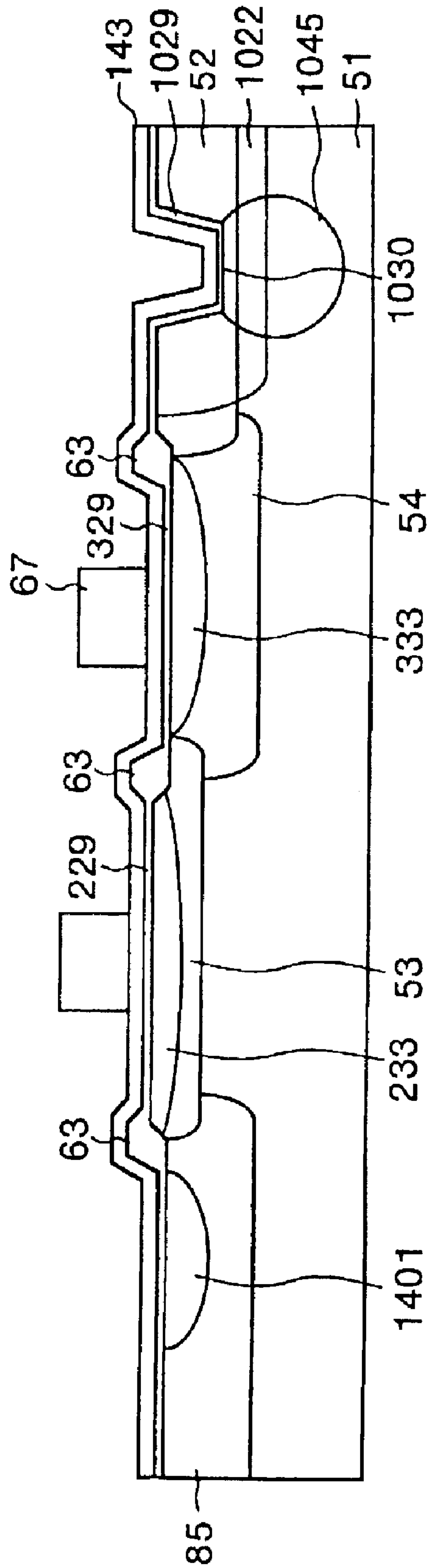
Figure 234:
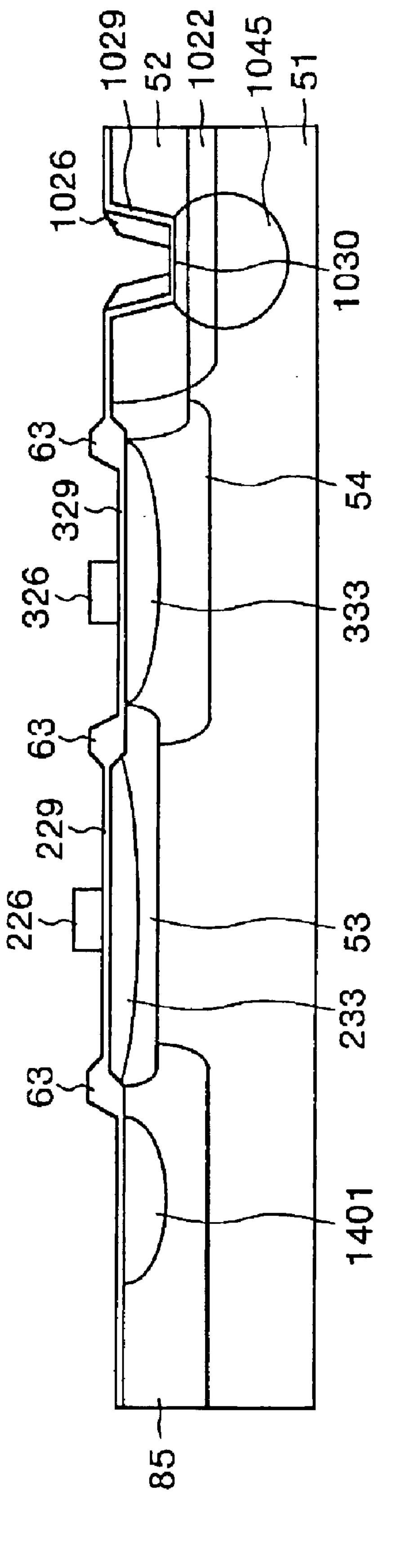
Figure 235:
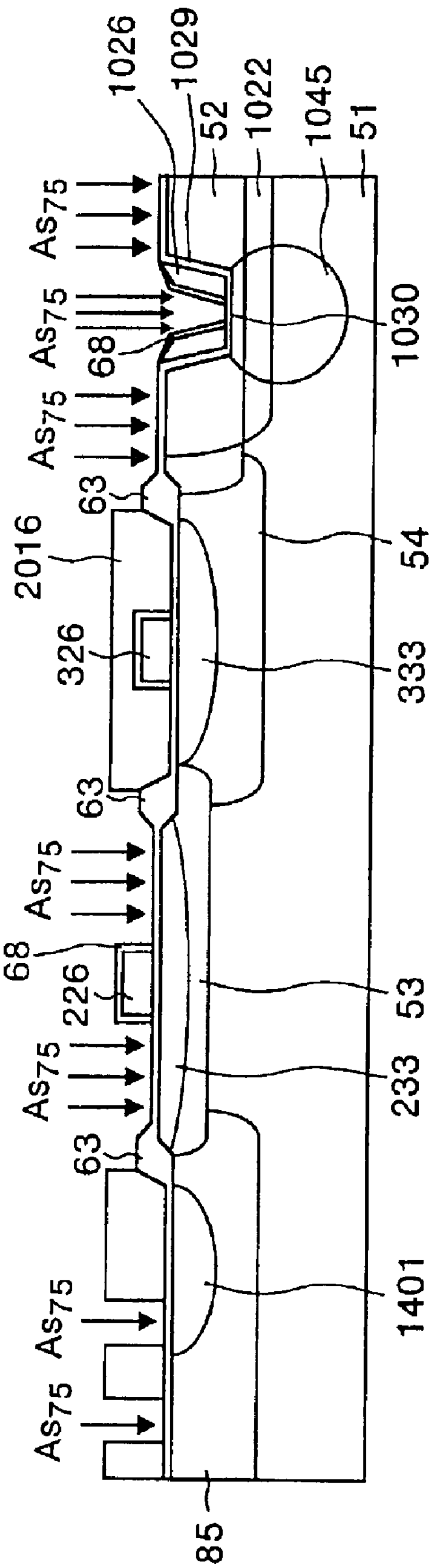
Figure 236:
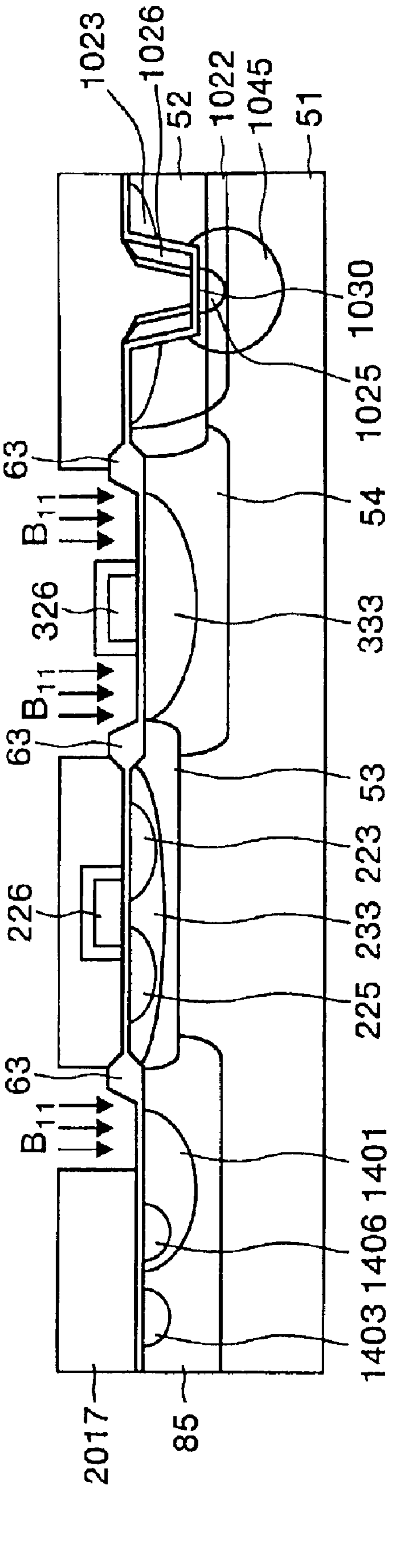
Figure 237:
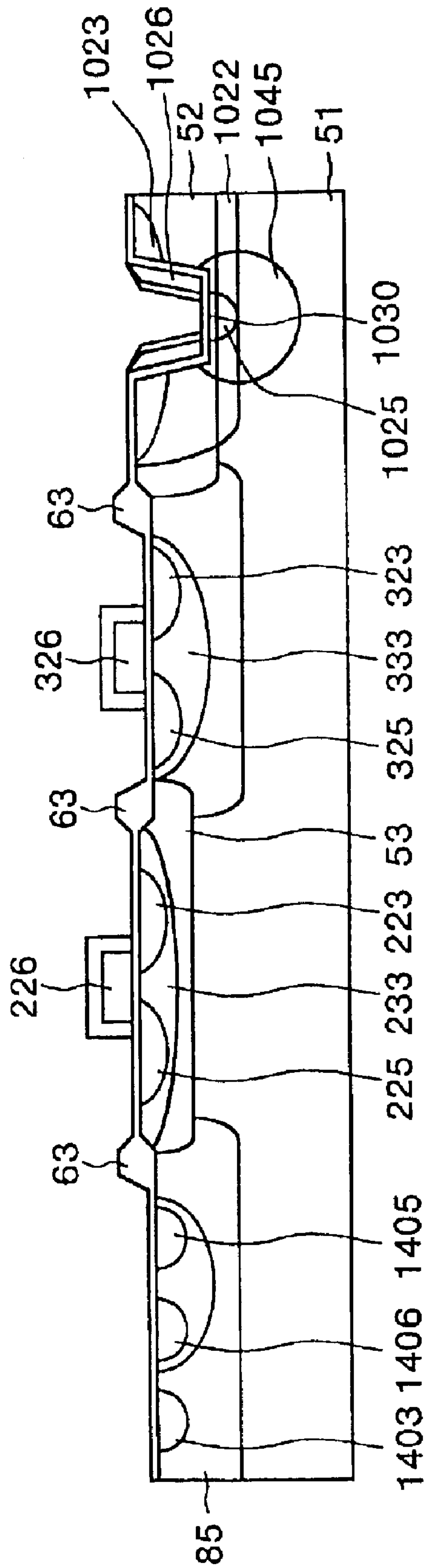

Subsequently, an n-type impurity such as phosphorus ($P_{31}$) is ion-implanted by using a mask 66 having an opening in an area corresponding to a future channel region of the intended PMOS (see FIG. 231). The implanted impurity is diffused to form a channel region 333 of the intended PMOS in the first n-well region 54. After the mask 66 and the thin oxide film on the substrate surface and the surface of the trench 1030 are removed, gate oxide films 1029, 229, and 329 are formed (see FIG. 232). Then, a polysilicon layer 143 is laid and a mask 67 is formed on the polysilicon layer 143 only in areas corresponding to future gate electrodes of the intended NMOS and PMOS (see FIG. 233). The operations of FIG. 229 and the operations of FIG. 231 may be reversed in order.

Subsequently, anisotropic etching (RIE or the like) is performed, whereby a gate electrode 226 of the intended NMOS, a gate electrode 326 of the intended PMOS, and gate electrodes 1026 of the intended TLPM are formed. The mask 67 is removed thereafter (see FIG. 234). Then, shadow oxide films 68 are formed, and a mask 2016 having openings in an area corresponding to a future source region and drain regions of the intended TLPM, an NMOS forming area, and areas corresponding to a future n-type collector region and n-type emitter region of the intended bipolar transistor is formed. Then, an n-type impurity such as arsenic ($As_{75}$) is ion-implanted (see FIG. 235).

The implanted impurity is diffused, whereby a source region 1025 of the intended TLPM is formed under the bottom surface of the trench 1030, drain regions 1023 of the intended TLPM are formed on both sides of the trench 1030, a source region 225 and a drain region 223 of the intended NMOS are formed in the channel region 233, and an n-type collector region 1403 and an n-type emitter region 1406 of the intended bipolar transistor are formed. After the mask 2016 is removed, a p-type impurity such as boron ($B_{11}$) is ion-implanted by using a mask 2017 having openings in a PMOS forming area and an area corresponding to a future p-type base region of the intended bipolar transistor (see FIG. 236).

The implanted impurity is diffused, whereby a source region 325 and a drain region 323 of the intended PMOS and a p-type base region 1405 of the intended bipolar transistor are formed. The mask 2017 is removed thereafter (see FIG. 237). Then, an interlayer insulating film 131 is laid, a contact hole is formed through it so as to reach the bottom surface of the trench 1030, and the inside of the trench 1030 is filled with a source polysilicon layer. Then, a passivation film 71 is formed and contact holes are formed. Finally, source electrodes and drain electrodes are formed and a collector electrode 1409, a base electrode 1410, and an emitter electrode 1411 of the bipolar transistor 1400 are formed. The operations of FIG. 235 and FIG. 236 may be reversed.

According to the seventeenth embodiment, the bipolar transistor 1400 and the TLPM 1100 can be integrated on the same semiconductor substrate. Therefore, TLPMs can be incorporated into analog ICs in general by integrating such bipolar transistors and TLPMs and resistance elements, capacitance elements, etc. on the same semiconductor substrate. As such, the seventeenth embodiment can provide an analog IC having lower power consumption than a conventional analog IC using planar power MOSFETs.

Figure 238:
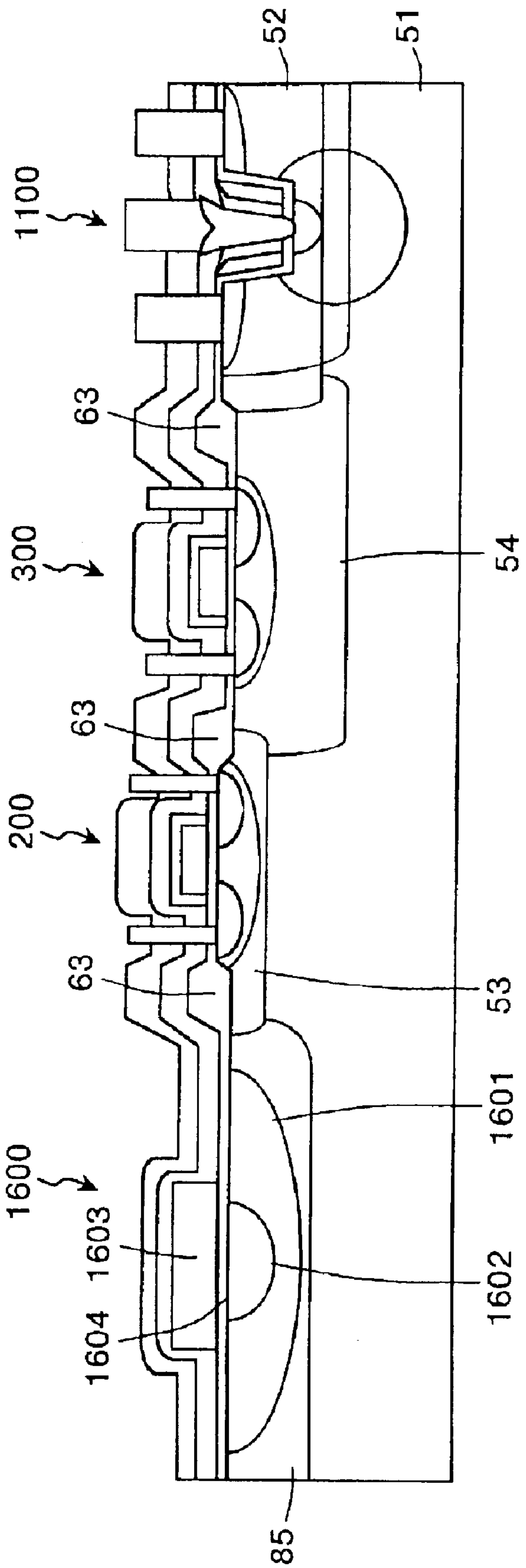
FIG. 238 is a vertical sectional view showing the configuration of a semiconductor device according to an eighteenth embodiment of the invention.

In a semiconductor device according to an eighteenth embodiment of the invention, a capacitance element and a TLPM are integrated on the same semiconductor substrate. FIG. 238 is a vertical sectional view showing the configuration of the semiconductor device according to the eighteenth embodiment. As shown in FIG. 238, a TLPM (e.g., the TLPM 1100 of the sixth embodiment), a PMOS 300, an NMOS 200, and a capacitance element 1600 are formed in a first p-well region 52, a first n-well region 54, a second p-well region 53, and a second n-well region 85, respectively.

A p-type offset region 1601 is formed in the second n-well region 85. A high-concentration p-type region 1602 is formed in the p-type offset region 1601. A capacitance electrode 1603 is provided over the high-concentration p-type region 1602 with a capacitance insulating film 1604 interposed in-between.

A manufacturing process of the semiconductor device shown in FIG. 238 is described below. FIGS. 239–244 are vertical sectional views showing intermediate states of manufacture of the embodiment of the semiconductor device of FIG. 238. First, as shown in FIGS. 150–152 and 225–232, a first p-well region 52, a second p-well region 53, a first n-well region 54, and a second n-well region 85, an extended drain region 1022, a trench 1030, selective oxidation films 63, a p-type base region 1045 of the intended TLPM, a channel region 233 of the intended NMOS, a p-type offset region 1601 (given reference numeral 1401 in FIG. 230) of the intended capacitance element, a channel region 333 of the intended PMOS, gate oxide films 1029, 229, and 329, and a capacitance insulating film 1604 (given no reference numeral in FIG. 230) are formed.

Figure 239:
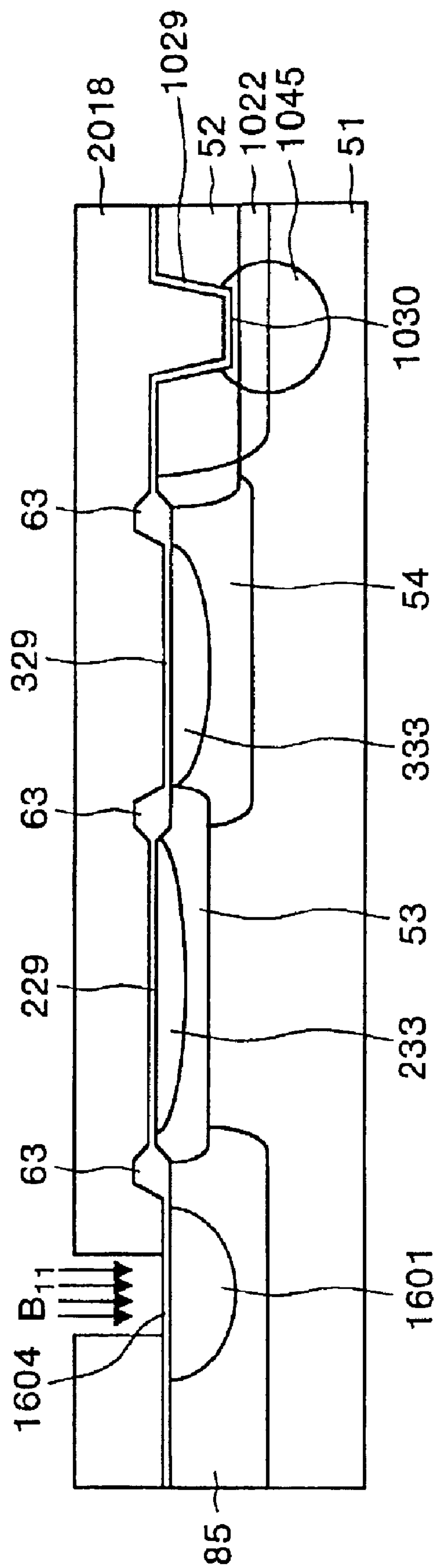
FIGS. 239–244 are vertical sectional views showing intermediate states of manufacture of the embodiment of the semiconductor device shown in FIG. 238.
Figure 240:
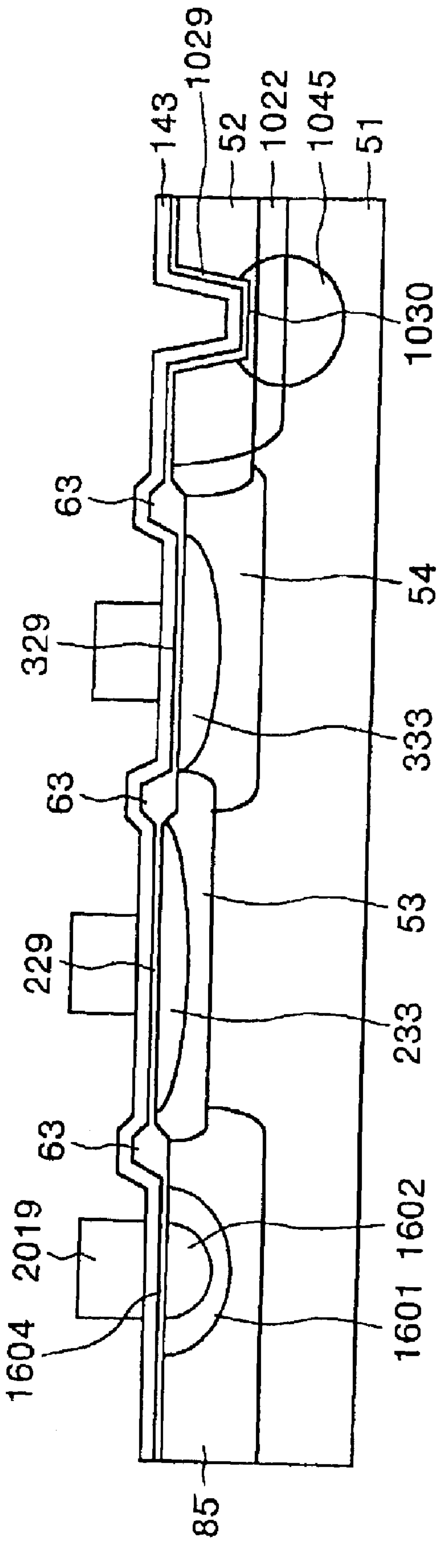
Figure 241:
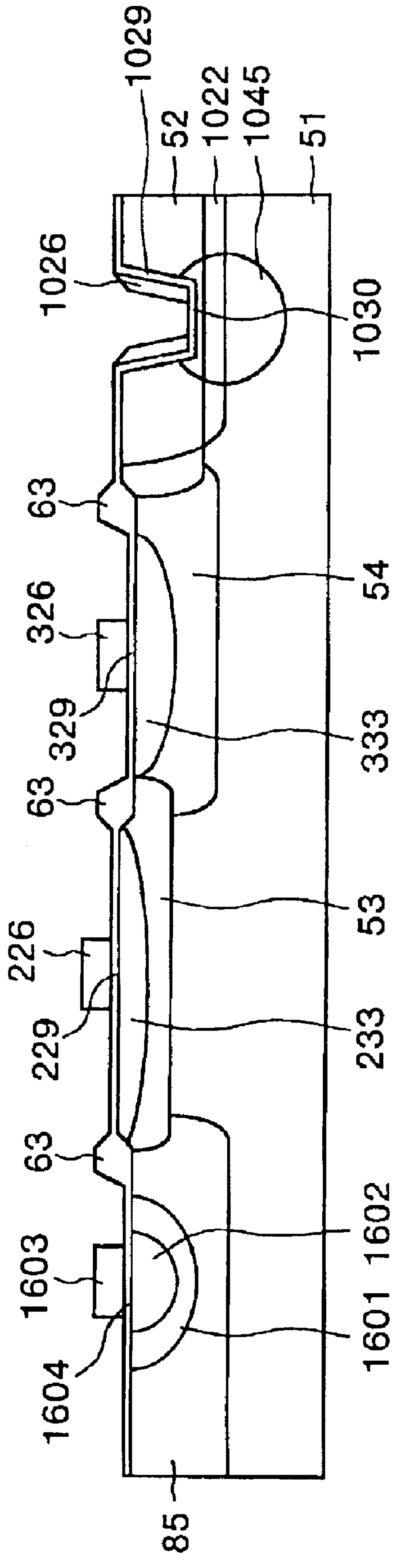
Figure 242:
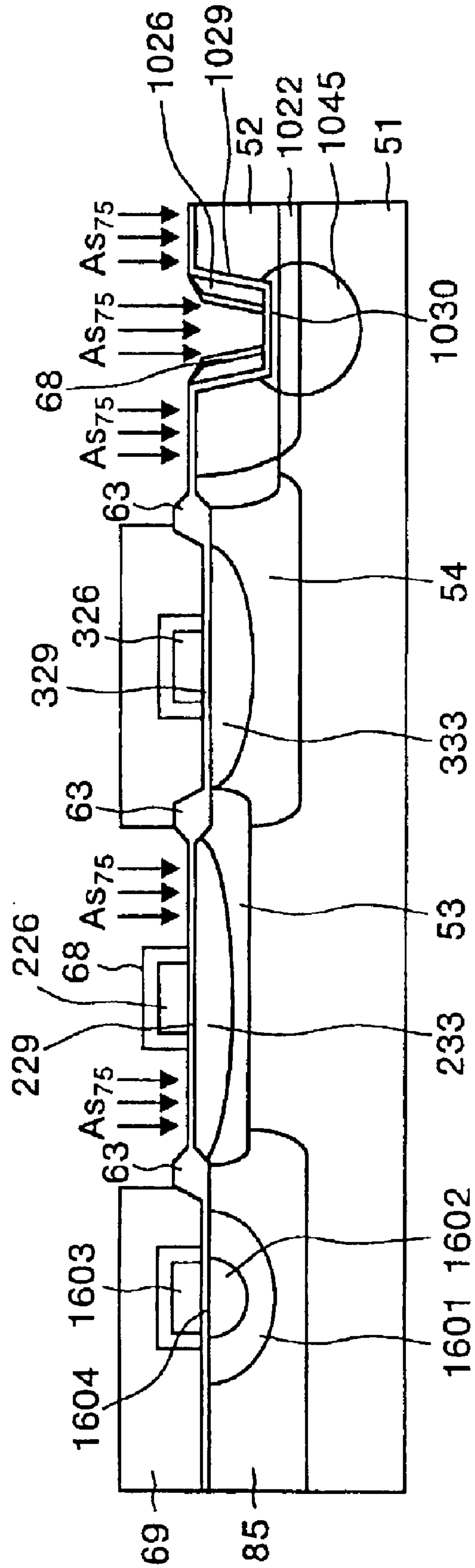
Figure 243:
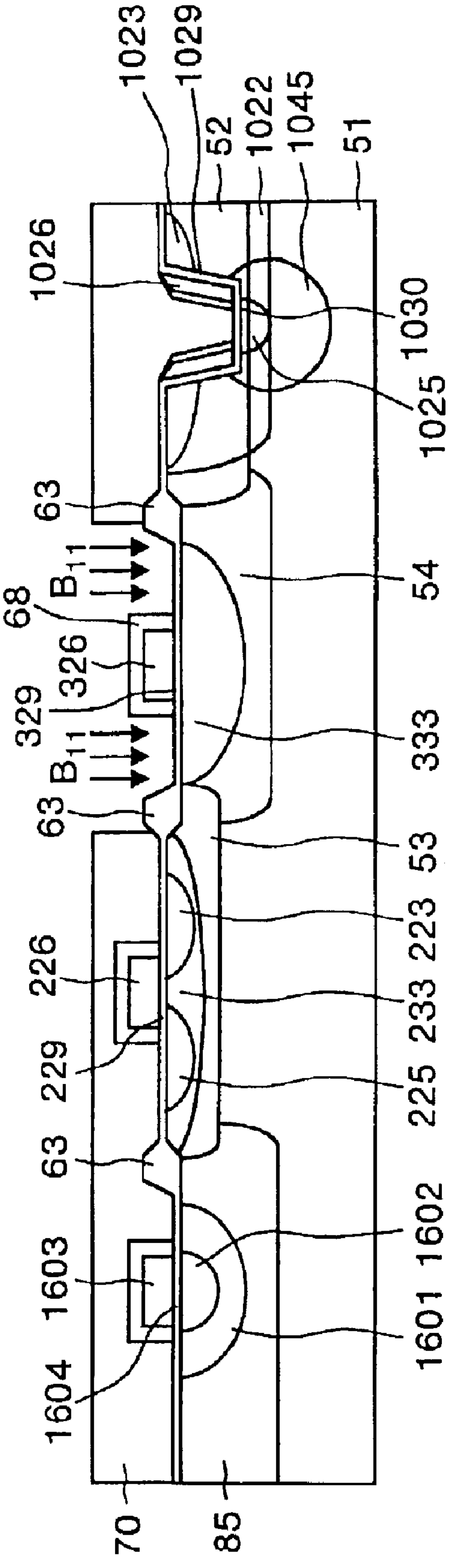
Figure 244:
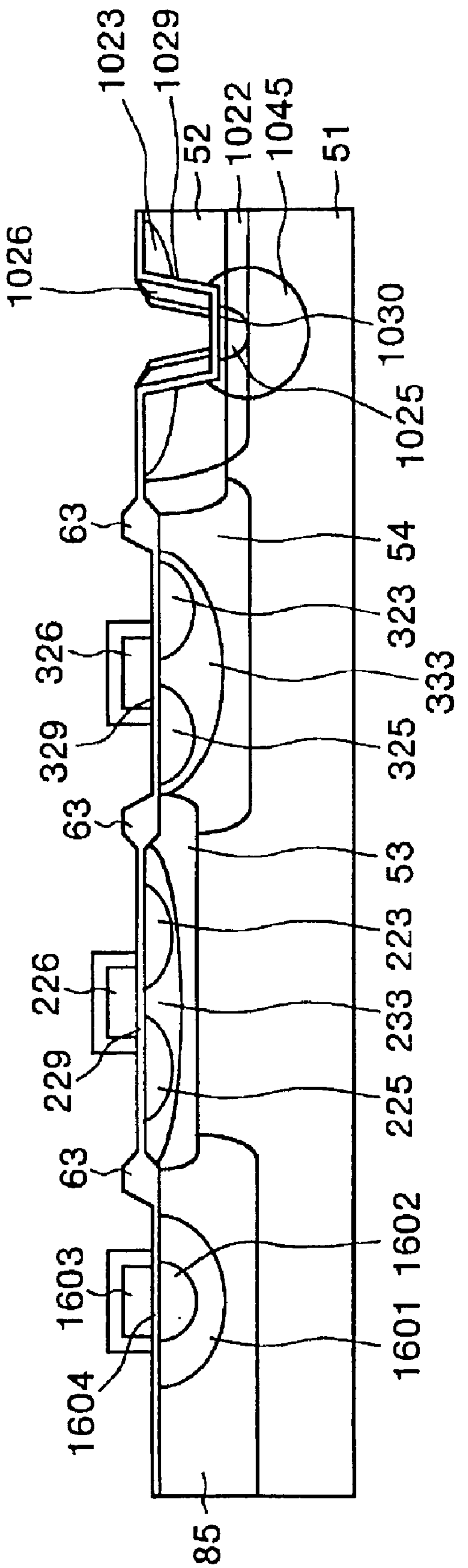

Subsequently, a p-type impurity such as boron ($B_{11}$) is ion-implanted by using a mask 2018 having an opening in an area corresponding to a future high-concentration p-type region of the intended capacitance element (see FIG. 239). The implanted impurity is diffused to form a high-concentration p-type region 1602 in the p-type offset region 1601. After the mask 2018 is removed, a polysilicon layer 143 is laid and a mask 2019 is formed only in areas corresponding to future gate electrodes of the intended NMOS and PMOS and a future capacitance electrode (see FIG. 240).

Then, anisotropic etching (RIE or the like) is performed to form a capacitance electrode 1603, a gate electrode 226 of the intended NMOS, a gate electrode 326 of the intended PMOS, and gate electrodes 1026 of the intended TLPM. The mask 2019 is removed thereafter (see FIG. 241). Then, shadow oxide films 68 are formed, and a mask 69 having openings in an area corresponding to a future source region and drain regions of the intended TLPM and an NMOS forming area is formed. Then, an n-type impurity such as arsenic ($As_{75}$) is ion-implanted (see FIG. 242).

The implanted impurity is diffused, whereby a source region 1025 of the intended TLPM is formed under the bottom surface of the trench 1030, drain regions 1023 of the intended TLPM are formed on both sides of the trench 1030, and a source region 225 and a drain region 223 of the intended NMOS are formed in the channel region 233. After the mask 69 is removed, a p-type impurity such as boron ($B_{11}$) is ion-implanted by using a mask 70 having an opening in a PMOS forming area (see FIG. 243). The implanted impurity is diffused to form a source region 325 and a drain region 323 of the intended PMOS. The mask 70 is removed thereafter (see FIG. 244). The operations of FIG. 242 and FIG. 243 may be reversed.

Then, an interlayer insulating film 131 is laid, a contact hole is formed through it to reach the bottom surface of the trench 1030, and the inside of the trench 1030 is filled with a source polysilicon layer. Then, a passivation film 71 is formed and contact holes are formed. Finally, source electrodes and drain electrodes are formed.

According to the eighteenth embodiment, the capacitance element 1600 and the TLPM 1100 can be integrated on the same semiconductor substrate. Therefore, TLPMs can be incorporated into analog ICs in general by integrating such capacitor elements and TLPMs and resistance elements, bipolar transistors, etc. on the same semiconductor substrate. Thus, the eighteenth embodiment can provide an analog IC having lower power consumption than a conventional analog IC using planar power MOSFETs.

Figure 245:
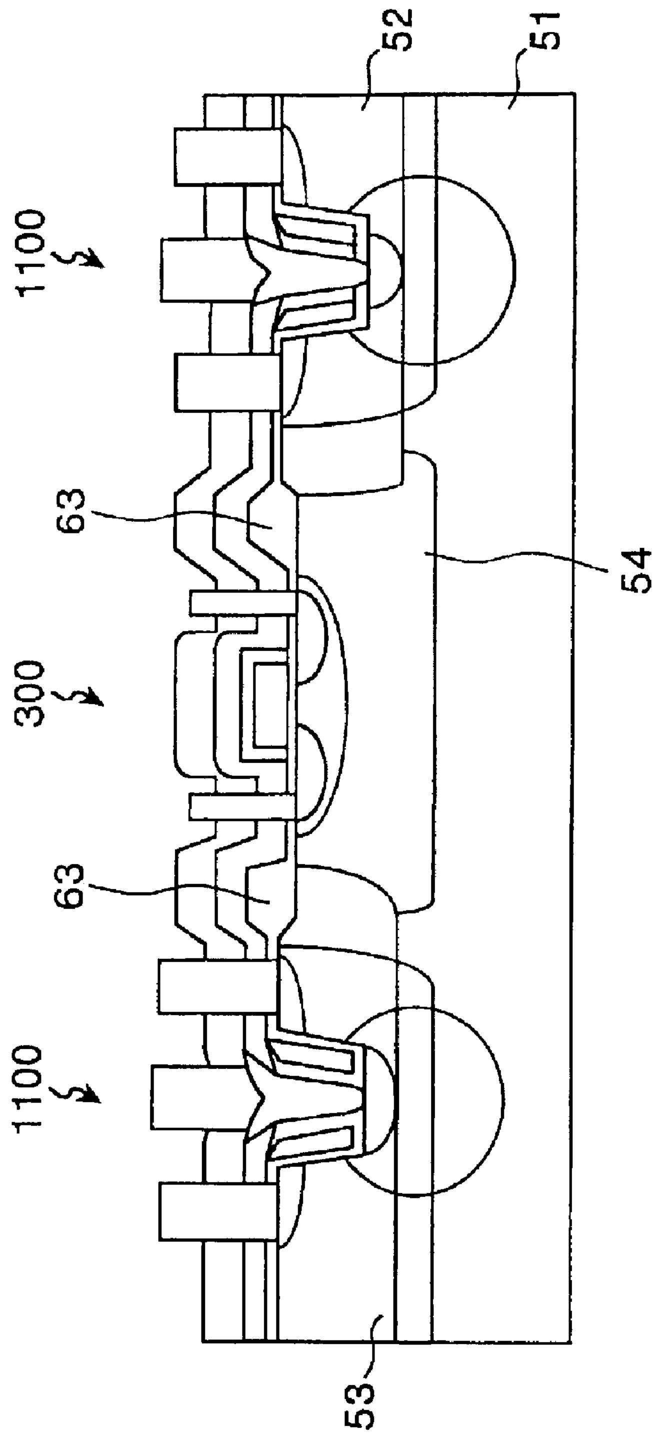
FIG. 245 is a vertical sectional view showing the configuration of a semiconductor device according to a nineteenth embodiment of the invention.

FIG. 245 is a vertical sectional view showing the configuration of a semiconductor device according to a nineteenth embodiment of the invention. As shown in FIG. 245, the semiconductor device according to the nineteenth embodiment is a semiconductor device of FIG. 98 according to the sixth embodiment in which the TLPM 1100, rather than the NMOS 200, is formed not only in the first p-well region 52 but also in the second p-well region 53.

In this manner, a TLPM may be formed in each of a plurality of p-well regions in the above-described sixth to eighteenth embodiments. Similarly, a TLPM may be formed in each of a plurality of n-well regions. Further, a plurality of TLPMs may be formed in a single well region. The nineteenth embodiment provides an advantage that TLPMs can be formed as large-current devices because a plurality of TLPMs having the same conductivity type exists on the same semiconductor substrate.

Figure 246:
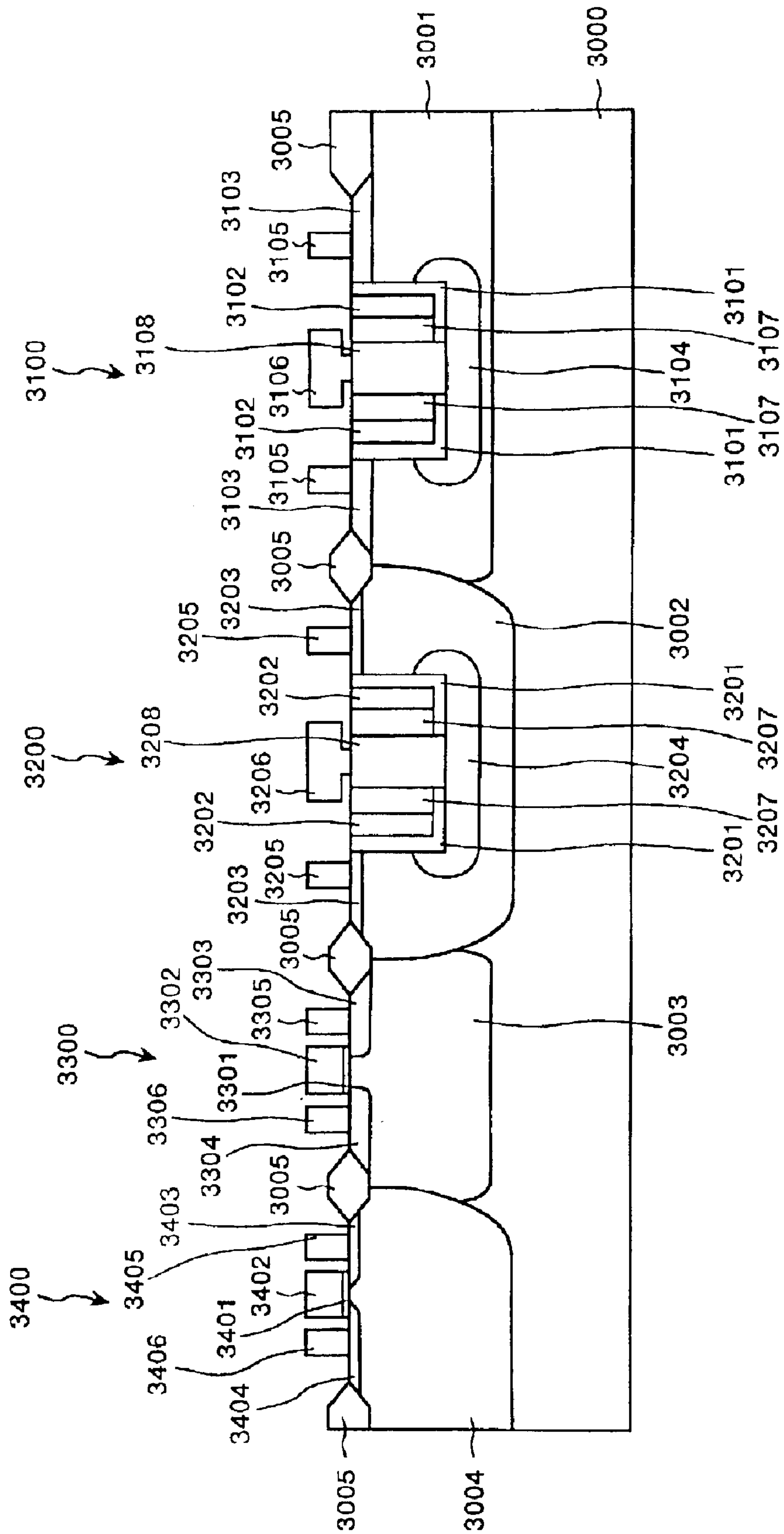
FIG. 246 is a vertical sectional view showing the configuration of a semiconductor device according to a twentieth embodiment of the invention.

FIG. 246 is a vertical sectional view showing the configuration of a semiconductor device according to a twentieth embodiment of the invention. As shown in FIG. 246, in the semiconductor device according to the twentieth embodiment, a first n-well region 3001, a first p-well region 3002, a second n-well region 3003, and a second p-well region 3004 are formed on a semiconductor substrate 3000 and a p-channel, first TLPM 3100, an n-channel, second TLPM 3200, a PMOS 3300, and an NMOS 3400 are formed in the first n-well region 3001, the first p-well region 3002, the second n-well region 3003, and the second p-well region 3004, respectively. Gate oxide films 3101 and 3201 of the respective TLPMs 3100 and 3200 are thicker than gate oxide films 3301 and 3401 of the PMOS 3300 and NMOS 3400.

In FIG. 246, reference numerals 3102, 3202, 3302, and 3402 denote gate electrodes. Reference numerals 3103, 3203, 3303, and 3403 denote source electrodes. Reference numerals 3104, 3204, 3304, and 3404 denote drain regions. Reference numerals 3105, 3205, 3305, and 3405 denote source electrodes. Reference numerals 3106, 3206, 3306, and 3406 denote drain electrodes. Reference numerals 3107 and 3207 denote interlayer insulating films. Reference numerals 3108 and 3208 denote drain polysilicon layers. Reference numeral 3005 denotes selective oxidation films for device isolation. In FIG. 246, an interlayer insulating film and a passivation film on the substrate surface are omitted.

Figure 247:
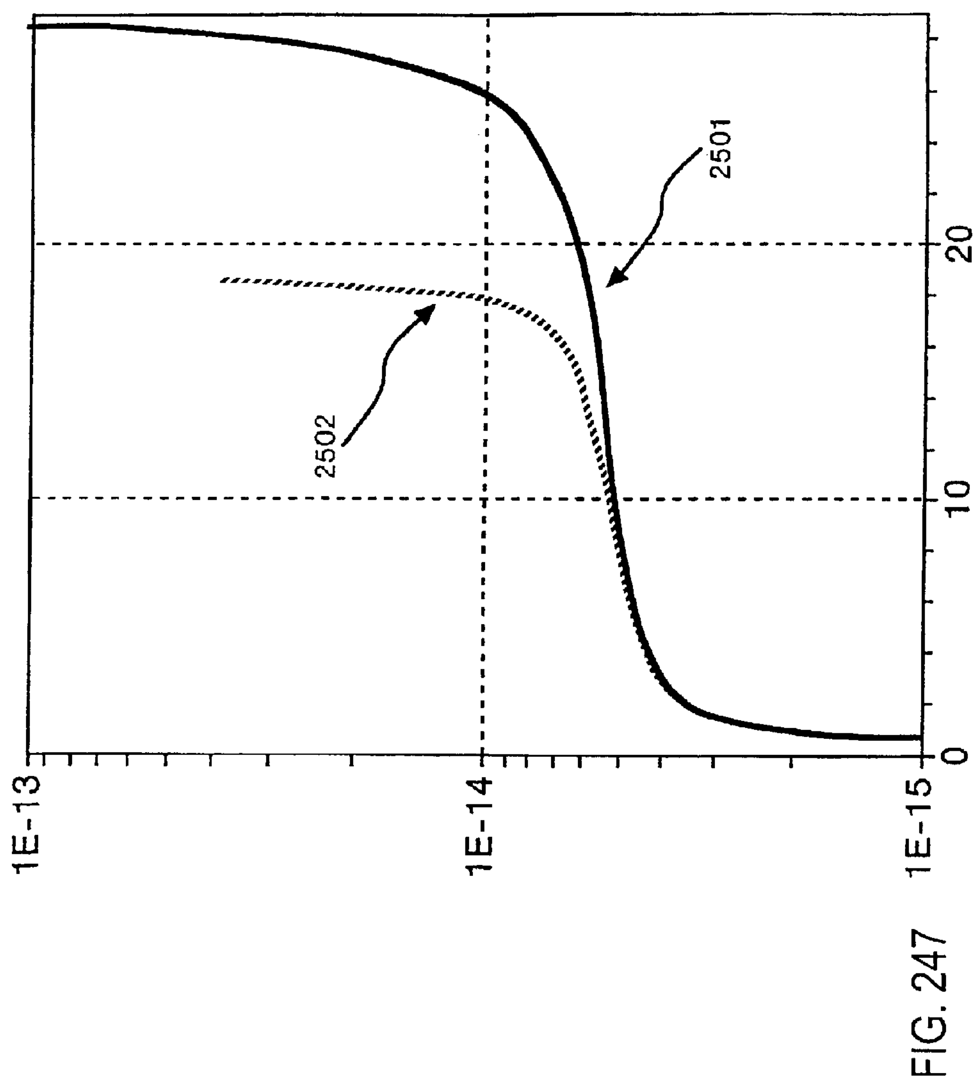
FIG. 247 is a graph showing a simulation result of a relationship between the gate oxide film thickness and the drain breakdown voltage.
Figure 248:
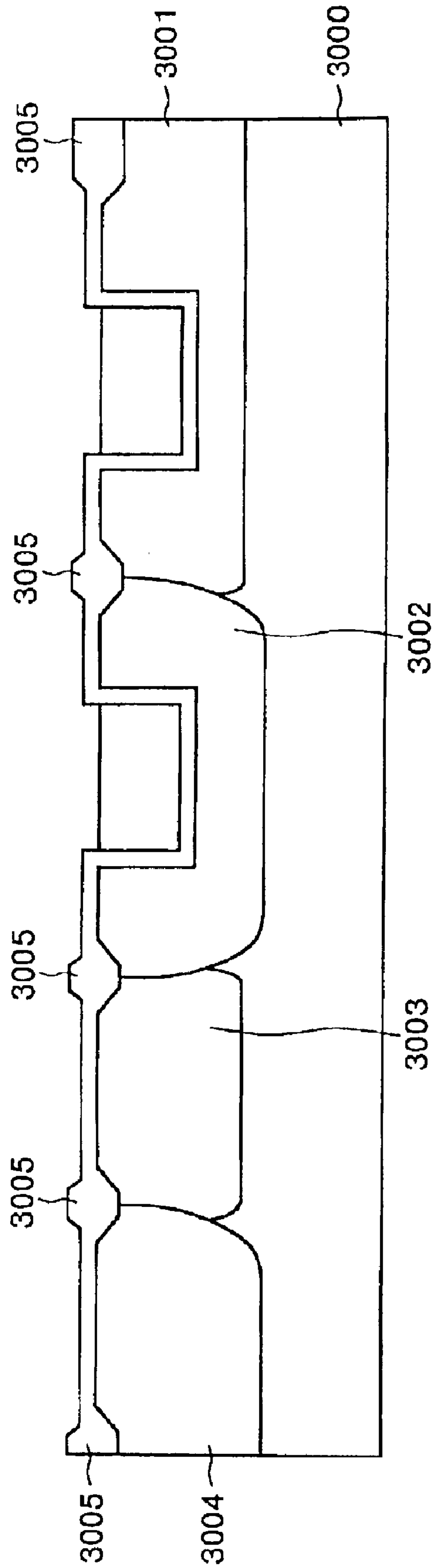
FIGS. 248–256 are vertical sectional views showing intermediate states of manufacture of the semiconductor device having a configuration similar to the embodiment of the semiconductor device shown in FIG. 246.
Figure 249:
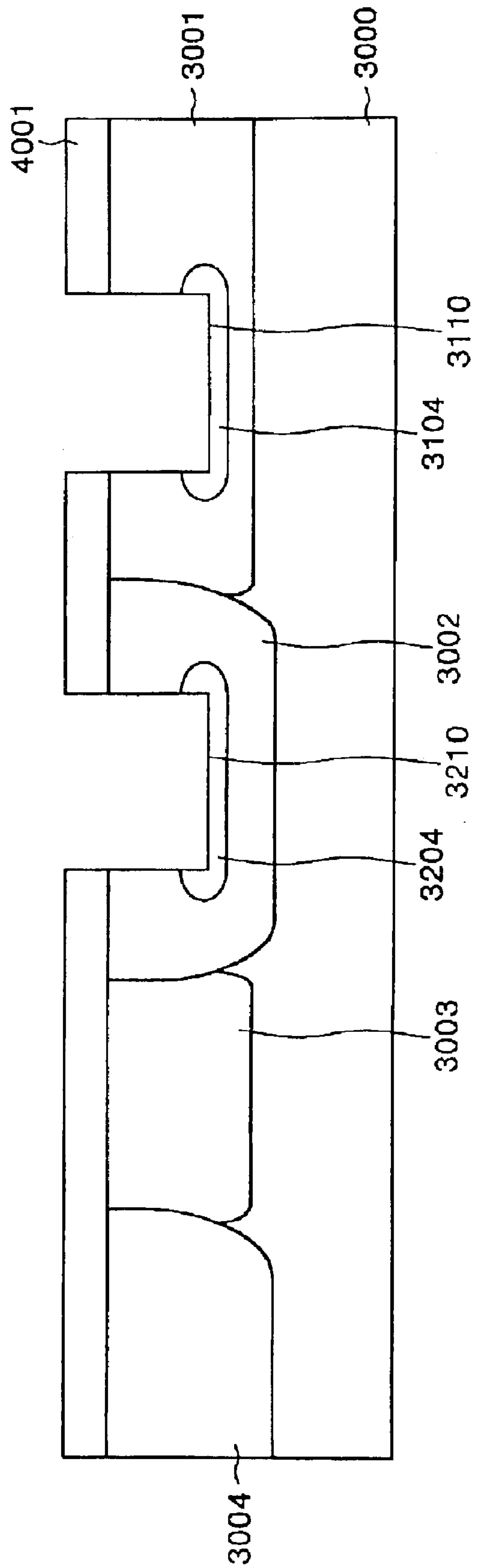

No particular limitations are imposed on the thickness of the gate oxide films 3101 and 3201 of the respective TLPMs 3100 and 3200, which may, for example, be 600 Å. In contrast, no particular limitations are imposed on the thickness of the gate oxide films 3301 and 3401 of the PMOS 3300 and NMOS 3400, which may, for example, be 170 Å. Usually, a voltage of 20 V or more is applied to the drain of a TLPM that is a high-breakdown-voltage device. FIG. 247 is a graph showing a simulation result of a relationship between the gate oxide film thickness and the drain breakdown voltage. As shown in FIG. 247, when the gate oxide film thickness is 600 Å 2501, the drain breakdown voltage is equal to 27 V, which is desirable. In contrast, when the gate oxide film thickness is 200 Å (a value of ordinary CMOS portions) 2502, the drain breakdown voltage is equal to about 18 V, which is less desirable.

Therefore, one method for obtaining a sufficiently high drain breakdown voltage of TLPMs is to increase the thickness of the gate oxide films. However, in this case, the gate oxide films of CMOS portions are also thick and cause various problems for example, an increased threshold voltage, a decreased response speed, an increased resistance to current flow, and a decreased noise margin. Thus, the gate oxide films 3101 and 3201 of the TLPMs 3100 and 3200 are made thicker than the gate oxide films 3301 and 3401 of the PMOS 3300 and the NMOS 3400 by an exemplary manufacturing process described below.

FIGS. 248–256 are vertical sectional views showing intermediate states of manufacture of the embodiment of the semiconductor device shown in FIG. 246. First, a first n-well region 3001, a first p-well region 3002, a second n-well region 3003, and a second p-well region 3004 are formed selectively on a p-type semiconductor substrate 3000 (see FIG. 248). Then, a first trench 3110 and a second trench 3210 are formed by using a patterned mask oxide film 4001. A drain region 3104 and 3204 are formed under the bottom surfaces of the first trench 3110 and the second trench 3210, respectively (see FIG. 249).

Figure 250:
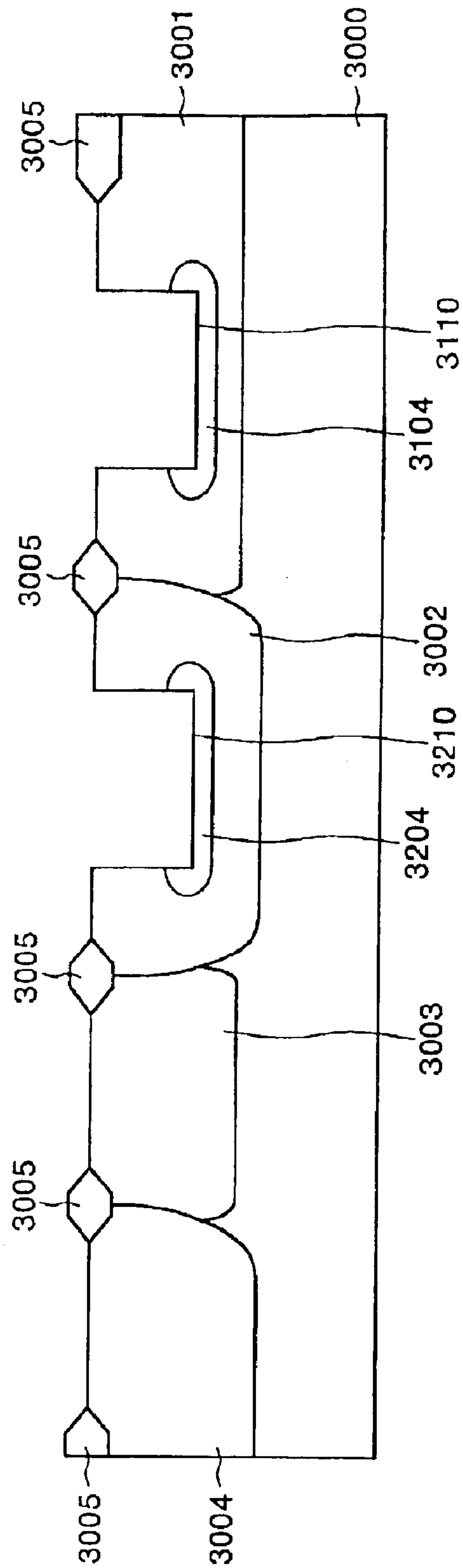
Figure 251:
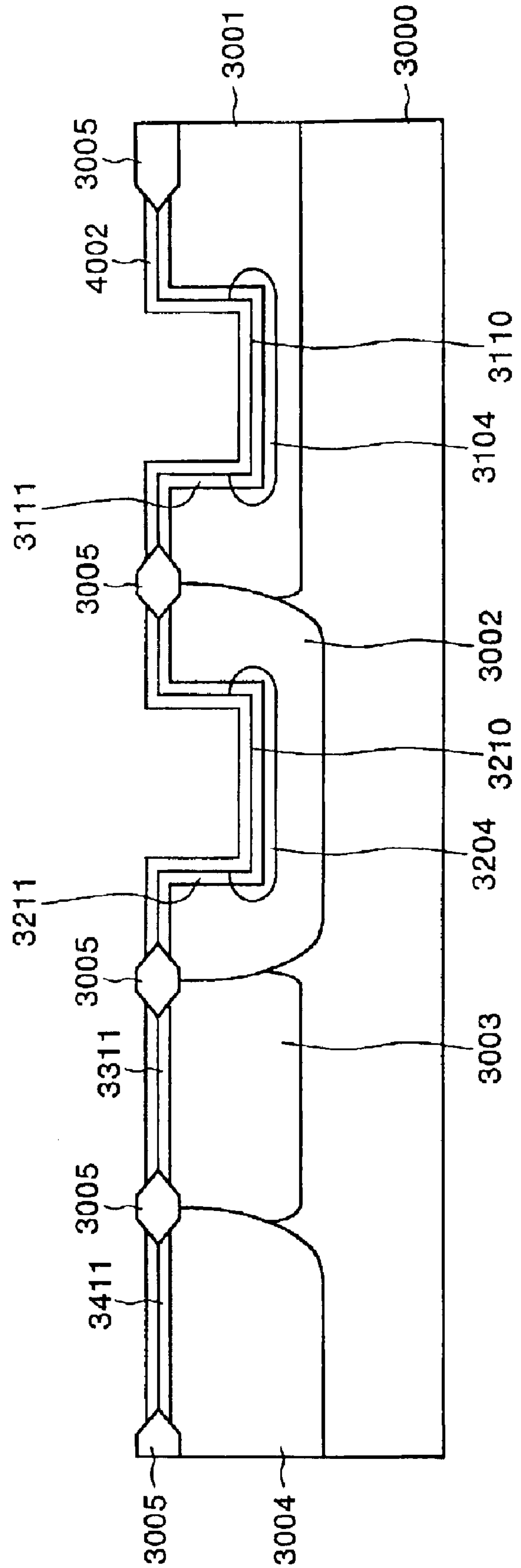
Figure 252:
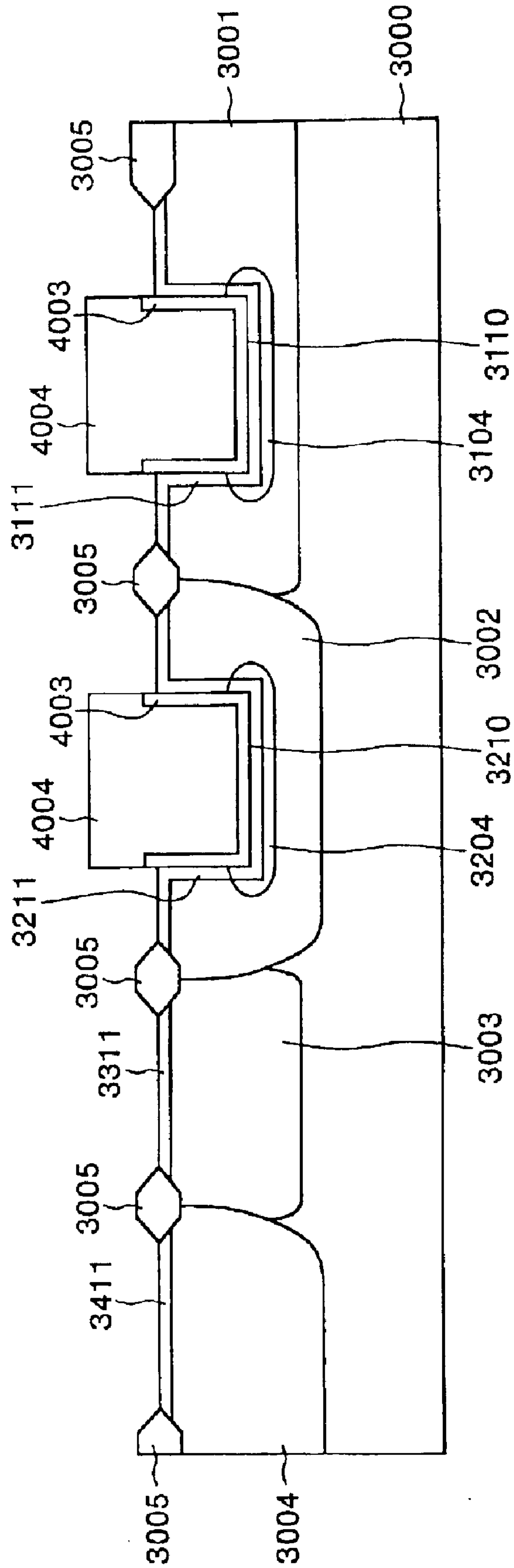

After the mask oxide film 4001 is removed, selective oxidation films 3005 for device isolation are formed (see FIG. 250). Then, a sacrificial oxide film 4002 is formed, and channel regions 3111, 3211, 3311, and 3411 of the respective intended TLPM 3100, TLPM 3200, PMOS 3300, and NMOS 3400 are formed by ion implantation or the like (see FIG.251). After the sacrificial film 4002 is removed, a first gate oxide film 4003 is formed on the substrate surface and the surfaces of the trenches 3110 and 3210. Then, the trenches 3110 and 3210 are covered with a mask 4004 and etching or the like is performed in this state, whereby the first gate oxide film 4003 is removed from the CMOS portion. As a result, the first gate oxide film 4003 remains only in the trenches 3110 and 3210 (see FIG. 252).

Figure 253:
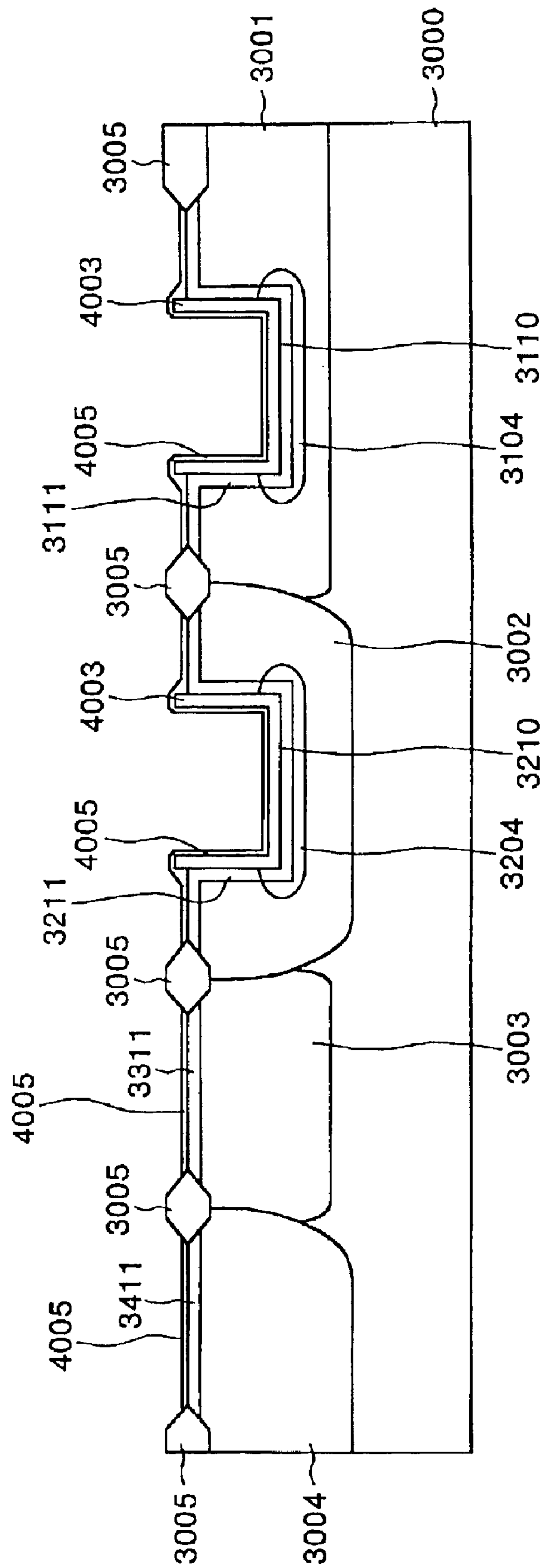
Figure 254:
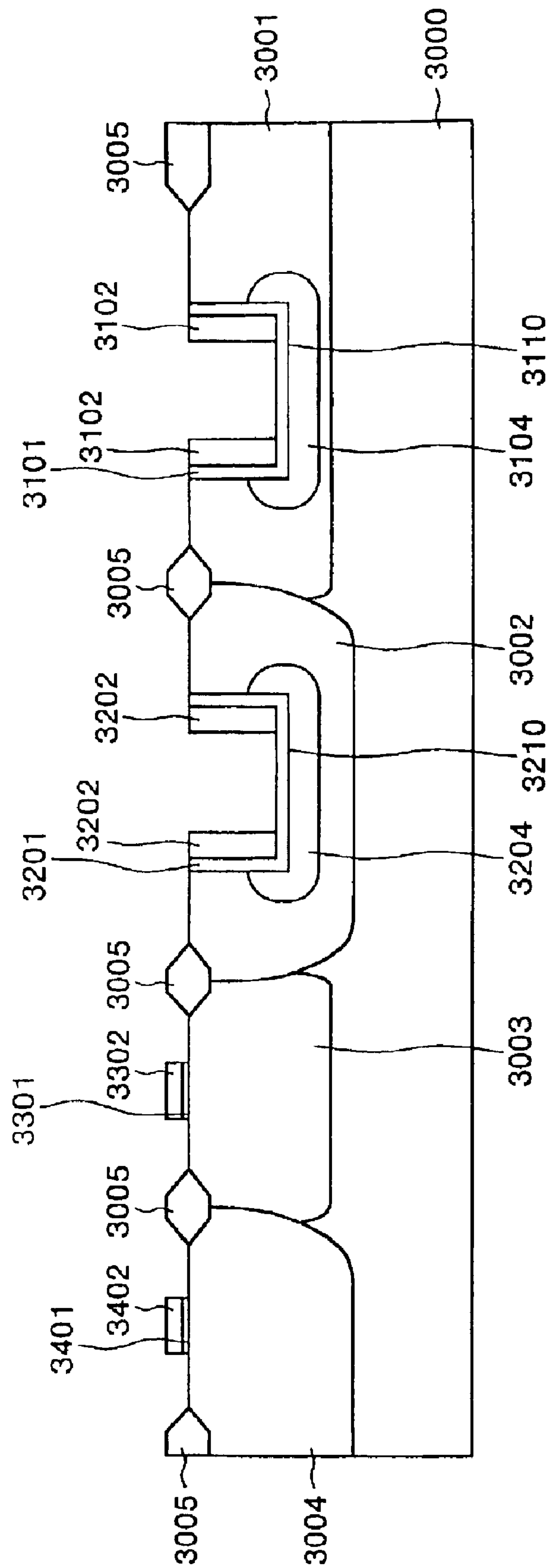

After the mask 4004 is removed, a second gate oxide film 4005 is formed on the substrate surface and the surfaces of the trenches 3110 and 3210 (see FIG. 253). As a result, a gate oxide film 3301 of the PMOS 3300 and a gate oxide film 3401 of the NMOS 3400 are formed by the second gate oxide film 4005. In contrast, a gate oxide film of the first TLPM 3100 and a gate oxide film 3201 of the second TLPM 3200 have a laminated structure of the first gate oxide film 4003 and the second gate oxide film 4005, and hence are thicker than the gate oxide films 3301 and 3401 of the CMOS portion.

Figure 255:
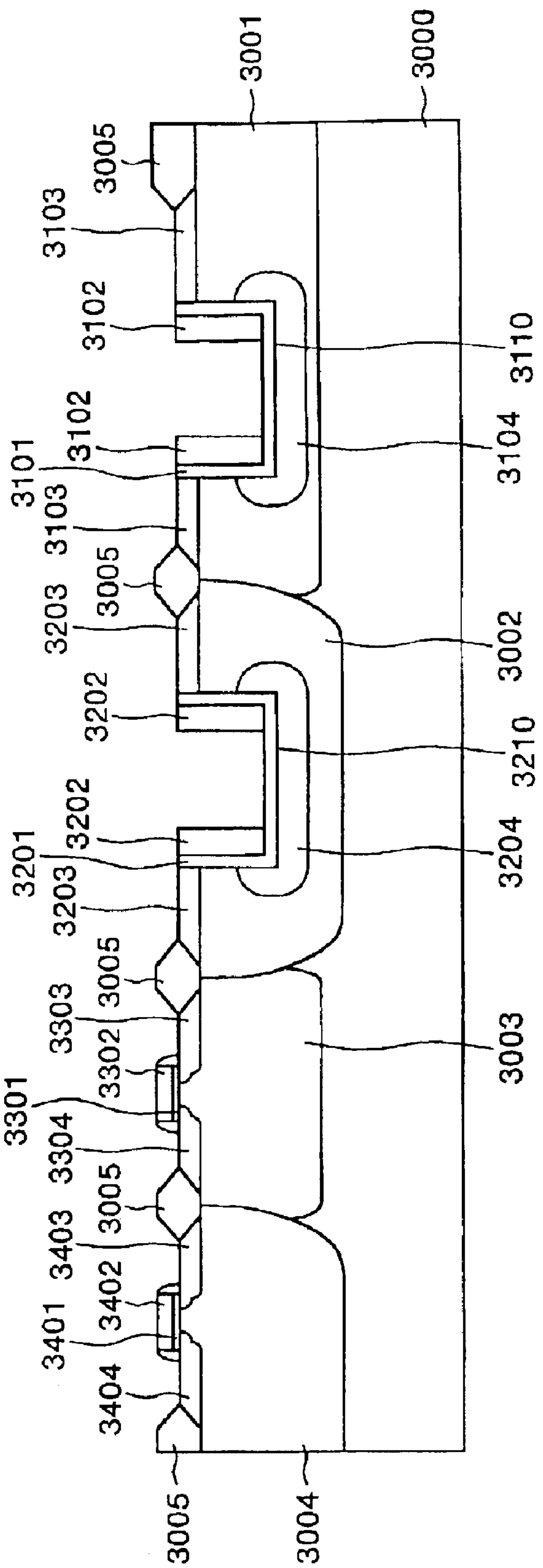
Figure 256:
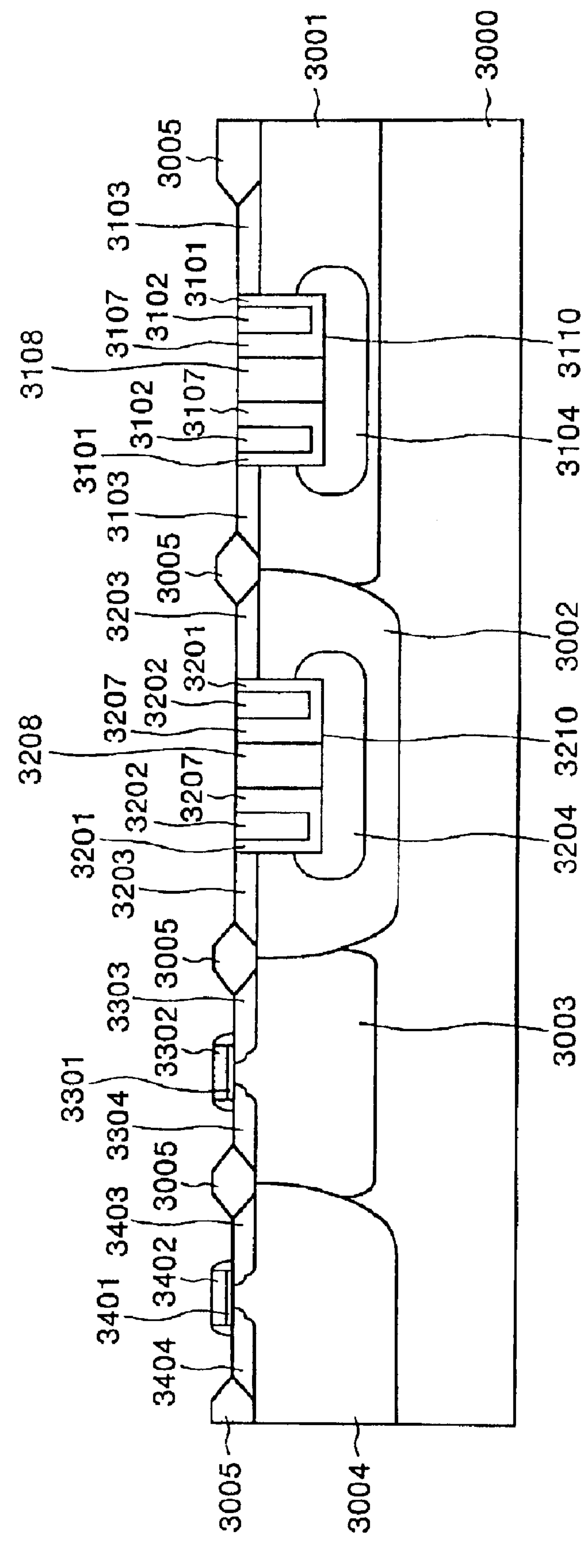

Subsequently, gate electrodes 3102, 3202, 3302, and 3402 are formed (see FIG. 254), and source regions 3103, 3203, 3303, and 3403 of the TLPMs 3100 and 3200, the PMOS 3300, and NMOS 3400 and drain regions 3304 and 3404 of the PMOS 3300 and NMOS 3400 are formed (see FIG. 255). It is noted that LDD structures are employed in the illustrated example. Then, an interlayer insulating film is laid, contact holes are formed at the bottom of the trench through the interlayer insulating film, and the insides of the first trench 3110 and the second trench 3210 are filled with drain polysilicon layers 3108 and 3208, respectively (see FIG. 256). Then, a passivation film is formed over the substrate surface, contact holes are formed, and source electrode and drain electrodes are formed. A semiconductor device is thus completed.

According to the twentieth embodiment, the gate oxide films 3101 and 3201 of the TLPMs 3100 and 3200 can be made thicker than the gate oxide films 3301 and 3401 of the CMOSFET portion. Therefore, a semiconductor device can be obtained in which CMOS portions having a low threshold voltage and power MOSFETs having a high breakdown voltage are integrated on the same semiconductor substrate.

A twenty-first embodiment relates to the structure of a buried electrode that can be applied to TLPMs to be integrated together with CMOS portions in the above-described manner as well as to an independent TLPM. Eight exemplary structures of a buried electrode are described below.

Figure 257:
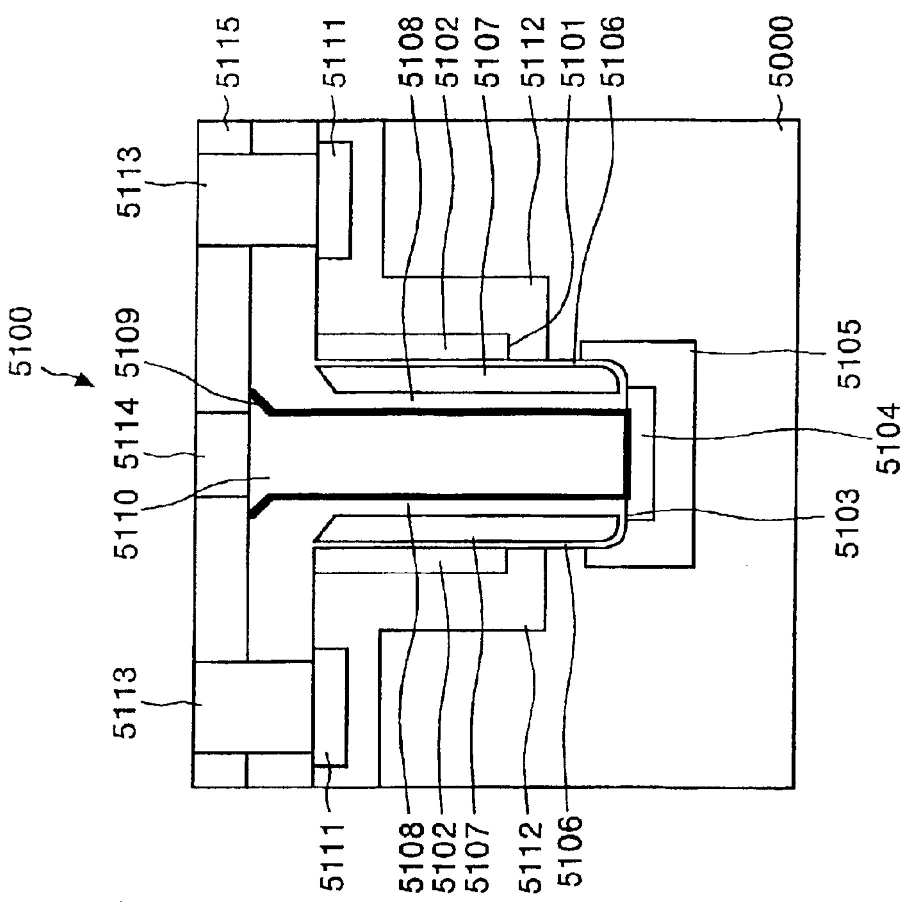
FIGS. 257–264 are vertical sectional views of first to eighth exemplary semiconductor devices according to a twenty-first embodiment of the invention.

FIG. 257 is a vertical sectional view of a representation of a first exemplary semiconductor device according to the twenty-first embodiment. A TLPM 5100 shown in FIG. 257 is a second type of device in which source contact is made at the bottom of a trench. A first-stage trench 5101 is formed in a semiconductor substrate 5000 and thick oxide films 5102 are formed on the side surfaces of the trench 5101. A second-stage trench 5103 is formed from the bottom surface of the first-stage trench 5101, and a source region 5104 and a base region 5105 are formed under the bottom surface of the second-stage trench 5103. Gate electrodes 5107 are formed parallel with the side surfaces of the thick oxide films 5102 of the first-stage trench 5101 and the side surfaces of the second-stage trench 5103 with a gate oxide film 5106 interposed in-between, respectively (inside the first-stage trench 5101 and the second-stage trench 5103).

A barrier metal layer 5109 made of Ti, TiN, Ta, TaN, TiC, TaC, $W_2N$, or the like is formed inside the gate electrodes 5107 with an interlayer insulating film 5108 interposed in-between. The barrier metal layer 5109 is in contact with the source region 5104, and a tungsten plug 5110 is positioned as a buried electrode inside the barrier metal layer 5109. Drain regions 5111 are provided in a surface layer of the substrate 5000, and extended drain regions 5112 are provided between the base region 5105 and the respective drain regions 5111. Drain electrodes 5113 are provided on the substrate surface to penetrate through the interlayer insulating film 5108 and a passivation film 5115 and to be in contact with the respective drain regions 5111. A source electrode 5114 is also provided on the substrate surface to be electrically connected to the source region 5104 via the tungsten plug 5110 and the barrier metal layer 5109.

According to the first example, when CVD is used, the tungsten plug 5110 can be buried at a growth rate of 0.15 to 0.6 μm per minute, which is two orders faster than in the case of burying doped polysilicon in which the growth rate is about 25 Å per minute. Another advantage is that the barrier metal layer 5109 prevents diffusion of tungsten into the silicon substrate or the oxide films.

Figure 258:
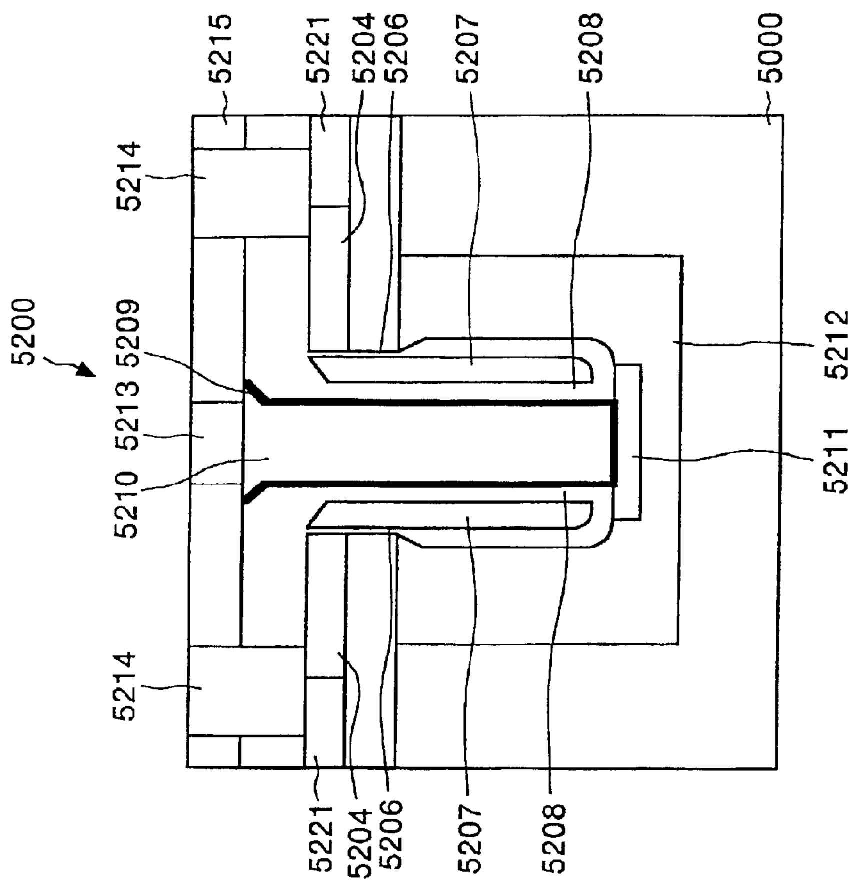

FIG. 258 is a vertical sectional view of a representation of a second exemplary semiconductor device according to the twenty-first embodiment. A TLPM 5200 shown in FIG. 258 is a first type of device in which drain contact is made at the bottom of a trench, and is formed by performing trench formation two times. A drain region 5211 is provided under the bottom surface of a trench and an extended drain region 5212 is provided so as to surround the trench. Gate electrodes 5207 are formed inside the trench with a gate oxide film 5206 interposed in-between. A barrier metal layer 5209 is provided inside the gate electrodes 5207 with an interlayer insulating film 5208 interposed in-between to be in contact with the drain region 5211. The inside of the barrier metal layer 5209 is filled with a tungsten plug 5210.

Source regions 5204 and plug regions 5221 are provided in a surface layer of a semiconductor substrate 5000. Each source electrode 5214 penetrates through the interlayer insulating film 5208 and a passivation film 5215 and is in contact with the associated source region 5204 and plug region 5221. A drain electrode 5213 is electrically connected to the drain region 5211 via the tungsten plug 5210 and the barrier metal layer 5209.

As in the first example, the second example provides the advantage that by employing CVD the tungsten plug 5210 can be buried two orders faster than when burying doped polysilicon.

Figure 259:
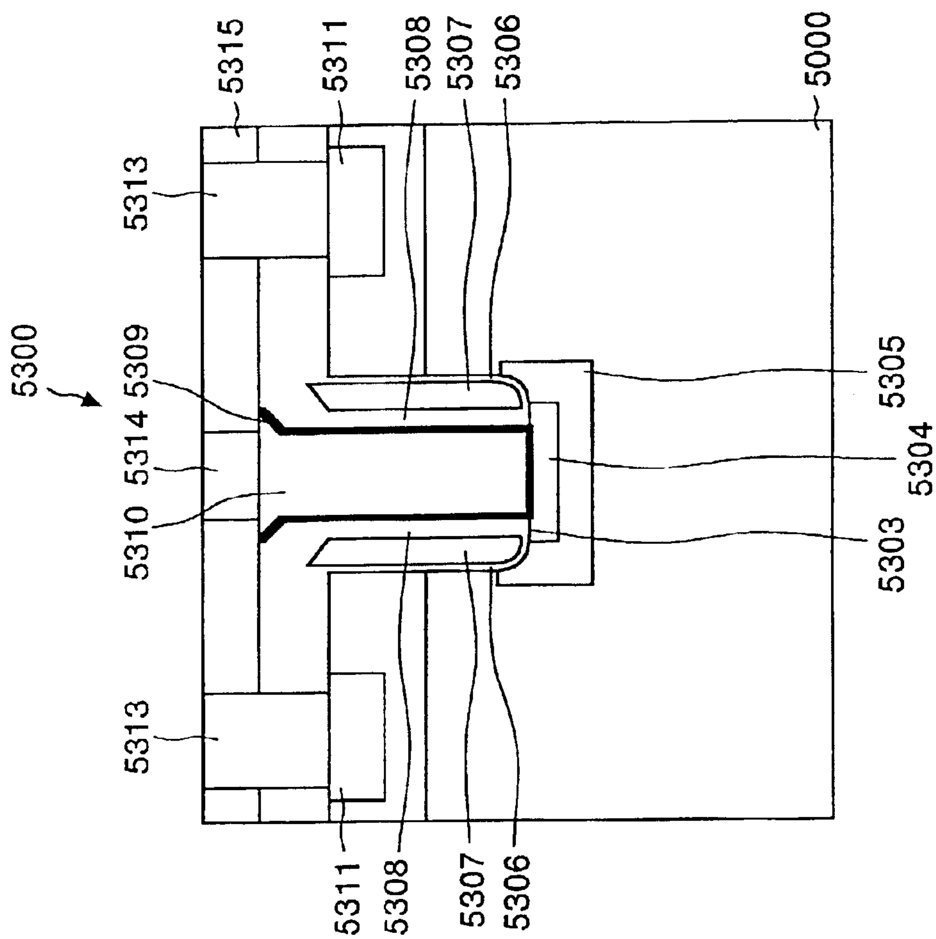

FIG. 259 is a vertical sectional view of a representation of a third exemplary semiconductor device according to the twenty-first embodiment. A TLPM 5300 shown in FIG. 259 is a second type of device in which source contact is made at the bottom of a trench, and is formed by performing trench formation once. A source region 5304 and a base region 5305 are provided under the bottom surface of a trench 5303. A gate oxide film 5306, gate electrodes 5307, an interlayer insulating film 5308, and a barrier metal layer 5309 that is in contact with the source region 5304 are provided inside the trench 5303 sequentially from the outside. The inside of the barrier metal layer 5309 is filled with a tungsten plug 5310.

Drain regions 5311 are provided in a surface layer of a semiconductor substrate 5000. Drain electrodes 5313 penetrate through the interlayer insulating film 5308 and a passivation film 5315 and are in contact with the respective drain regions 5311. A source electrode 5314 is electrically connected to the source region 5304 via the tungsten plug 5310 and the barrier metal layer 5309.

As in the first example, the third example provides the advantage that by employing CVD, the tungsten plug 5310 can be buried two orders faster than when burying doped polysilicon. Another advantage is that the barrier metal layer 5309 prevents diffusion of tungsten into the silicon substrate or the oxide films.

Figure 260:
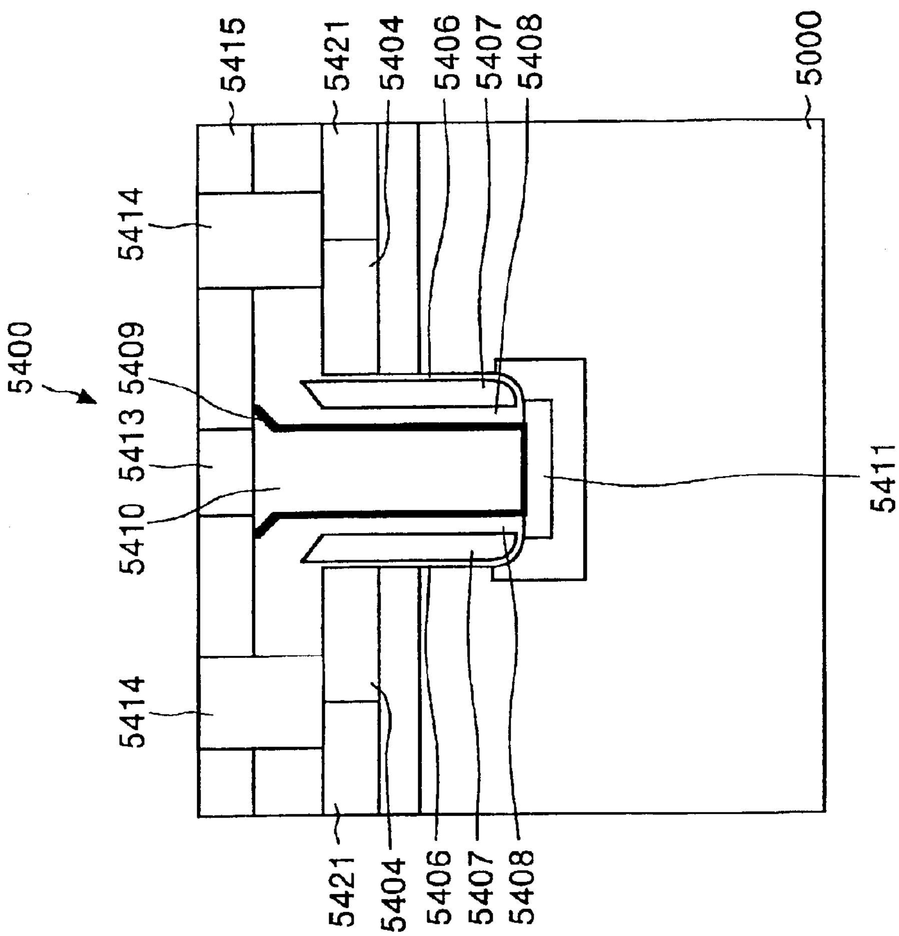

FIG. 260 is a vertical sectional view of a representation of a fourth exemplary semiconductor device according to the twenty-first embodiment. A TLPM 5400 shown in FIG. 260 is a first type of device in which drain contact is made at the bottom of a trench, and is formed by performing trench formation once. A drain region 5411 is provided under the bottom surface of a trench. A gate oxide film 5406, gate electrodes 5407, an interlayer insulating film 5408, and a barrier metal layer 5409 that is in contact with the drain region 5411 are provided inside the trench in this order from the outside. The inside of the barrier metal layer 5409 is filled with a tungsten plug 5410.

Source regions 5404 and plug regions 5421 are provided in a surface layer of a semiconductor substrate 5000. Each source electrode 5414 penetrates through the interlayer insulating film 5408 and a passivation film 5415 and is in contact with the associated source region 5404 and plug region 5421. A drain electrode 5413 is electrically connected to the drain region 5411 via the tungsten plug 5410 and the barrier metal layer 5409.

As in the first example, the fourth example provides the advantage that by employing CVD, the tungsten plug 5410 can be buried two orders faster than in the case of burying doped polysilicon.

Figure 261:
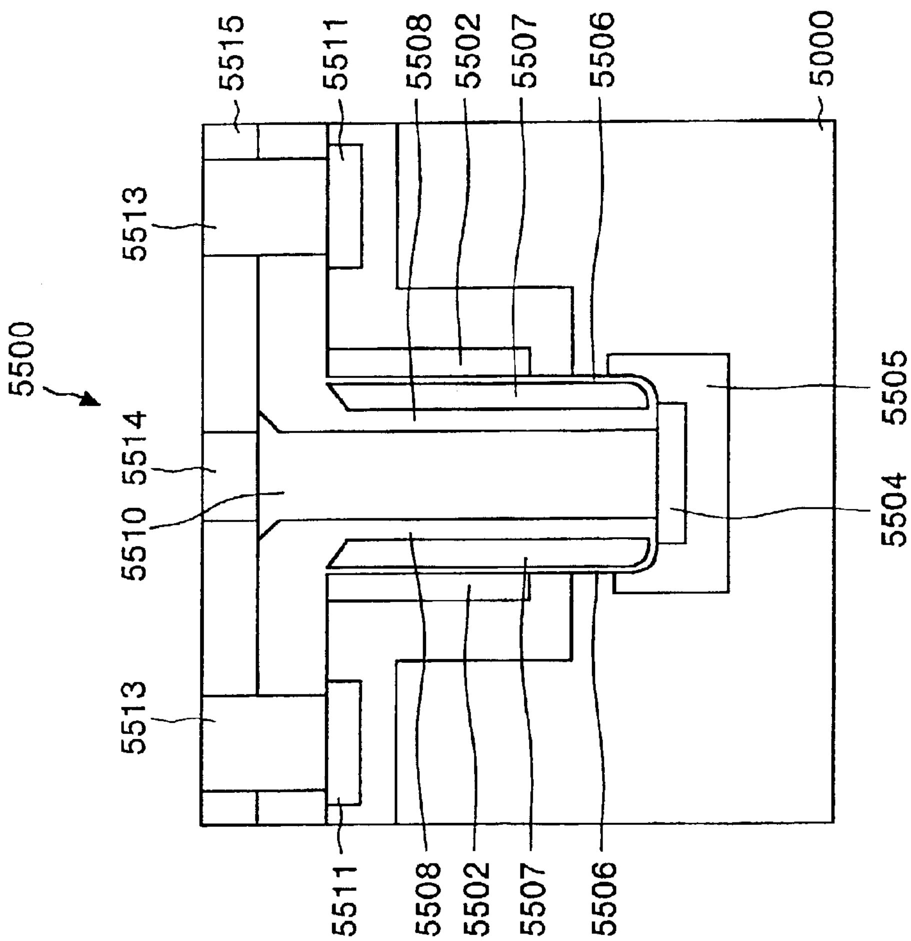

FIG. 261 is a vertical sectional view of a representation of a fifth exemplary semiconductor device according to the twenty-first embodiment. A TLPM 5500 shown in FIG. 261 is a second type of device in which source contact is made at the bottom of a trench, and is formed by performing trench formation two times. A source region 5504 and a base region 5505 are provided under the bottom surface of a trench. Thick oxide films 5502, a gate oxide film 5506, gate electrodes 5507, and an interlayer insulating film 5508 are provided inside the trench in this order from the outside. The inside of the interlayer insulating film 5508 is filled with a WSi (tungsten silicide) electrode 5510 that is in contact with the source region 5504.

Drain regions 5511 are provided in a surface layer of a semiconductor substrate 5000. Drain electrodes 5513 penetrate through the interlayer insulating film 5508 and a passivation film 5515 and are in contact with the respective drain regions 5511. A source electrode 5514 is electrically connected to the source region 5504 via the WSi electrode 5510.

As in the first example, the fifth example provides an advantage that by employing CVD the WSi electrode 5510 can be buried at a growth rate of 0.15 to 0.6 $\mu$m per minute, which is two orders faster than in the case of burying doped polysilicon. Another advantage is that the throughput is higher than in the first embodiment because no barrier metal layer is necessary.

Figure 262:
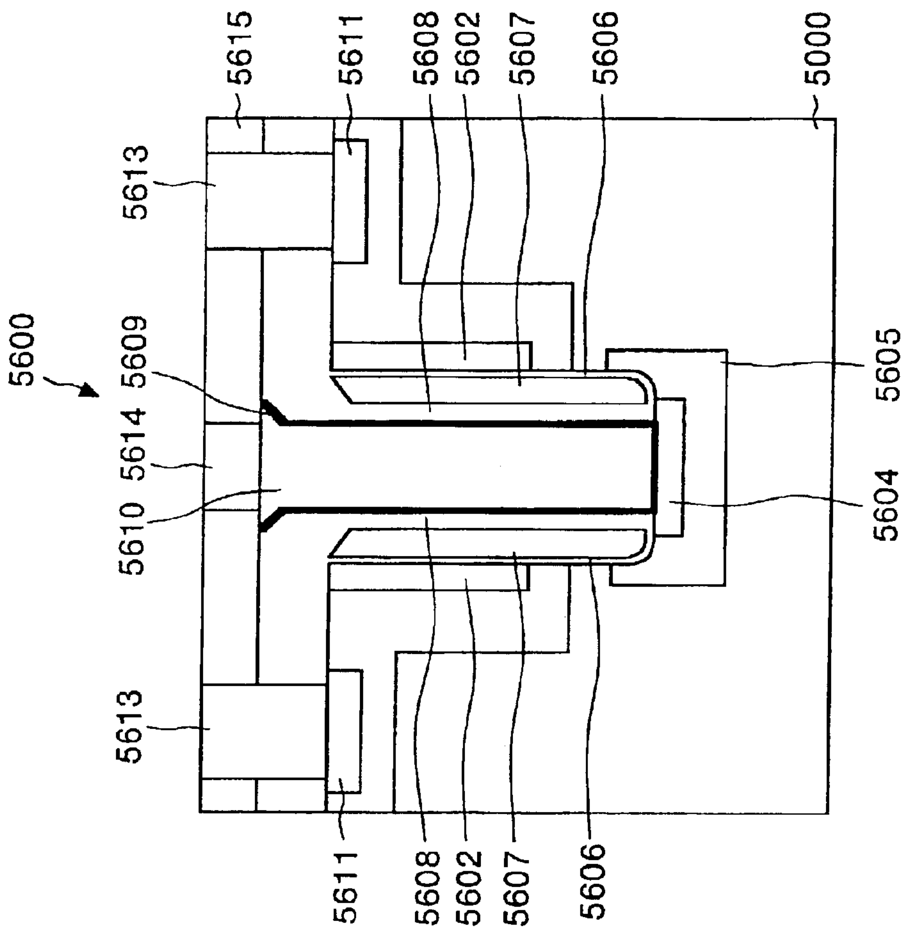

FIG. 262 is a vertical sectional view of a representation of a sixth exemplary semiconductor device according to the twenty-first embodiment. A TLPM 5600 shown in FIG. 262 is a second type of device in which source contact is made at the bottom of a trench, and is formed by performing trench formation two times. A source region 5604 and a base region 5605 are provided under the bottom surface of a trench. Thick oxide films 5602, a gate oxide film 5606, gate electrodes 5607, an interlayer insulating film 5608, and a barrier metal layer 5609 that is in contact with the source region 5604 are provided inside the trench in this order from the outside. The inside of the barrier metal layer 5609 is filled with a P-doped polysilicon electrode 5610.

Drain regions 5611 are provided in a surface layer of a semiconductor substrate 5000. Drain electrodes 5613 penetrate through the interlayer insulating film 5608 and a passivation film 5615 and are in contact with the respective drain regions 5611. A source electrode 5614 is electrically connected to the source region 5604 via the P-doped polysilicon electrode 5610 and the barrier metal layer 5609. According to the sixth example, the barrier metal layer 5609 can prevent diffusion of the dopant from the P-doped polysilicon electrode 5610.

Figure 263:
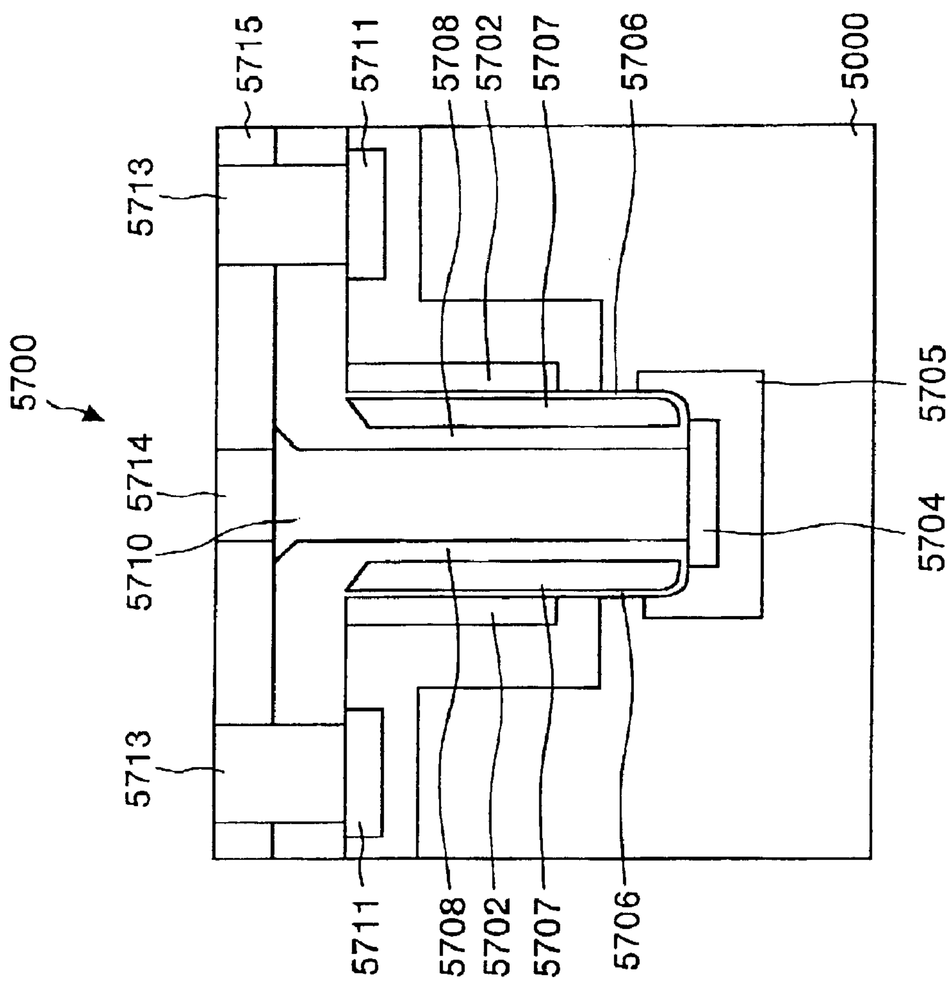

FIG. 263 is a vertical sectional view of a representation of a seventh exemplary semiconductor device according to the twenty-first embodiment. A TLPM 5700 shown in FIG. 263 is a second type of device in which source contact is made at the bottom of a trench, and is formed by performing trench formation two times. A source region 5704 and a base region 5705 are provided under[]the bottom surface of a trench.

Thick oxide films 5702, a gate oxide film 5706, gate electrodes 5707, and an interlayer insulating film 5708 are provided inside the trench in this order from the outside. The inside of the interlayer insulating film 5708 is filled with a buried electrode 5710 that is in contact with the source region 5704. The buried electrode 5710 is formed by filling the inside of the trench with non-doped polysilicon and then doping it with P (phosphorus).

Drain regions 5711 are provided in a surface layer of a semiconductor substrate 5000. Drain electrodes 5713 penetrate through the interlayer insulating film 5708 and a passivation film 5715 and are in contact with the respective drain regions 5711. A source electrode 5714 is electrically connected to the source region 5704 via the buried electrode 5710. The seventh embodiment provides an advantage that the throughput is increased because by employing CVD the non-doped polysilicon can be buried at a growth rate that is two–three orders faster than in the case of burying doped polysilicon.

Figure 264:
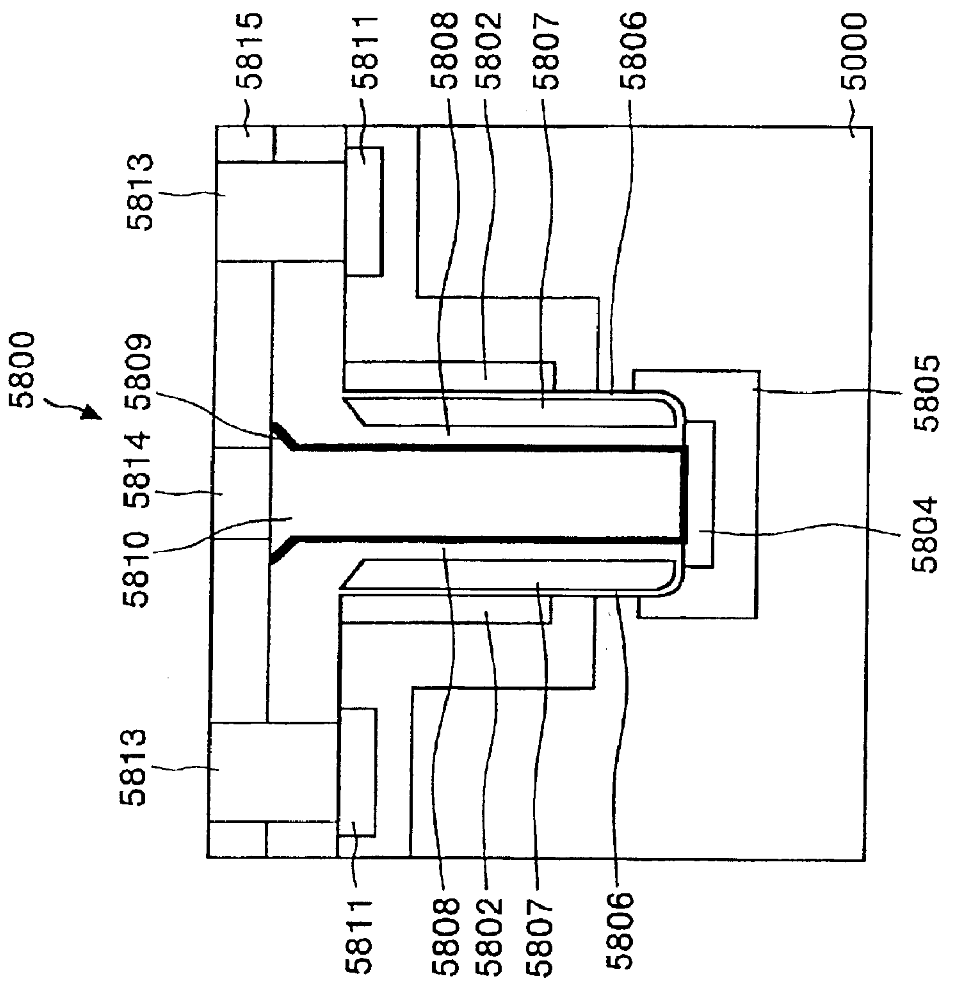

FIG. 264 is a vertical sectional view of a representation of an eighth exemplary semiconductor device according to the twenty-first embodiment. A TLPM 5800 shown in FIG. 264 is a second type of device in which source contact is made at the bottom of a trench, and is formed by performing trench formation two times. A source region 5804 and a base region 5805 are provided under the bottom surface of a trench. Thick oxide films 5802, a gate oxide film 5806, gate electrodes 5807, an interlayer insulating film 5808, and a barrier metal layer 5809 that is in contact with the source region 5804 are provided inside the trench in this order from the outside. The inside of the barrier metal layer 5809 is filled with a buried electrode 5810. The buried electrode 5810 is formed by filling the inside of the trench with non-doped polysilicon and then doping it with phosphorus.

Drain regions 5811 are provided in a surface layer of a semiconductor substrate 5000. Drain electrodes 5813 penetrate through the interlayer insulating film 5808 and a passivation film 5815 and are in contact with the respective drain regions 5811. A source electrode 5814 is electrically connected to the source region 5804 via the buried electrode 5810 and the barrier metal layer 5809. The eighth example provides an advantage that the throughput is increased because by employing CVD, the non-doped polysilicon can be buried at a growth rate that is two–three orders faster than in the case of burying doped polysilicon. Further, the barrier metal layer 5809 can prevent diffusion of the dopant from the buried electrode 5810.

The same advantages can be obtained by applying the concepts of the fifth through eighth examples to each of a first type of TLPM in which drain contact is made at the bottom of a trench and that is formed by performing trench formation two times, a second type of TLPM in which source contact is made at the bottom of a trench and that is formed by performing trench formation once, and a first type of TLPM in which drain contact is made at the bottom of a trench and that is formed by performing trench formation once.

In the twenty-first embodiment, the metal material of the buried electrode is not limited to tungsten and may be copper, aluminum, or the like. The dopant is not limited to phosphorus. The trench may be of three or more stages. The gate insulating film is not limited to an oxide film and may be an electrically insulative film or a high-resistivity film. Further, the invention can be applied not only to silicon semiconductor devices, but also to devices of compound semiconductors such as SiC.

The invention is not limited to the above embodiments and various modifications are possible. For example, in each of the above embodiments, the p-type regions may be replaced by n-type regions and vice versa. In some of the above embodiments, two p-well regions and one n-well region are employed. However, the numbers of p-well regions and n-well regions are not limited to two and one, respectively. The depth and the width of each trench may be determined as appropriate, whereby a TLPM of an arbitrary output stage can be obtained.

According to preferred embodiments of the invention, the gate electrodes of a TLPM and the gate electrodes of planar devices are formed by patterning the same polysilicon layer, and the drain electrode(s) and the source electrode(s) of the TLPM and the drain electrodes and the source electrodes of the planar devices are formed by patterning the same metal layer. Therefore, the TLPM and the planar devices can be connected electrically to each other by resulting metal wiring layers and polysilicon layers. Unlike conventional cases, it is not necessary to perform wire bonding on a printed circuit board. As a result, a small, low-cost one-chip power IC can be obtained low in on-resistance.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A manufacturing method of a semiconductor device comprising at least one trench lateral power MOSFET on a semiconductor substrate, comprising a first gate oxide film and first gate electrodes that are positioned in a trench, a first drain region positioned under a bottom surface of the trench, first source regions positioned on both sides of the trench, an extended drain region positioned between the first drain region and the first source regions, a first drain electrode connected electrically to the first drain region, and first source electrodes connected electrically to the respective first source regions, and at least one planar MOSFET positioned on the semiconductor substrate, comprising a second gate oxide film and a second gate electrode that are positioned on a surface of the semiconductor substrate, a second drain region and a second source region that are positioned in a surface layer of the semiconductor substrate on both sides of the second gate electrode, a second drain electrode connected electrically to the second drain region, and a second source electrode connected electrically to the second source region, the manufacturing method comprising:

forming the trench in the semiconductor substrate;

forming the extended drain region;

forming the first gate oxide film and the second gate oxide film;

forming first gate electrodes and the second gate electrode;

forming the first drain region, first source regions, the second drain region, and the second source region;

laying an interlayer insulating film over the surface of the semiconductor substrate;

etching the interlayer insulating film to expose the first drain region under the bottom surface of the trench;

filling the inside of the trench with a polysilicon layer that is in contact with the first drain region;

laying a passivation film over the surface of the semiconductor substrate;

etching the passivation film and the interlayer insulating film to expose the polysilicon layer, the first source regions, the second drain region, and the second source region; and laying a metal layer on the passivation film and patterning the metal layer to form the first drain electrode, first source electrodes, the second drain electrode, and the second source electrode that are in contact with the polysilicon layer, the first source regions, the second drain region, and the second source region, respectively.

2. The manufacturing method according to claim 1, wherein the polysilicon layer is laid over the surface of the semiconductor substrate after the first gate oxide film and the second gate oxide film have been formed, and then the polysilicon layer is patterned to form the first gate electrodes and the second gate electrode simultaneously.

3. The manufacturing method according to claim 1, wherein the first gate oxide film and the second gate oxide film are formed simultaneously by forming an oxide film over the surface of the semiconductor substrate after the extended drain region has been formed.

4. The manufacturing method according to claim 1, wherein a well region is formed in the semiconductor substrate, and then the trench is formed in the well region.

5. The manufacturing method according to claim 1, wherein after the trench is formed in the semiconductor substrate, impurity diffusion is performed through the trench to form a well region that surrounds the trench.

6. The manufacturing method according to claim 1, wherein selective oxidation films for device isolation are formed after the trench has been formed in the semiconductor substrate.

7. The manufacturing method according to claim 1, wherein the trench is formed after selective oxidation films for device isolation have been formed on the semiconductor substrate.

8. A manufacturing method of a semiconductor device comprising a trench lateral power MOSFET on a semiconductor substrate, comprising a first gate oxide film and first gate electrodes that are positioned in a trench; a first source region of a second conductivity type positioned under a bottom surface of the trench; first drain regions of a second conductivity type positioned on both sides of the trench; an extended drain region of a second conductivity type and a base region of a first conductivity type to serve as channel regions, the extended drain region and the base region being positioned between the first source region and the first drain regions; first drain electrodes connected electrically to the respective first drain regions; and a first source electrode connected electrically to the first source region; a first planar MOSFET positioned on the semiconductor substrate, comprising a second gate oxide film and a second gate electrode that are positioned on a surface of the semiconductor substrate; a second drain region of a first conductivity type and a second source region of a first conductivity type that are positioned in a surface layer of the semiconductor substrate on both sides of the second gate electrode; a second drain electrode connected electrically to the second drain region; and a second source electrode connected electrically to the second source region; and a second planar MOSFET positioned on the semiconductor substrate, comprising a third gate oxide film and a third gate electrode that are positioned on the surface of the semiconductor substrate; a third drain region of a second conductivity type and a third source region of a second conductivity type that are positioned in a surface layer of the semiconductor substrate on both sides of the third gate electrode; a third drain electrode connected electrically to the third drain region; and a third source electrode connected electrically to the third source region, the manufacturing method comprising:

forming the extended drain region in a semiconductor substrate;

forming the trench;

forming the base region and the channel region of the second planar MOSFET simultaneously;

forming the channel region of the first planar MOSFET;

forming the first gate oxide film, the second gate oxide film, and the third gate oxide film;

forming first gate electrodes, the second gate electrode, and the third gate electrode;

forming first drain regions, the first source region, the third drain region, and the third source region simultaneously;

forming the second drain region and the second source region simultaneously;

laying an interlayer insulating film over the surface of the semiconductor substrate, and etching the interlayer insulating film to expose the first source region at the bottom of the trench;

filling the inside of the trench with a polysilicon layer that is in contact with the first source region;

laying a passivation film over the surface of the semiconductor substrate, and etching the passivation film and the interlayer insulating film to expose the first drain regions, the polysilicon layer, the second drain region, the second source region, the third drain region, and the third source region; and laying a metal layer on the passivation film and patterning the metal layer to form first drain electrodes, the first source electrode, the second drain electrode, the second source electrode, the third drain electrode, and the third source electrode that are in contact with the first drain regions, the polysilicon layer, the second drain region, the second source region, the third drain region, and the third source region, respectively.

9. The manufacturing method according to claim 8, wherein the polysilicon layer is laid over the surface of the semiconductor substrate after the first gate oxide film, the second gate oxide film, and the third gate oxide film have been formed, and then the polysilicon layer is patterned to form the first gate electrodes, the second gate electrode, and the third gate electrode simultaneously.

10. The manufacturing method according to claim 8, wherein the first gate oxide film, the second gate oxide film, and the third gate oxide film are formed simultaneously.

11. The manufacturing method according to claim 8, wherein a body region having a same conductivity type as the base region is formed under the bottom surface of the trench after the trench has been formed and before the base region and the channel region of the second planar MOSFET are formed.

12. The manufacturing method according to claim 8, wherein the trench is formed after selective oxidation films for isolating the trench lateral power MOSFET, the first planar MOSFET, and the second planar MOSFET from each other have been formed.

13. A manufacturing method of a semiconductor device comprising a trench lateral power MOSFET on a semiconductor substrate, comprising a first gate oxide film and first gate electrodes that are positioned in a trench; a first source region of a second conductivity type positioned under a bottom surface of the trench; first drain regions of a second conductivity type positioned on both sides of the trench; an extended drain region of a second conductivity type and a base region of a first conductivity type to serve as channel regions, the extended drain region and the base region being positioned between the first source region and the first drain regions; first drain electrodes connected electrically to the respective first drain regions; and a first source electrode connected electrically to the first source region; a first planar MOSFET positioned on the semiconductor substrate, comprising a second gate oxide film and a second gate electrode that are positioned on a surface of the semiconductor substrate; a second drain region of a first conductivity type and a second source region of a first conductivity type that are positioned in a surface layer of the semiconductor substrate on both sides of the second gate electrode; a second drain electrode connected electrically to the second drain region; and a second source electrode connected electrically to the second source region; and a second planar MOSFET on the semiconductor substrate, comprising a third gate oxide film and a third gate electrode that are positioned on the surface of the semiconductor substrate; a third drain region of a second conductivity type and a third source region of a second conductivity type that are positioned in a surface layer of the semiconductor substrate on both sides of the third gate electrode; a third drain electrode connected electrically to the third drain region; and a third source electrode connected electrically to the third source region, the manufacturing method comprising:

forming the trench in a semiconductor substrate;

forming a well region of a first conductivity type that surrounds the trench by implanting an impurity into a region of the trench lateral power MOSFET and diffusing the implanted impurity;

forming the extended drain region;

forming the base region and the channel region of the second planar MOSFET simultaneously;

forming the channel region of the first planar MOSFET;

forming the first gate oxide film, the second gate oxide film, and the third gate oxide film;

forming first gate electrodes, the second gate electrode, and the third gate electrode;

forming first drain regions, the first source region, the third drain region, and the third source region simultaneously;

forming the second drain region and the second source region simultaneously;

laying an interlayer insulating film over the surface of the semiconductor substrate, and etching the interlayer insulating film to expose the first source region at the bottom of the trench;

filling the inside of the trench with a polysilicon layer that is in contact with the first source region;

laying a passivation film over the surface of the semiconductor substrate, and etching the passivation film and the interlayer insulating film to expose the first drain regions, the polysilicon layer, the second drain region, the second source region, the third drain region, and the third source region; and laying a metal layer on the passivation film and patterning the metal layer to form first drain electrodes, a first source electrode, a second drain electrode, a second source electrode, a third drain electrode, and a third source electrode that are in contact with the first drain regions, the polysilicon layer, the second drain region, the second source region, the third drain region, and the third source region, respectively.

14. A manufacturing method of a semiconductor device comprising a trench lateral power MOSFET on a semiconductor substrate, comprising a first gate oxide film and first gate electrodes that are positioned in a trench; a first source region of a second conductivity type positioned under a bottom surface of the trench; first drain regions of a second conductivity type positioned on both sides of the trench; an extended drain region of a second conductivity type and a base region of a first conductivity type to serve as channel regions, the extended drain region and the base region being positioned between the first source region and the first drain regions; first drain electrodes connected electrically to the respective first drain regions; and a first source electrode connected electrically to the first source region; a first planar MOSFET positioned on the semiconductor substrate, comprising a second gate oxide film and a second gate electrode that are positioned on a surface of the semiconductor substrate; a second drain region of a first conductivity type and a second source region of a first conductivity type that are positioned in a surface layer of the semiconductor substrate on both sides of the second gate electrode; a second drain electrode connected electrically to the second drain region; and a second source electrode connected electrically to the second source region; and a second planar MOSFET positioned on the semiconductor substrate, comprising a third gate oxide film and a third gate electrode that are positioned on the surface of the semiconductor substrate; a third drain region of a second conductivity type and a third source region of a second conductivity type that are positioned in a surface layer of the semiconductor substrate on both sides of the third gate electrode; a third drain electrode connected electrically to the third drain region; and a third source electrode connected electrically to the third source region, the manufacturing method comprising:

forming the extended drain region in the semiconductor substrate;

forming the trench;

forming the base region and the channel region of the second planar MOSFET simultaneously;

forming the channel region of the first planar MOSFET;

forming the first gate oxide film, the second gate oxide film, and the third gate oxide film;

forming first gate electrodes, the second gate electrode, and the third gate electrode;

forming first drain regions, the first source region, the third drain region, and the third source region simultaneously;

forming the second drain region and the second source region simultaneously;

laying an interlayer insulating film over the surface of the semiconductor substrate, and etching the interlayer insulating film to expose the first source region at the bottom of the trench;

forming, in the trench, a barrier metal layer that is in contact with the first source region;

filling the inside of the trench with a polysilicon layer that is in contact with the barrier metal layer;

laying a passivation film over the surface of the semiconductor substrate, and etching the passivation film and the interlayer insulating film to expose the first drain regions, the polysilicon layer, the second drain region, the second source region, the third drain region, and the third source region; and laying a metal layer on the passivation film and patterning the metal layer to form first drain electrodes, the first source electrode, the second drain electrode, the second source electrode, the third drain electrode, and the third source electrode that are in contact with the first drain regions, the polysilicon layer, the second drain region, the second source region, the third drain region, and the third source region, respectively.

15. The manufacturing method according to claim 14, wherein a plug region is formed under the bottom surface of the trench after the first gate electrodes, the second gate electrode, and the third gate electrode have been formed and before the interlayer insulating film is formed over the surface of the semiconductor substrate, then the interlayer insulating film is etched to expose the plug region at the bottom of the trench, and then the barrier metal layer is brought into contact with the plug region.

16. The manufacturing method according to claim 14, including forming body regions having a same conductivity type as the base region and then forming extended drain regions having a different conductivity type than the base region by double diffusion on both sides of the trench after the trench has been formed and before the base region and the channel region of the second planar MOSFET are formed.

17. A manufacturing method of a semiconductor device comprising a first trench lateral power MOSFET on a semiconductor substrate, comprising a first gate oxide film and first gate electrodes that are positioned in a first trench; a first source region of a second conductivity type positioned under a bottom surface of the first trench; first drain regions of a second conductivity type positioned on both sides of the first trench; a first extended drain region of a second conductivity type and a first base region of a first conductivity type to serve as channel regions, the first extended drain region and the first base region being positioned between the first source region and the first drain regions; first drain electrodes connected electrically to the respective first drain regions; and a first source electrode connected electrically to the first source region; a second trench lateral power MOSFET positioned on the semiconductor substrate, comprising a second gate oxide film and second gate electrodes that are positioned in a second trench; a second source region of a first conductivity type positioned under a bottom surface of the second trench; second drain regions of a first conductivity type positioned on both sides of the second trench; a second extended drain region of a second conductivity type and a second base region of a second conductivity type to serve as channel regions, the second extended drain region and the second base region being positioned between the second source region and the second drain regions; second drain electrodes connected electrically to the respective second drain regions; and a second source electrode connected electrically to the second source region; and a planar MOSFET positioned on the same semiconductor substrate as the first trench lateral power MOSFET, comprising a third gate oxide film and a third gate electrode that are positioned on the surface of the semiconductor substrate; a third drain region of a second conductivity type and a third source region of a second conductivity type that are positioned in a surface layer of the semiconductor substrate on both sides of the third gate electrode; a third drain electrode connected electrically to the third drain region; and a third source electrode connected electrically to the third source region, the manufacturing method comprising:

forming the first extended drain region and the second extended drain region in the semiconductor substrate;

forming the first trench and the second trench;

implanting an impurity of a first conductivity type into a region to become the first base region and a region to become the channel region of the planar MOSFET simultaneously;

implanting an impurity of a second conductivity type into a region to become the second base region;

diffusing the implanted impurities to form the first base region, the second base region, and the channel region of the planar MOSFET simultaneously;

forming the first gate oxide film, the second gate oxide film, and the third gate oxide film;

forming first gate electrodes, second gate electrodes, and the third gate electrode;

implanting an impurity of the second conductivity type into regions to become first drain regions, a region to become the first source region, a region to become the third drain region, and a region to become the third source region simultaneously;

implanting an impurity of the first conductivity type into regions to become second drain regions and a region to become the second source region;

diffusing the implanted impurities to form the first drain regions, the first source region, the second drain regions, the second source region, the third drain region, and the third source region simultaneously;

laying an interlayer insulating film over the surface of the semiconductor substrate, and etching the interlayer insulating film to expose the first source region and the second source region at the bottoms of the first trench and the second trench, respectively;

filling the insides of the first trench and the second trench with a first polysilicon layer and a second polysilicon layer that are in contact with the first source region and the second source region, respectively;

laying a passivation film over the surface of the semiconductor substrate, and etching the passivation film and the interlayer insulating film to expose the first drain regions, the first polysilicon layer, the second drain regions, the second polysilicon layer, the third drain region, and the third source region; and laying a metal layer on the passivation film and patterning the metal layer to form first drain electrodes, the first source electrode, second drain electrodes, the second source electrode, the third drain electrode, and the third source electrode that are in contact with the first drain regions, the first polysilicon layer, the second drain regions, the second polysilicon layer, the third drain region, and the third source region, respectively.

18. The manufacturing method according to claim 17, wherein the first polysilicon layer is laid over the surface of the semiconductor substrate after the first gate oxide film, the second gate oxide film, and the third gate oxide film have been formed, and then the first polysilicon layer is patterned to form the first gate electrodes, the second gate electrodes, and the third gate electrode simultaneously.

19. The manufacturing method according to claim 17, wherein the first gate oxide film, the second gate oxide film, and the third gate oxide film are formed simultaneously.

20. The manufacturing method according to claim 17, wherein a body region having the same conductivity type as the first base region is formed under the bottom surface of the first trench after the first trench has been formed and before the impurity of the first conductivity type is implanted into the region to become the first base region and the region to become the channel region of the planar MOSFET.

21. The manufacturing method according to claim 17, wherein a body region having the same conductivity type as the second base region is formed under the bottom surface of the second trench after the second trench has been formed and before the impurity of the second conductivity type is implanted into the region to become the second base region.

22. A manufacturing method of a semiconductor device comprising a first trench lateral power MOSFET on a semiconductor substrate, comprising a first gate oxide film and first gate electrodes that are positioned in a first trench; a first source region of a second conductivity type positioned under a bottom surface of the first trench; first drain regions of a second conductivity type positioned on both sides of the first trench; a first extended drain region of a second conductivity type and a first base region of a first conductivity type to serve as channel regions, the first extended drain region and the first base region being positioned between the first source region and the first drain regions; first drain electrodes connected electrically to the respective first drain regions; and a first source electrode connected electrically to the first source region; a second trench lateral power MOSFET positioned on the semiconductor substrate, comprising a second gate oxide film and second gate electrodes that are positioned in a second trench; a second source region of a first conductivity type positioned under a bottom surface of the second trench; second drain regions of a first conductivity type positioned on both sides of the second trench; a second extended drain region of a first conductivity type and a second base region of a second conductivity type to serve as channel regions, the second extended drain region and the second base region being positioned between the second source region and the second drain regions; second drain electrodes connected electrically to the respective second drain regions; and a second source electrode connected electrically to the second source region; and a planar MOSFET positioned on the semiconductor substrate, comprising a third gate oxide film and a third gate electrode that are positioned on the surface of the semiconductor substrate; a third drain region of a second conductivity type and a third source region of a second conductivity type that are positioned in a surface layer of the semiconductor substrate on both sides of the third gate electrode; a third drain electrode connected electrically to the third drain region; and a third source electrode connected electrically to the third source region, the manufacturing method comprising:

forming the first extended drain region and the second extended drain region in the semiconductor substrate;

forming the first trench and the second trench;

implanting an impurity of the first conductivity type into a region to become the first base region and a region to become the channel region of the planar MOSFET simultaneously;

implanting an impurity of the second conductivity type into a region to become the second base region;

diffusing the implanted impurities to form the first base region, the second base region, and the channel region of the planar MOSFET simultaneously;

forming the first gate oxide film, the second gate oxide film, and the third gate oxide film;

forming first gate electrodes, second gate electrodes, and the third gate electrode;

implanting an impurity of the second conductivity type into regions to become first drain regions, a region to become the first source region, a region to become the third drain region, and a region to become the third source region simultaneously;

implanting an impurity of the first conductivity type into regions to become second drain regions and a region to become the second source region;

diffusing the implanted impurities to form the first drain regions, the first source region, the second drain regions, the second source region, the third drain region, and the third source region simultaneously;

laying an interlayer insulating film over the surface of the semiconductor substrate, and etching the interlayer insulating film to expose the first source region and the second source region at the bottoms of the first trench and the second trench, respectively;

forming, in the first trench and the second trench, a first barrier metal layer and a second barrier metal layer that are in contact with the first source region and the second source region, respectively;

filling the insides of the first trench and the second trench with a first polysilicon layer and a second polysilicon layer that are in contact with the first barrier metal layer and the second barrier metal layer, respectively;

laying a passivation film over the surface of the semiconductor substrate, and etching the passivation film and the interlayer insulating film to expose the first drain regions, the first polysilicon layer, the second drain regions, the second polysilicon layer, the third drain region, and the third source region; and laying a metal layer on the passivation film and patterning the metal layer to form first drain electrodes, a first source electrode, second drain electrodes, a second source electrode, a third drain electrode, and a third source electrode that are in contact with the first drain regions, the first polysilicon layer, the second drain regions, the second polysilicon layer, the third drain region, and the third source region, respectively.

23. The manufacturing method according to claim 20, including forming body regions having the first conductivity type and then forming extended drain regions having the second conductivity type by double diffusion on both sides of the first trench after the first trench has been formed and before the impurity of the first conductivity type is implanted into the region to become the first base region and the region to become the channel region of the planar MOSFET.

24. The manufacturing method according to claim 21, including forming body regions having the second conductivity type and then forming extended drain regions having the first conductivity type by double diffusion on both sides of the second trench after the second trench has been formed and before the impurity of the second conductivity type is implanted into the region to become the second base region.

25. A manufacturing method of a semiconductor device comprising a first trench lateral power MOSFET on a semiconductor substrate, comprising a first gate oxide film and first gate electrodes that are positioned in a first trench; a first source region of a second conductivity type positioned under a bottom surface of the first trench; first drain regions of a second conductivity type positioned on both sides of the first trench; a first extended drain region of a second conductivity type and a first base region of a first conductivity type to serve as channel regions, the first extended drain region and the first base region being positioned between the first source region and the first drain regions; first drain electrodes connected electrically to the respective first drain regions; and a first source electrode connected electrically to the first source region; a second trench lateral power MOSFET positioned on the same semiconductor substrate as the first trench lateral power MOSFET, comprising a second gate oxide film and second gate electrodes that are positioned in a second trench; a second source region of a first conductivity type positioned under a bottom surface of the second trench; second drain regions of a first conductivity type positioned on both sides of the second trench; a second extended drain region of a first conductivity type and a second base region of a second conductivity type to serve as channel regions, the second extended drain region and the second base region being positioned between the second source region and the second drain regions; second drain electrodes connected electrically to the respective second drain regions; and a second source electrode connected electrically to the second source region; a first planar MOSFET positioned on the semiconductor substrate, comprising a third gate oxide film and a third gate electrode that are positioned on the surface of the semiconductor substrate; a third drain region of a second conductivity type and a third source region of a second conductivity type that are positioned in a surface layer of the semiconductor substrate on both sides of the third gate electrode; a third drain electrode connected electrically to the third drain region; and a third source electrode connected electrically to the third source region; and a second planar MOSFET positioned on the same semiconductor substrate as the first trench lateral power MOSFET, comprising a fourth gate oxide film and a fourth gate electrode that are positioned on the surface of the semiconductor substrate; a fourth drain region of a first conductivity type and a fourth source region of a first conductivity type that are positioned in a surface layer of the semiconductor substrate on both sides of the fourth gate electrode; a fourth drain electrode connected electrically to the fourth drain region; and a fourth source electrode connected electrically to the fourth source region, the manufacturing method comprising:

- forming the first extended drain region and the second extended drain region in the semiconductor substrate;
- forming the first trench and the second trench;
- forming the first base region and the channel region of the first planar MOSFET simultaneously;
- forming the second base region and the channel region of the second planar MOSFET simultaneously;
- forming the first gate oxide film, the second gate oxide film, the third gate oxide film, and the fourth gate oxide film;
- forming first gate electrodes, second gate electrodes, the third gate electrode, and the fourth gate electrode;
- forming first drain regions, the first source region, the third drain region, and the third source region simultaneously;
- forming second drain regions, the second source region, the fourth drain region, and the fourth source region simultaneously;
- laying an interlayer insulating film over the surface of the semiconductor substrate, and etching the interlayer insulating film to expose the first source region and the second source region at the bottoms of the first trench and the second trench, respectively;
- filling the insides of the first trench and the second trench with a first polysilicon layer and a second polysilicon layer that are in contact with the first source region and the second source region, respectively;
- laying a passivation film over the surface of the semiconductor substrate, and etching the passivation film and the interlayer insulating film to expose the first drain regions, the first polysilicon layer, the second drain regions, the second polysilicon layer, the third drain region, the third source region, the fourth drain region, and the fourth source region; and
- laying a metal layer on the passivation film and patterning the metal layer to form first drain electrodes, the first source electrode, second drain electrodes, the second source electrode, the third drain electrode, the third source electrode, the fourth drain electrode, and the fourth source electrode that are in contact with the first drain regions, the first polysilicon layer, the second drain regions, the second polysilicon layer, the third drain region, the third source region, the fourth drain region, and the fourth source region, respectively.

26. The manufacturing method according to claim 25, wherein the first polysilicon layer is laid over the surface of the semiconductor substrate after the first gate oxide film, the second gate oxide film, the third gate oxide film, and the fourth gate oxide film have been formed, and then the first polysilicon layer is patterned to form the first gate electrodes, the second gate electrodes, the third gate electrode, and the fourth gate electrode simultaneously.

27. The manufacturing method according to claim 25, wherein the first gate oxide film, the second gate oxide film, and the third gate oxide film, and the fourth gate oxide film are formed simultaneously.

28. The manufacturing method according to claim 25, wherein a body region having a same conductivity type as the first base region is formed under the bottom surface of the first trench after the first trench has been formed and before the first base region and the channel region of the first planar MOSFET are formed.

29. The manufacturing method according to claim 25, wherein a body region having a same conductivity type as the second base region is formed under the bottom surface of the second trench after the second trench has been formed and before the second base region and the channel region of the second planar MOSFET are formed.

30. A manufacturing method of a semiconductor device comprising a first trench lateral power MOSFET on a semiconductor substrate, comprising a first gate oxide film and first gate electrodes that are positioned in a first trench; a first source region of a second conductivity type positioned under a bottom surface of the first trench; first drain regions of a second conductivity type positioned on both sides of the first trench; a first extended drain region of a second conductivity type and a first base region of a first conductivity type to serve as channel regions, the first extended drain region and the first base region being positioned between the first source region and the first drain regions; first drain electrodes connected electrically to the respective first drain regions; and a first source electrode connected electrically to the first source region; a second trench lateral power MOSFET positioned on the semiconductor substrate, comprising a second gate oxide film and second gate electrodes that are positioned in a second trench; a second source region of a first conductivity type positioned under a bottom surface of the second trench; second drain regions of a first conductivity type positioned on both sides of the second trench; a second extended drain region of a first conductivity type and a second base region of a second conductivity type to serve as channel regions, the second extended drain region and the second base region being positioned between the second source region and the second drain regions; second drain electrodes connected electrically to the respective second drain regions; and a second source electrode connected electrically to the second source region; a first planar MOSFET positioned on the semiconductor substrate, comprising a third gate oxide film and a third gate electrode that are positioned on the surface of the semiconductor substrate; a third drain region of a second conductivity type and a third source region of a second conductivity type that are positioned in a surface layer of the semiconductor substrate on both sides of the third gate electrode; a third drain electrode connected electrically to the third drain region; and a third source electrode connected electrically to the third source region; and a second planar MOSFET positioned on the semiconductor substrate, comprising a fourth gate oxide film and a fourth gate electrode that are positioned on the surface of the semiconductor substrate; a fourth drain region of a first conductivity type and a fourth source region of a first conductivity type that are positioned in a surface layer of the semiconductor substrate on both sides of the fourth gate electrode; a fourth drain electrode connected electrically to the fourth drain region; and a fourth source electrode connected electrically to the fourth source region, the manufacturing method comprising:

forming the first extended drain region and the second extended drain region in a semiconductor substrate;

forming the first trench and the second trench;

forming the first base region and the channel region of the first planar MOSFET simultaneously;

forming the second base region and the channel region of the second planar MOSFET simultaneously;

forming the first gate oxide film, the second gate oxide film, the third gate oxide film, and the fourth gate oxide film;

forming first gate electrodes, second gate electrodes, the third gate electrode, and the fourth gate electrode;

forming first drain regions, the first source region, the third drain region, and the third source region simultaneously;

forming second drain regions, the second source region, the fourth drain region, and the fourth source region simultaneously;

laying an interlayer insulating film over the surface of the semiconductor substrate, and etching the interlayer insulating film to expose the first source region and the second source region at the bottoms of the first trench and the second trench, respectively;

forming, in the first trench and the second trench, a first barrier metal layer and a second barrier metal layer that are in contact with the first source region and the second source region, respectively;

filling the insides of the first trench and the second trench with a first polysilicon layer and a second polysilicon layer that are in contact with the first barrier metal layer and the second barrier metal layer, respectively;

laying a passivation film over the surface of the semiconductor substrate, and etching the passivation film and the interlayer insulating film to expose the first drain regions, the first polysilicon layer, the second drain regions, the second polysilicon layer, the third drain region, the third source region, the fourth drain region, and the fourth source region; and laying a metal layer on the passivation film and patterning the metal layer to form first drain electrodes, the first source electrode, second drain electrodes, the second source electrode, the third drain electrode, the third source electrode, the fourth drain electrode, and the fourth source electrode that are in contact with the first drain regions, the first polysilicon layer, the second drain regions, the second polysilicon layer, the third drain region, the third source region, the fourth drain region, and the fourth source region, respectively.

31. The manufacturing method according to claim 28, including forming body regions having a first conductivity type and then forming extended drain regions having a second conductivity type by double diffusion on both sides of the first trench after the first trench has been formed and before the first base region and the channel region of the first planar MOSFET are formed.

32. The manufacturing method according to claim 29, including forming body regions having a second conductivity type and then forming extended drain regions having a first conductivity type by double diffusion on both sides of the second trench after the second trench has been formed and before the second base region and the channel region of the second planar MOSFET are formed.

* * * * *